(12) United States Patent
Shishido

(10) Patent No.: US 8,988,400 B2
(45) Date of Patent: Mar. 24, 2015

(54) DISPLAY DEVICE AND DRIVING METHOD THEREOF

(75) Inventor: Hideaki Shishido, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 915 days.

(21) Appl. No.: 11/581,171

(22) Filed: Oct. 13, 2006

(65) Prior Publication Data

US 2007/0085847 A1 Apr. 19, 2007

(30) Foreign Application Priority Data

Oct. 18, 2005 (JP) ................................. 2005-303656

(51) Int. Cl.
*G06F 3/038* (2013.01)
*G09G 3/32* (2006.01)
*H01L 27/12* (2006.01)
(Continued)

(52) U.S. Cl.
CPC ............ *G09G 3/3233* (2013.01); *G09G 3/3291* (2013.01); *G09G 2300/0819* (2013.01); *G09G 2300/0852* (2013.01); *G09G 2310/0262* (2013.01); *G09G 2320/043* (2013.01); *H01L 27/12* (2013.01); *H01L 27/1214* (2013.01); *H01L 27/3244* (2013.01); *H01L 27/3248* (2013.01); *H01L 27/3258* (2013.01);
(Continued)

(58) Field of Classification Search
CPC . G09G 3/3208; G09G 3/3225; G09G 3/3233; G09G 3/3241; G09G 3/325; G09G 3/3258
See application file for complete search history.

(56) References Cited

U.S. PATENT DOCUMENTS 3,562,425 A * 2/1971 Poirier .......................... 348/309
5,550,066 A 8/1996 Tang et al.
(Continued)

FOREIGN PATENT DOCUMENTS

CN 1551084 A 12/2004
CN 1595484 A 3/2005
(Continued)

OTHER PUBLICATIONS

Office Action re Chinese application No. CN 201010517836.0, dated Oct. 31, 2011 (with English translation).
(Continued)

*Primary Examiner* — Amare Mengistu
*Assistant Examiner* — Crystal A Mathews
(74) *Attorney, Agent, or Firm* — Husch Blackwell LLP

(57) ABSTRACT

To provide a display device and a driving method thereof, where variations in the threshold voltage of transistors can be compensated and thus variations in luminance of light-emitting elements can be suppressed. In a first period, initialization is performed; in a second period, a voltage based on the threshold voltage of a first transistor is held in first and second storage capacitors; in a third period, a voltage based on a video signal voltage and the threshold voltage of the first transistor is held in the first and second storage capacitors; and in a fourth period, voltages held in the first and second storage capacitors are applied to a gate terminal of the first transistor to supply a current to a light-emitting element, so that the light-emitting element emits light. Through the operation process, a current obtained by compensating variations in the threshold voltage of the first transistor can be supplied to the light-emitting element, thereby variations in luminance can be suppressed.

11 Claims, 73 Drawing Sheets

(51) Int. Cl.
*H01L 27/32* (2006.01)
*H01L 29/786* (2006.01)
(52) U.S. Cl.
CPC ...... *H01L 27/3265* (2013.01); *H01L 29/78621* (2013.01); *H01L 29/78627* (2013.01)
USPC ........................................................ 345/204

(56) References Cited

U.S. PATENT DOCUMENTS

| | | | |
|---|---|---|---|
| 5,952,789 A * | 9/1999 | Stewart et al. | 315/169.4 |
| 6,476,419 B1 | 11/2002 | Yasuda | |
| 6,501,466 B1 * | 12/2002 | Yamagishi et al. | 345/204 |
| 6,583,775 B1 | 6/2003 | Sekiya et al. | |
| 6,690,033 B2 | 2/2004 | Yamazaki et al. | |
| 6,825,070 B2 * | 11/2004 | Yamanaka et al. | 438/157 |
| 6,876,345 B2 | 4/2005 | Akimoto et al. | |
| 6,950,081 B2 | 9/2005 | Akimoto et al. | |
| 7,142,180 B2 | 11/2006 | Akimoto et al. | |
| 7,221,343 B2 | 5/2007 | Kageyama et al. | |
| 7,221,349 B2 | 5/2007 | Hashido et al. | |
| 7,256,421 B2 | 8/2007 | Yamazaki et al. | |
| 7,259,737 B2 | 8/2007 | Ono et al. | |
| 7,277,071 B2 * | 10/2007 | Oh | 345/76 |
| 7,277,072 B2 | 10/2007 | Akimoto et al. | |
| 7,279,708 B2 | 10/2007 | Kwak et al. | |
| 7,286,105 B2 | 10/2007 | Akimoto et al. | |
| 7,307,612 B2 | 12/2007 | Goto et al. | |
| 7,330,168 B2 | 2/2008 | Anzai | |
| 7,358,938 B2 | 4/2008 | Kim | |
| 7,365,713 B2 | 4/2008 | Kimura | |
| 7,365,742 B2 | 4/2008 | Kim et al. | |
| 7,382,340 B2 * | 6/2008 | Kim et al. | 345/76 |
| 7,427,971 B2 * | 9/2008 | Eom | 345/82 |
| 7,432,888 B2 * | 10/2008 | Kwak | 345/76 |
| 7,435,992 B2 | 10/2008 | Choi et al. | |
| 7,436,376 B2 | 10/2008 | Akimoto et al. | |
| 7,456,810 B2 | 11/2008 | Kimura | |
| 7,623,102 B2 | 11/2009 | Matsumoto | |
| 7,646,367 B2 | 1/2010 | Kimura | |
| 7,692,378 B2 | 4/2010 | Yamazaki | |
| 7,719,492 B2 | 5/2010 | Childs | |
| 7,875,889 B2 | 1/2011 | Choi et al. | |
| 7,940,233 B2 | 5/2011 | Kim et al. | |
| 7,956,533 B2 | 6/2011 | Kim et al. | |
| 7,999,803 B2 | 8/2011 | Goto et al. | |
| 8,017,944 B2 | 9/2011 | Yamazaki et al. | |
| 8,031,144 B2 | 10/2011 | Akimoto et al. | |
| 8,035,109 B2 | 10/2011 | Kimura | |
| 8,063,859 B2 | 11/2011 | Kimura | |
| 8,120,031 B2 | 2/2012 | Yamazaki et al. | |
| 8,159,427 B2 | 4/2012 | Akimoto et al. | |
| 8,305,306 B2 | 11/2012 | Kimura | |
| 8,376,802 B2 | 2/2013 | Kim et al. | |
| 8,378,356 B2 | 2/2013 | Kimura | |
| 8,633,878 B2 | 1/2014 | Akimoto et al. | |
| 2001/0045929 A1 * | 11/2001 | Prache et al. | 345/89 |
| 2003/0052614 A1 * | 3/2003 | Howard | 315/169.1 |
| 2003/0231152 A1 * | 12/2003 | Shin | 345/83 |
| 2004/0056257 A1 * | 3/2004 | Sakamoto et al. | 257/79 |
| 2004/0070557 A1 * | 4/2004 | Asano et al. | 345/76 |
| 2004/0174349 A1 * | 9/2004 | Libsch et al. | 345/204 |
| 2004/0207615 A1 * | 10/2004 | Yumoto | 345/211 |
| 2005/0007316 A1 | 1/2005 | Akimoto et al. | |
| 2005/0057459 A1 | 3/2005 | Miyazawa | |
| 2005/0212787 A1 | 9/2005 | Noguchi et al. | |
| 2005/0280614 A1 * | 12/2005 | Goh | 345/76 |
| 2006/0023551 A1 * | 2/2006 | Peng et al. | 365/226 |
| 2006/0044230 A1 * | 3/2006 | Eom | 345/76 |
| 2006/0066536 A1 | 3/2006 | Ota et al. | |
| 2006/0139253 A1 * | 6/2006 | Choi et al. | 345/76 |
| 2008/0136753 A1 | 6/2008 | Kim | |
| 2009/0174699 A1 | 7/2009 | Fish et al. | |
| 2010/0277402 A1 | 11/2010 | Miyazawa | |
| 2011/0210990 A1 | 9/2011 | Kim et al. | |
| 2012/0001187 A1 | 1/2012 | Yamazaki et al. | |
| 2012/0175619 A1 | 7/2012 | Yamazaki et al. | |
| 2013/0057174 A1 | 3/2013 | Kimura | |
| 2013/0153909 A1 | 6/2013 | Kimura | |

FOREIGN PATENT DOCUMENTS

| | | | |
|---|---|---|---|
| EP | 0 717 439 A2 | 6/1996 | |
| EP | 1 061 497 A1 | 12/2000 | |
| EP | 1 102 234 A2 | 5/2001 | |
| EP | 1 128 439 A2 | 8/2001 | |
| EP | 1 533 782 A2 | 5/2005 | |
| EP | 1 536 405 A2 | 6/2005 | |
| EP | 1 536 472 A1 | 6/2005 | |
| EP | 1 585 100 A1 | 10/2005 | |
| EP | 1 624 436 A1 | 2/2006 | |
| JP | 7-92499 | 4/1995 | |
| JP | 08-241047 A | 9/1996 | |
| JP | 9-127556 | 5/1997 | |
| JP | 2000-231347 A | 8/2000 | |
| JP | 2001-60076 | 3/2001 | |
| JP | 2001-92377 | 4/2001 | |
| JP | 2001-147659 | 5/2001 | |
| JP | 2001-282137 A | 10/2001 | |
| JP | 2001-318628 A | 11/2001 | |
| JP | 2003-005709 A | 1/2003 | |
| JP | 2003-173869 A | 6/2003 | |
| JP | 2003-202834 A | 7/2003 | |
| JP | 2003-241687 A | 8/2003 | |
| JP | 2003-316328 | 11/2003 | |
| JP | 2003-323133 A | 11/2003 | |
| JP | 2003-330413 | 11/2003 | |
| JP | 2003-345307 | 12/2003 | |
| JP | 2004-079509 A | 3/2004 | |
| JP | 2004-286816 | 10/2004 | |
| JP | 2004-341023 | 12/2004 | |
| JP | 2004-354596 | 12/2004 | |
| JP | 2005-10223 | 1/2005 | |
| JP | 2005-99714 | 4/2005 | |
| JP | 2005-128521 | 5/2005 | |
| JP | 2005-157298 A | 6/2005 | |
| JP | 2005-157308 | 6/2005 | |
| JP | 2005-518557 | 6/2005 | |
| JP | 2005-258407 | 9/2005 | |
| JP | 2005-266806 A | 9/2005 | |
| JP | 2005-275276 | 10/2005 | |
| JP | 2005-338789 A | 12/2005 | |
| JP | 2005-338796 A | 12/2005 | |
| JP | 2006-285210 | 10/2006 | |
| JP | 2007-519956 | 7/2007 | |
| JP | 2007-522492 | 8/2007 | |
| KR | 10-2005-0090861 | 9/2005 | |
| WO | WO 03/071511 A2 | 8/2003 | |
| WO | WO 2005/069266 A1 | 7/2005 | |
| WO | WO 2005/069267 A1 | 7/2005 | |
| WO | WO 2005069266 A1 * | 7/2005 | G09G 3/32 |

OTHER PUBLICATIONS

Office Action re Korean application No. KR 10-2006-0099331, dated Mar. 26, 2013 (with English translation).

Office Action re Chinese application No. CN 200610137396.X, dated Oct. 16, 2009 (with English translation).

* cited by examiner

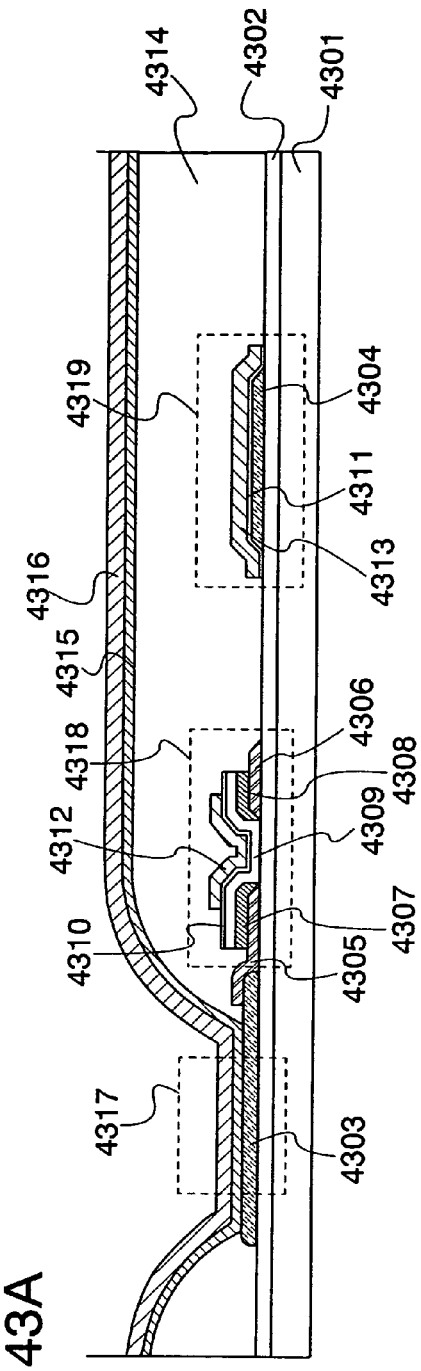
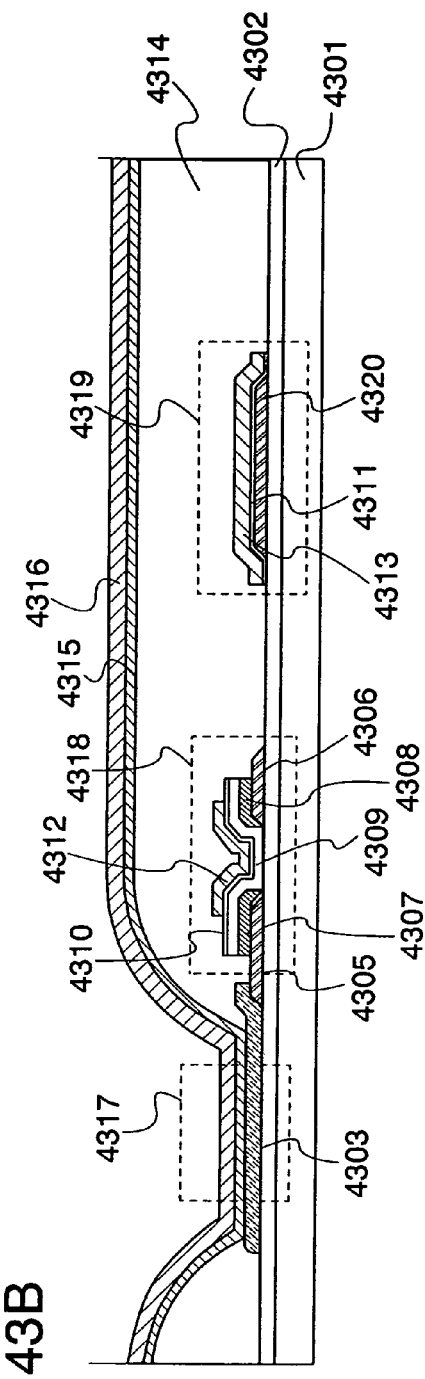
FIG. 43A
FIG. 43B

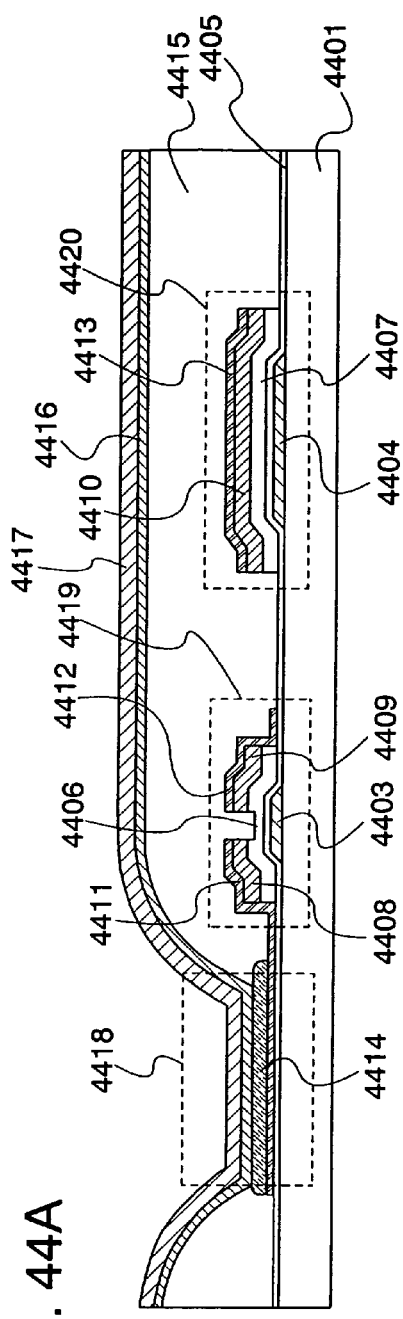

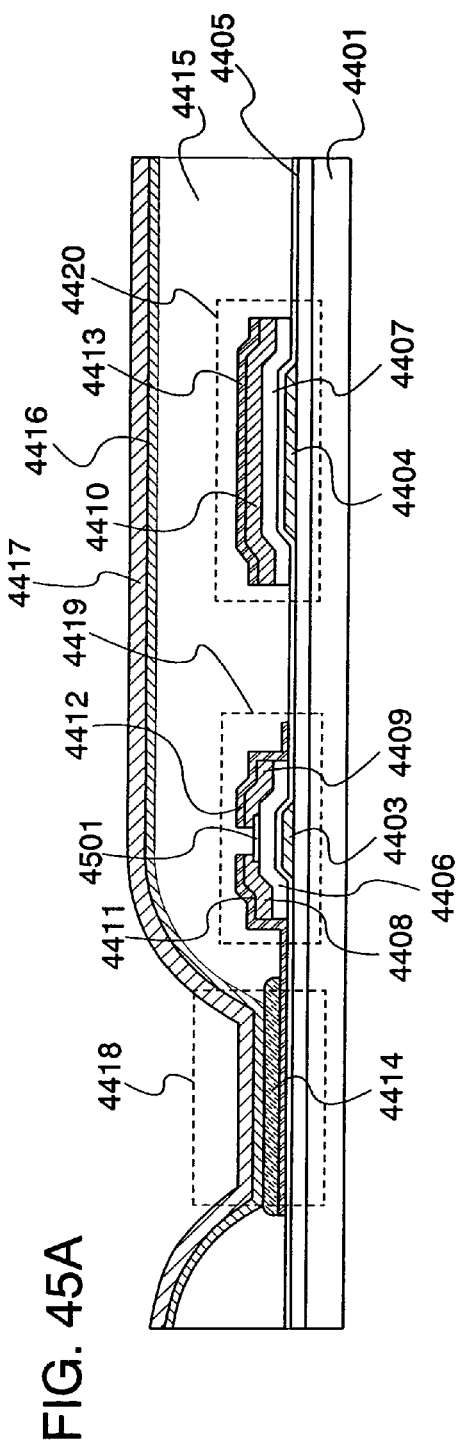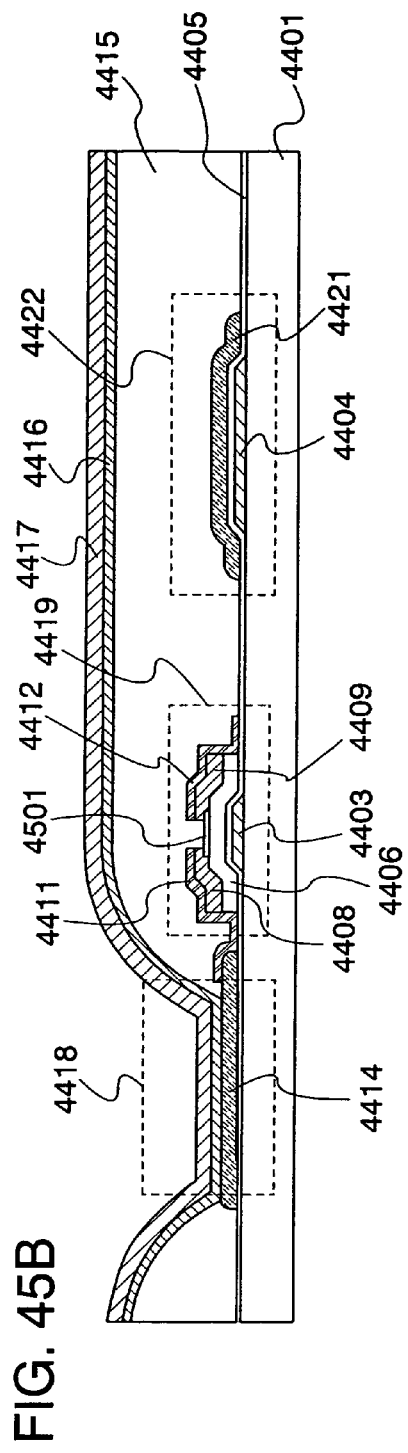
FIG. 45A
FIG. 45B

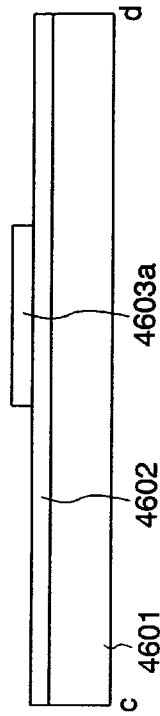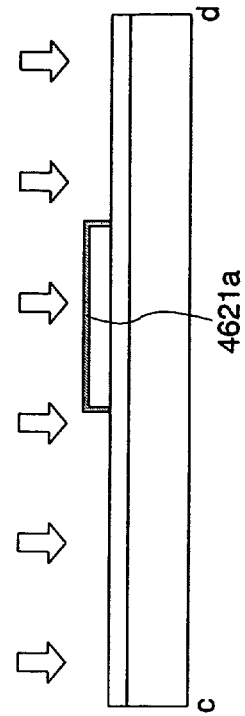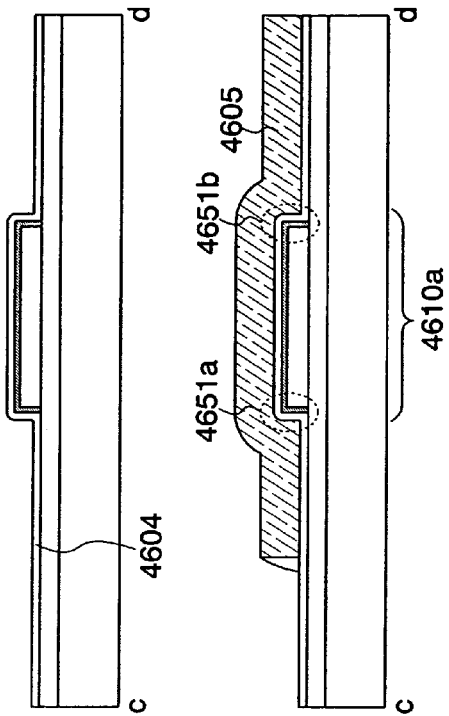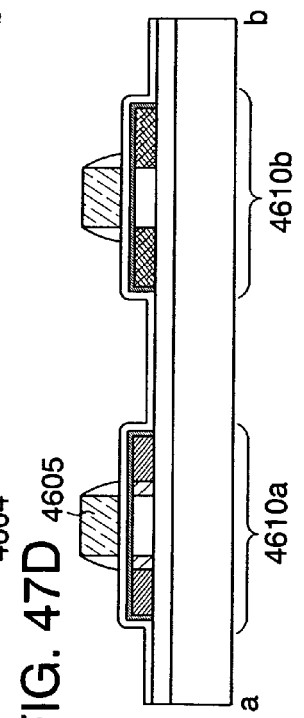
FIG. 47A
FIG. 47B
FIG. 47C
FIG. 47D

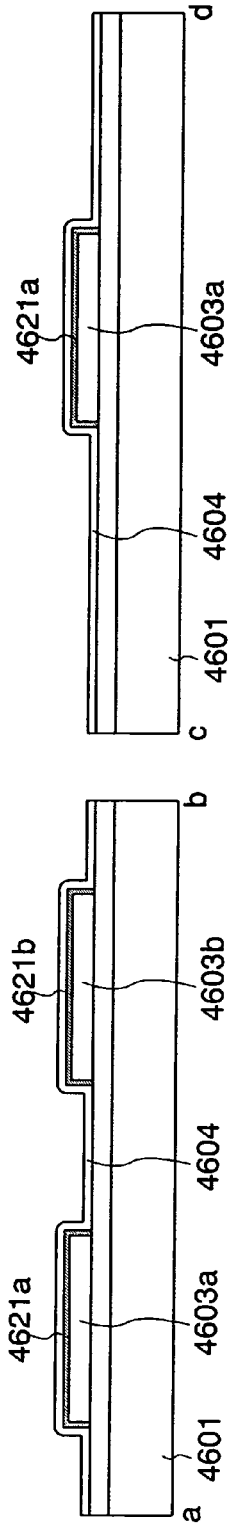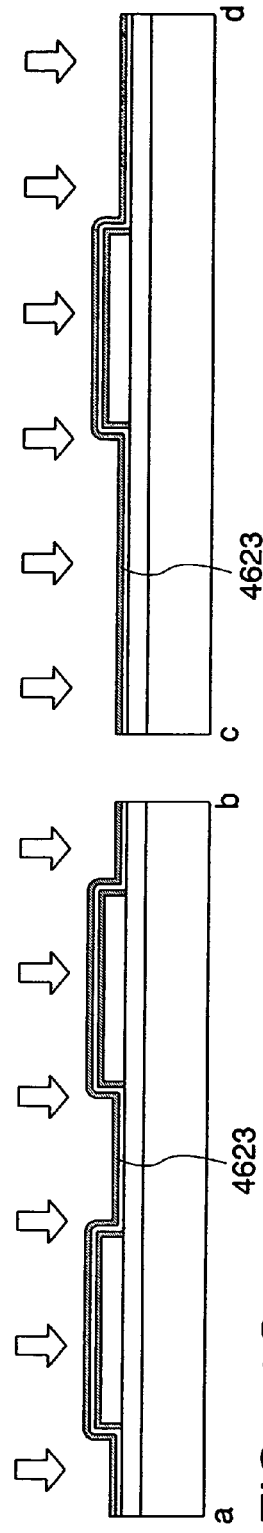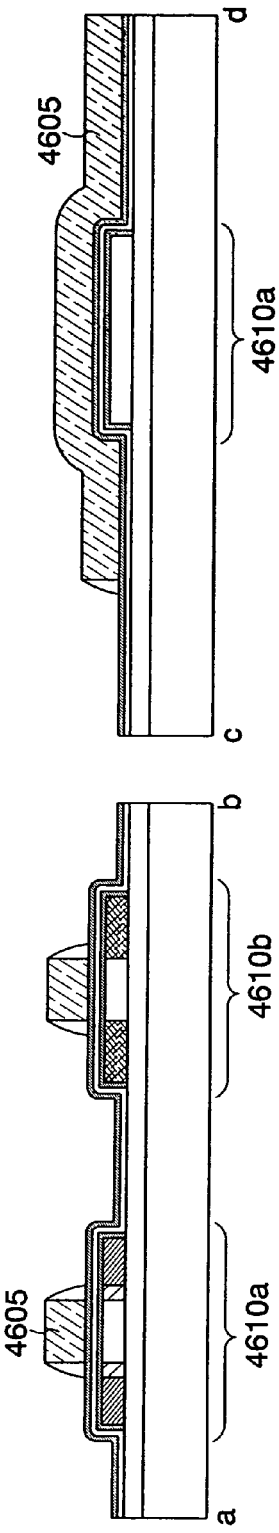

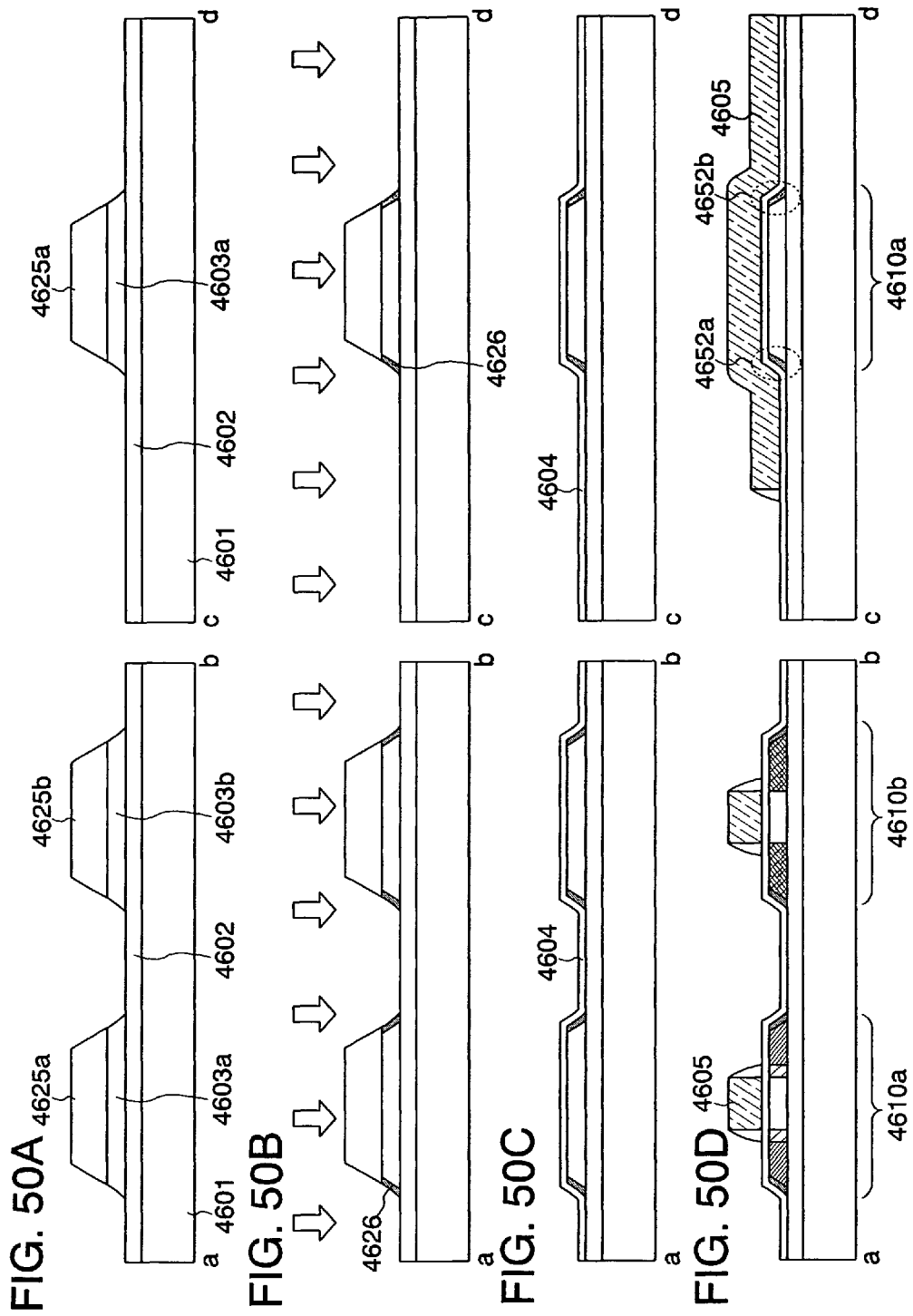

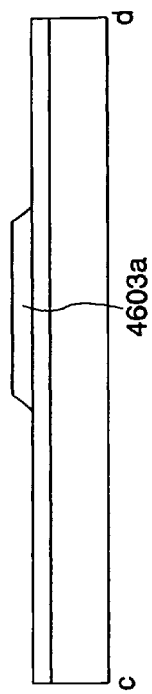
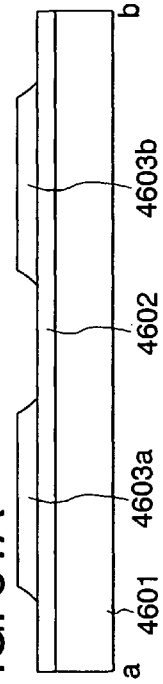
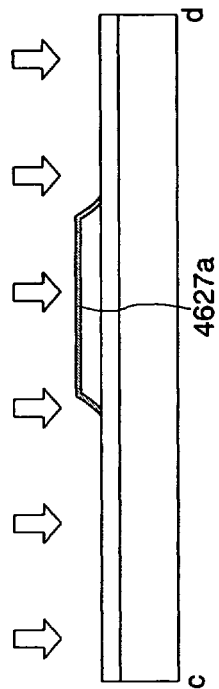
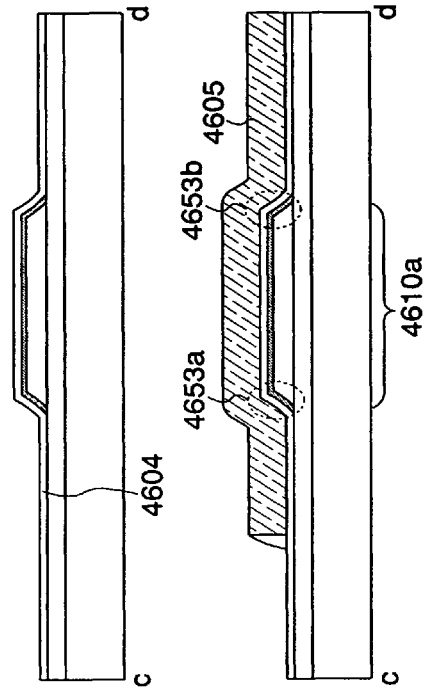
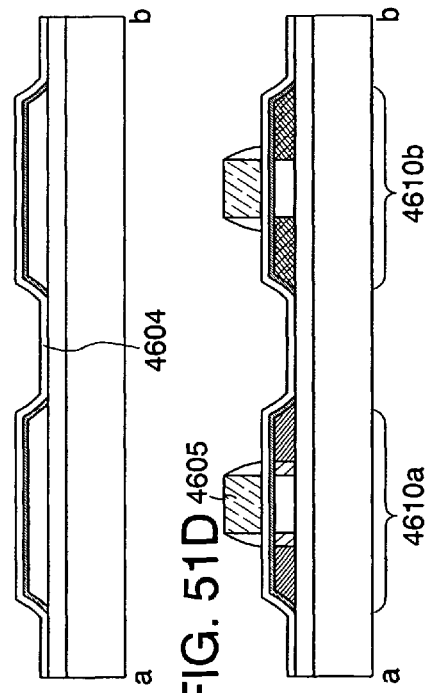

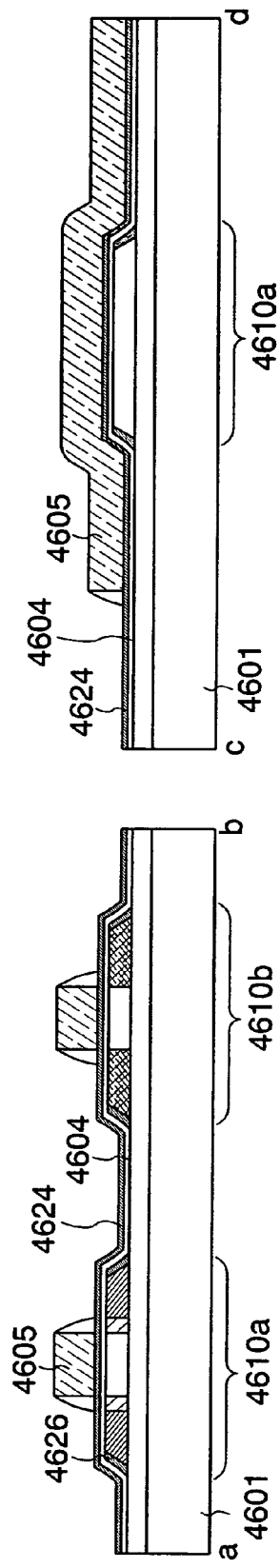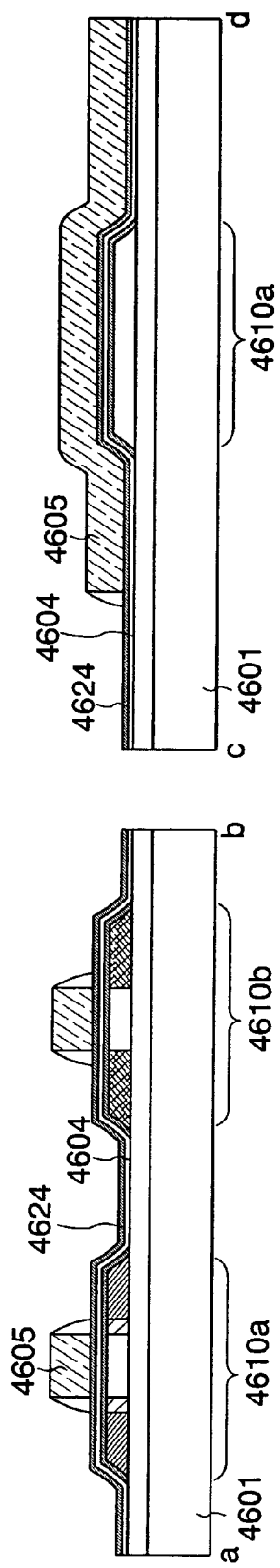

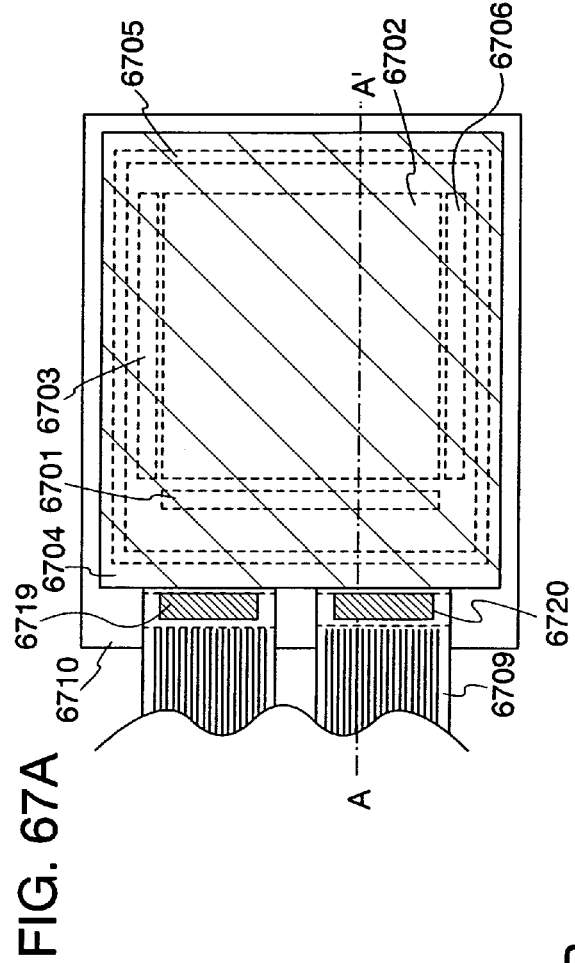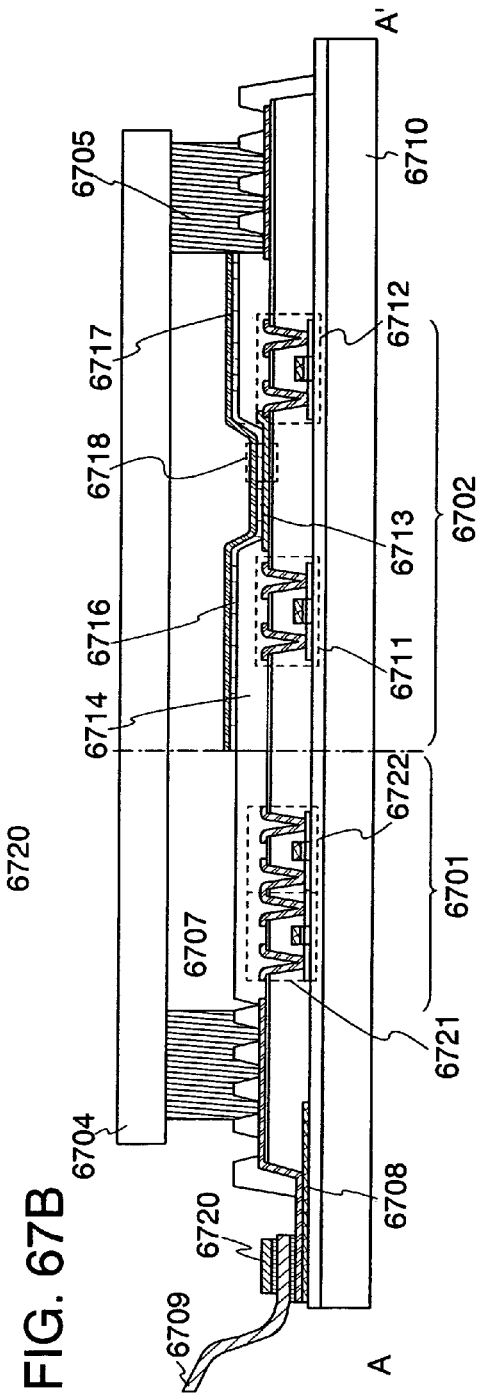
FIG. 67A
FIG. 67B

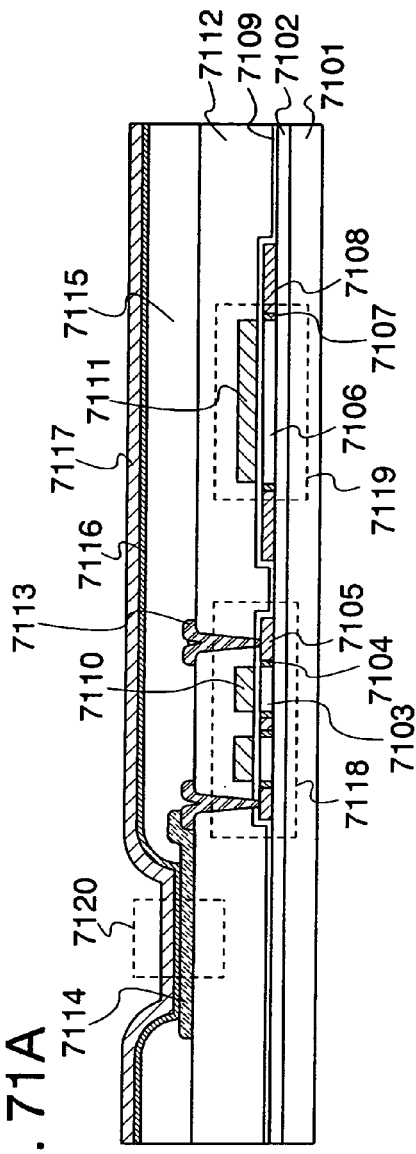
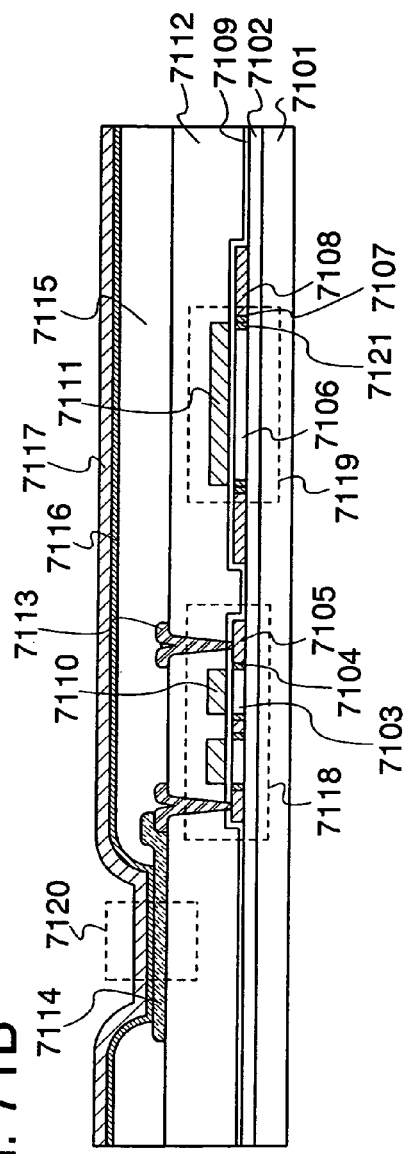
FIG. 71A
FIG. 71B

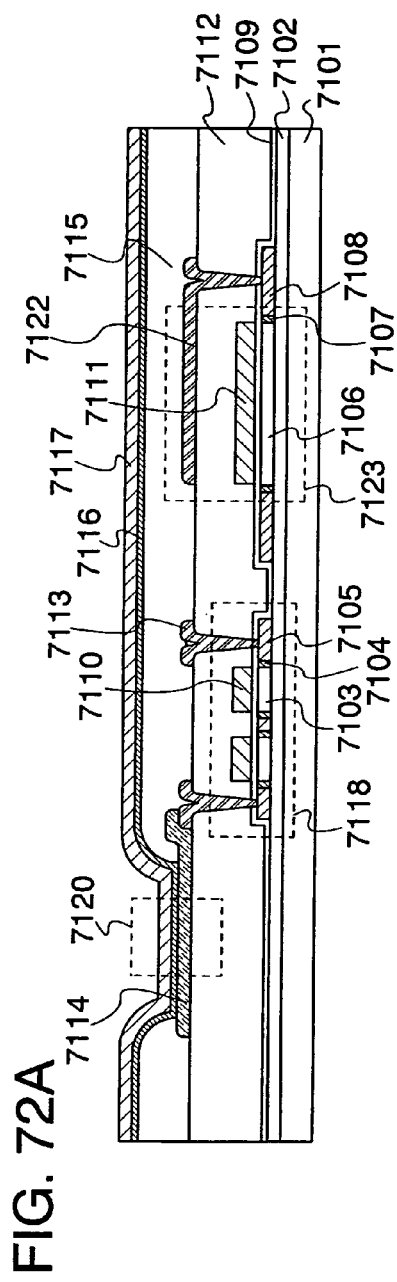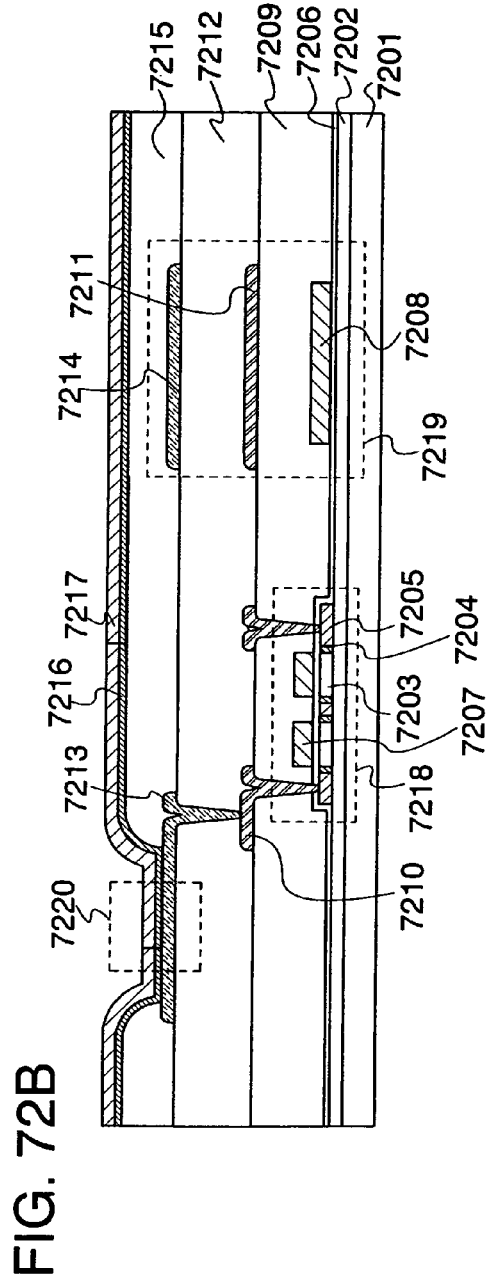
FIG. 72A
FIG. 72B

DISPLAY DEVICE AND DRIVING METHOD THEREOF

BACKGROUND OF THE INVENTION

1. Field of the Invention

The present invention relates to a structure of a display device having transistors. In particular, the invention relates to a structure of an active matrix display device having thin film transistors manufactured over an insulator such as glass or plastic. Further, the invention relates to an electronic device using such a display device as a display portion.

2. Description of the Related Art

In recent years, a so-called self-luminous display device having pixels each of which includes a light-emitting element such as a light-emitting diode (LED) has been drawing attention. As a light-emitting element used for such a self-luminous display device, an organic light-emitting diode (also called an OLED (Organic Light-Emitting Diode), an organic EL element, an electroluminescence (Electro Luminescence: EL) element, and the like) is drawing attention, which is becoming to be more frequently used for an EL display and the like. Since a light-emitting element such as an OLED is a self-luminous type, an EL display has advantages that visibility of pixels is higher, no backlight is required, the response speed is higher, and the like, compared with a liquid crystal display. The luminance of a light-emitting element is controlled with the amount of current flowing thereto.

In addition, in recent years, an active matrix display device having pixels each of which is provided with a light-emitting element and a transistor for controlling the light emission of the light-emitting element has been developed. An active matrix display device is expected to be put into practical use because it can realize high-resolution display on a large screen, which is difficult to be achieved with a passive matrix display device, and realize an operation with lower power consumption than that of a passive matrix display device, as well as having high reliability.

When driving methods of pixels of an active matrix display device are classified according to the kind of input signals, a voltage programming method and a current programming method can be given as examples. The former voltage programming method is a method of controlling the luminance of a light-emitting element with a driving element by inputting a video signal (voltage) which is to be delivered to a pixel to a gate electrode of the driving element. On the other hand, the latter current programming method is a method of controlling the luminance of a light-emitting element by flowing a programmed signal current into the light-emitting element.

An exemplary pixel configuration of a display device which employs a voltage programming method, and a driving method thereof will be described, with reference to FIG. 64. Note that description will be made by using an EL display device as a typical display device.

FIG. 64 is a diagram illustrating an exemplary pixel configuration of a display device which employs a voltage programming method (see Reference 1: Japanese Published Patent Application No. 2001-147659). A pixel shown in FIG. 64 includes a driving transistor 6401, a switching transistor 6402, a storage capacitor 6403, a signal line 6404, a scan line 6405, a first power supply line 6406, a second power supply line 6407, and a light-emitting element 6408.

Note that in this specification, the description that "a transistor is on" means a state that a gate-source voltage of a transistor is higher than the threshold voltage thereof, and thus a current flows between a source and a drain, while the description that "a transistor is off" means a state that a gate-source voltage of a transistor is less than or equal to the threshold voltage thereof, and thus no current flows between a source and a drain.

When the switching transistor 6402 is turned on in response to a potential change of the scan line 6405, a video signal which is input to the signal line 6404 is delivered to a gate of the driving transistor 6401. A gate-source voltage of the driving transistor 6401 is determined by a potential of the video signal input, and a current flowing between a source and a drain of the driving transistor 6401 is determined accordingly. This current is supplied to the light-emitting element 6408, and thus the light-emitting element 6408 emits light.

In this manner, the voltage programming method is a method of setting the gate-source voltage of the driving transistor 6401 with a potential of a video signal, and thus setting a current flowing between the source and the drain of the driving transistor 6401, so that the light-emitting element 6408 emits light at a luminance corresponding to the current.

As a semiconductor element for driving a light-emitting element, a polysilicon (p-Si) transistor is used. However, a polysilicon transistor can easily have variations in electrical properties such as the threshold voltage, on-current, and mobility, resulting from defects in crystal grain boundaries. Referring to the pixel shown in FIG. 64, when the properties of the driving transistor 6401 vary between each pixel, the drain current thereof also varies even when the same video signal is input. Accordingly, the luminance of the light-emitting element 6408 varies.

In addition, in the conventional pixel circuit (FIG. 64), a storage capacitor is connected between the gate and the source of the driving transistor. Given that this storage capacitor is formed from a MOS transistor, a channel region of the MOS transistor cannot be induced when a gate-source voltage of the MOS transistor becomes substantially equal to the threshold voltage thereof. Therefore, the MOS transitor cannot function as a storage capacitor. As a result, video signals cannot be accurately held therein.

In this manner, in the conventional voltage programming method, luminance of light-emitting elements varies due to variations in the electrical properties of transistors.

SUMMARY OF THE INVENTION

In view of the foregoing problems, it is an object of the invention to provide a display device and a driving method thereof, where variations in the threshold voltage of transistors can be compensated, and thus variations in luminance of light-emitting elements can be reduced.

One feature of the invention is a display device which includes a pixel having a light-emitting element, a first transistor, a second transistor, a storage capacitor, a power supply line, and a capacitive line. A gate terminal of the first transistor is connected to a first electrode of the storage capacitor; and a first terminal of the first transistor is connected to the power supply line. A second electrode of the storage capacitor is connected to the capacitive line. The first transistor has a function of supplying a current to the light-emitting element, while the second transistor has a function of a switch for setting the first transistor to a diode-connection state. The first transistor is set to a diode-connection state by turning on the second transistor, so that a voltage based on the threshold voltage of the first transistor is held in the storage capacitor.

One feature of the invention is a display device which includes a pixel having a light-emitting element, a first transistor, a second transistor, a storage capacitor, a first power supply line, a second power supply line, a scan line, and a capacitive line. A gate terminal of the first transistor is connected to a first terminal of the second transistor and a first electrode of the storage capacitor; a first terminal of the first transistor is connected to the first power supply line; and a second terminal of the first transistor is connected to a second terminal of the second transistor and a first electrode of the light-emitting element. A gate terminal of the second transistor is connected to the scan line; a second electrode of the storage capacitor is connected to the capacitive line; and a second electrode of the light-emitting element is connected to the second power supply line. The first transistor has a function of supplying a current to the light-emitting element, while the second transistor has a function of a switch for setting the first transistor to a diode-connection state. The first transistor is set to a diode-connection state by turning on the second transistor, so that a voltage based on the threshold voltage of the first transistor is held in the storage capacitor.

One feature of the invention is a display device which includes a pixel having a light-emitting element, a first transistor, a second transistor, a third transistor, a fourth transistor, a fifth transistor, a first storage capacitor, a second storage capacitor, a first power supply line, a second power supply line, a signal line, and a capacitive line. A gate terminal of the first transistor is connected to a first electrode of the first storage capacitor and a first electrode of the second storage capacitor; and a first terminal of the first transistor is connected to the first power supply line. A second electrode of the second storage capacitor is connected to the capacitive line; and a second electrode of the light-emitting element is connected to the second power supply line. The first transistor has a function of supplying a current to the light-emitting element; the second transistor has a function of a switch for connecting a second electrode of the first storage capacitor to the signal line; the third transistor has a function of a switch for connecting the second electrode of the first storage capacitor to the capacitive line; the fourth transistor has a function of a switch for setting the first transistor to a diode-connection state; and the fifth transistor has a function of a switch for controlling a supply of a current to the light-emitting element. The first transistor is set to a diode-connection state by turning on the fourth transistor, so that a voltage based on the threshold voltage of the first transistor is held in the first storage capacitor and the second storage capacitor.

One feature of the invention is a display device which includes a pixel having a light-emitting element, a first transistor, a second transistor, a third transistor, a fourth transistor, a fifth transistor, a first storage capacitor, a second storage capacitor, a first power supply line, a second power supply line, a first scan line, a second scan line, a third scan line, a fourth scan line, a signal line, and a capacitive line. A gate terminal of the first transistor is connected to a second terminal of the fourth transistor, a first electrode of the first storage capacitor, and a first electrode of the second storage capacitor; a first terminal of the first transistor is connected to the first power supply line; and a second terminal of the first transistor is connected to a first terminal of the fourth transistor and a first terminal of the fifth transistor. A gate terminal of the second transistor is connected to the first scan line; a first terminal of the second transistors is connected to a second electrode of the first storage capacitor, and a first terminal of the third transistor; and a second terminal of the second transistor is connected to the signal line. A gate terminal of the third transistor is connected to the second scan line; and a second terminal of the third transistor is connected to the capacitive line. A gate terminal of the fourth transistor is connected to the third scan line. A gate terminal of the fifth transistor is connected to the fourth scan line; and a second terminal of the fifth transistor is connected to a first electrode of the light-emitting element. A second electrode of the second storage capacitor is connected to the capacitive line; and a second electrode of the light-emitting element is connected to the second power supply line. The first transistor has a function of supplying a current to the light-emitting element; the second transistor has a function of a switch for connecting the second electrode of the first storage capacitor to the signal line; the third transistor has a function of a switch for connecting the second electrode of the first storage capacitor to the capacitive line; the fourth transistor has a function of a switch for setting the first transistor to a diode-connection state; and the fifth transistor has a function of a switch for controlling a supply of a current to the light-emitting element. The first transistor is set to a diode-connection state by turning on the fourth transistor, so that a voltage based on the threshold voltage of the first transistor is held in the first storage capacitor and the second storage capacitor.

One feature of the invention is a display device which includes a pixel having a light-emitting element, a first transistor, a second transistor, a third transistor, a fourth transistor, a first storage capacitor, a second storage capacitor, a first power supply line, a second power supply line, a signal line, and a capacitive line. A gate terminal of the first transistor is connected to a first electrode of the first storage capacitor and a second electrode of the second storage capacitor; a first terminal of the first transistor is connected to the first power supply line; and a second terminal of the first transistor is connected to a first electrode of the light-emitting element. A second electrode of the second storage capacitor is connected to the capacitive line; and a second electrode of the light-emitting element is connected to the second power supply line. The first transistor has a function of supplying a current to the light-emitting element; the second transistor has a function of a switch for connecting the second electrode of the first storage capacitor to the signal line; the third transistor has a function of a switch for connecting the second electrode of the first storage capacitor to the capacitive line; and the fourth transistor has a function of a switch for setting the first transistor to a diode-connection state. The first transistor is set to a diode-connection state by turning on the fourth transistor, so that a voltage based on the threshold voltage of the first transistor is held in the first storage capacitor and the second storage capacitor. A voltage applied to the second power supply line changes over time.

One feature of the invention is a display device which includes a pixel having a light-emitting element, a first transistor, a second transistor, a third transistor, a fourth transistor, a first storage capacitor, a second storage capacitor, a first power supply line, a second power supply line, a first scan line, a second scan line, a signal line, and a capacitive line. A gate terminal of the first transistor is connected to a second terminal of the fourth transistor, a first electrode of the first storage capacitor, and a first electrode of the second storage capacitor; a first terminal of the first transistor is connected to the first power supply line; and a second terminal of the first transistor is connected to a first terminal of the fourth transistor and a first electrode of the light-emitting element. A gate terminal of the second transistor is connected to the first scan line; a first terminal of the second transistor is connected to a second electrode of the first storage capacitor and a first terminal of the third transistor; and a second terminal of the second transistor is connected to the signal line. A gate terminal of the third transistor is connected to the second scan line; and a second terminal of the third transistor is connected to the capacitive line. A gate terminal of the fourth transistor is connected to the third scan line; a second electrode of the second storage capacitor is connected to the capacitive line;

and a second electrode of the light-emitting element is connected to the second power supply line. The first transistor has a function of supplying a current to the light-emitting element; the second transistor has a function of a switch for connecting the second electrode of the first storage capacitor to the signal line; the third transistor has a function of a switch for connecting the second electrode of the first storage capacitor to the capacitive line; and the fourth transistor has a function of a switch for setting the first transistor to a diode-connection state. The first transistor is set to a diode-connection state by turning on the fourth transistor, so that a voltage based on the threshold voltage of the first transistor is held in the first storage capacitor and the second storage capacitor. A voltage applied to the second power supply line changes over time.

Note that the display device in accordance with the invention may further include a sixth transistor, in which case the sixth transistor may have a function of a switch for applying an initial potential to the second terminal of the first transistor. In addition, the second terminal of the sixth transistor may be connected to a wire included in the pixel. Further, the display device may further include an initialization line so that the second terminal of the sixth transistor is connected to the initialization line and a potential which is applied to the initialization line as an initialization potential is applied to the second terminal of the first transistor.

In addition, a gate terminal of the sixth transistor may be connected to a fifth scan line; a first terminal of the sixth transistor may be connected to the second terminal of the first transistor, the first terminal of the fourth transistor, and the first terminal of the fifth transistor; and a second terminal of the sixth transistor may be connected to the second terminal of the second transistor, the first terminal of the third transistor, and the second electrode of the first storage capacitor.

Alternatively, a gate terminal of the sixth transistor may be connected to a fifth scan line; a first terminal of the sixth transistor may be connected to the gate terminal of the first transistor, the second terminal of the fourth transistor, the first electrode of the first storage capacitor, the first terminal of the fourth transistor, and the second electrode of the second storage capacitor; and a second terminal of the sixth transistor may be connected to the second terminal of the second transistor, the first terminal of the third transistor, and the second electrode of the first storage capacitor.

Alternatively, a gate terminal of the sixth transistor may be connected to a fifth scan line; a first terminal of the sixth transistor may be connected to the second terminal of the first transistor, the first terminal of the fourth transistor, and the first terminal of the fifth transistor; and a second terminal of the sixth transistor may be connected to the capacitive line.

Alternatively, a gate terminal of the sixth transistor may be connected to a fifth scan line; a first terminal of the sixth transistor may be connected to the second terminal of the first transistor, the first terminal of the fourth transistor, and the first terminal of the fifth transistor; and a second terminal of the sixth transistor may be connected to the second scan line or the third scan line.

Note that the display device in accordance with the invention may further include a reference line, and the reference line may be connected to the second terminal of the third transistor.

Note also that in the display device in accordance with the invention, the capacitive line may be replaced by another wire.

In the display device in accordance with the invention, the first transistor is formed to have the largest value of W/L (ratio of a channel width W to a channel length L) among all of the transistors.

In the display device in accordance with the invention, the third transistor and the fourth transistor may have the same conductivity type.

In the display device in accordance with the invention, the fourth transistor may be an n-channel transistor.

The display device in accordance with the invention may include a plurality of scan lines, and the gate electrodes of the respective transistors may be connected to different scan lines from each other. Alternatively, gate electrodes of at least two transistors among all of the transistors may be connected to the same scan line.

One feature of the invention is a driving method of a display device which includes a pixel having a light-emitting element, which includes the steps of: supplying a current to the light-emitting element to set a voltage between opposite electrodes of a storage capacitor at an initial voltage in a first period; turning on a second transistor to set a first transistor to a diode-connection state so that a voltage between the opposite electrodes of the storage capacitor is set at a voltage based on the threshold voltage of the first transistor in a second period; applying a video signal-voltage to a signal line so that a voltage between the opposite electrodes of the storage capacitor is set at a voltage based on the video signal voltage applied to the signal line and the threshold voltage of the first transistor in a third period; and applying a voltage held in the storage capacitor to a gate terminal of the first transistor to supply a current to the light-emitting element through the first transistor in a fourth period, so that the light-emitting element emits light in a fourth period.

One feature of the invention is a driving method of a display device which includes a pixel having a light-emitting element, which includes the steps of: supplying a current to the light-emitting element to set a voltage between opposite electrodes of a storage capacitor at an initial voltage in a first period; turning on a second transistor to set a first transistor to a diode-connection state so that a voltage between the opposite electrodes of the storage capacitor is set at a voltage based on the threshold voltage of the first transistor in a second period; applying a video signal voltage to a signal line so that a voltage between the opposite electrodes of the storage capacitor is set at a voltage based on the video signal voltage applied to the signal line and the threshold voltage of the first transistor in a third period; and applying a voltage held in the storage capacitor to a gate terminal of the first transistor to supply a current to the light-emitting element through the first transistor, so that the light-emitting element emits light in a fourth period.

One feature of the invention is a driving method of a display device which includes a pixel having a light-emitting element, which includes the steps of: turning on a third transistor to apply an initial potential to a second terminal of a first transistor in a first period; turning on a fourth transistor to set the first transistor to a diode-connection state so that voltages between opposite electrodes of first and second storage capacitors are set at a voltage based on the threshold voltage of the first transistor in a second period; applying a video signal voltage to a signal line so that voltages between the opposite electrodes of the first and second storage capacitors are set at a voltage based on the video signal voltage applied to the signal line and the threshold voltage of the first transistor in a third period; and applying voltages held in the first and second storage capacitors to a gate terminal of the first transistor to supply a current to the light-emitting element through the first transistor, so that the light-emitting element emits light in a fourth period.

One feature of the invention is a driving method of a display device which includes a pixel having a light-emitting element, which includes the steps of: turning on a third transistor to apply an initial potential to a second terminal of a first transistor in a first period; turning on a fourth transistor to set the first transistor to a diode-connection state so that voltages between opposite electrodes of first and second storage capacitors are set at a voltage based on the threshold voltage of the first transistor in a second period; applying a video signal voltage to a signal line so that voltages between the opposite electrodes of the first and second storage capacitors are set at a voltage based on the video signal voltage applied to the signal line and the threshold voltage of the first transistor in a third period; and applying voltages held in the first and second storage capacitors to a gate terminal of the first transistor to supply a current to the light-emitting element through the first transistor, so that the light-emitting element emits light in a fourth period.

Note that in the driving method of a display device in accordance with the invention, voltages applied to the second power supply line in the first and fourth periods may differ from voltages applied to the second power supply line in the second and third periods.

One feature of the invention is a driving method of a display device which includes a pixel having a light-emitting element, which includes the steps of: turning on a third transistor to apply an initial potential to a second terminal of a first transistor in a first period; turning on a fourth transistor to set the first transistor to a diode-connection state so that voltages between opposite electrodes of first and second storage capacitors are set at a voltage based on the threshold voltage of the first transistor in a second period; applying a video signal voltage to a signal line so that voltages between the opposite electrodes of the first and second storage capacitors are set at a voltage based on the video signal voltage applied to the signal line and the threshold voltage of the first transistor in a third period; and applying voltages held in the first and second storage capacitors to a gate terminal of the first transistor to supply a current to the light-emitting element through the first transistor, so that the light-emitting element emits light in a fourth period. In addition, voltages applied to the second power supply line in the first and fourth periods differ from voltages applied to the second power supply line in the second and third periods.

One feature of the invention is a driving method of a display device which includes a pixel having a light-emitting element, which includes the steps of: turning on a third transistor to apply an initial potential to a second terminal of a first transistor in a first period; turning on a second transistor to set the first transistor to a diode-connection state so that voltages between opposite electrodes of first and second storage capacitors are set at a voltage based on the threshold voltage of the first transistor in a second period; applying a video signal voltage to a signal line so that voltages between the opposite electrodes of the first and second storage capacitors are set at a voltage based on the video signal voltage applied to the signal line and the threshold voltage of the first transistor in a third period; and applying voltages held in the first and second storage capacitors to a gate terminal of the first transistor to supply a current to the light-emitting element through the first transistor, so that the light-emitting element emits light in a fourth period. In addition, voltages applied to the second power supply line in the first and fourth periods differ from voltages applied to the second power supply line in the second and third periods.

Note that in the driving method of a display device in accordance with the invention, the pixel may further include an initialization line, and the second terminal of the third transistor may be connected to the initialization line so that a potential which is applied to the initialization line as an initialization potential is applied to the second terminal of the first transistor in the first period.

Note also that it is difficult to distinguish a source and a drain of a transistor from each other due to its structure. Further, potential levels thereof may be switched depending on the operation of a circuit. Therefore, in this specification, a source and a drain are not specified, and described as a first terminal and a second terminal. For example, when a first terminal is a source, a second terminal refers to a drain, and vice versa, when a first terminal is a drain, a second terminal refers to a source.

In the invention, a pixel means one color element. Thus, in the case of a color display device having color elements of R (Red), G (Green), and B (Blue), a minimum unit of an image is composed of three pixels of an R pixel, a G pixel, and a B pixel. Note that the color elements are not limited to three colors, and color elements with more than three colors may be employed, or color elements with colors other than the RGB may be employed. For example, RGBW may be used by adding white (W) to RGB. In addition, one or more colors selected from among yellow, cyan, magenta, and the like may be added to RGB, for example.

Further, another color which is similar to at least one of R, G, and B may be added. For example, four color elements of R, G, B1, and B2 may be formed. Although B1 and B2 are both blue colors, they have different wavelengths from each other. By using such color elements, display can be performed with closer colors to the real image, as well as the power consumption can be reduced. Note that each color element may be controlled in brightness by using a plurality of regions. In such a case, one color element is used as one pixel, and each region whose brightness is controlled within the pixel is used as a subpixel. Accordingly, in the case of performing display using an area gray scale method, for example, one color element has a plurality of regions whose brightness is controlled, so that the whole regions are used for expressing gray scales. In this case, each region whose brightness is controlled corresponds to a subpixel. Accordingly, in such a case, one color element is composed of a plurality of subpixels. Further, there may be a case where each subpixel has a region with a different area dimension which contributes to display. In addition, viewing angles may be widened by supplying slightly different signals to a plurality of regions whose brightness is controlled in one color element, that is, a plurality of subpixels which constitute one color element.

In the invention, pixels may be provided (arranged) in matrix. Herein, the description that "pixels are provided (arranged) in matrix" includes a case where pixels are provided linearly or not linearly in the longitudinal direction or the lateral direction. For example, in the case of performing full color display with three color elements (e.g., RGB), there may be a case where dots of the three color elements are arranged in stripes or in delta pattern. Further, there may be a case where dots of the three color elements are provided in the Bayer arrangement.

Note that various types of transistors can be used as a transistor of the invention. Therefore, types of transistors which can be used are not limited to a certain type. For example, a thin film transistor (TFT) including a non-single crystalline semiconductor film typified by amorphous silicon or polycrystalline silicon can be used. Accordingly, various advantages can be provided that such transistors can be manufactured at a low temperature, can be manufactured at low cost, can be formed over a large substrate as well as a transparent substrate, and further, such transistors can transmit light. In addition, the transistors can be formed by using a semiconductor substrate or an SOI substrate. In addition, a MOS transistor, a junction transistor, a bipolar transistor, or the like can be used as a transistor in this specification. Accordingly, transistors with few variations, transistors with a high current supply capacity, and transistors with a small size can be manufactured, and thus a circuit with low power consumption can be constructed by using such transistors.

Further, a transistor including a compound semiconductor such as ZnO, a-InGaZnO, SiGe, or GaAs, or a thin film transistor obtained by thinning such a compound semiconductor can be employed. Accordingly, such transistors can be manufactured at a low temperature, can be manufactured at a room temperature, and can be formed directly over a low heat-resistant substrate such as a plastic substrate or a film substrate. In addition, a transistor or the like formed by ink-jet method or a printing method may also be employed. Accordingly, such transistors can be manufactured at a room temperature, can be manufactured at a low vacuum, and can be manufactured over a large substrate. In addition, since such transistors can be manufactured without using a mask (reticle), the layout of the transistors can be easily changed. A transistor including an organic semiconductor or a carbon nanotube, or other transistors can be used as well. Accordingly, the transistors can be formed over a substrate which can be bent.

Note that a non-single crystalline semiconductor film may contain hydrogen or halogen. In addition, various types of substrates can be used as a substrate over which transistors are formed without limiting to a certain type. Accordingly, transistors may be formed over, for example, a single crystalline substrate, an SOI substrate, a glass substrate, a quartz substrate, a plastic substrate, a paper substrate, a cellophane substrate, a stone substrate, a stainless steel substrate, a substrate made of a stainless steel foil, or the like. In addition, after forming transistors over a substrate, the transistors may be transposed to another substrate. By using such substrates, transistors with excellent properties and with low power consumption can be formed, and thus, a device with high durability and high heat resistance can be formed.

Note also that various types of elements can be used as a switch shown in this specification. An electrical switch, a mechanical switch, and the like are given as examples. That is, anything that can control a current flow can be used, and thus, various types of elements can be used without limiting to a certain element. For example, it may be a transistor, a diode (e.g., a PN junction diode, a PIN diode, a Schottky diode, a diode-connected transistor, or the like), a thyristor, or a logic circuit combining such elements. Therefore, in the case of using a transistor as a switch, the polarity (conductivity type) of the transistor is not particularly limited to a certain type since it operates just as a switch. However, when off-current is preferred to be small, a transistor of a polarity with small off-current is desirably employed. As a transistor with small off-current, there is a transistor provided with an LDD region, a transistor with a multi-gate structure, or the like.

In addition, it is desirable to employ an n-channel transistor when a potential of a source terminal of a transistor being operated as a switch is closer to the low-potential-side power supply (e.g., Vss, GND, 0 V, or the like), while a p-channel transistor is desirably employed when the potential of the source terminal is closer to the high-potential-side power supply (e.g., Vdd or the like). This helps the switch operate efficiently since the absolute value of the gate-source voltage of the transistor can be increased. A CMOS switch may also be used by using both n-channel and p-channel transistors. By employing a CMOS switch, the switch can efficiently operate as a switch since a current can flow therethrough when either one of the p-channel transistor or the n-channel transistor is turned on. For example, a voltage can be appropriately output regardless of whether a voltage of an input signal of the switch is high or low. Further, since a voltage amplitude of a signal for turning on or off the switch can be suppressed, power consumption can be reduced.

In the invention, the description that an object is formed "on" or formed "above" another object does not necessarily mean the object is in direct contact with another object. The description includes a case where two objects are not in direct contact with each other, that is, a case where another object is sandwiched therebetween. Accordingly, when it is described that a layer B is formed on (above) a layer A, it means either a case where the layer B is formed in direct contact with the layer A, or a case where another layer (e.g., a layer C, a layer D, or the like) is formed in direct contact with the layer A, and then the layer B is formed in direct contact with the layer C or D. In addition, the description that an object is formed "over" another object, it does not necessarily mean that the object is in direct contact with another object, and another object may be sandwiched therebetween. Accordingly, for example, when it is described that a layer B is formed over a layer A, it means either a case where the layer B is formed in direct contact with the layer A, or a case where another layer (e.g., a layer C, a layer D, or the like) is formed in direct contact with the layer A, and then the layer B is formed in direct contact with the layer C or D. Similarly, when it is described that an object is formed below or under another object, it means either a case where the objects are in direct contact with each other or a case where the objects are not in contact with each other.

The display device of the invention may be various modes or may include various display elements. For example, a display medium whose contrast changes by an electromagnetic action can be used, such as an EL element (e.g., an organic EL element, an inorganic EL element, or an EL element containing both organic and inorganic materials); an electron-emissive element; a liquid crystal element; electronic ink; a grating light valve (GLV); a plasma display (PDP); a digital micromirror device (DMD); a piezoelectric ceramic element; or a carbon nanotube. In addition, a display device using an EL element includes an EL display; a display device using an electron-emissive element includes a field emission display (FED), an SED-type flat panel display (SED: Surface-conduction Electron-emitter Display), or the like; a display device using a liquid crystal element includes a liquid crystal display, a transmissive liquid crystal display, a semi-transmissive liquid crystal display, and a reflective liquid crystal display; and a display device using electronic ink includes electronic paper.

Note that a light-emitting element in the invention means an element whose brightness can be controlled with the amount of current flowing into the element. Typically, an EL element can be used. In addition to an EL element, a light-emitting element such as an element used for a field emission display (FED), and SED (Surface-conduction Electron-emitter Display) which is one of the FEDs can be used.

In the invention, a connection means an electrical connection. Therefore, elements that enable an electrical connection (e.g., other elements, switches, and the like) may be added to a predetermined connection relation which is disclosed in the structure of the invention.

In the display device of the invention, a current which flows into a light-emitting element is determined independently of the threshold voltage of a transistor. Therefore, variations in the threshold voltage of transistors can be compensated, and thus variations in luminance of light-emitting elements can be reduced, which leads to improved image quality.

BRIEF DESCRIPTION OF THE DRAWINGS

In the accompanying drawings,

FIGS. 43A and 43B illustrate exemplary structures of the display device of the invention;

FIGS. 44A and 44B illustrate exemplary structures of the display device of the invention;

FIGS. 45A and 45B illustrate exemplary structures of the display device of the invention;

FIGS. 47A to 47D illustrate a manufacturing method of a transistor used in the display device of the invention;

FIGS. 48A to 48C illustrate a manufacturing method of a transistor used in the display device of the invention;

FIGS. 50A to 50D illustrate a manufacturing method of a transistor used in the display device of the invention;

FIGS. 51A to 51D illustrate a manufacturing method of a transistor used in the display device of the invention;

FIGS. 52A to 52B illustrate a manufacturing method of a transistor used in the display device of the invention;

FIGS. 67A and 67B illustrate exemplary structures of a display panel used for the display device of the invention;

FIGS. 71A and 71B illustrate exemplary structures of the display device of the invention;

FIGS. 72A and 72B illustrate exemplary structures of the display device of the invention.

DETAILED DESCRIPTION OF THE INVENTION

Although the invention will be fully described by way of embodiment modes with reference to the accompanying drawings, it is to be understood that various changes and modifications will be apparent to those skilled in the art. Therefore, unless such changes and modifications depart from the scope of the invention, they should be construed as being included therein. Thus, the invention is not limited to the description in the following embodiment modes.

Embodiment Mode 1

First, a basic configuration of a pixel circuit in the display device of the invention will be described with reference to FIG. 1. Note that description will be made by using an EL element as an exemplary light-emitting element.

Figure 1:
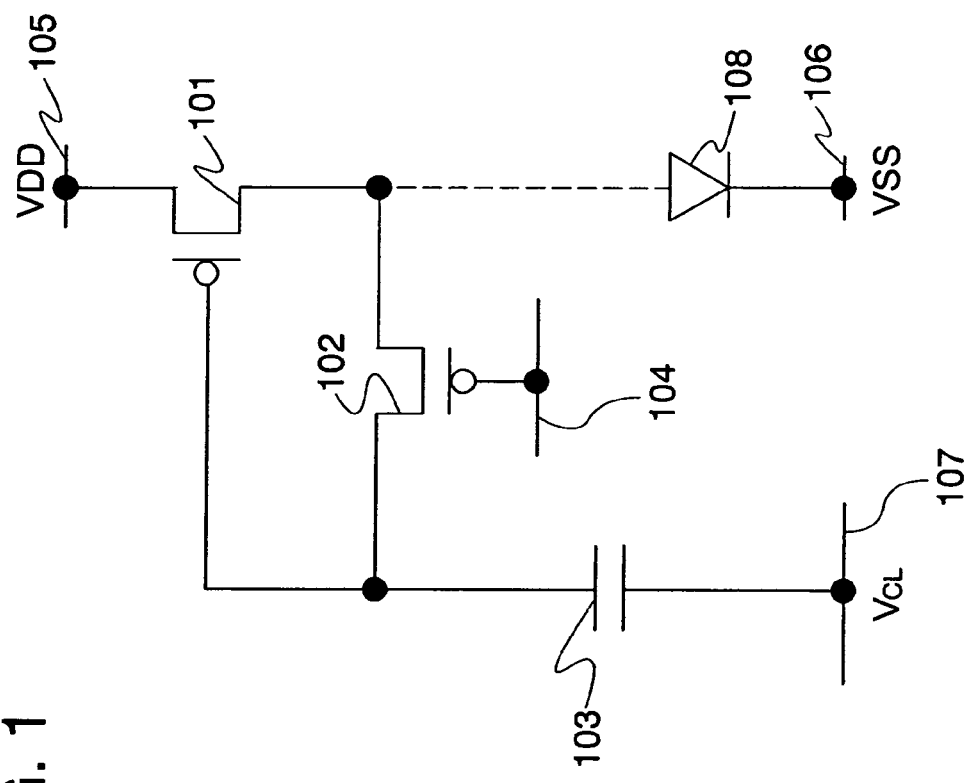
FIG. 1 illustrates an exemplary basic configuration of a pixel in the display device of the invention.

FIG. 1 is a diagram showing a minimum circuit configuration for acquiring the threshold voltage of a transistor in the pixel configurations of this embodiment mode. FIG. 1 includes a first transistor 101, a second transistor 102, a storage capacitor 103, a scan line 104, a first power supply line 105, a second power supply line 106, a capacitive line 107, and a light-emitting element 108.

Note that in FIG. 1, the first transistor 101 and the second transistor 102 are p-channel transistors.

A gate terminal of the first transistor 101 is connected to a second terminal of the second transistor 102 and a first electrode of the storage capacitor 103; a first terminal of the first transistor 101 is connected to the first power supply line 105; and a second terminal of the first transistor 101 is connected to a first terminal of the second transistor 102. A gate terminal of the second transistor 102 is connected to the scan line 104. A second electrode of the storage capacitor 103 is connected to the capacitive line 107. A second electrode of the light-emitting element 108 is connected to the second power supply line 106.

The first power supply line 105 is applied with a power supply potential VDD, the second power supply line 106 is applied with a power supply potential VSS, and the capacitive line 107 is applied with a potential $V_{CL}$. Note that the potential relationship is VDD>VSS and VDD>$V_{CL}$.

The first transistor 101 herein has a function of supplying a current to the light-emitting element 108. The second transistor 102 has a function of a switch for setting the first transistor 101 to a diode-connection state.

Note that in this specification, a "diode connection" means a state that a gate terminal of a transistor is connected to either a first or second terminal thereof.

In the pixel circuit shown in FIG. 1, the first transistor 101 is brought into a diode-connection state by turning on the second transistor 102, so that a current flows into the storage capacitor 103, and thus the storage capacitor 103 is charged. The charging of the storage capacitor 103 continues until a voltage held in the storage capacitor 103 reaches VDD−|$V_{th}$|−$V_{CL}$ (a potential obtained by subtracting the threshold voltage |$V_{th}$| of the first transistor 101 and the potential $V_{CL}$ of the capacitive line 107 from the power supply potential VDD). When the voltage held in the storage capacitor 103 reaches VDD−|$V_{th}$|−$V_{CL}$, the first transistor 101 is turned off, and a current stops flowing into the storage capacitor 103.

Through the aforementioned operation, a voltage based on the threshold voltage |$V_{th}$| of the first transistor 101 can be held in the storage capacitor 103.

Figure 2:
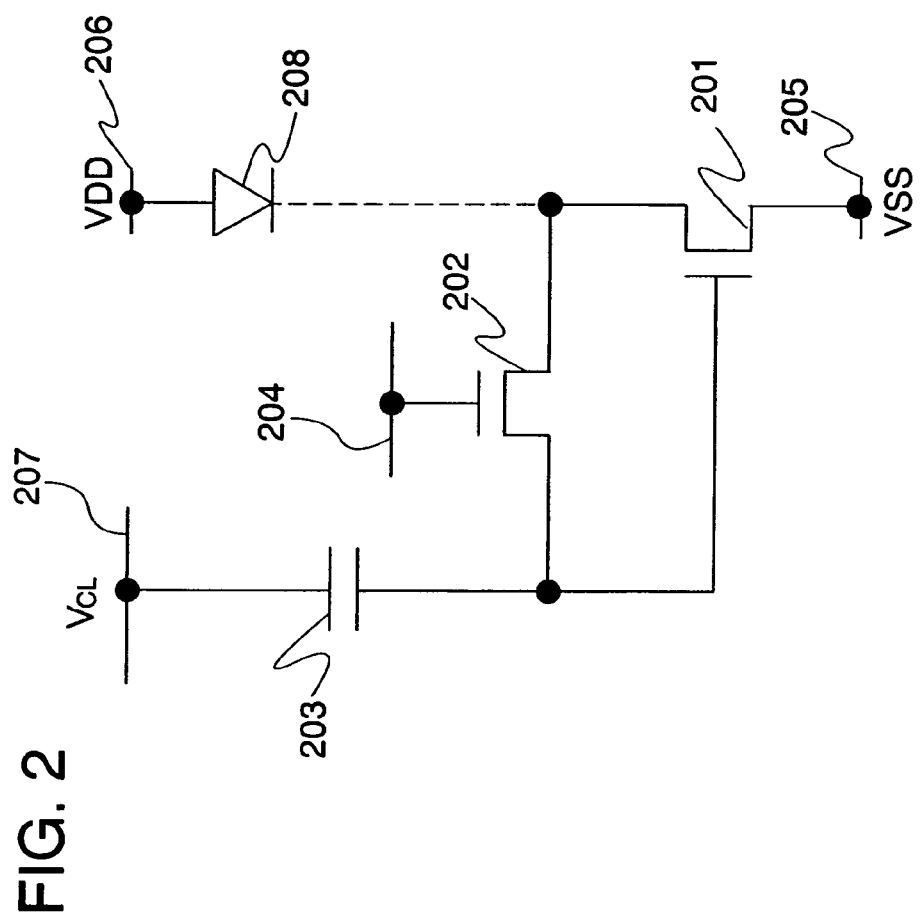
FIG. 2 illustrates an exemplary basic configuration of a pixel in the display device of the invention.

FIG. 2 shows a minimum circuit configuration for acquiring the threshold voltage of the first transistor, in the case where the first transistor is an n-channel transistor.

FIG. 2 includes a first transistor 201, a second transistor 202, a storage capacitor 203, a scan line 204, a first power supply line 205, a second power supply line 206, a capacitive line 207, and a light-emitting element 208.

Note that in FIG. 2, the second transistor 202 is an n-channel transistor.

The first power supply line 205 is applied with a power supply potential VSS, the second power supply line 206 is applied with a power supply potential VDD, and the capacitive line 207 is applied with a potential $V_{CL}$. Note that the potential relationship is VDD>VSS and $V_{CL}$>VSS.

In the pixel circuit shown in FIG. 2, the first transistor 201 is brought into a diode-connection state by turning on the second transistor 202, so that a current flows into the storage capacitor 203, and thus the storage capacitor 203 is charged. The charging of the storage capacitor 203 continues until a voltage held in the storage capacitor 203 reaches $V_{CL}$−VSS−|$V_{th}$| (a potential obtained by subtracting the power supply potential VSS and the threshold voltage |$V_{th}$| of the first transistor 201 from the potential $V_{CL}$ of the capacitive line 207). When the voltage held in the storage capacitor 203 has reached $V_{CL}$−VSS−|$V_{th}$|, the first transistor 201 is turned off, and a current stops flowing into the storage capacitor 203.

Through the aforementioned operation, a voltage based on the threshold voltage |$V_{th}$| of the first transistor 201 can be held in the storage capacitor 203.

Next, a pixel configuration of this embodiment which has the basic circuit configuration shown in FIG. 1 or FIG. 2 will be described, with reference to FIG. 3. Note that description will be made by using an EL element as an exemplary light-emitting element.

Figure 3:
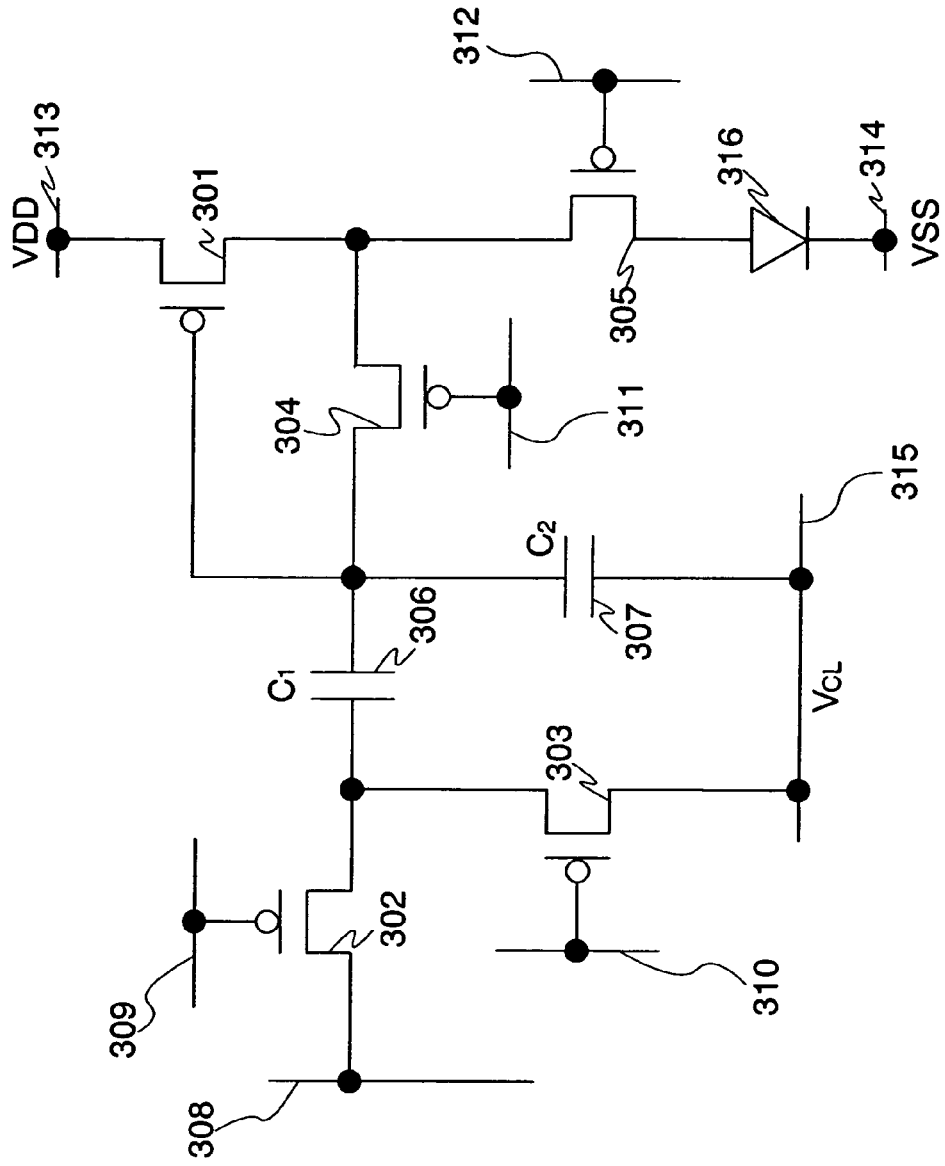
FIG. 3 illustrates an exemplary pixel configuration of the display device of the invention.

FIG. 3 is a diagram showing a pixel circuit of this embodiment mode. The pixel circuit of this embodiment mode includes a first transistor 301 to a fifth transistor 305, a first storage capacitor 306, a second storage capacitor 307, a signal line 308, a first scan line 309 to a fourth scan line 312, a first power supply line 313, a second power supply line 314, a capacitive line 315, and a light-emitting element 316.

The first transistor 301 herein is used as a transistor for supplying a current to the light-emitting element 316, while each of the second transistor 302 to the fifth transistor 305 is used as a switch for selecting a connection of wires.

A gate terminal of the first transistor 301 is connected to a second terminal of the fourth transistor 304, a first electrode of the storage capacitor 306, and a first electrode of the second capacitor 307; a first terminal of the first transistor 301 is connected to the first power supply line 313; and a second terminal of the first transistor 301 is connected to a first terminal of the fourth transistor 304 and a first terminal of the fifth transistor 305. A gate terminal of the second transistor 302 is connected to the first scan line 309; a first terminal of the second transistor 302 is connected to the signal line 308; and a second terminal of the second transistor 302 is connected to a first terminal of the third transistor 303 and a second electrode of the first storage capacitor 306. A gate terminal of the third transistor 303 is connected to the second scan line 310, and a second terminal of the third transistor 303 is connected to the capacitive line 315. A gate terminal of the fourth transistor 304 is connected to the third scan line 311. A gate terminal of the fifth transistor 305 is connected to the fourth scan line 312, and a second terminal of the fifth transistor 305 is connected to a first electrode of the light-emitting element 316. A second electrode of the second storage capacitor 307 is connected to the capacitive line 315. A second electrode of the light-emitting element 316 is connected to the second power supply line 314.

The first power supply line 313 is applied with a power supply potential VDD, the second power supply line 314 is applied with a power supply potential VSS, and the capacitive line 315 is applied with a potential $V_{CL}$. Note that the potential relationship is VDD>VSS and VDD>$V_{CL}$.

Note that in the pixel circuit shown in FIG. 3, all of the first transistor 301 to the fifth transistor 305 are p-channel transistors.

Note also that the fourth transistor 304 in FIG. 3 corresponds to the second transistor 102 in FIG. 1, and the second storage capacitor 307 in FIG. 3 corresponds to the storage capacitor 103 in FIG. 1.

Next, operation of the pixel circuit in this embodiment mode will be described with reference to FIG. 4 to FIG. 8.

Figure 4:
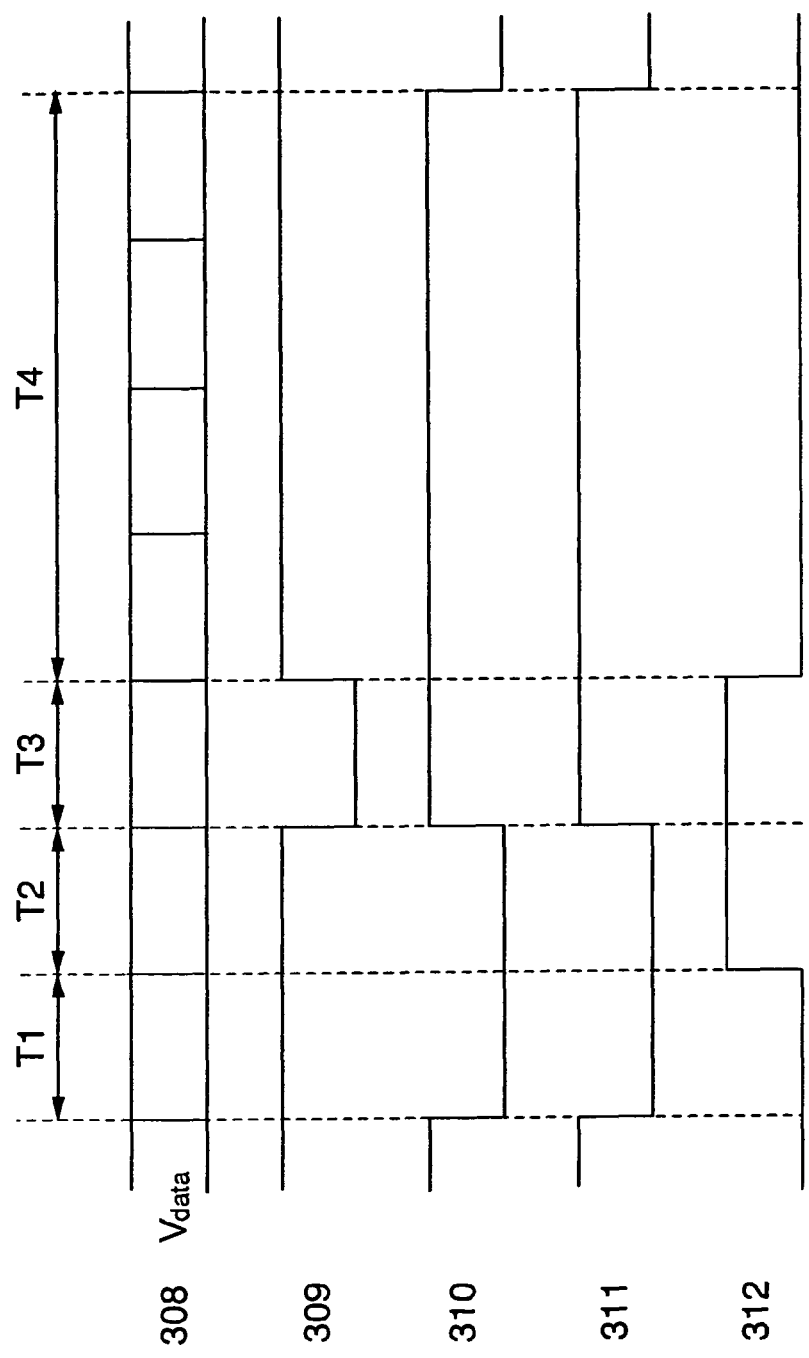
FIG. 4 illustrates the operation of a pixel circuit in the display device of the invention.

FIG. 4 shows a timing chart of video signal voltages and pulses that are input to the signal line 308 and the first scan line 309 to the fourth scan line 312. The whole period is divided into fourth periods including a first period T1 to a fourth period T4 in accordance with each operation of the pixel circuits shown in FIG. 5 to 8.

FIGS. 5 to 8 show connection states of the pixel circuit in this embodiment in each period. In FIGS. 5 to 8, portions shown by solid lines are electrically connected, while portions shown by dashed lines are not electrically connected.

Figure 5:
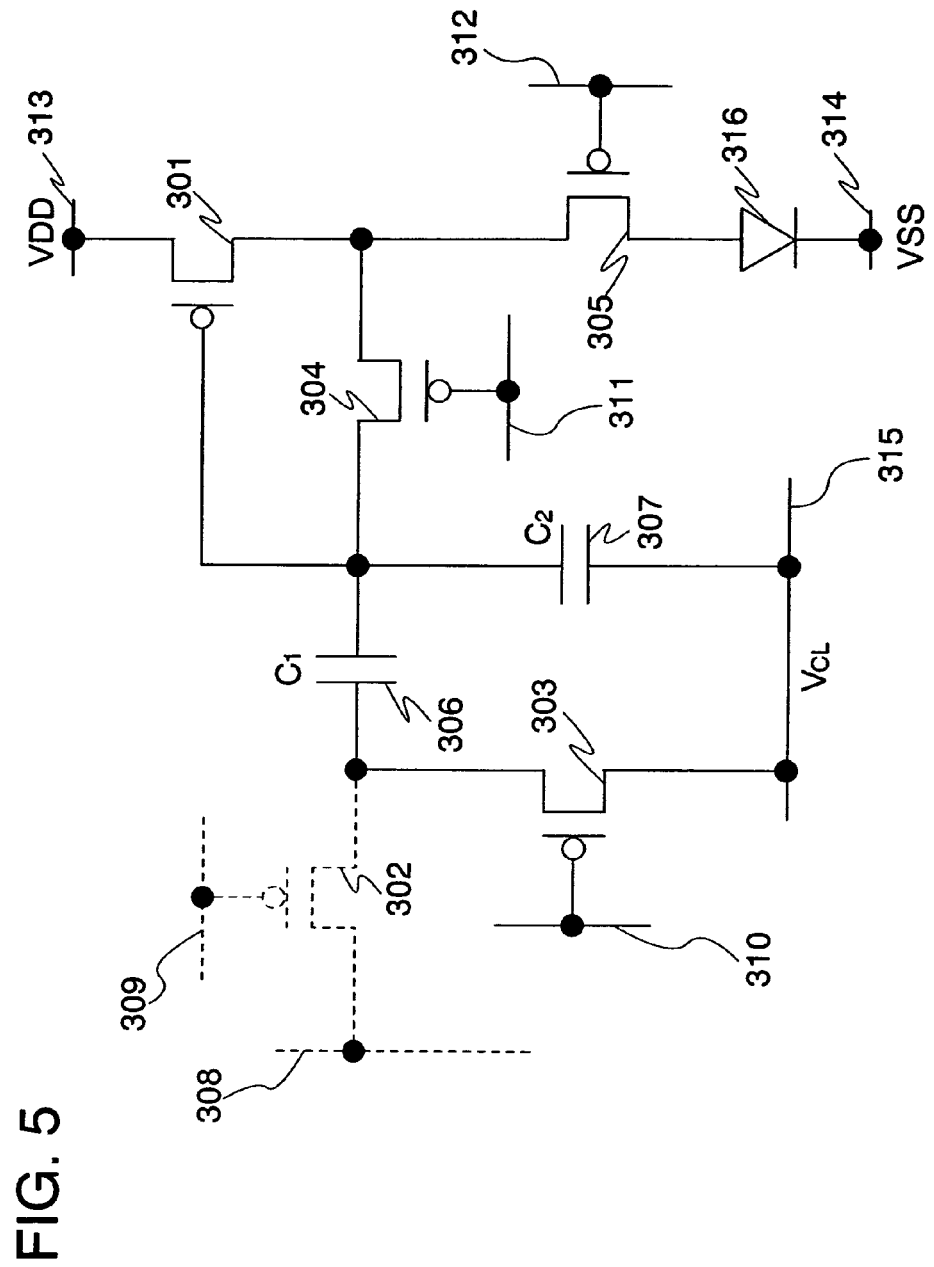
FIG. 5 illustrates the operation of a pixel circuit in the display device of the invention.

First, operation of the pixel circuit in the first period T1 will be described with reference to FIG. 5. FIG. 5 is a diagram showing a connection state of the pixel circuit in the first period T1. In the first period T1, the second scan line 310 to the fourth scan line 312 are at L level, and the third transistor 303 to the fifth transistor 305 are on. Meanwhile, the first scan line 309 is at H level and the second transistor 302 is off. Accordingly, the first transistor 301 has a diode-connection state, and thus a current flows into the light-emitting element 316. As a result, potentials of the second terminal of the first transistor 301, the first electrode of the first storage capacitor 306, and the first electrode of the second storage capacitor 307 drop, thereby an initialization voltage is held in the first storage capacitor 306 and the second storage capacitor 307.

Through the aforementioned operation, an initialization voltage is held in the first storage capacitor 306 and the second storage capacitor 307 in the first period T1. In this specification, this operation is called initialization.

Figure 6:
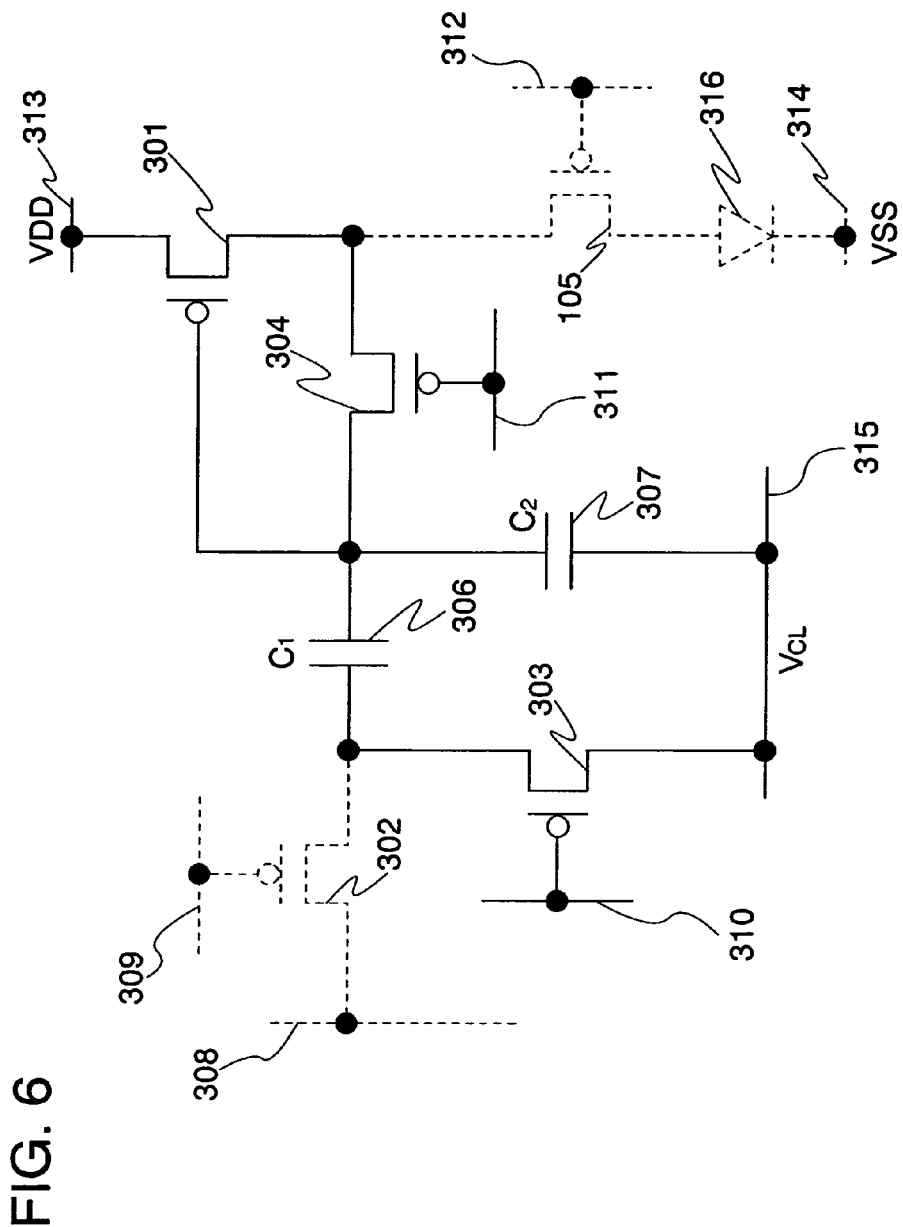
FIG. 6 illustrates the operation of a pixel circuit in the display device of the invention.

Next, operation of the pixel circuit in the second period T2 will be described with reference to FIG. 6. FIG. 6 is a diagram showing a connection state of the pixel circuit in the second period T2. In the second period T2, the second scan line 310 and the third scan line 311 are at L level, and the third transistor 303 and the fourth transistor 304 are on. Meanwhile, the first scan line 309 and the fourth scan line 312 are at H level, and the second transistor 302 and the fifth transistor 305 are off. Accordingly, the first transistor 301 has a diode-connection state, so that a current flows into the first storage capacitor 306 and the second storage capacitor 307 which are connected in parallel, and thus the first storage capacitor 306 and the second storage capacitor 307 are charged. The charging of the first storage capacitor 306 and the second storage capacitor 307 continues until a voltage held in the first storage capacitor 306 and the second storage capacitor 307 reaches VDD−|$V_{th}$|−$V_{CL}$ (a potential obtained by subtracting the threshold voltage |$V_{th}$| of the first transistor 301 and the potential $V_{CL}$ of the capacitive line 315 from the power supply potential VDD). When the voltage held in the first storage capacitor 306 and the second storage capacitor 307 reaches VDD−|$V_{th}$|−$V_{CL}$, the first transistor 301 is turned off, and a current stops flowing into the first storage capacitor 306 and the second storage capacitor 307.

Through the aforementioned operation, a voltage based on the threshold voltage |$V_{th}$| of the first transistor 301 is held in the first storage capacitor 306 and the second storage capacitor 307 in the second period T2.

Note that in order to hold a voltage based on the threshold voltage |$V_{th}$| of the first transistor 301 in the first storage capacitor 306 and the second storage capacitor 307 in the second period T2, the second terminal of the first transistor 301 is required to be set at a potential lower than VDD−|$V_{th}$| (the difference between the power supply potential VDD and the threshold voltage |$V_{th}$| of the first transistor 301). Accordingly, by flowing a current into the light-emitting element 316 in the first period T1, the second terminal of the first transistor 301 can be surely set at a potential lower than VDD−|$V_{th}$|, and thus the threshold voltage can be surely acquired.

Figure 7:
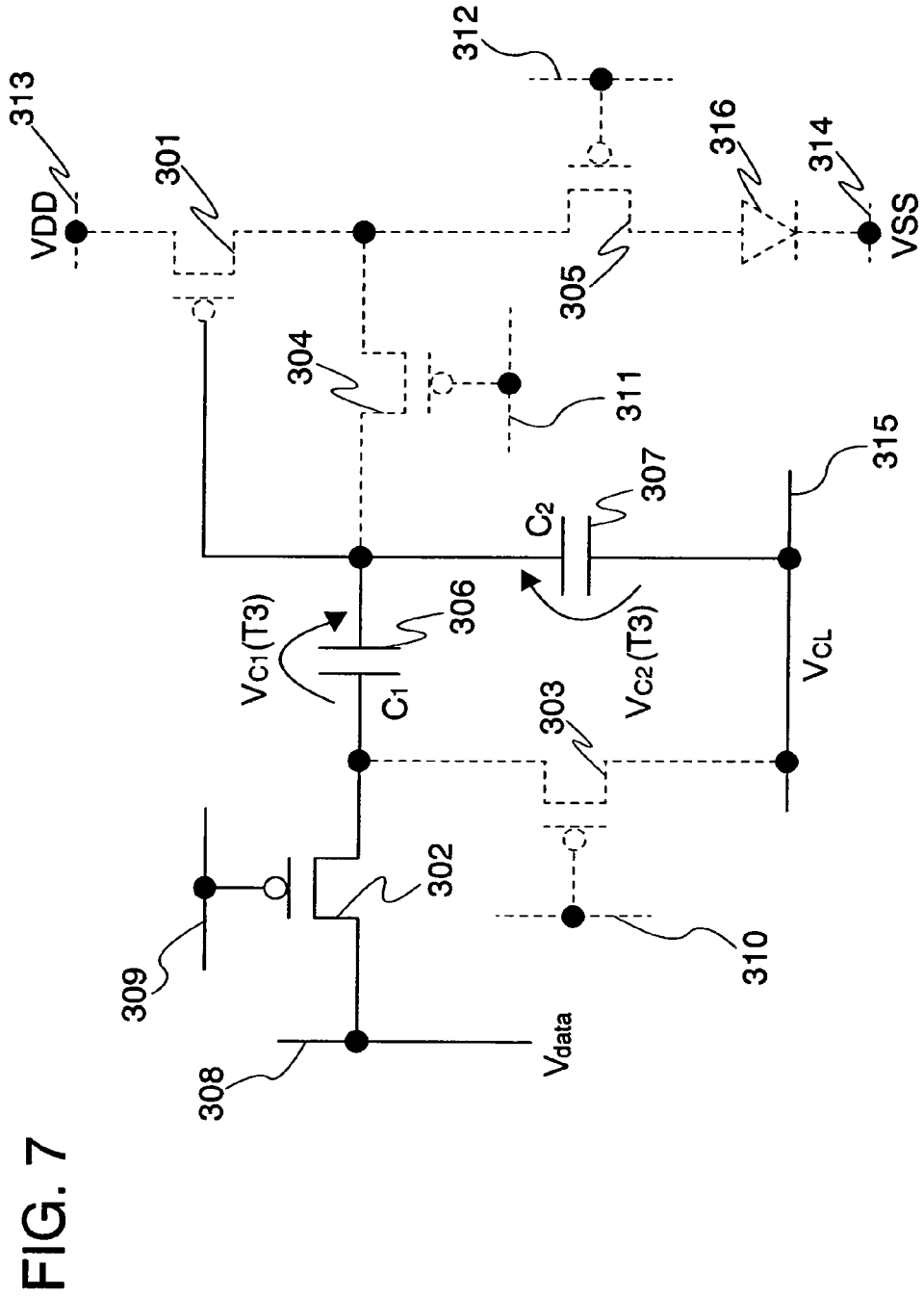
FIG. 7 illustrates the operation of a pixel circuit in the display device of the invention.

Next, operation of the pixel circuit in the third period T3 will be described with reference to FIG. 7. FIG. 7 is a diagram showing a connection state of the pixel circuit in the third period T3. In the third period T3, the first scan line 309 is at L level and the second transistor 302 is on. Meanwhile, the second scan line 310 to the fourth scan line 312 are at H level and the third transistor 303 to the fifth transistor 305 are off. The signal line 308 is applied with a video signal voltage $V_{data}$. Accordingly, the first storage capacitor 306 and the second storage capacitor 307 are connected in series, and thus voltages are held in the first storage capacitor 306 and the second storage capacitor 307 in accordance with their capacitance ratio. At this time, given that the voltages held in the first storage capacitor 306 and the second storage capacitor 307 are $V_{C1}(T3)$ and $V_{C2}(T3)$ respectively, $V_{C1}(T3)$ and $V_{C2}(T3)$ can be represented by the following formulas (1) and (2) respectively.

$$V_{C1}(T3) = VDD - |V_{th}| - \frac{C_2}{C_1 + C_2} V_{data} - \frac{C_1}{C_1 + C_2} V_{CL} \quad \text{formula (1)}$$

$$V_{C2}(T3) = VDD - |V_{th}| + \frac{C_1}{C_1+C_2}V_{data} - \frac{2C_1+C_2}{C_1+C_2}V_{CL} \quad \text{formula (2)}$$

Note that $C_1$ is a capacitance value of the first storage capacitor 306, while $C_2$ is a capacitance value of the second storage capacitor 307.

Through the aforementioned operation, a voltage based on the video signal voltage $V_{data}$ and the threshold voltage $|V_{th}|$ of the first transistor 301 is held in the first storage capacitor 306 and the second storage capacitor 307 in the third period T3.

Figure 8:
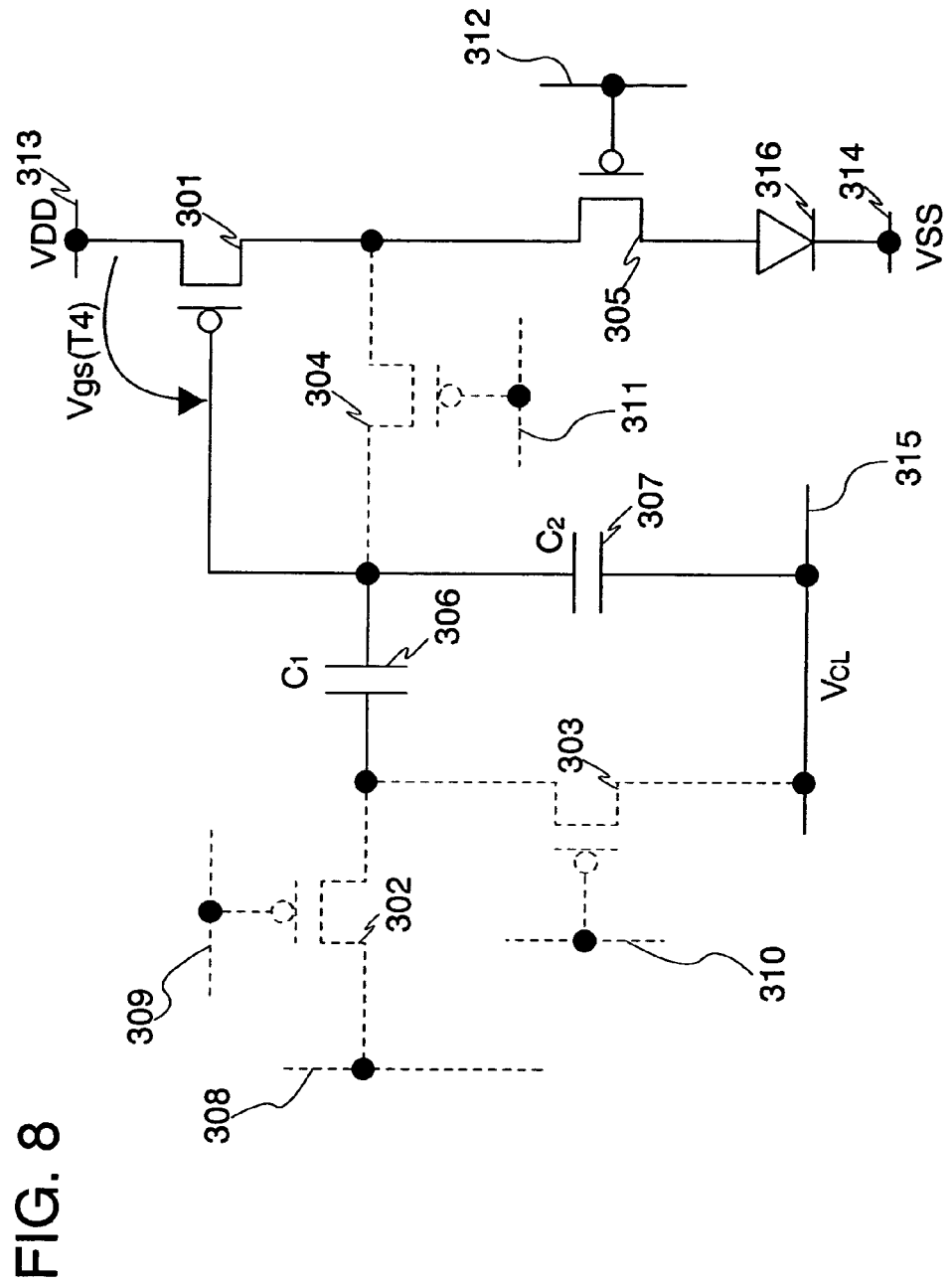
FIG. 8 illustrates the operation of a pixel circuit in the display device of the invention.

Next, operation of the pixel circuit in the fourth period T4 will be described with reference to FIG. 8. FIG. 8 is a diagram showing a connection state of the pixel circuit in the fourth period T4. In the fourth period T4, the fourth scan line 312 is at L level and the fifth transistor 305 is on. Meanwhile, the first scan line 309 to the third scan line 311 are at H level and the second transistor 302 to the fourth transistor 304 are off. Accordingly, the gate terminal of the first transistor 301 is applied with $V_{C2}(T3)+V_{CL}$ (a sum of the voltage $V_{C2}(T3)$ held in the second storage capacitor 307 and the potential $V_{CL}$ of the capacitive line 315). Thus, given that the gate-source voltage of the first transistor 301 in the fourth period T4 is $V_{gs}(T4)$, $V_{gs}(T4)$ can be represented by the following formula (3).

$$|V_{gs}(T4)| = \quad \text{formula (3)}$$
$$VDD - V_{C2}(T3) - V_{CL} = |V_{th}| - \frac{C_1}{C_1+C_2}(V_{data} - V_{CL})$$

Accordingly, a current $I_{OLED}$ which flows between the drain and the source of the first transistor 301 can be represented by the following formula (4), and this current flows into the light-emitting element 316 through the fifth transistor 305, so that the light-emitting element 316 emits light.

$$I_{OLED} = \frac{\beta}{2}(|V_{gs}(T4)| - |V_{th}|)^2 = \frac{\beta}{2}\left(\frac{C_1}{C_1+C_2}\right)^2 (V_{data} - V_{CL})^2 \quad \text{formula (4)}$$

Note that $\beta$ is a constant that is determined by the mobility or size of a transistor, capacitance of an oxide film, and the like.

Through the aforementioned operation, the current $I_{OLED}$ which is dependent on the video signal voltage $V_{data}$ flows into the light-emitting element 316 in the fourth period T4, so that the light-emitting element 316 emits light.

Now, functions of the first transistor 301 to the fifth transistor 305 are described in detail, in the operation process of the pixel circuit shown in FIG. 3.

The first transistor 301 has a function of supplying a current to the light-emitting element 316 in the third period T4.

The second transistor 302 functions as a switch for connecting the second electrode of the first storage capacitor 306 to the signal line 308 in order to input a video signal voltage $V_{data}$ into the pixel in the third period T3.

The third transistor 303 functions as a switch for connecting the second electrode of the first storage capacitor 306 to the capacitive line 315 in order to hold a voltage based on the threshold voltage $|V_{th}|$ of the first transistor 301 in the first storage capacitor 306 in the second period T2.

The fourth transistor 304 functions as a switch for setting the first transistor 301 to a diode-connection state in order to hold a voltage based on the threshold voltage $|V_{th}|$ of the first transistor 301 in the first storage capacitor 306 and the second storage capacitor 307 in the second period T2.

The fifth transistor 305 functions as a switch for controlling a current not to flow into the light-emitting element 316 in the second period T2 and the third period T3, and controlling a current to flow into the light-emitting element 316 in the first period T1 and the fourth period T4. That is, the fifth transistor 305 functions as a switch for controlling a current supply to the light-emitting element 316.

Through the aforementioned operation process, the current $I_{OLED}$ is supplied to the light-emitting element 316 so that the light-emitting element 316 can emit light at a luminance corresponding to the current $I_{OLED}$. At this time, the current $I_{OLED}$ which flows into the light-emitting element 316 is independent of the threshold voltage $|V_{th}|$ of the first transistor 301 as can be seen in formula (4). Therefore, variations in the threshold voltage of the transistor can be compensated.

Note that the video signal voltage $V_{data}$ is set lower than or equal to the potential $V_{CL}$ of the capacitive line 315 in order to turn on the first transistor 301 in the fourth period T4.

Note also that the potential $V_{CL}$ of the capacitive line 315 has only to be lower than $VDD-|V_{th}|$ (the difference between the power supply line VDD and the threshold voltage $|V_{th}|$ of the first transistor 301). Note also that the voltage $V_{CL}$ of the capacitive line 315 is desirably as low as possible in order that a voltage based on the threshold voltage $|V_{th}|$ of the first transistor 301, the video signal voltage $V_{data}$, and the like can be surely held in the first storage capacitor 306 and the second storage capacitor 307. However, since the video signal voltage $V_{data}$ is set lower than or equal to the potential $V_{CL}$ of the capacitive line 315, given that the potential $V_{CL}$ of the capacitive line 315 is set too low, the video signal voltage $V_{data}$ is required to be further decreased. Accordingly, it is more desirable to set the potential $V_{CL}$ of the capacitive line 315 within an optimal range. For example, the range of the potential $V_{CL}$ of the capacitive line 315 may be set such that $-(VDD+VSS)/2 \leq V_{CL} \leq (VDD+VSS)/2$.

Figure 9:
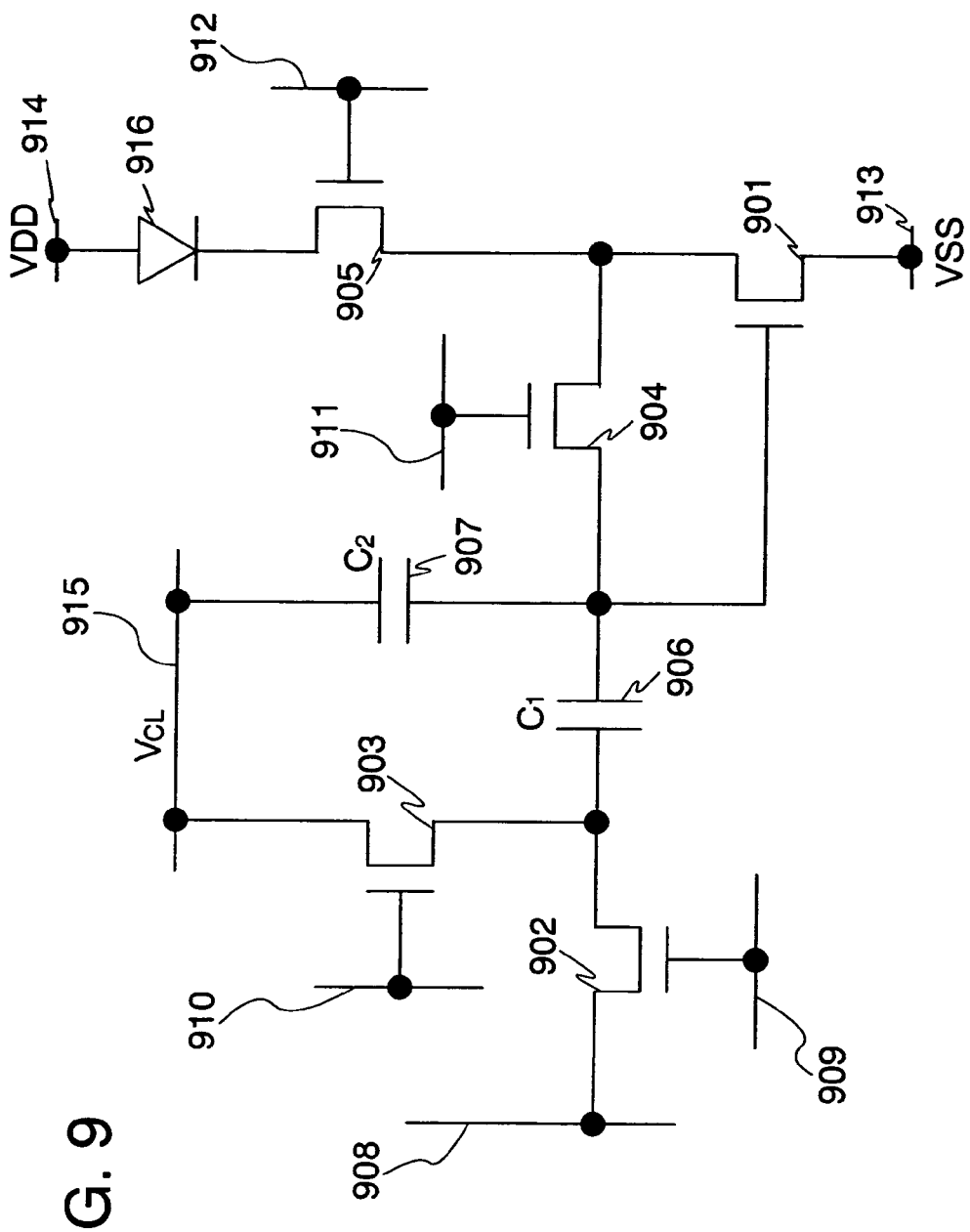
FIG. 9 illustrates an exemplary pixel configuration of the display device of the invention.

Although the first transistor 301 in the pixel circuit shown in FIG. 3 is a p-channel transistor, the first transistor 301 may be an n-channel transistor. FIG. 9 shows a pixel configuration in the case where the first transistor is an n-channel transistor.

The pixel circuit in FIG. 9 includes a first transistor 901 to a fifth transistor 905, a first storage capacitor 906, a second storage capacitor 907, a signal line 908, a first scan line 909 to a fourth scan line 912, a first power supply line 913, a second power supply line 914, a capacitive line 915, and a light-emitting element 916.

Note that in the pixel circuit in FIG. 9, all of the second transistor 902 to the fifth transistor 905 are n-channel transistors.

The first transistor 901 herein is used as a transistor for supplying a current to the light-emitting element 916, while each of the second transistor 902 to the fifth transistor 905 is used as a switch for selecting a connection of wires.

A gate terminal of the first transistor 901 is connected to a second terminal of the fourth transistor 904, a first electrode of the first storage capacitor 906, and a first electrode of the second storage capacitor 907; a first terminal of the first transistor 901 is connected to the first power supply line 913; and a second terminal of the first transistor 901 is connected to a first terminal of the fourth transistor 904 and a first terminal of the fifth transistor 905. A gate terminal of the second transistor 902 is connected to the first scan line 909; a first terminal of the second transistor 902 is connected to the signal line 908; and a second terminal of the second transistor 902 is connected to a first terminal of the third transistor 903 and a second electrode of the storage capacitor 906. A gate terminal of the third transistor 903 is connected to the second scan line 910, and a second terminal of the third transistor 903 is connected to the capacitive line 915. A gate terminal of the fourth transistor 904 is connected to the third scan line 911. A gate terminal of the fifth transistor 905 is connected to the fourth scan line 912, and a second terminal of the fifth transistor 905 is connected to a second electrode of the light-emitting element 916. A second electrode of the second storage capacitor 907 is connected to the capacitive line 915. A first electrode of the light-emitting element 916 is connected to the second power supply line 914.

The first power supply line 913 is applied with a power supply potential VSS, the second power supply line 914 is applied with a power supply potential VDD, and the capacitive line 915 is applied with a potential $V_{CL}$. Note that the potential relationship is VDD>VSS and $V_{CL}$>VSS.

Note that the fourth transistor 904 in FIG. 9 corresponds to the second transistor 202 in FIG. 2, and the second storage capacitor 907 in FIG. 9 corresponds to the storage capacitor 203 in FIG. 2.

Next, operation of the pixel circuit in this embodiment mode will be described with reference to FIG. 10.

Figure 10:
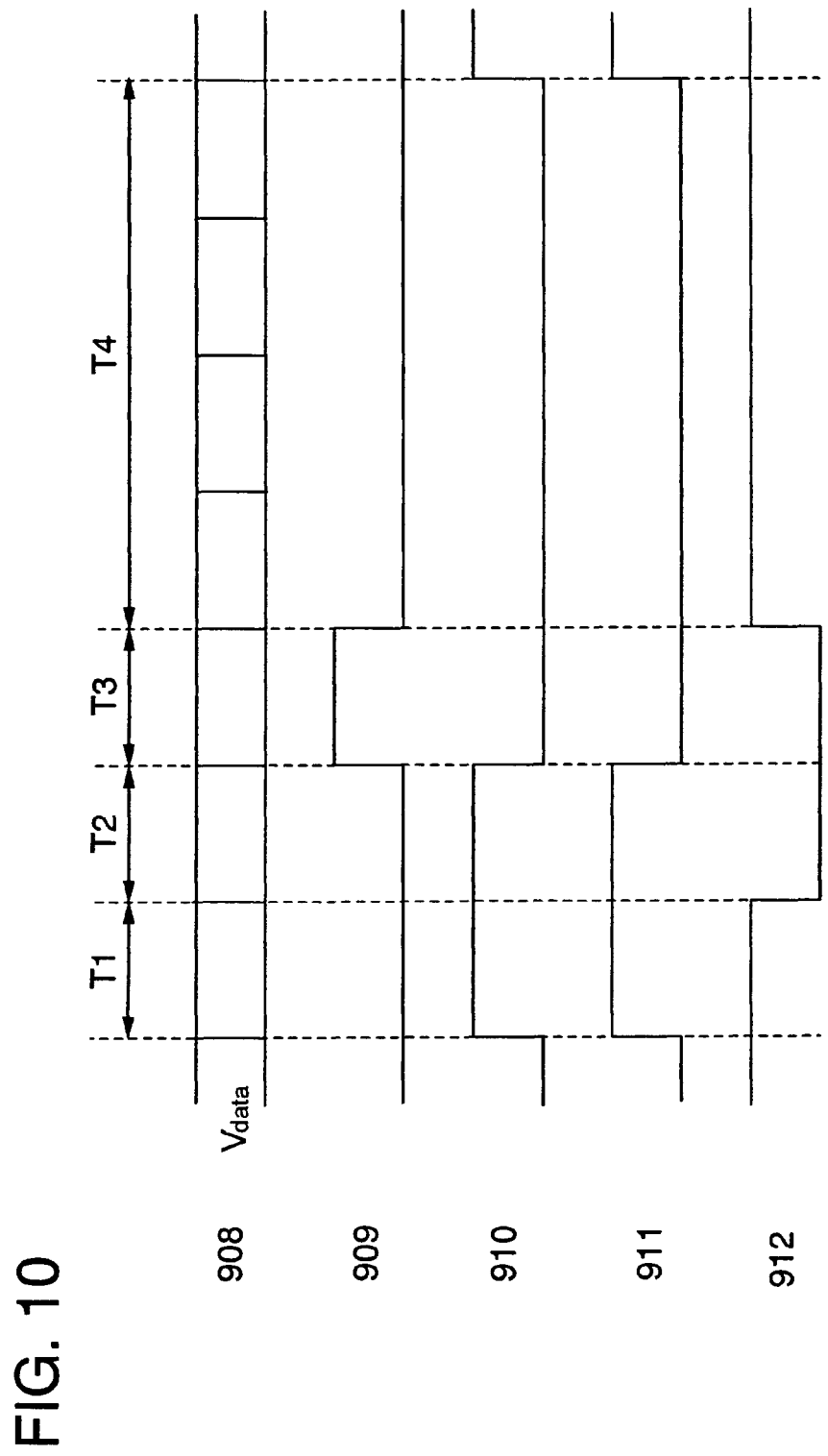
FIG. 10 illustrates the operation of a pixel circuit in the display device of the invention.

FIG. 10 shows a timing chart of video signal voltages and pulses that are input to the first scan line 909 to the fourth scan line 912. Since all of the first to fifth transistors are n-channel transistors, the input timing of pulses (H level/L level) into the first scan line 909 to the fourth scan line 912 is inverted from the one in the case where all of the transistors are p-channel transistors (FIG. 4). In addition, the whole period is divided into fourth periods including a first period T1 to a fourth period T4 in accordance with each operation of the pixel circuit.

The operation of the pixel circuit in FIG. 9 in the first period T1 to the fourth period T4 is the same as the operation of the pixel circuit shown in FIG. 3. That is, an initial voltage is held in the first storage capacitor 906 and the second storage capacitor 907 in the first period T1. That is, initialization is performed. Next, in the second period T2, a voltage based on the threshold voltage $|V_{th}|$ of the first transistor 901 is held in the first storage capacitor 906 and the second storage capacitor 907. Then, in the third period, a voltage based on the video signal voltage $V_{data}$ and the threshold voltage $|V_{th}|$ of the first transistor 901 is held in the first storage capacitor 906 and the second storage capacitor 907. Finally, in the fourth period T4, a current $I_{OLED}$ which is dependent on the video signal voltage $V_{data}$ flows into the light-emitting element 916, so that the light-emitting element 916 emits light. Note that the current $I_{OLED}$ which flows into the light-emitting element 916 can be represented by formula (4) like the pixel circuit in FIG. 3.

Note also that in order to hold a voltage based on the threshold voltage $|V_{th}|$ of the first transistor 901 in the first storage capacitor 906 and the second storage capacitor 907 in the second period T2, the second terminal of the first transistor 901 is required to be set at a potential higher than VSS+$|V_{th}|$ (the sum of the power supply potential VSS and the threshold voltage $|V_{th}|$ of the first transistor 901) in advance. Accordingly, the second terminal of the first transistor 901 can be surely set at a potential higher than VSS+$|V_{th}|$ by flowing a current into the light-emitting element 916 in the first period T1, and thus the threshold voltage can be surely acquired and compensated.

Note also that in the operation process of the pixel circuit shown in FIG. 9, functions of the first transistor 901 to the fifth transistor 905 are the same as the functions of the first transistor 301 to the fifth transistor 305 in the pixel circuit shown in FIG. 3.

Through the aforementioned operation process, the current $I_{OLED}$ is supplied to the light-emitting element 916 so that the light-emitting element 916 can emit light at a luminance corresponding to the current $I_{OLED}$. At this time, the current $I_{OLED}$ which flows into the light-emitting element 916 is independent of the threshold voltage $|V_{th}|$ of the first transistor 901 as can be seen in formula (4). Therefore, variations in the threshold voltage of the transistor can be compensated.

Note that the video signal voltage $V_{data}$ is set higher than or equal to the potential $V_{CL}$ of the capacitive line 915 in order to turn on the first transistor 901 in the fourth period T4.

Note also that the potential $V_{CL}$ of the capacitive line 915 has only to be higher than VSS+$|V_{th}|$ (the sum of the power supply potential VSS and the threshold voltage $|V_{th}|$ of the first transistor 901). Note also that the voltage $V_{CL}$ of the capacitive line 915 is desirably as high as possible in order that a voltage based on the threshold voltage $|V_{th}|$ of the first transistor 901, the video signal voltage $V_{data}$, and the like can be surely held in the first storage capacitor 906 and the second storage capacitor 907. However, since the video signal voltage $V_{data}$ is set higher than or equal to the potential $V_{CL}$ of the capacitive line 915, given that the potential $V_{CL}$ of the capacitive line 315 is set too high, the video signal voltage $V_{data}$ is required to be further increased. Accordingly, it is more desirable to set the potential $V_{CL}$ of the capacitive line 915 within an optimal range. For example, the range of the potential $V_{CL}$ of the capacitive line 915 may be set such that (VDD+VSS)/2≤$V_{CL}$≤3×(VDD+VSS)/2.

As described above, the pixel configuration in this embodiment mode can compensate variations in the threshold voltage of transistors, thereby variations in luminance of light-emitting elements can be reduced. Therefore, image quality can be improved.

In addition, in the pixel circuit in this embodiment mode, the current $l_{OLED}$ which flows into the light-emitting element depends on the capacitance ratio of the first storage capacitor to the second storage capacitor as represented by formula (4). Therefore, the $I_{OLED}$ is constant as long as the capacitance ratio is constant. The first storage capacitor and the second storage capacitor are typically formed through the same process. Therefore, even if mask patterns are misaligned in the manufacturing process, errors in capacitance between the first storage capacitor and the second storage capacitor can be substantially an equal amount. Thus, even when a manufacturing error occurs, the value of $[C_1/(C_1+C_2)]$ can be maintained at a substantially constant value, and accordingly, $I_{OLED}$ can be maintained at a substantially constant value.

When many pixels emit light at the same time, the level of the power supply potential VDD which is applied to the power supply line varies between pixels in different positions, due to effects of a voltage drop at the power supply line to which the power supply potential VDD is applied. However, in the pixel circuit in this embodiment mode, the current $I_{OLED}$ which flows into the light-emitting element is independent of the power supply potential VDD as can be seen in formula (4). Therefore, effects of variations in the power supply potential VDD due to a voltage drop at the power supply line can be eliminated.

Note that in this embodiment mode, each of the first storage capacitor and the second storage capacitor may be formed from either metal or a MOS transistor.

Figure 11:
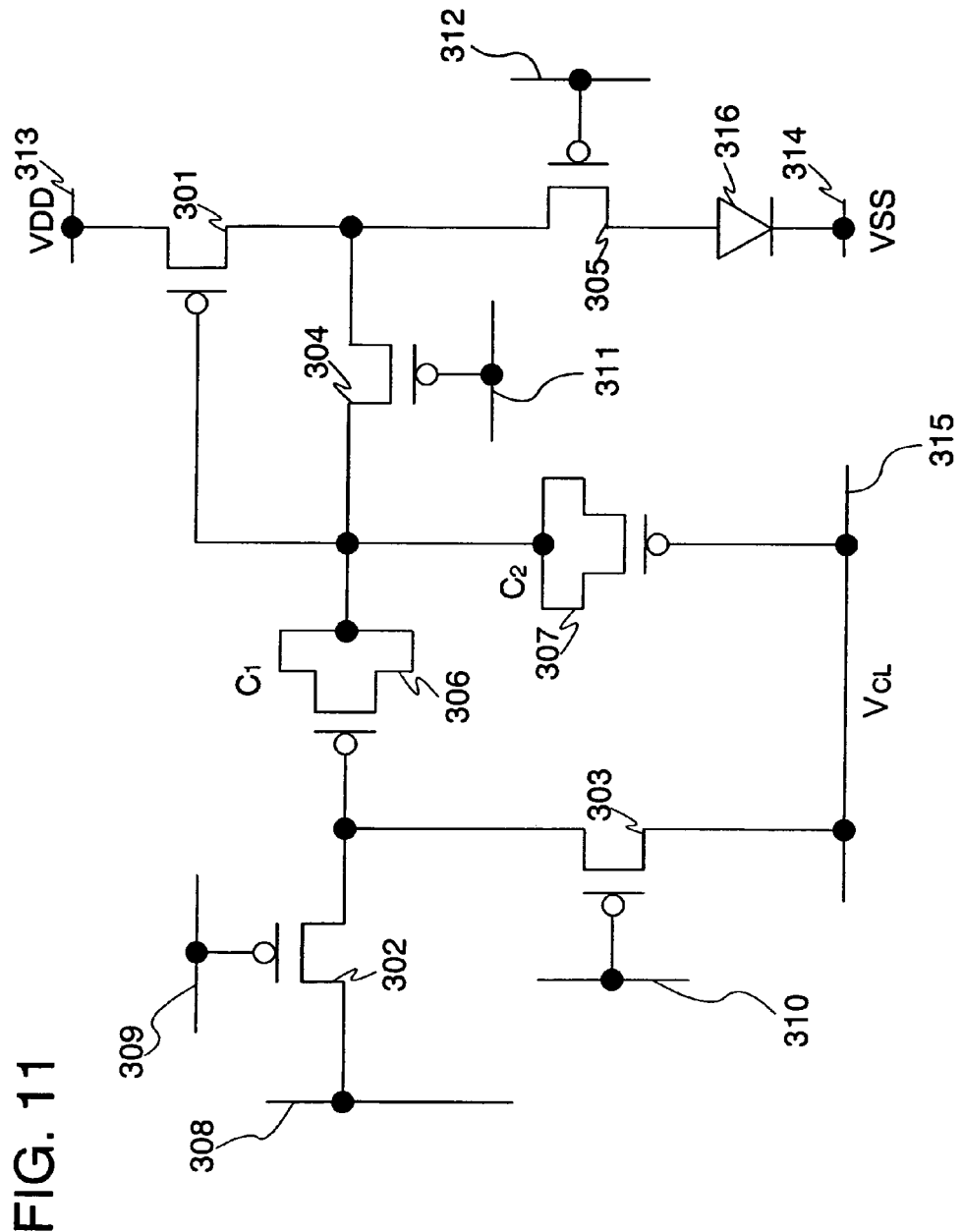
FIG. 11 illustrates an exemplary pixel configuration of the display device of the invention.
Figure 12:
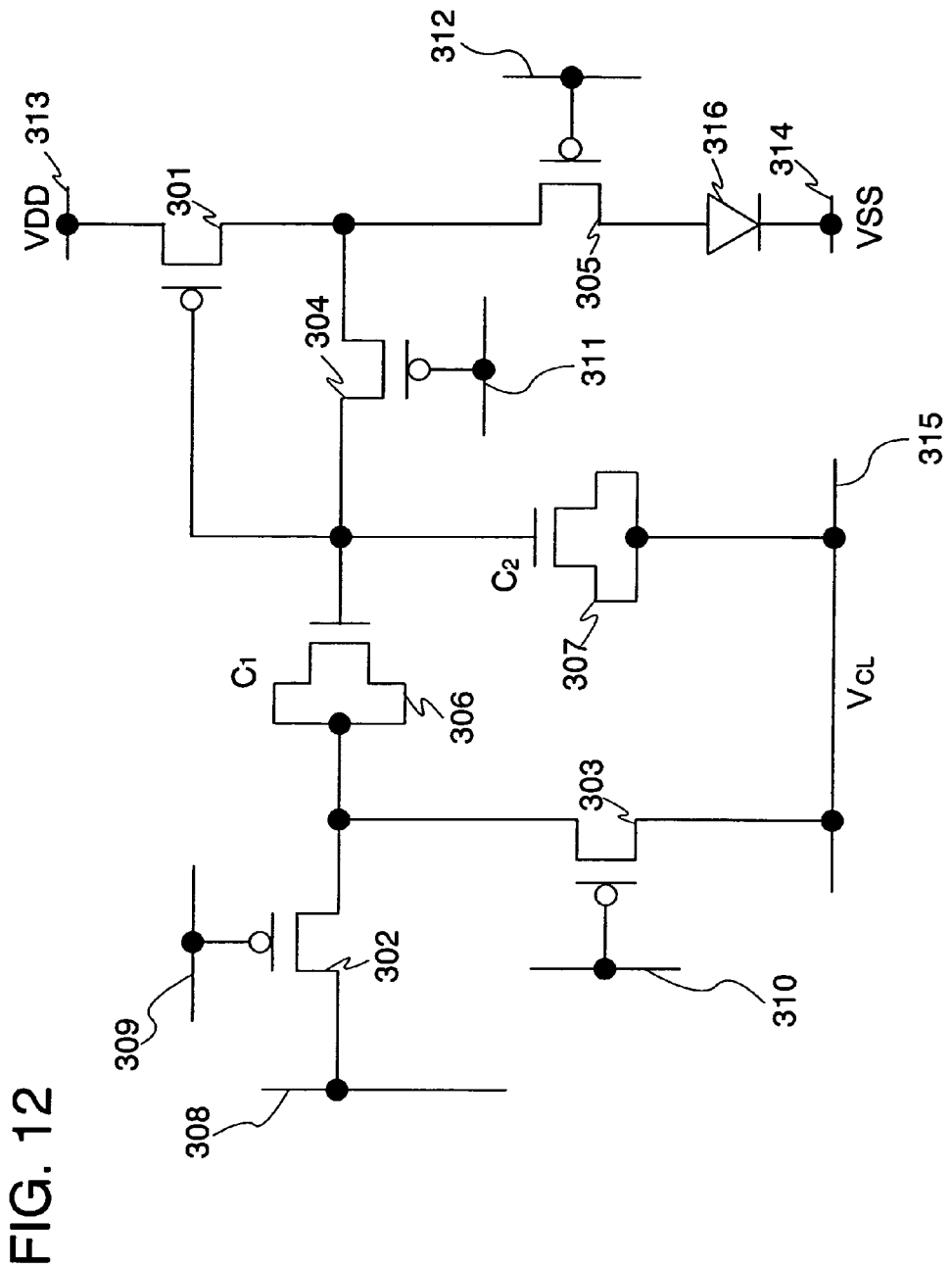
FIG. 12 illustrates an exemplary pixel configuration of the display device of the invention.

For example, FIG. 11 and FIG. 12 illustrate the case where each of the first storage capacitor and the second storage capacitor is formed from a MOS transistor in the pixel circuit shown in FIG. 3.

FIG. 11 shows the case where the first storage capacitor 306 and the second storage capacitor 307 are formed from p-channel transistors. In the case of forming a storage capacitor from a p-channel transistor, a gate terminal of the p-channel transistor is required to be set at a potential lower than first and second terminals thereof in order to induce a channel region in the p-channel transistor for holding charges. In the case of the pixel circuit shown in FIG. 3, the first electrode of the first storage capacitor 306 has a higher potential than the second electrode thereof, and also the first electrode of the second storage capacitor 307 has a higher potential than the second electrodes thereof. Therefore, in order to make the p-channel transistors function as storage capacitors, first terminals and second terminals of the p-channel transistors are connected as the first electrodes of the first storage capacitor 306 and the second storage capacitor 307 respectively, while gate terminals of the p-channel transistors are connected as the second electrodes of the first storage capacitor 306 and the second storage capacitor 307 respectively.

FIG. 12 shows the case where the first storage capacitor 306 and the second storage capacitor 307 are formed from n-channel transistors. In the case of forming a storage capacitor from an n-channel transistor, a gate terminal of the n-channel transistor is required to be set at a potential higher than first and second terminals thereof in order to induce a channel region in the n-channel transistor for holding charges. Therefore, in order to make the n-channel transistors function as storage capacitors, gate terminals of the n-channel transistors are connected as the first electrodes of the first storage capacitor 306 and the second storage capacitor 307 respectively, while first terminals and second terminals of the n-channel transistors are connected as the second electrodes of the first storage capacitor 306 and the second storage capacitor 307 respectively.

Figure 13:
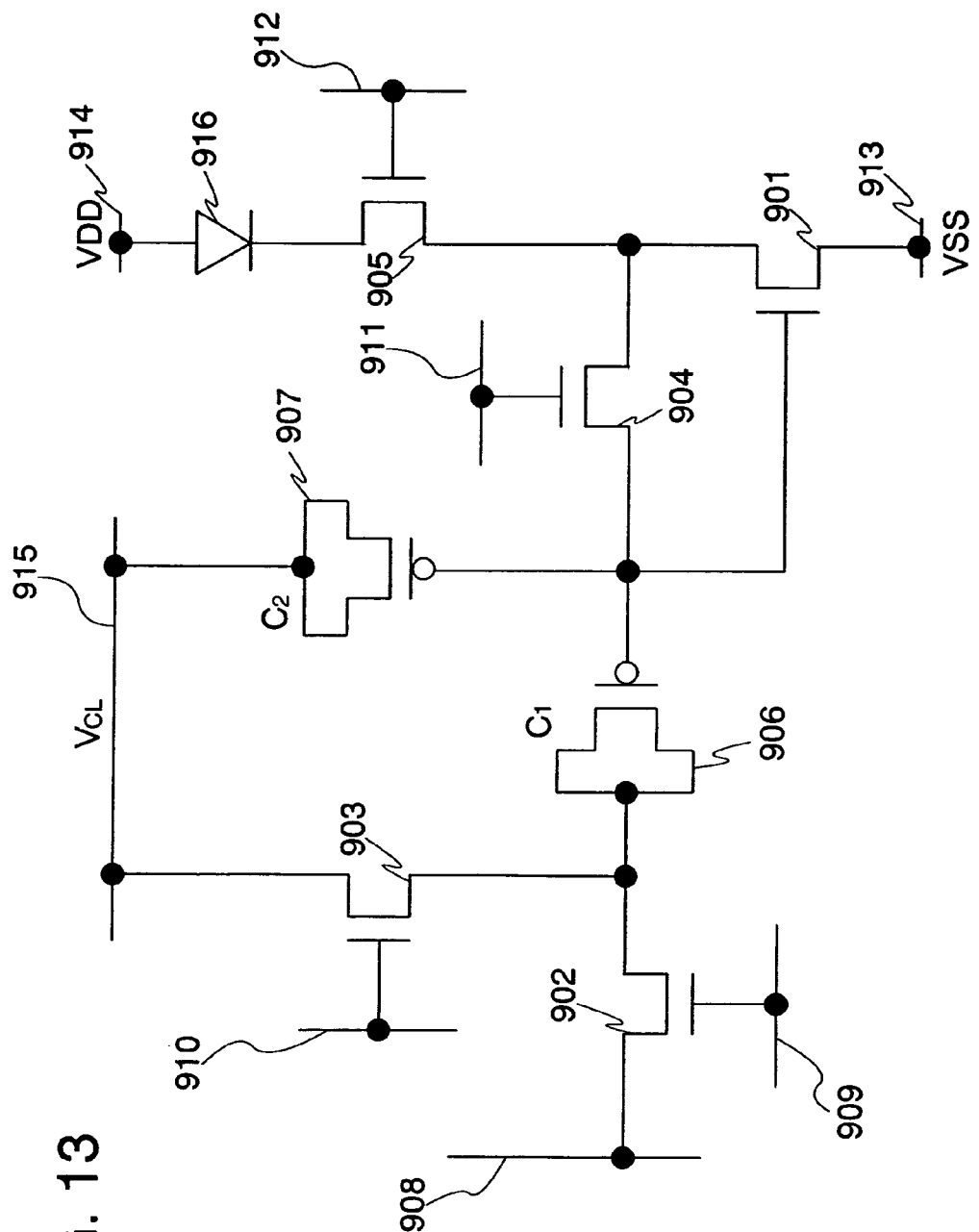
FIG. 13 illustrates an exemplary pixel configuration of the display device of the invention.
Figure 14:
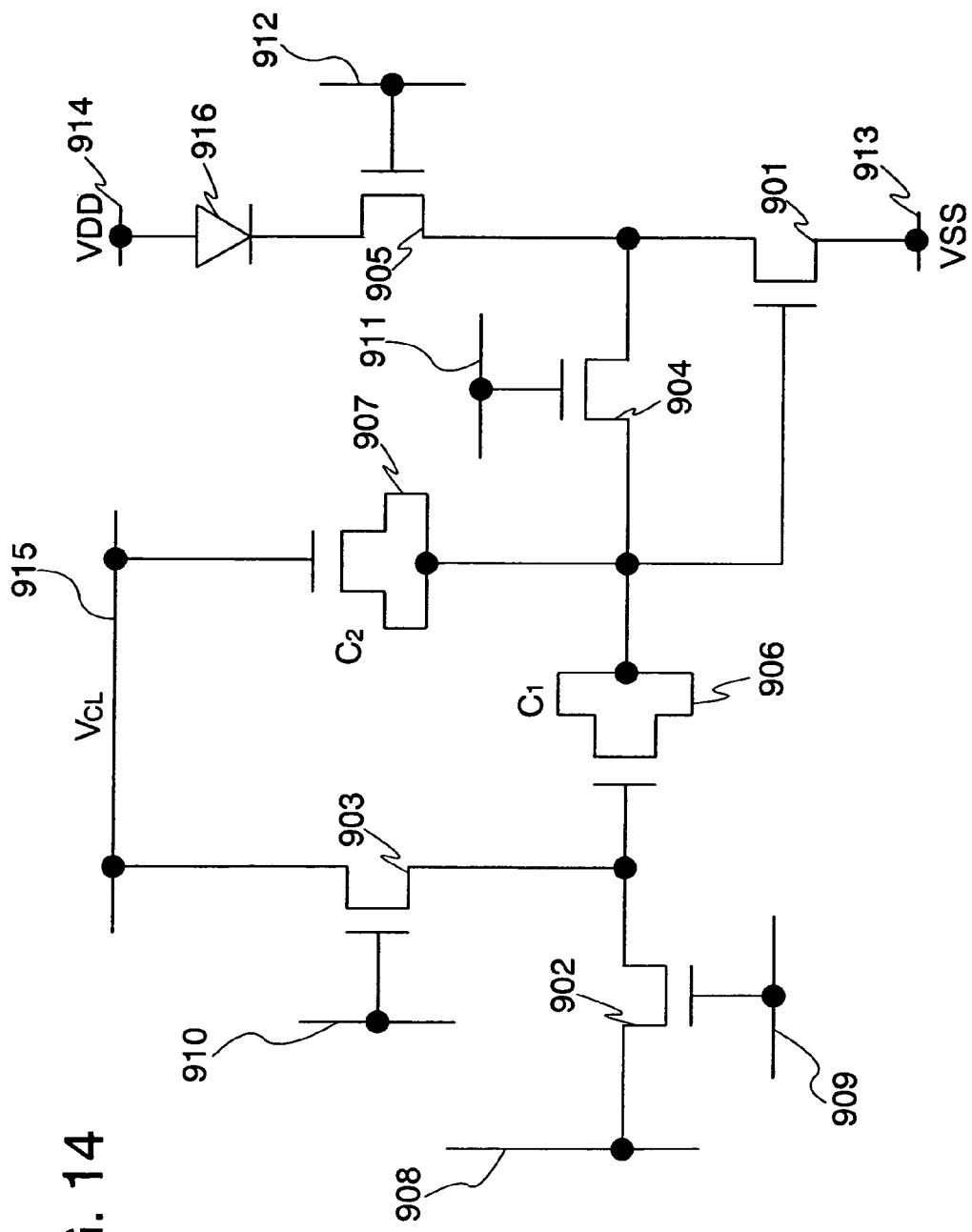
FIG. 14 illustrates an exemplary pixel configuration of the display device of the invention.

As another example, FIG. 13 and FIG. 14 show the case where the first and second storage capacitors in the pixel circuit in FIG. 9 are formed from MOS transistors.

FIG. 13 shows the case where the first storage capacitor 906 and the second storage capacitor 907 are formed from n-channel transistors. In the case of the pixel circuit in FIG. 9, the second electrode of the first storage capacitor 306 has a higher potential than the first electrode thereof, and also the second electrode of the second storage capacitor 307 has a higher potential than the first electrode thereof. Therefore, in order to make the n-channel transistors function as storage capacitors, first and second terminals of the n-channel transistors are connected as the first electrodes of the first storage capacitor 906 and the second storage capacitor 907 respectively, while gate terminals of the n-channel transistors are connected as the second electrodes of the first storage capacitor 306 and the second storage capacitor 907 respectively.

FIG. 14 shows the case where the first storage capacitor 906 and the second storage capacitor 907 are formed from p-channel transistors. In order to make the p-channel transistors function as storage capacitors, gate terminals of the p-channel transistors are connected as the first electrodes of the first storage capacitor 906 and the second storage capacitor 907 respectively, while first and second terminals of the p-channel transistors are connected as the second electrodes of the first storage capacitor 906 and the second storage capacitor 907 respectively.

Note that although the first and second storage capacitors are formed from transistors with the same conductivity type in FIG. 11 to FIG. 14, the invention is not limited to this, and transistors with different conductivity types may be used as well.

By connecting the first and second storage capacitors between the gate terminal of the first transistor and the capacitive line as in this embodiment mode, given that each of the first and second storage capacitors is formed from a MOS transistor, a voltage higher than the threshold voltage of the MOS transistor is constantly applied between a gate and a source of the MOS transistor. Therefore, a channel region can be constantly induced in the MOS transistor so that it can constantly function as a storage capacitor. Thus, a desired voltage can be accurately held in the storage capacitors in the operation process of the pixel circuit.

In addition, in the pixel configuration of this embodiment mode, when the first transistor is formed to have the largest value of W/L (ratio of the channel width W to the channel length L) among the first to fifth transistors, a current flowing between the drain and the source of the first transistor can be further increased. Accordingly, the operation of acquiring a voltage based on the threshold voltage $|V_{th}|$ of the first transistor in the first period T1 can be performed with a larger current, which leads to a faster operation. Further, the current $I_{OLED}$ which flows into the light-emitting element in the fourth period T4 can be further increased, which leads to higher luminance.

Note that in this embodiment mode, the timing at which pulses are input into the second scan line and the third scan line is the same; therefore, the third transistor and the fourth transistor may be controlled with either one of the second scan line or the third scan line.

Figure 15:
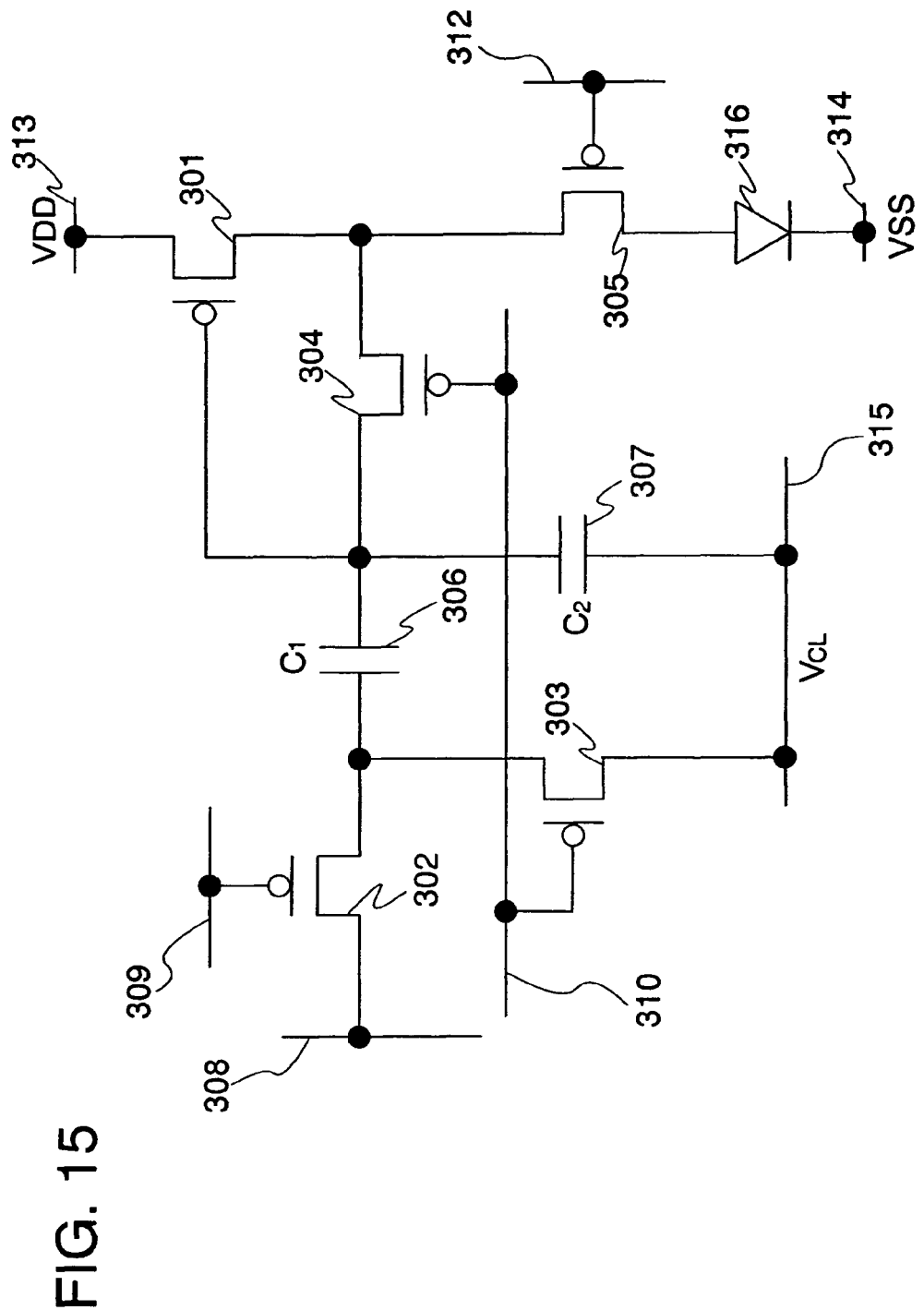
FIG. 15 illustrates an exemplary pixel configuration of the display device of the invention.

For example, FIG. 15 shows an example where the third transistor 303 and the fourth transistor 304 in the pixel circuit shown in FIG. 3 are controlled with the second scan line 310. Note that in FIG. 15, the gate terminals of the third transistor 303 and the fourth transistor 304 are connected to the second scan line 310.

Figure 16:
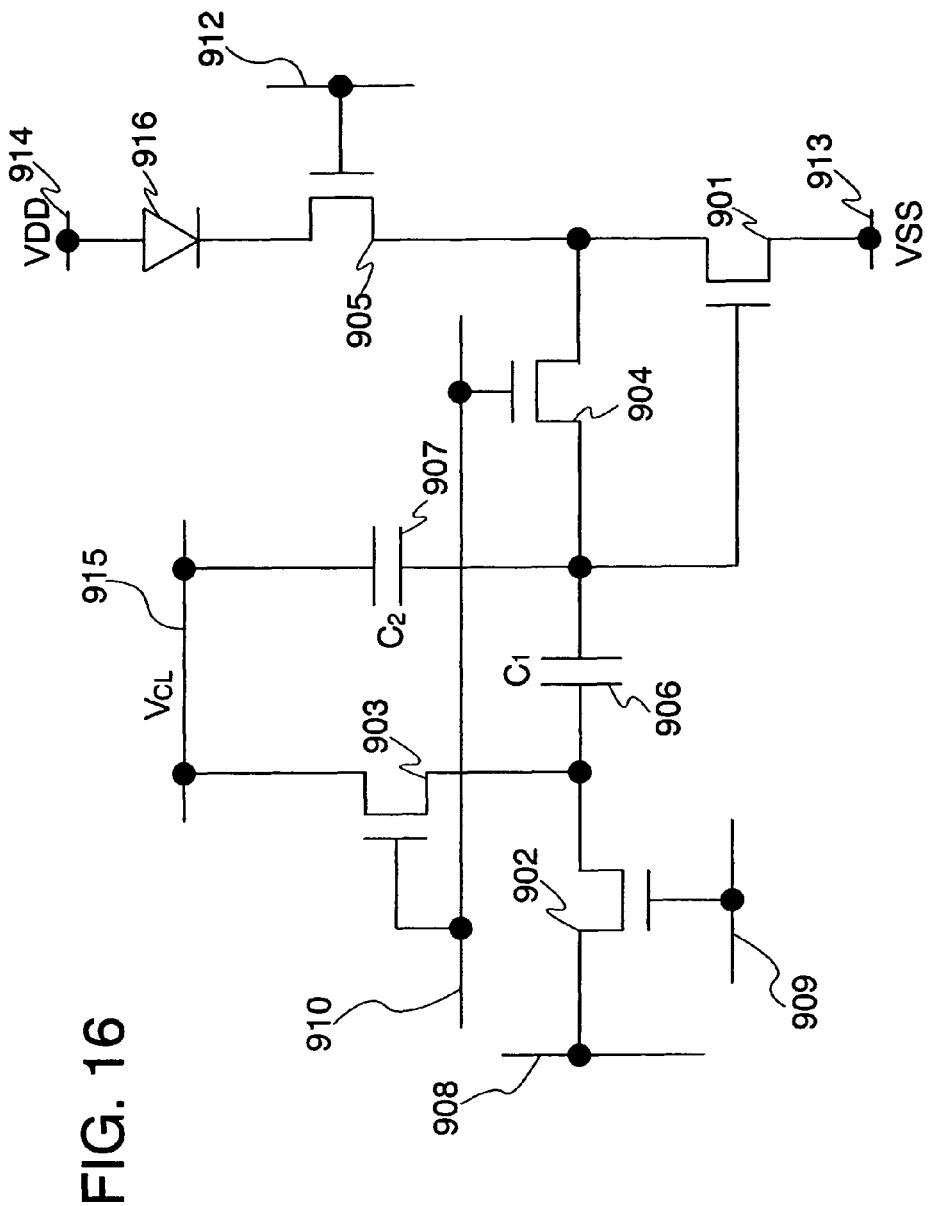
FIG. 16 illustrates an exemplary pixel configuration of the display device of the invention.

In addition, FIG. 16 shows another example where the third transistor 903 and the fourth transistor 904 in the pixel circuit shown in FIG. 9 are controlled with the second scan line 910. Note that in FIG. 16, the gate terminals of the third transistor 903 and the fourth transistor 904 are connected to the second scan line 910.

In this manner, by controlling the third transistor and the fourth transistor with the same scan line, the number of scan lines can be reduced, thereby the aperture ratio of pixels can be increased.

Note that although this embodiment mode has illustrated examples where all of the second to fifth transistors are transistors with the same conductivity type such as either p-channel transistors or n-channel transistors, the invention is not limited to these. The circuits may be constructed by using both p-channel transistors and n-channel transistors.

Figure 17:
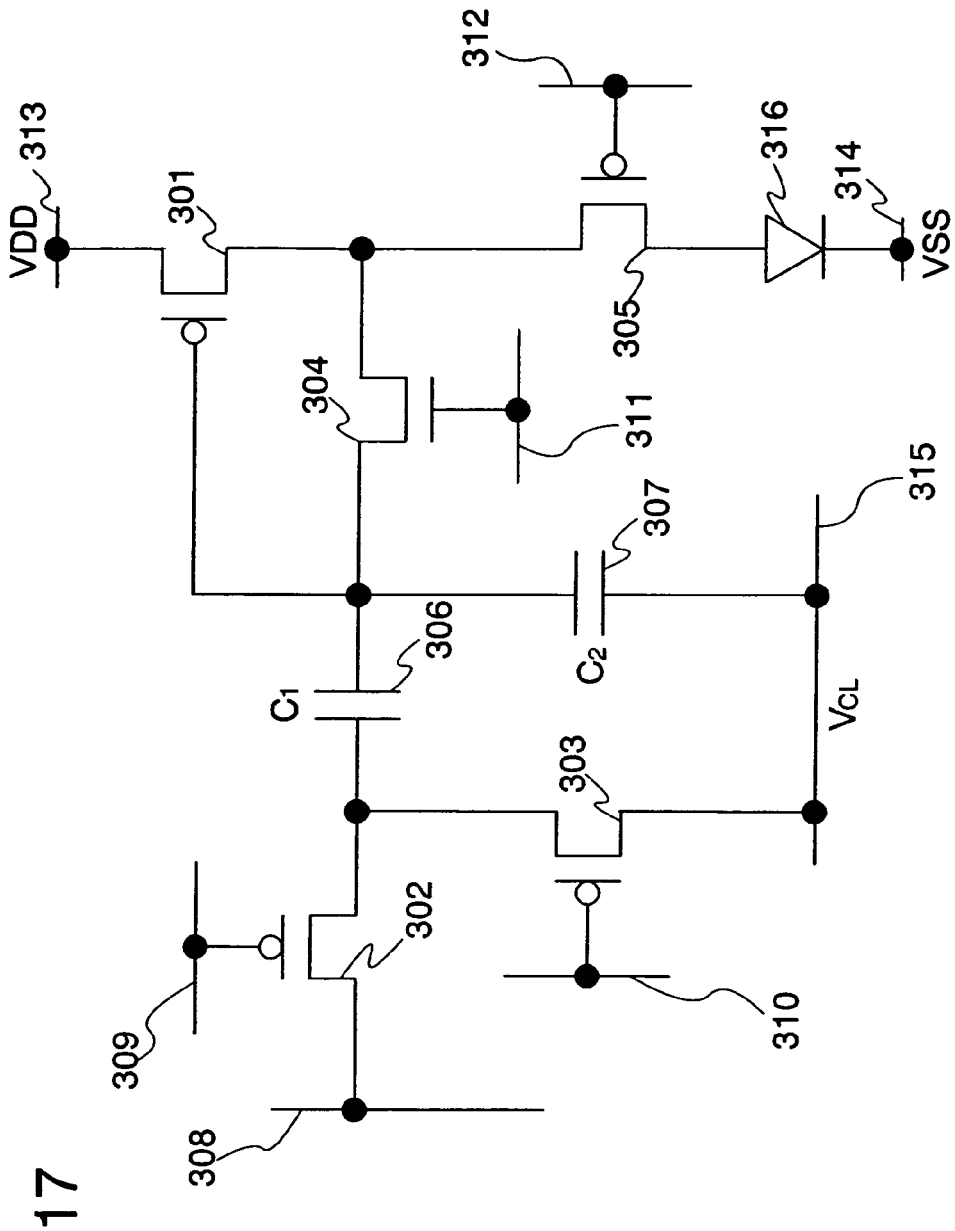
FIG. 17 illustrates an exemplary pixel configuration of the display device of the invention.
Figure 18:
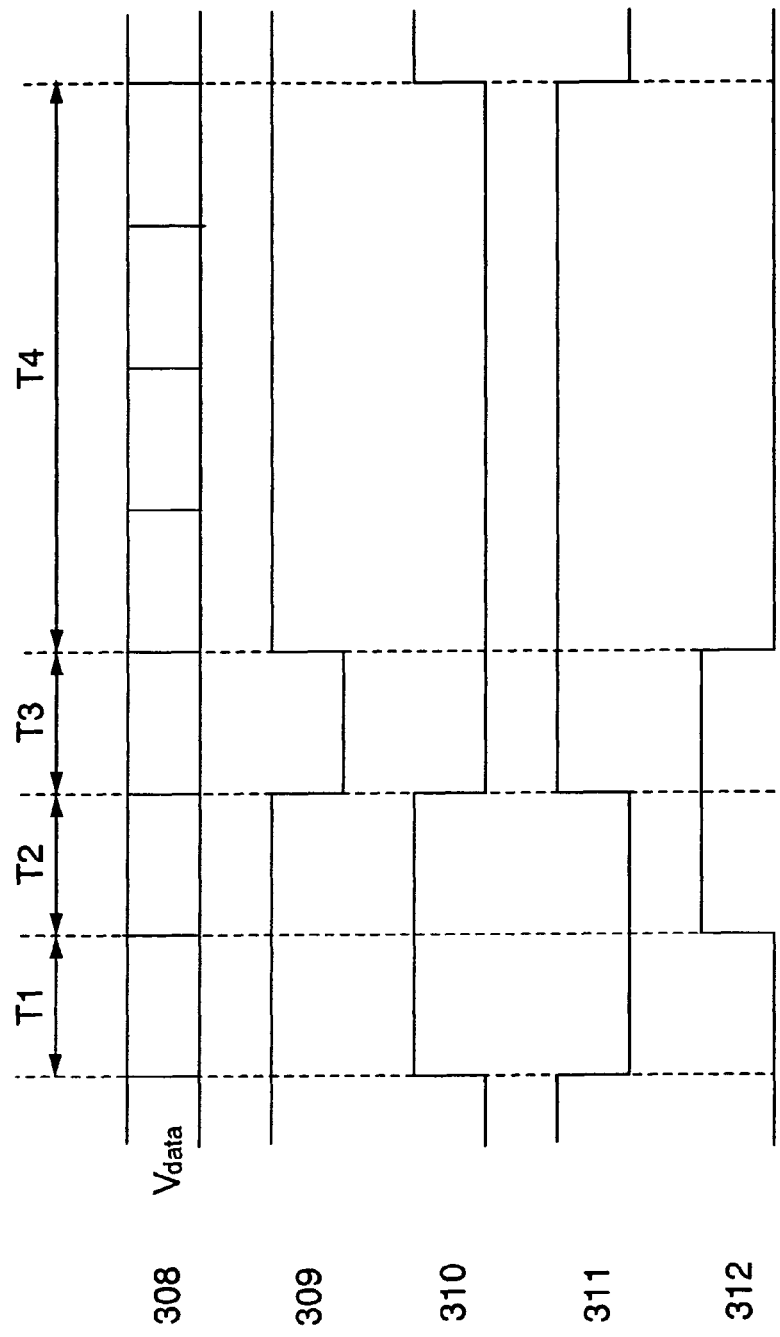
FIG. 18 illustrates the operation of a pixel circuit in the display device of the invention.

For example, in FIG. 3, the fourth transistor 304 may be an n-channel transistor, while the transistors other than the fourth transistor 304 may be p-channel transistors. FIG. 17 shows a pixel circuit of this case. In addition, FIG. 18 shows a timing chart of video signal voltages and pulses that are input to the signal line 308 and the first scan line 309 to the fourth scan line 312.

In this manner, when an n-channel transistor is used for the fourth transistor 304, leak current of the fourth transistor 304 can be decreased than the case of using a p-channel transistor. Therefore, leaks of charges held in the first storage capacitor 306 and the second storage capacitor 307 are decreased, which leads to smaller fluctuations of voltages held in the first storage capacitor 306 and the second storage capacitor 307.

Accordingly, a constant voltage is continuously applied to the gate terminal of the first transistor 301, in particular, in the light-emitting period (T4). Thus, the light-emitting element 316 can be supplied with a constant current. As a result, the light-emitting element 316 can emit light at a constant luminance, thereby luminance unevenness can be reduced.

Note that the conductivity types of the second transistor to the fifth transistor are not limited to the above description.

Embodiment Mode 2

Although a capacitive line is separately provided in Embodiment Mode 1, it may be replaced by another wire which is already provided in the pixel. For example, the capacitive line can be omitted by using any one of the first to fourth scan lines. This embodiment mode describes a case where one of the first to fourth scan lines is used as a substitute for the capacitive line. Note that description will be made by using an EL element as an exemplary light-emitting element.

Figure 19:
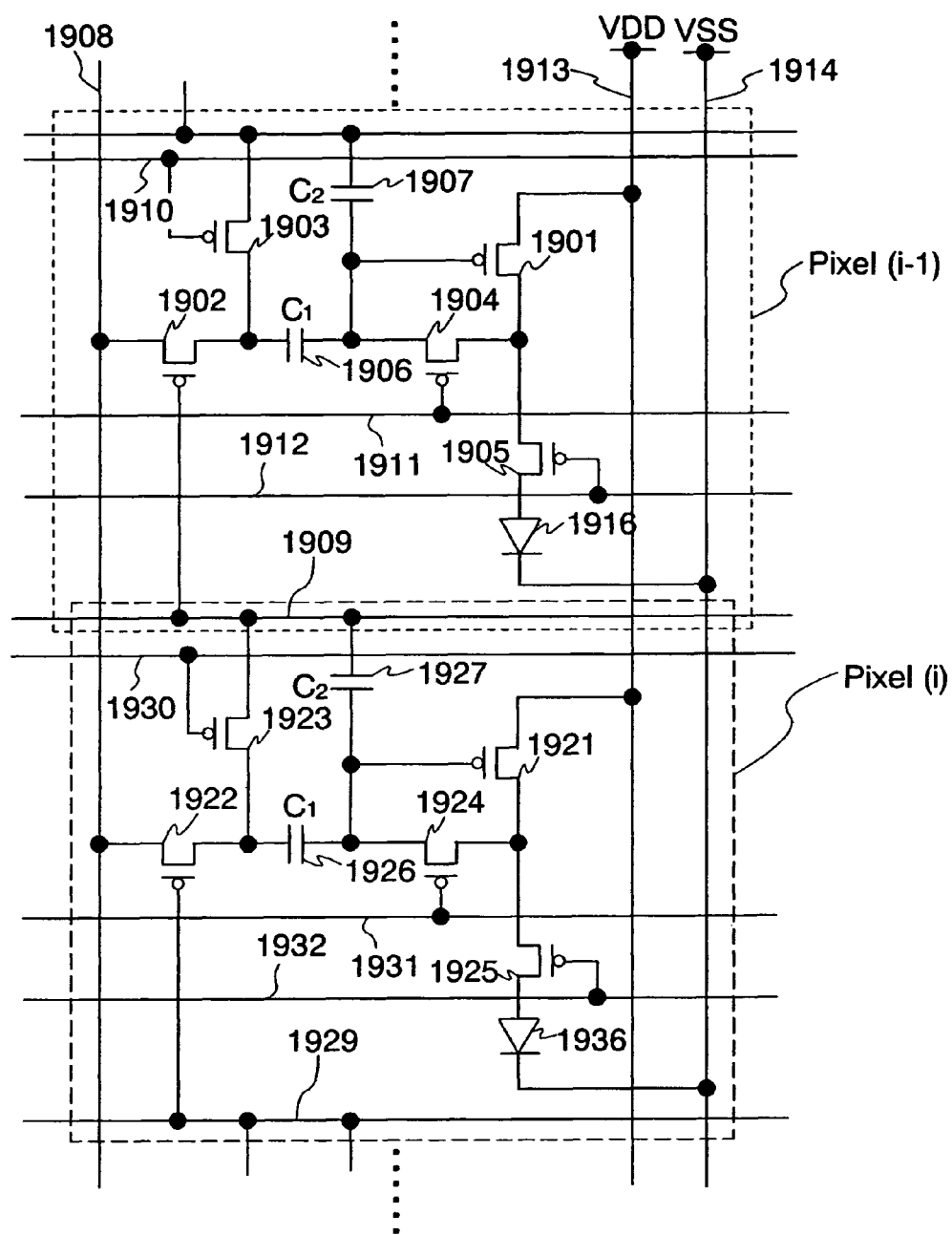
FIG. 19 illustrates an exemplary pixel configuration of the display device of the invention.

For example, FIG. 19 shows an exemplary pixel circuit in the case where the capacitive line in FIG. 3 is replaced by a first scan line in the preceding row. In FIG. 19, a first scan line 1909 of a Pixel (i−1) in an (i−1)-th row is used as a capacitive line of a Pixel (i) in an i-th row, and a second terminal of a third transistor 1923 and a second electrode of a second storage capacitor 1927 in the Pixel (i) in the i-th row are connected to the first scan line 1909 of the Pixel (i−1) in the (i−1)-th row.

Figure 20:
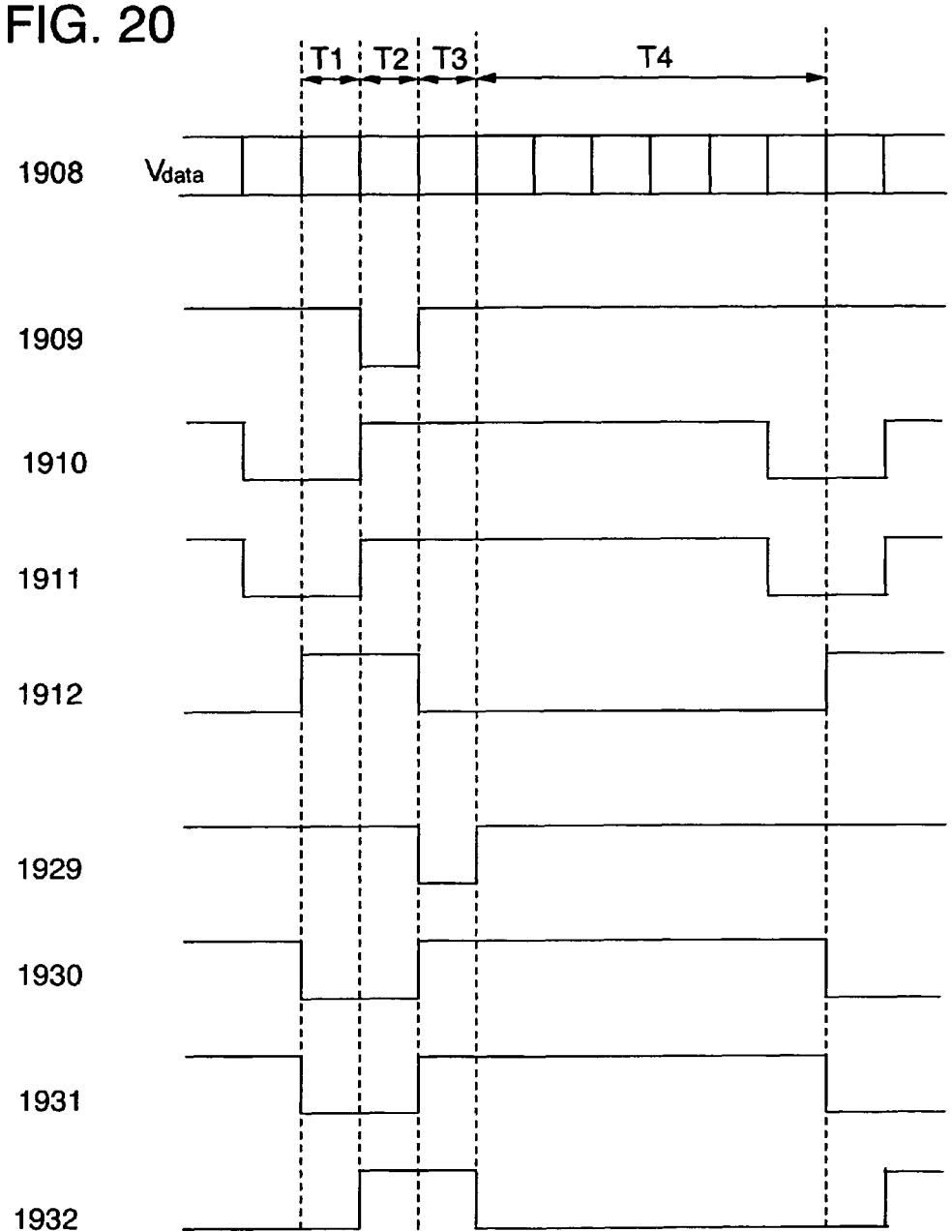
FIG. 20 illustrates the operation of a pixel circuit in the display device of the invention.

FIG. 20 shows a timing chart of video signal voltages and pulses that are input to the signal line 1908, the first scan line 1909 to a fourth scan line 1912 of the Pixel (i−1) in the (i−1)-th row, and a first scan line 1929 to a fourth scan line 1932 of the Pixel (i) in the i-th row. Note that the periods T1 to T4 in FIG. 20 correspond to the operation of the Pixel (i) in the i-th row.

When the pixel configuration as shown in FIG. 19 is employed, a potential which is applied to the first scan line 1909 of the Pixel (i−1) in the (i−1)-th row is applied to the second terminal of the third transistor 1923 and the second electrode of the second storage capacitor 1927 in the Pixel (i) in the i-th row. Thus, in the second period T2, an L-level potential is applied to the second terminal of the third transistor 1923 and the second electrode of the second storage capacitor 1927 in the Pixel (i) in the i-th row, while in the first period T1, the third period T3, and the fourth period T4, an H-level potential is applied thereto. Accordingly, a constant potential can be applied to the second terminal of the third transistor 1923 and the second electrode of the second storage capacitor 1927 in the Pixel (i) in the i-th row in each period, and thus the operation of the pixel circuit as described in Embodiment Mode 1 can be performed. Note that the Pixel (i−1) in the (i−1)-th row of FIG. 19 includes a first transistor 1901 to a fifth transistor 1905, a first storage capacitor 1906, a second storage capacitor 1907, the first scan line 1909 to the fourth scan line 1912, a first power supply line 1913, a second power supply line 1914, and a light-emitting element 1916. And, the Pixel (i) in the i-th row of FIG. 19 includes a first transistor 1921 to a fifth transistor 1925, a first storage capacitor 1926, the second storage capacitor 1927, the first power supply line 1913, the second power supply line 1914, the first scan line 1929 to the fourth scan line 1932, and a light-emitting element 1936.

Figure 21:
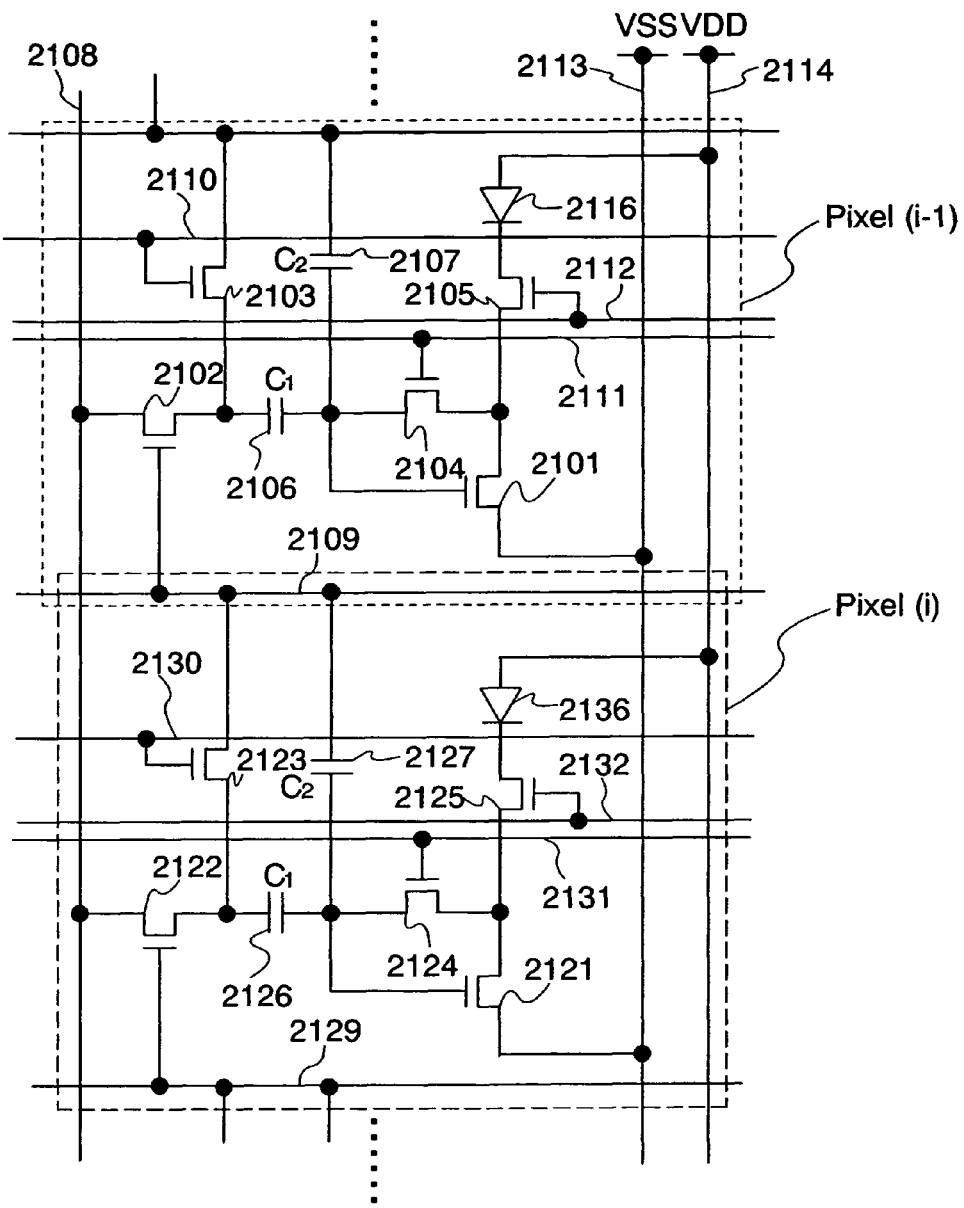
FIG. 21 illustrates an exemplary pixel configuration of the display device of the invention.

As another example, FIG. 21 shows the case where the capacitive line in FIG. 9 is replaced by the first scan line in the preceding row. In FIG. 21, a first scan line 2109 of a Pixel (i−1) in an (i−1)-th row is used as a capacitive line of a Pixel (i) in an i-th row, and a second terminal of a third transistor 2123 and a second electrode of a second storage capacitor 2127 of a Pixel (i) in an i-th row are connected to the first scan line 2109 of the Pixel (i−1) in the (i−1)-th row.

Figure 22:
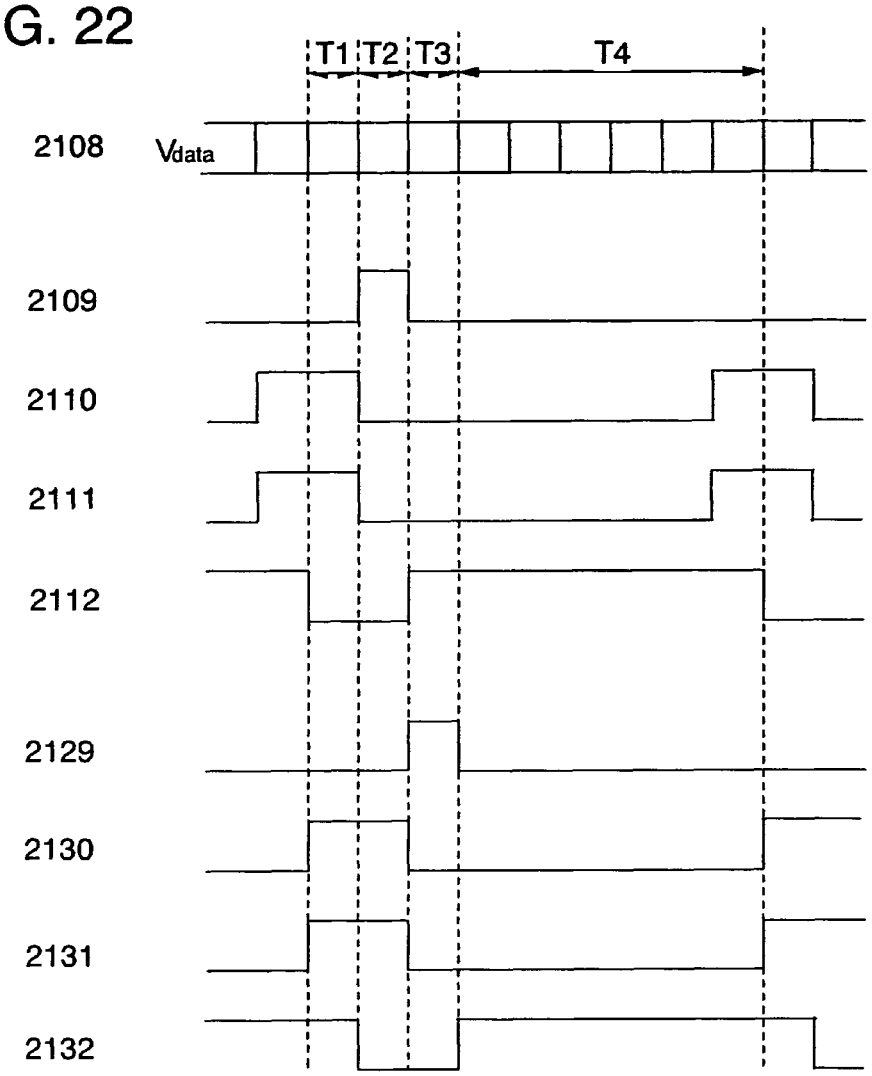
FIG. 22 illustrates the operation of a pixel circuit in the display device of the invention.

FIG. 22 shows a timing chart of video signal voltages and pulses that are input to the signal line 2108, the first scan line 2109 to a fourth scan line 2112 of the Pixel (i−1) in the (i−1)-th row, and a first scan line 2129 to a fourth scan line 2132 of the Pixel (i) in the i-th row. Note that the periods T1 to T4 in FIG. 22 correspond to the operation of the Pixel (i) in the i-th row.

When the pixel configuration as shown in FIG. 21 is employed, a potential which is applied to the first scan line 2109 of the Pixel (i−1) in the (i−1)-th row is applied to the second terminal of the third transistor 2123 and the second electrode of the second storage capacitor 2127 in the Pixel (i) in the i-th row. Thus, in the second period T2, an H-level potential is applied to the second terminal of the third transistor 2123 and the second electrode of the second storage capacitor 2127 in the Pixel (i) in the i-th row, while in the first period T1, the third period T3, and the fourth period T4, an L-level potential is applied thereto. Accordingly, a constant potential can be applied to the second terminal of the third transistor 2123 and the second electrode of the second storage capacitor 2127 in the Pixel (i) in the i-th row in each period, and thus the operation of the pixel circuit as described in Embodiment Mode 1 can be performed. Note that the Pixel (i−1) in the (i−1)-th row of FIG. 21 includes a first transistor 2101 to a fifth transistor 2105, a first storage capacitor 2106, a second storage capacitor 2107, the first scan line 2109 to the fourth scan line 2112, a first power supply line 2113, a second power supply line 2114, and a light-emitting element 2116. And, the Pixel (i) in the i-th row of FIG. 21 includes a first transistor 2121 to a fifth transistor 2125, a first storage capacitor 2126, the second storage capacitor 2127, the first power supply line 2113, the second power supply line 2114, the first scan line 2129 to the fourth scan line 2132, and a light-emitting element 2136.

In this manner, by using the first scan line as a substitute for the capacitive line, no additional capacitive line is required. Therefore, the number of wires can be reduced and thus the aperture ratio of pixels can be increased. Further, since there is no need to generate a voltage to be applied to a capacitive line, a circuit for generating the voltage can be omitted, which leads to a reduction in power consumption.

Note that a scan line used as a substitute for the capacitive line is not limited to the first scan line. Any one of the second to fourth scan lines in the preceding row may be used as the substitute for the capacitive line. Alternatively, any one of the second to fourth scan lines in the subsequent row may be used as the substitute for the capacitive line. Note also that a constant potential is applied to the first scan line in the preceding row and the fourth scan line in the preceding row during the light-emitting period (T4) of the pixel in the present row; therefore, a current flowing into the light-emitting element during the light-emitting period of the pixel in the present row can be maintained at a constant value, and thus the light-emitting element can emit light at a constant luminance. Thus, it is desirable to use either the first scan line in the preceding row or the fourth scan line in the preceding row as a substitute for the capacitive line.

Note that this embodiment mode can be freely combined with Embodiment Mode 1.

Embodiment Mode 3

Although a current is supplied to a light-emitting element for performing initialization in Embodiment Mode 1 and Embodiment Mode 2, initialization can be performed by adding an initialization transistor in the pixel circuit which is shown heretofore. In this embodiment mode, description will be made of a method of initialization using an initialization transistor. Note that description will be made by using an EL element as an exemplary light-emitting element.

In order to perform initialization, a second terminal of a first transistor is required to be set at an initialization potential. At this time, by connecting the second terminal of the first transistor to an electrode of another element or another wire through an initialization transistor, and then turning on the initialization transistor, the second terminal of the first transistor can be set at a potential of the electrode of the another element or the another wire.

That is, the initialization transistor functions as a switch for connecting the second terminal of the first transistor to an electrode of another element or another wire in order to set the second terminal of the first transistor at an initialization potential.

For example, in the case of the pixel circuit shown in FIG. 3, in order to hold a voltage based on the threshold voltage $|V_{th}|$ of the first transistor 301 in the first storage capacitor 306 and the second storage capacitor 307, the second terminal of the first transistor 301 is required to be set at a potential lower than VDD−$|V_{th}|$ (the difference between the power supply potential VDD and the threshold voltage $|V_{th}|$ of the first transistor 301). Thus, the second terminal of the first transistor 301 can be set at an initialization potential that is lower than VDD−$|V_{th}|$ by connecting the second terminal of the first transistor 301 to an electrode of another element or another wire through an initialization transistor in the first period T1.

Figure 23:
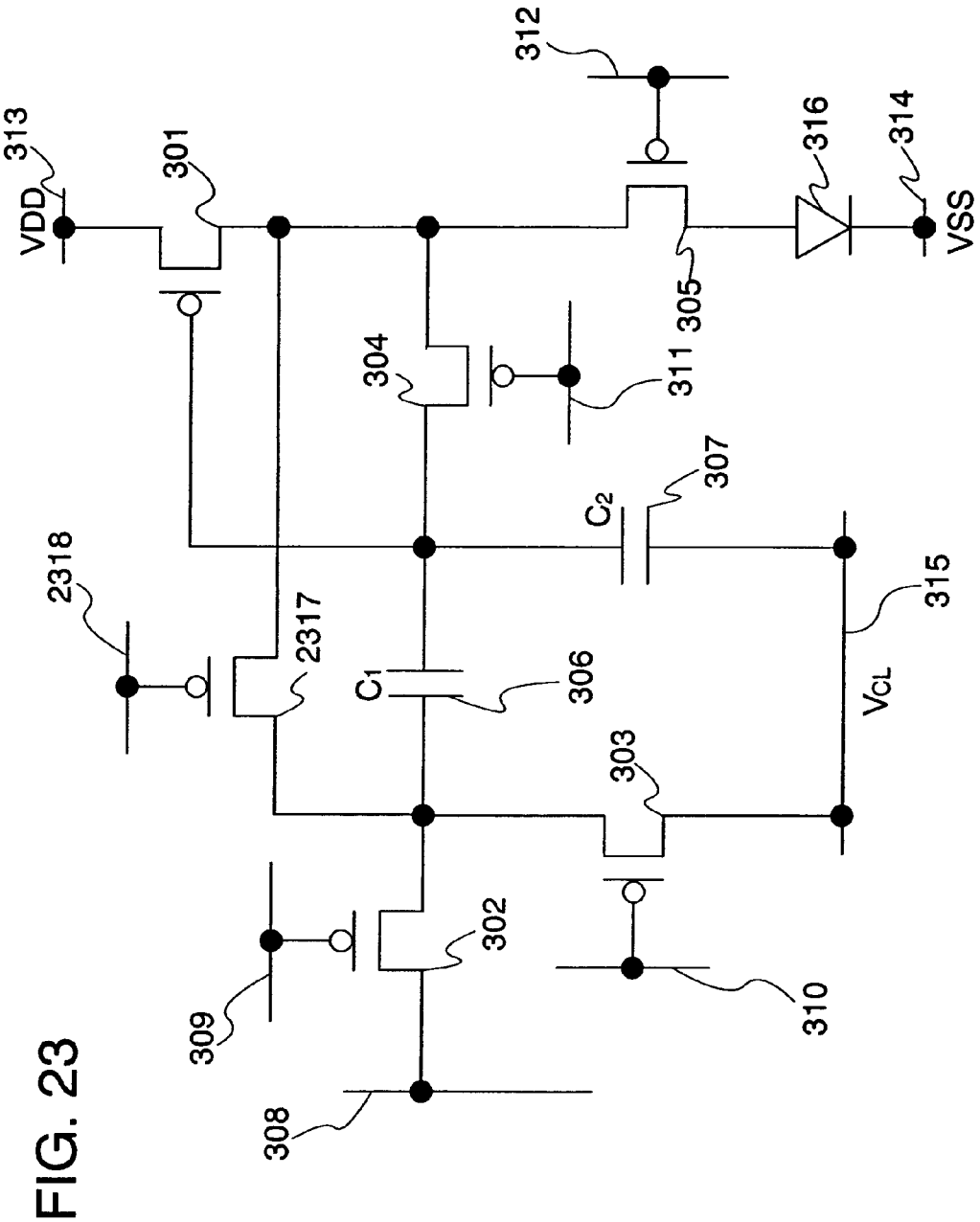
FIG. 23 illustrates an exemplary pixel configuration of the display device of the invention.

FIG. 23 shows an example of providing an initialization transistor in the pixel circuit shown in FIG. 3. In FIG. 23, a sixth transistor 2317 that is an initialization transistor and a fifth scan line 2318 are additionally provided in the pixel circuit shown in FIG. 3. Note that a gate terminal of the sixth transistor 2317 is connected to the fifth scan line 2318; a first terminal of the sixth transistor 2317 is connected to the second terminal of the first transistor 301, the first terminal of the fourth transistor 304, and the first terminal of the fifth transistor 305; and a second terminal of the sixth transistor 2317 is connected to the second terminal of the second transistor 302, the first terminal of the third transistor 303, and the second electrode of the first storage capacitor 306.

The operation of the pixel circuit shown in FIG. 23 will be described with reference to FIG. 24 and FIG. 25.

Figure 24:
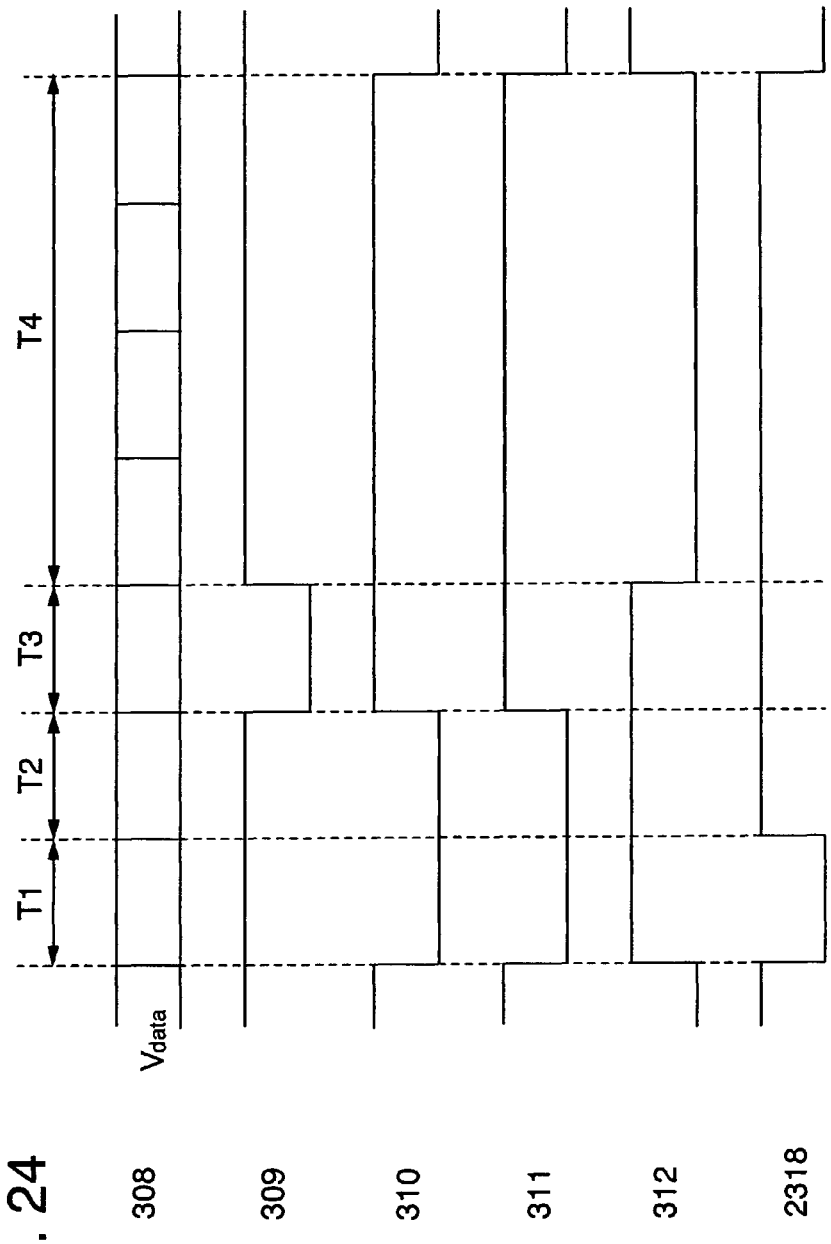
FIG. 24 illustrates the operation of a pixel circuit in the display device of the invention.
Figure 25:
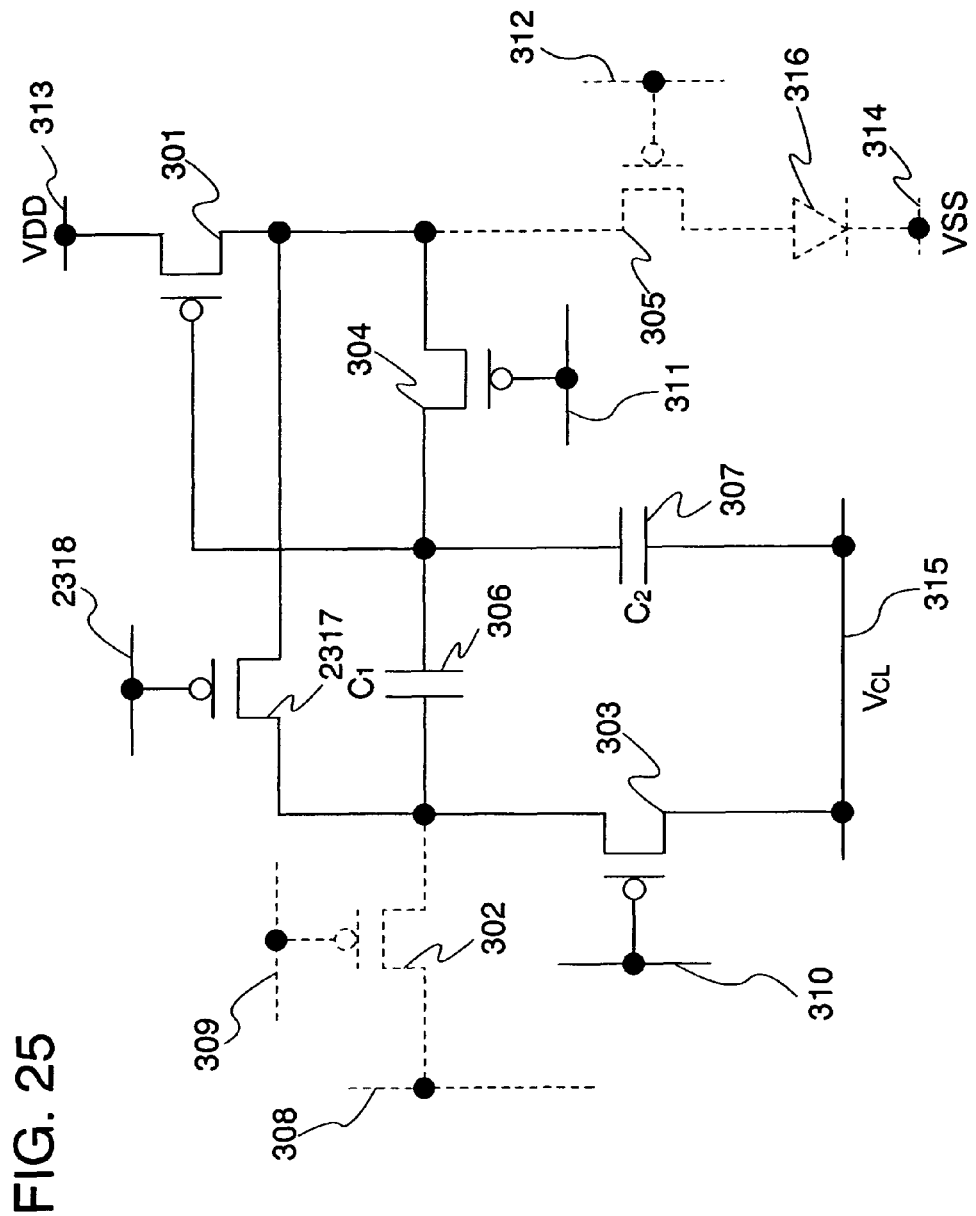
FIG. 25 illustrates the operation of a pixel circuit in the display device of the invention.

FIG. 24 shows a timing chart of video signal voltages and pulses that are input to the signal line 308 and the first scan line 309 to the fifth scan line 2318. In addition, the whole period is divided into fourth periods including a first period T1 to a fourth period T4 in accordance with each operation of the pixel circuit.

The operation of the pixel circuit in the first period T1 will be described with reference to FIG. 25. In the first period T1, the second scan line 310, the third scan line 311, and the fifth scan line 2318 are at L level, and the third transistor 303, the fourth transistor 304, and the sixth transistor 2317 are on. Meanwhile, the first scan line 309 and the fourth scan line 312 are at H level, and the second transistor 302 and the fifth transistor 305 are off. Accordingly, the second terminal of the first transistor 301 is connected to the capacitive line 315, and thus the second terminal of the first transistor 301, the first electrode of the first storage capacitor 306, and the first electrode of the second storage capacitor 307 have the same potential as the potential $V_{CL}$ of he capacitive line 315.

Through the aforementioned operation, the second terminal of the first transistor 301, the first electrode of the first storage capacitor 306, and the first electrode of the second storage capacitor 307 are set at the potential $V_{CL}$ of the capacitive line 315 as an initialization potential in the first period T1.

In this manner, by setting the second terminal of the first transistor 301 at the potential $V_{CL}$ of the capacitive line 315 which is lower than VDD−$|V_{th}|$ in the first period T1, the second terminal of the first transistor 301 can be surely set at a potential lower than VDD−$|V_{th}|$, thereby the threshold voltage can be surely acquired.

Note that in the second period T2 to the fourth period T4, the fifth scan line 2318 is set at H level to turn off the sixth transistor 2317. Then, the same operation as that of the pixel circuit shown in FIG. 3 is performed.

Note also that the sixth transistor 2317 has only to be connected so that the second terminal of the first transistor 301 is set at a potential lower than VDD−$|V_{th}|$ in the first period T1 for performing initialization.

Figure 26:
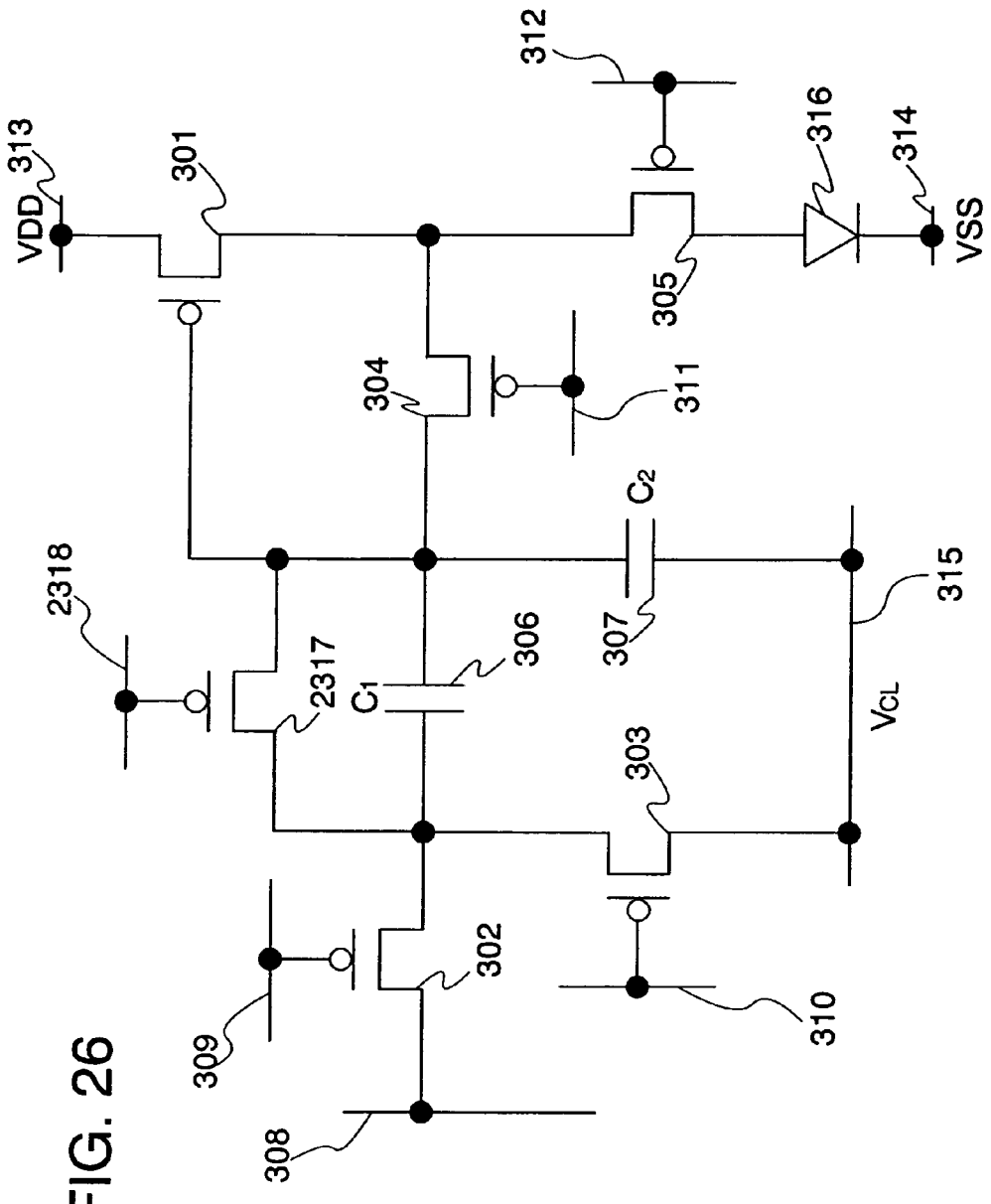
FIG. 26 illustrates an exemplary pixel configuration of the display device of the invention.
Figure 27:
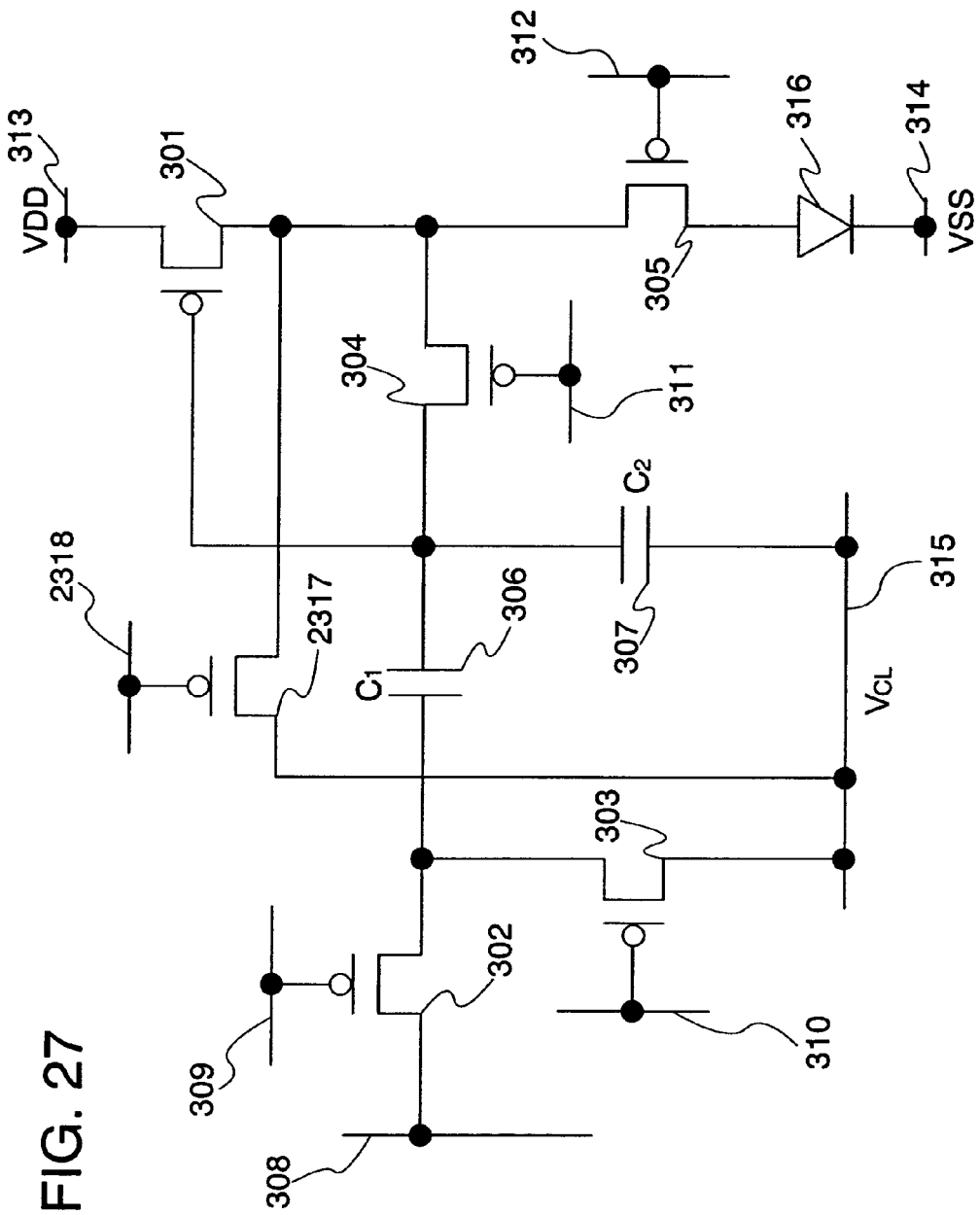
FIG. 27 illustrates an exemplary pixel configuration of the display device of the invention.
Figure 65:
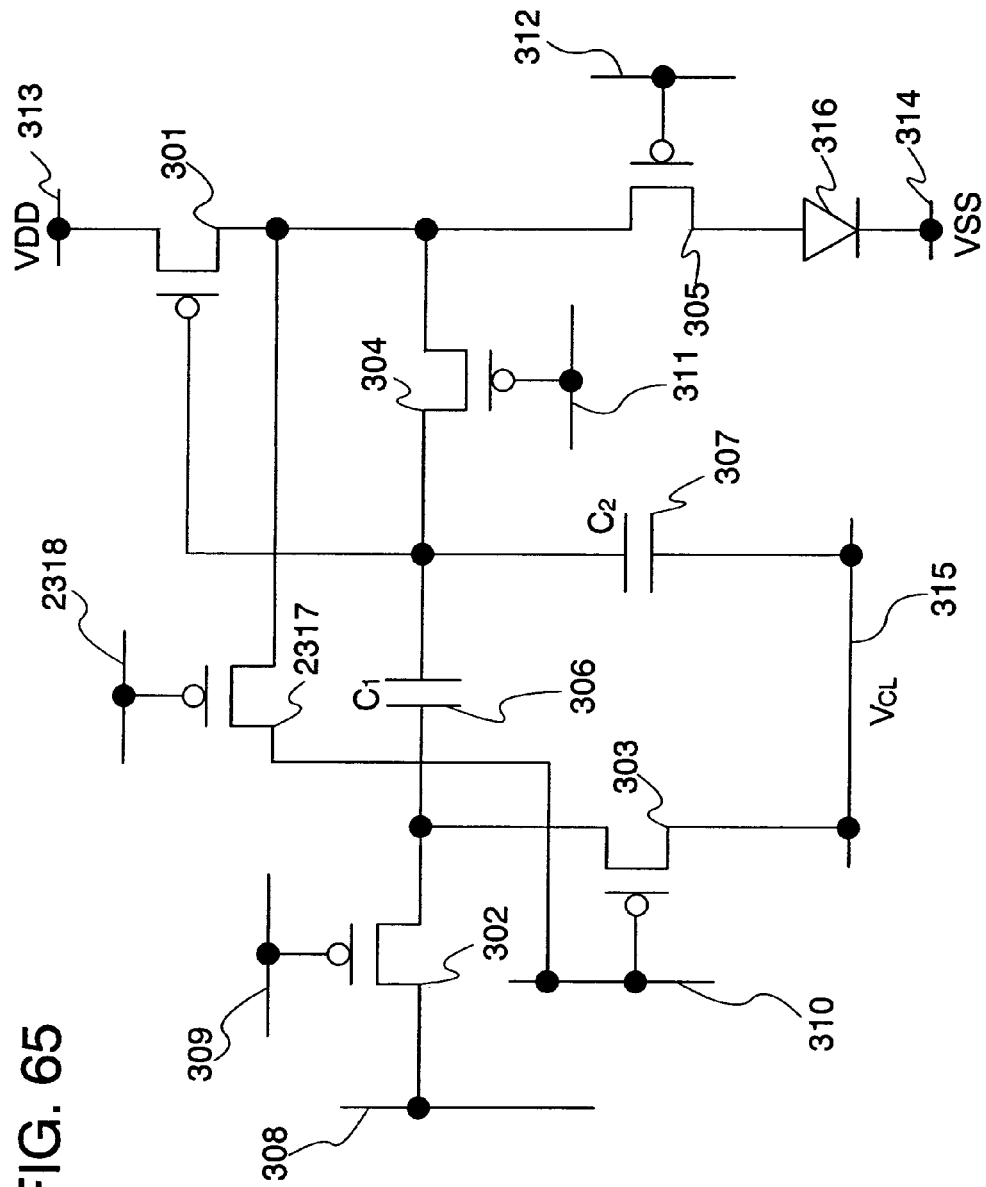
FIG. 65 illustrates an exemplary pixel configuration of the display device of the invention.
Figure 66:
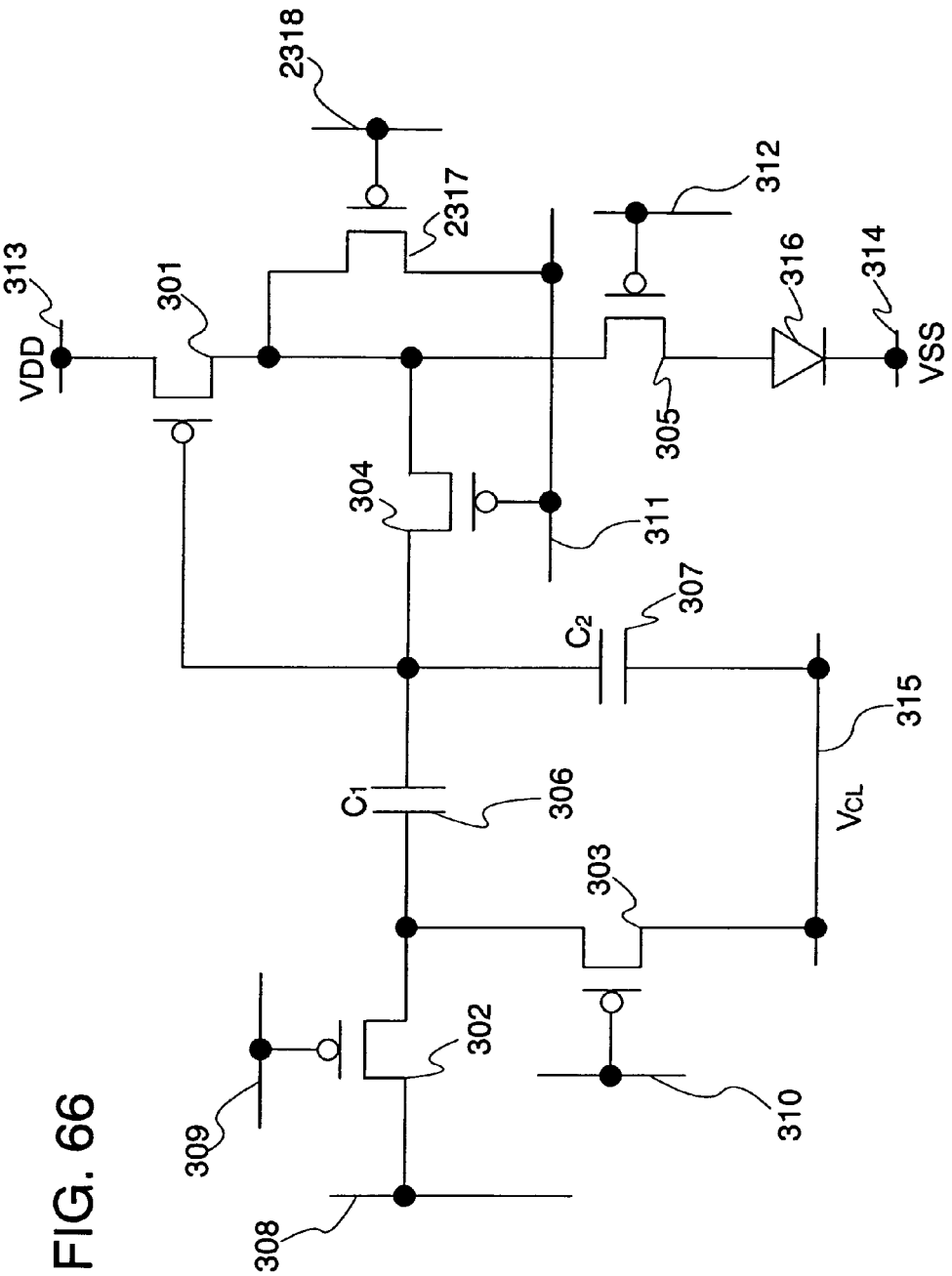
FIG. 66 illustrates an exemplary pixel configuration of the display device of the invention.

For example, as shown in FIG. 26, the first terminal of the sixth transistor 2317 may be connected to the gate terminal of the first transistor 301, the second terminal of the fourth transistor 304, the first electrode of the first storage capacitor 306, and the first electrode of the second storage capacitor 307. Alternatively, the second terminal of the sixth transistor 2317 may be connected to the capacitive line 315 as shown in FIG. 27. As a further alternative, the second terminal of the sixth transistor 2317 may be connected to the second scan line 310 as shown in FIG. 65, or connected to the third scan line 311 as shown in FIG. 66.

In addition, an initialization line (initialization power supply line) may be provided in order to set the second terminal of the first transistor 301 at an initialization potential.

Figure 28:
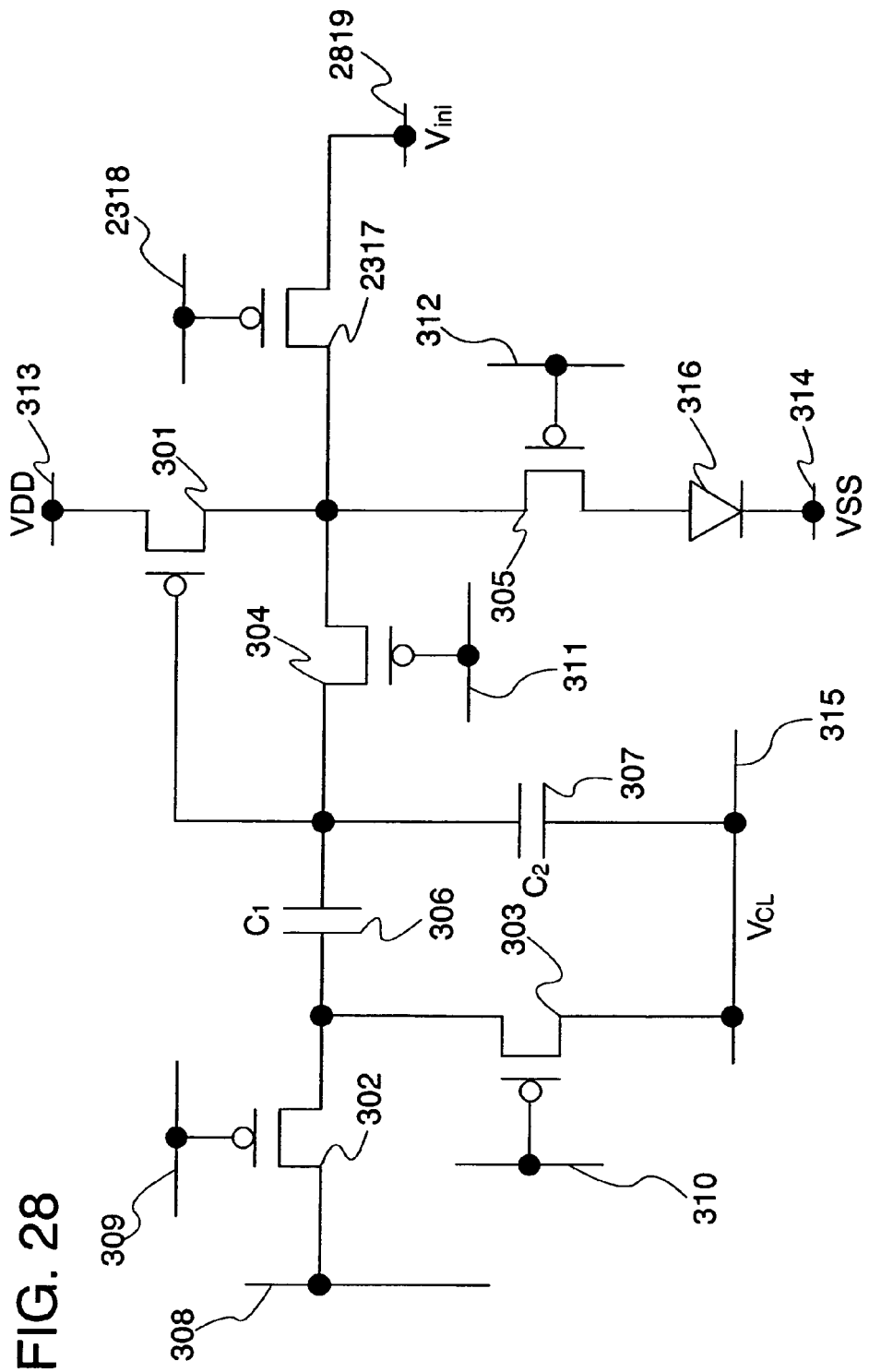
FIG. 28 illustrates an exemplary pixel configuration of the display device of the invention.

For example, FIG. 28 shows an example where an initialization transistor and an initialization line are provided in the pixel circuit shown in FIG. 3. In FIG. 28, the sixth transistor 2317 which is an initialization transistor, the fifth scan line 2318, and an initialization line 2819 are additionally provided in the pixel circuit shown in FIG. 3. Note that the gate terminal of the sixth transistor 2317 is connected to the fifth scan line 2318; the first terminal of the sixth transistor 2317 is connected to the second terminal of the first transistor 301, the first terminal of the fourth transistor 304, and the first terminal of the fifth transistor 305; and the second terminal of the sixth transistor 2317 is connected to the initialization line 2819.

The initialization line 2819 is applied with an initialization potential $V_{ini}$. Note that the potential relationship is $V_{ini}$<VDD−$|V_{th}|$.

Figure 29:
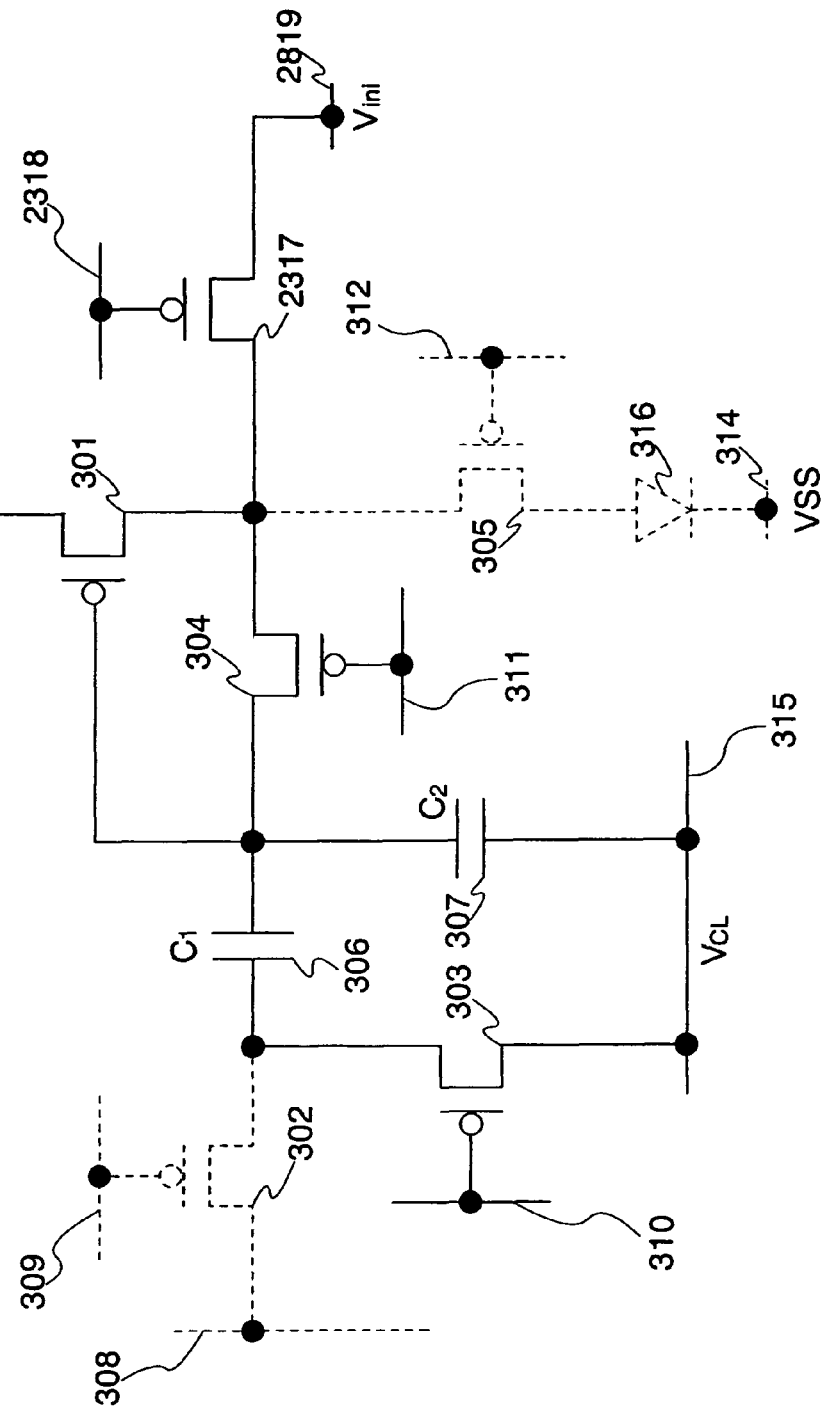
FIG. 29 illustrates the operation of a pixel circuit in the display device of the invention.

FIG. 29 shows the operation of the pixel circuit shown in FIG. 28 in the first period T1. In the first period T1, the first transistor 301 has a diode-connection state, and a current flows through the initialization line 2819. As a result, the second terminal of the first transistor 301, the first electrode of the first storage capacitor 306, and the first electrode of the second storage capacitor 307 have the same potential as the initialization line 2819, and thus $V_{ini}$−$V_{CL}$ (the difference between the initialization potential $V_{ini}$ and the potential $V_{CL}$ of the capacitive line 315) is held in the first storage capacitor 306 and the second storage capacitor 307.

Through the aforementioned operation, a voltage corresponding to the difference between the potential of the initialization line 2819 and the potential of the capacitive line 315 is held as an initialization voltage in the first storage capacitor 306 and the second storage capacitor 307.

In this manner, by providing the initialization line 2819 to set the second terminal of the first transistor 301 at $V_{ini}$−$V_{CL}$ (the difference between the initialization potential $V_{ini}$ and the potential $V_{CL}$ of the capacitive line 315) which is lower than VDD−$|V_{th}|$, the second terminal of the first transistor 301 can be surely set at a potential lower than VDD−|$V_{th}$|, and thus the threshold voltage can be surely acquired.

Figure 30:
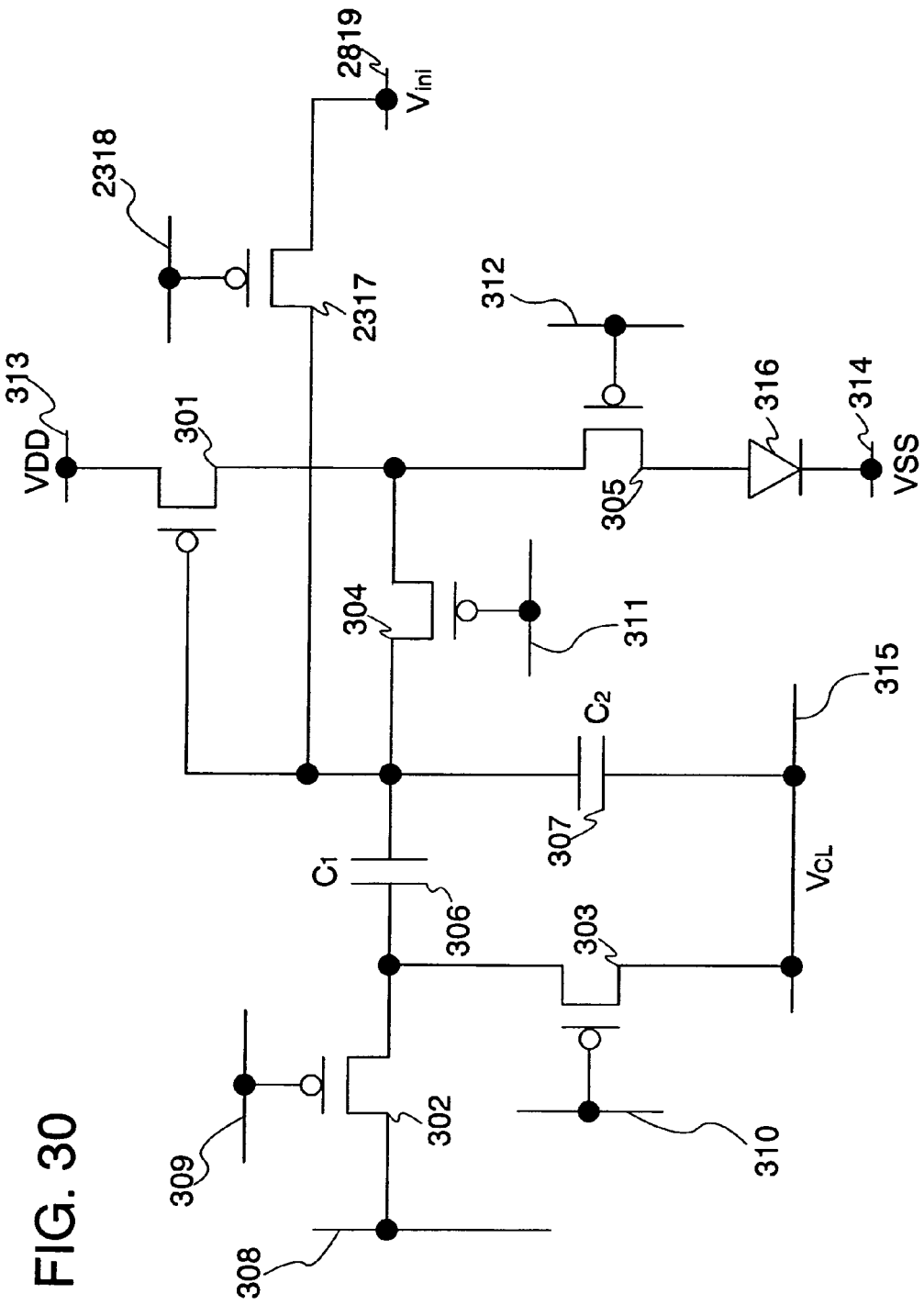
FIG. 30 illustrates an exemplary pixel configuration of the display device of the invention.

Note that the sixth transistor 2317 has only to be connected so that the second terminal of the first transistor 301 is set at the initialization potential $V_{ini}$. For example, as shown in FIG. 30, the first terminal of the sixth transistor 2317 may be connected to the gate terminal of the first transistor 301, the second terminal of the fourth transistor 304, the first electrode of the first storage capacitor 306, and the first electrode of the second storage capacitor 307.

In this manner, by performing initialization by additionally providing an initialization transistor and an initialization line, the threshold voltage of the first transistor can be acquired and compensated with more accuracy.

In addition, unlike the method of initialization described in Embodiment Mode 1 where a current flows into a light-emitting element while performing initialization, so that the light-emitting element emits light in the first period T1, the method described in this embodiment mode can suppress the light emission of a light-emitting element in the periods other than the light-emitting period since no current flows into the light-emitting element while performing initialization and thus the light-emitting element does not emit light in the first period T1.

Note that although the sixth transistor as an initialization transistor is a p-channel transistor in this embodiment mode, the invention is not limited to this, and thus the sixth transistor may be an n-channel transistor.

Note also that although this embodiment mode has illustrated an example where the first transistor is a p-channel transistor (FIG. 3), this embodiment mode can be similarly applied to the case where the first transistor is an n-channel transistor as in the pixel circuit shown in FIG. 9.

In the case of additionally providing an initialization transistor in the pixel circuit shown in FIG. 9, the initialization transistor is connected so that the second terminal of the first transistor is set at a potential higher than VSS+|$V_{th}$| (the sum of the power supply potential VSS and the threshold voltage |$V_{th}$| of the first transistor). Similarly, in the case of additionally providing an initialization line, the potential $V_{ini}$ applied to the initialization line is set at a potential higher than VSS+|$V_{th}$| (the sum of the power supply potential VSS and the threshold voltage |$V_{th}$| of the first transistor).

Although the initialization line is separately provided in this embodiment mode, another wire which is already provided in the pixel may be used as the initialization line. For example, any one of the first scan line to the fifth scan line may be used as the initialization line. Note that a wire that is used as the initialization line is not limited to one of the wires provided in the pixel of the present row, and thus it may be any wire provided in a pixel of another row. Accordingly, there is no need to additionally provide an initialization line, thereby the number of wires can be reduced and the aperture ratio of pixels can be increased.

This embodiment mode can be freely combined with Embodiment Mode 1 or Embodiment Mode 2.

Embodiment Mode 4

Although the potential of the second power supply line is a fixed potential in Embodiment Mode 1 to Embodiment Mode 3, the potential of the second power supply line may be changed in accordance with the first period to the fourth period. In this embodiment mode, description will be made of a case where the potential of the second power supply line is changed in accordance with the first period to the fourth period. Note that description will be made by using an EL element as an exemplary light-emitting element.

For example, although the fifth transistor 305 in the pixel circuit shown in FIG. 3 is turned off to flow no current into the light-emitting element 316 in the second period T2 and the third period T3, a current supply to the light-emitting element 316 can be stopped by, for example, removing the fifth transistor 305 and directly connecting the second terminal of the first transistor 301 to the first electrode of the light-emitting element 316, so that the potential of the second power supply line 314 in the second period T2 and the third period T3 can be higher than the potential of the first electrode of the light-emitting element 316. This is because a reverse bias is applied to the light-emitting element 316 by setting the potential of the second power supply line 314 to be higher than the potential of the first electrode of the light-emitting element 316.

Figure 31:
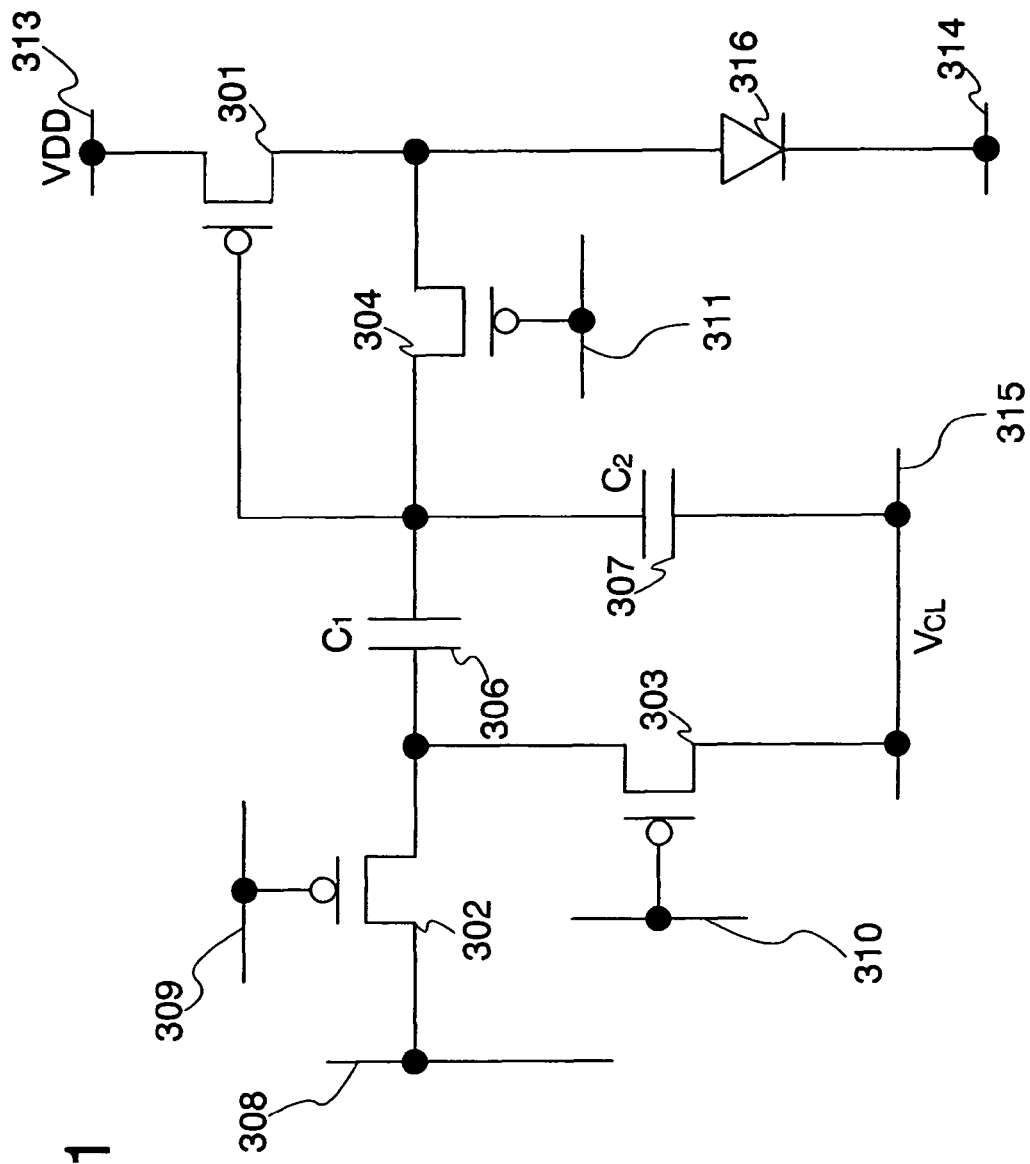
FIG. 31 illustrates an exemplary pixel configuration of the display device of the invention.
Figure 32:
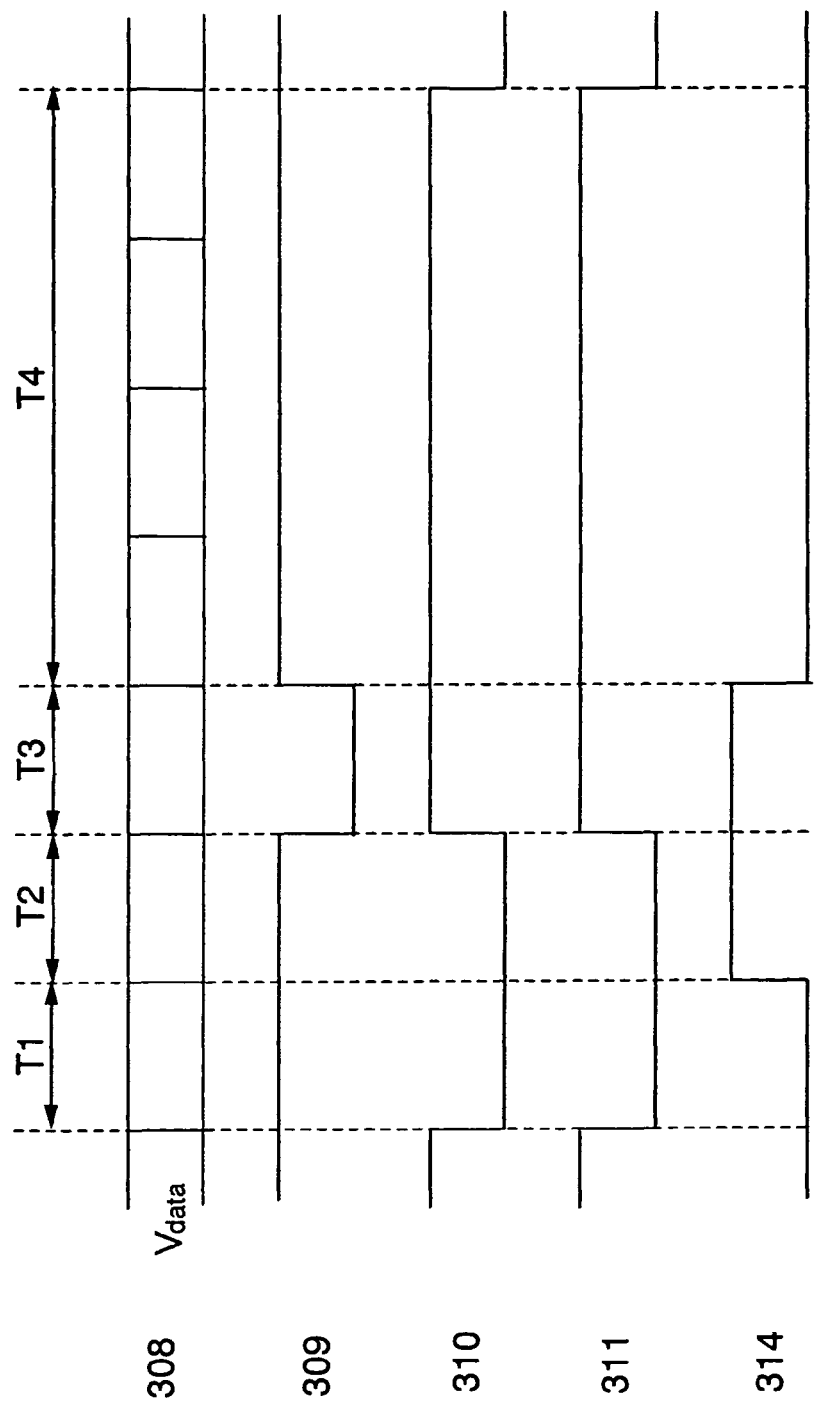
FIG. 32 illustrates the operation of a pixel circuit in the display device of the invention.

In FIG. 31, the second terminal of the first transistor 301 is connected to the first electrode of the light-emitting element 316 unlike the pixel circuit shown in FIG. 3. In addition, FIG. 32 shows a timing chart of video signal voltages and pulses that are input to the signal line 308, the first scan line 309 to the third scan line 311, and the second power supply line 314. Note that the timing at which pulses are input to the first scan line 309 to the third scan line 311 is the same as that of the pixel circuit shown in FIG. 3.

Note that in the second period T2 and the third period T3, a reverse bias is applied to the light-emitting element 316 by setting the potential of the second power supply line 314 to be higher than or equal to VDD−|$V_{th}$| (the difference between the power supply potential VDD and the threshold voltage |$V_{th}$| of the first transistor 301), so that a current supply to the light-emitting element 316 can be suspended in the second period T2 and the third period T3.

Note also that as a method of initialization, the method of initialization using an initialization transistor described in Embodiment Mode 3 may be used. In that case, initialization can be performed without supplying a current to the light-emitting element 316 by setting the potential of the second power supply line 314 to be higher than the potential of the second terminal of the first transistor 301 in the first period T1.

In addition, as another method of initialization, the method of initialization using an initialization transistor and an initialization line described in Embodiment Mode 3 may be used. In that case, initialization can be performed without supplying a current to the light-emitting element 316 by setting the potential of the second power supply line 314 to be higher than or equal to the initialization potential $V_{ini}$ in the first period T1.

Figure 33:
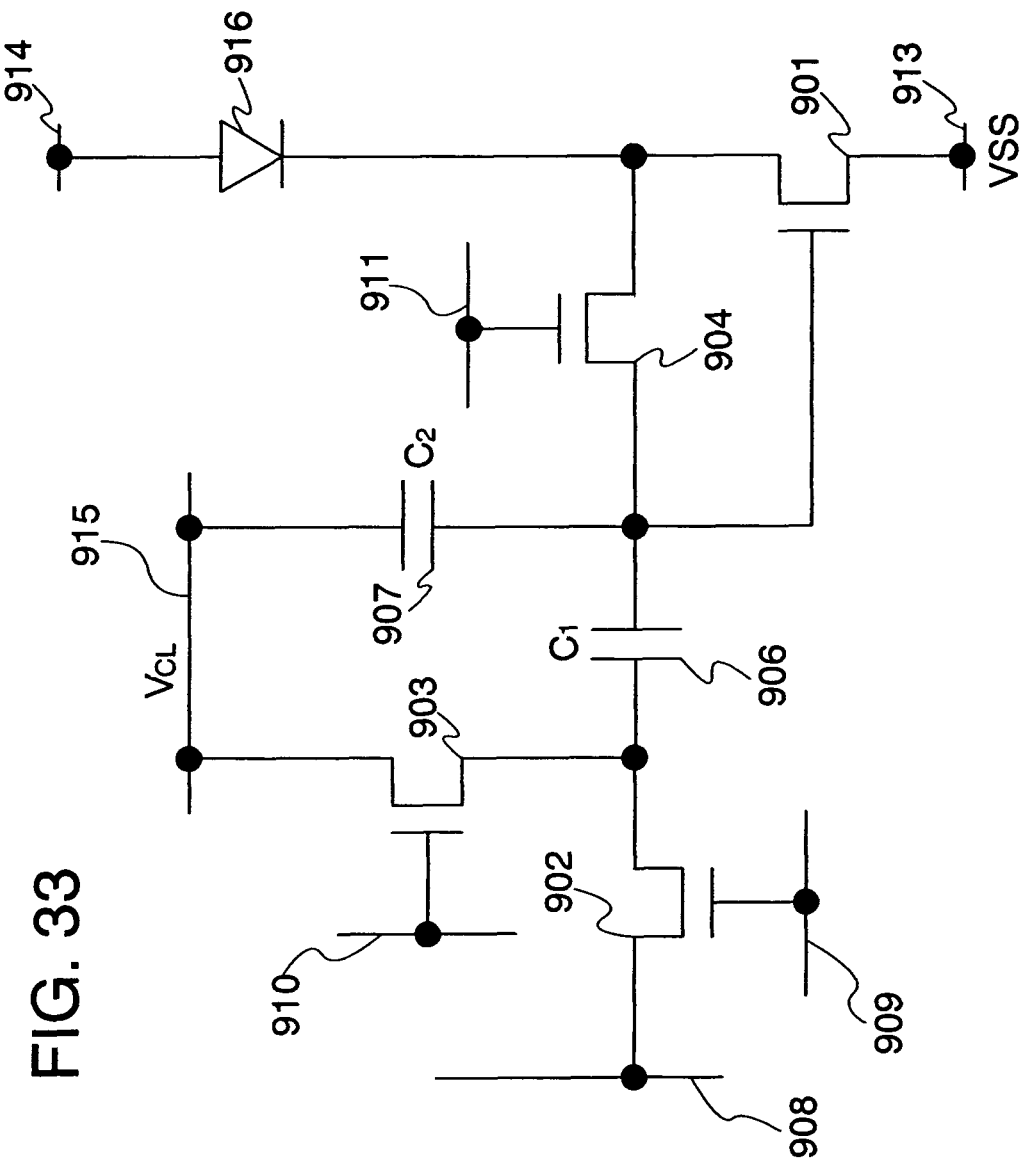
FIG. 33 illustrates an exemplary pixel configuration of the display device of the invention.
Figure 34:
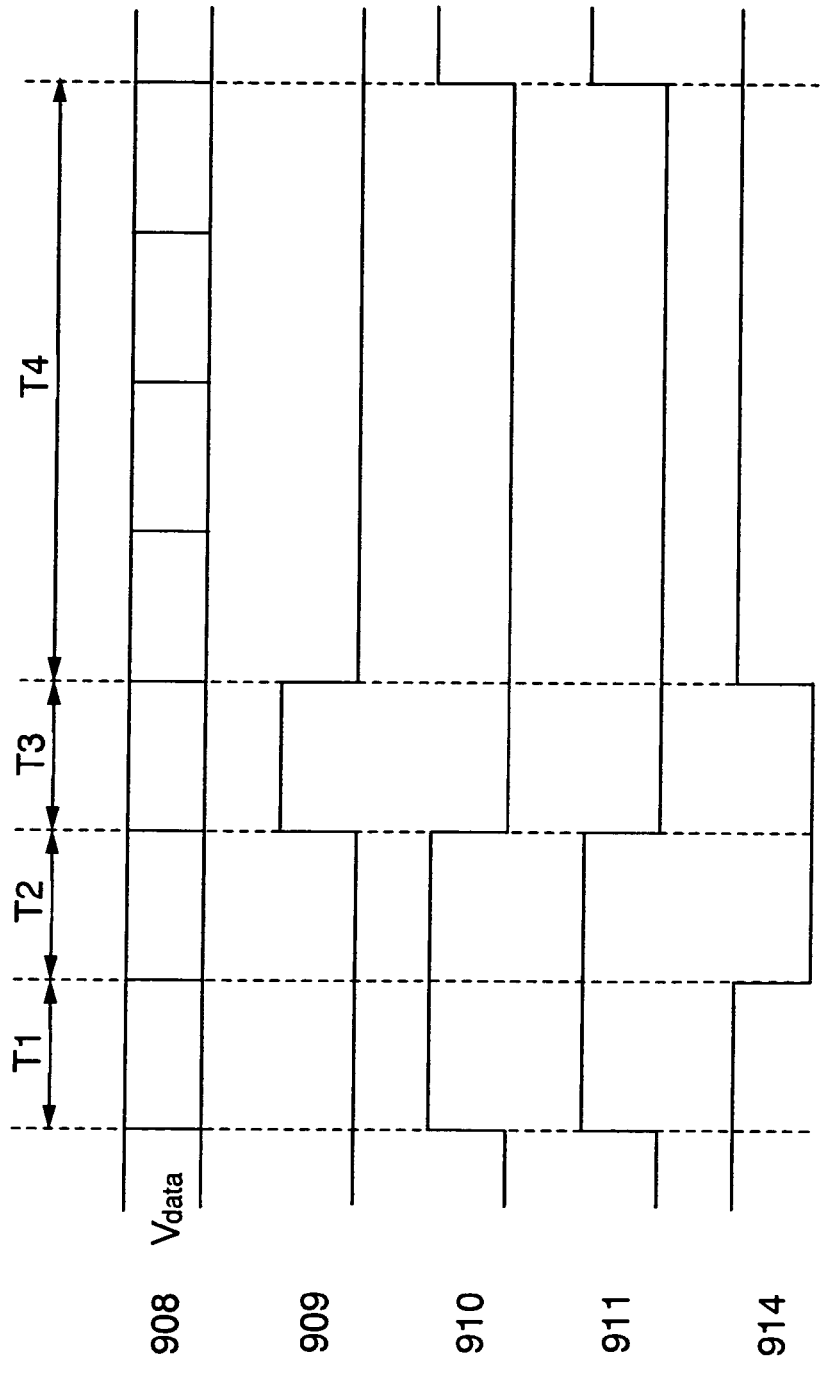
FIG. 34 illustrates the operation of a pixel circuit in the display device of the invention.

FIG. 33 and FIG. 34 show examples where the potential of the second power supply line is changed in the pixel circuit shown in FIG. 9.

In FIG. 33, the second terminal of the first transistor 901 is connected to the second electrode of the light-emitting element 916 in the pixel circuit shown in FIG. 9. In addition, FIG. 34 shows a timing chart of video signal voltages and pulses that are input to the signal line 908, the first scan line 909 to the third scan line 911, and the second power supply line 914. Note that the timing at which pulses are input to the first scan line 909 to the third scan line 911 is the same as that of the pixel circuit shown in FIG. 9.

Note that in the second period T2 and the third period T3, a reverse bias is applied to the light-emitting element 916 by setting the potential of the second power supply line 914 to be lower than the second electrode of the light-emitting element 916, so that a current supply to the light-emitting element 916 can be suspended in the second period T2 and the third period T3.

Note also that the aforementioned operation can be performed by setting the potential of the second power supply line 914 to be lower than or equal to VSS+|V$_{th}$| (the sum of the power supply potential VSS and the threshold voltage |V$_{th}$| of the first transistor 901) in the second period T2 and the third period T3.

Note also that as a method of initialization, the method of initialization using an initialization transistor described in Embodiment Mode 3 may be used. In that case, initialization can be performed without supplying a current to the light-emitting element 916 by setting the potential of the second power supply line 914 to be lower than the potential of the second terminal of the first transistor 901 in the first period T1.

In addition, as another method of initialization, the method of initialization using an initialization transistor and an initialization line described in Embodiment Mode 3 may be used. In that case, initialization can be performed without supplying a current to the light-emitting element 916 by setting the potential of the second power supply line 914 to be lower than or equal to the initialization potential V$_{ini}$ in the first period T1.

In this manner, by changing the potential of the second power supply line in each period, a current supply to the light-emitting element can be suspended in the periods other than the light-emitting period (T4); therefore, light emission of the light-emitting element in the periods other than the light-emitting element can be suppressed. Further, since there is no need to provide a fifth transistor and a fourth scan line, the aperture ratio of pixels can be increased and the number of scan line driver circuits can be reduced, thereby power consumption can be reduced.

This embodiment mode can be freely combined with any of Embodiment Modes 1 to 3.

Embodiment Mode 5

Although the second terminal of the third transistor and the second electrode of the second storage capacitor are connected to a common capacitive line in Embodiment Mode 1 to Embodiment Mode 4, they may be connected to different wires. In this embodiment mode, description will be made of a case where a reference line is additionally provided so that the second electrode of the second storage capacitor is connected to the capacitive line while the second terminal of the third transistor is connected to the reference line. Note that description will be made by using an EL element as an exemplary light-emitting element.

Figure 35:
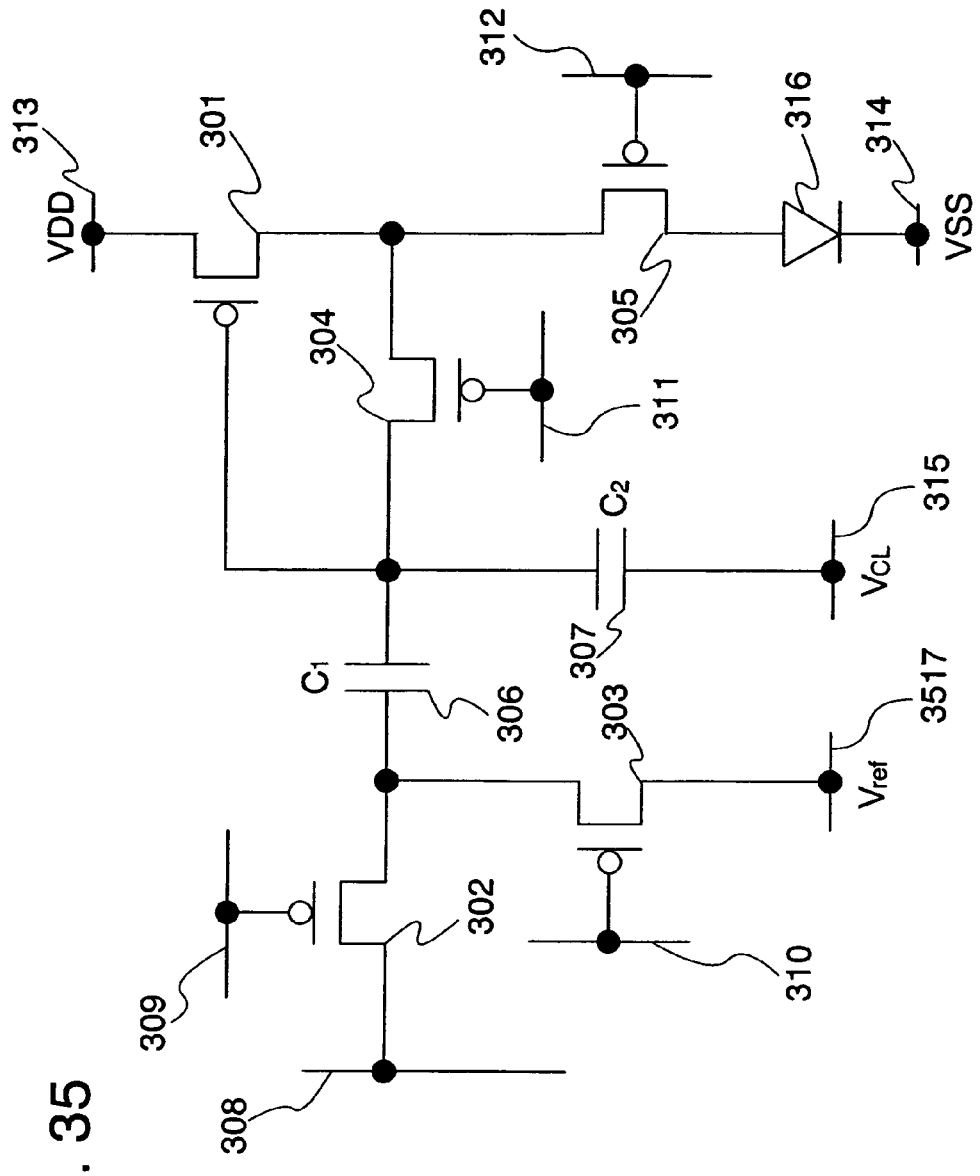
FIG. 35 illustrates an exemplary pixel configuration of the display device of the invention.

For example, FIG. 35 shows an example of the pixel circuit shown in FIG. 3, where the second electrode of the second storage capacitor is connected to the capacitive line, while the second terminal of the third transistor is connected to the reference line. In FIG. 35, a reference line 3517 is additionally provided in the pixel circuit shown in FIG. 3. Then, the second electrode of the second storage capacitor 307 is connected to the capacitive line 315, and the second terminal of the third transistor 303 is connected to the reference line 3517.

In addition, the reference line 3517 is applied with a reference potential V$_{ref}$.

The operation process of the pixel circuit shown in FIG. 35 is almost the same as the operation process of the pixel circuit shown in FIG. 3. What is different from the operation process of the pixel circuit shown in FIG. 3 is the level of a voltage held in the first storage capacitor 306 and the second storage capacitor 307, and the amount of current I$_{OLED}$ which flows into the light-emitting element 316.

First, initialization is performed in the first period T1.

Next, in the second period T2, a voltage based on the threshold voltage |V$_{th}$| of the first transistor 301 is held in the first storage capacitor 306 and the second storage capacitor 307. At this time, the first storage capacitor 306 holds VDD−|V$_{th}$|−V$_{ref}$ (a potential obtained by subtracting the threshold voltage |V$_{th}$| of the first transistor 301 and the reference potential V$_{ref}$ from the power supply potential VDD). Meanwhile, the second storage capacitor 307 holds VDD−|V$_{th}$|−V$_{CL}$ (a potential obtained by subtracting the threshold voltage |V$_{th}$| of the first transistor 301 and the potential V$_{CL}$ of the capacitive line 315 from the power supply potential VDD).

Next, in the third period T3, a voltage based on the video signal voltage V$_{data}$ and the threshold voltage |V$_{th}$| of the first transistor 301 is held in the first storage capacitor 306 and the second storage capacitor 307. At this time, given that the voltages held in the first storage capacitor 306 and the second storage capacitor 307 are V$_{C1}$(T3) and V$_{C2}$(T3) respectively, V$_{C1}$(T3) and V$_{C2}$(T3) can be represented by the following formulas (5) and (6) respectively.

$$V_{C1}(T3) = VDD - |V_{th}| - \frac{C_2}{C_1+C_2}V_{data} - \frac{C_1}{C_1+C_2}V_{ref} \quad \text{formula (5)}$$

$$V_{C2}(T3) = VDD - |V_{th}| + \frac{C_1}{C_1+C_2}(V_{data} - V_{ref}) - V_{CL} \quad \text{formula (6)}$$

Next, in the fourth period T4, the current I$_{OLED}$ which is dependent on the video signal voltage V$_{data}$ flows into the light-emitting element 316, so that the light-emitting element 316 emits light. At this time, given that the gate-source voltage of the first transistor 301 is V$_{gs}$(T4), V$_{gs}$(T4) can be represented by the following formula (7). Thus, a current I$_{OLED}$ which flows into the light-emitting element 316 can be represented by the following formula (8), $$|V_{gs}(T4)| = \quad \text{formula (7)}$$
$$VDD - V_{C2}(T3) - V_{CL} = |V_{th}| - \frac{C_1}{C_1+C_2}(V_{data} - V_{ref})$$

$$I_{OLED} = \frac{\beta}{2}(|V_{gs}(T4)| - |V_{th}|)^2 = \frac{\beta}{2}\left(\frac{C_1}{C_1+C_2}\right)^2(V_{data} - V_{ref})^2 \quad \text{formula (8)}$$

Note that in order to turn on the first transistor 301 in the fourth period T4, the video signal voltage V$_{data}$ is set lower than or equal to the reference potential V$_{ref}$.

Figure 36:
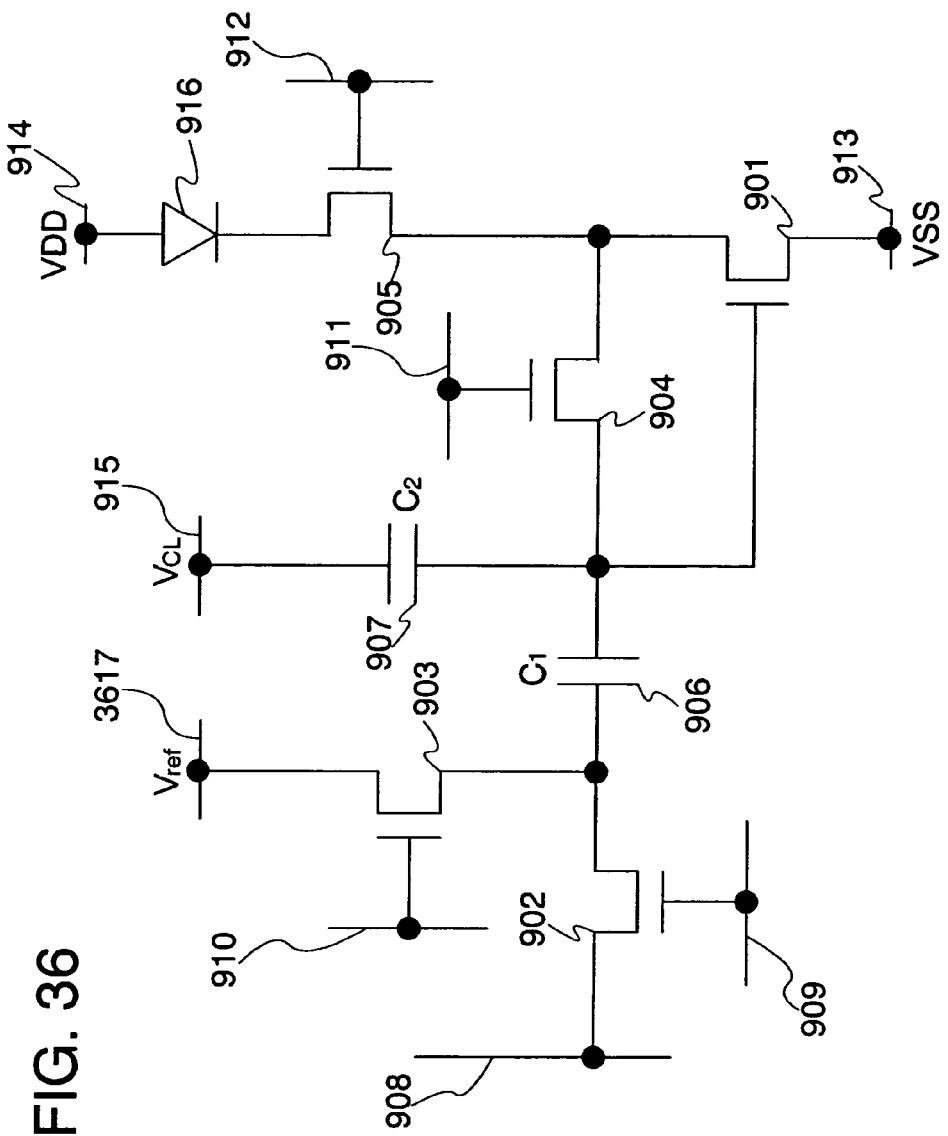
FIG. 36 illustrates an exemplary pixel configuration of the display device of the invention.

In addition, as another example, FIG. 36 shows an example of the pixel circuit shown in FIG. 9, where the second electrode of the second storage capacitor is connected to the capacitive line, while the second terminal of the third transistor is connected to the reference line. In FIG. 36, a reference line 3617 is additionally provided in the pixel circuit shown in FIG. 9. Then, the second electrode of the second storage capacitor 907 is connected to the capacitive line 915 and the second terminal of the third transistor 903 is connected to the reference line 3617.

In addition, the reference line 3617 is applied with a reference potential $V_{ref}$.

The operation process of the pixel circuit shown in FIG. 36 is almost the same as the operation process of the pixel circuit shown in FIG. 9. What is different from the operation process of the pixel circuit shown in FIG. 9 is the level of a voltage held in the first storage capacitor 906 and the second storage capacitor 907, and the amount of current $I_{OLED}$ which flows into the light-emitting element 916 in the light-emitting period T4. The amount of current $I_{OLED}$ which flows into the light-emitting element 916 in the light-emitting period T4 can be represented by formula (8) similarly to the pixel circuit shown in FIG. 35.

Next, in the fourth period T4, the video signal voltage $V_{data}$ is set higher than or equal to the reference potential $V_{ref}$ in order to turn on the first transistor 901.

In this manner, in the pixel circuits shown in FIG. 35 and FIG. 36, the current $I_{OLED}$ which flows into the light-emitting element depends on the difference between the video signal voltage $V_{data}$ and the reference potential $V_{ref}$ as can be seen in formula (8).

Note that in the pixel circuits shown in FIGS. 35 and 36, the potential range of the reference potential $V_{ref}$ is not particularly limited.

In this manner, by separately providing a capacitive line and a reference line, potentials of the capacitive line and the reference line can be separately controlled. In addition, although the potential range of the video signal voltage $V_{data}$ depends on the potential $V_{CL}$ of the capacitive line in the pixel configuration shown in Embodiment Mode 1 to Embodiment Mode 4, the potential range of the video signal voltage $V_{data}$ depends on the reference potential $V_{ref}$ in the pixel configuration of this embodiment mode. Therefore, the potential of the video signal voltage $V_{data}$ can be set within the optimal range by fixing the potential $V_{CL}$ of the capacitive line at an appropriate level and setting the reference potential $V_{ref}$ within an optimal range.

Note that although a reference line is separately provided in this embodiment mode, the reference line may be replaced by another wire which is already provided in the pixel. For example, any one of the first to fifth scan lines may be used as the reference line. Note also that a wire that is used as the reference line is not limited to one of the wires provided in the pixel of the present row, and thus it may be any wire provided in a pixel of another row. Accordingly, there is no need to additionally provide an initialization line, thereby the number of wires can be reduced and the aperture ratio of pixels can be increased.

This embodiment mode can be freely combined with any of Embodiment Modes 1 to 4.

Embodiment Mode 6

Figure 37:
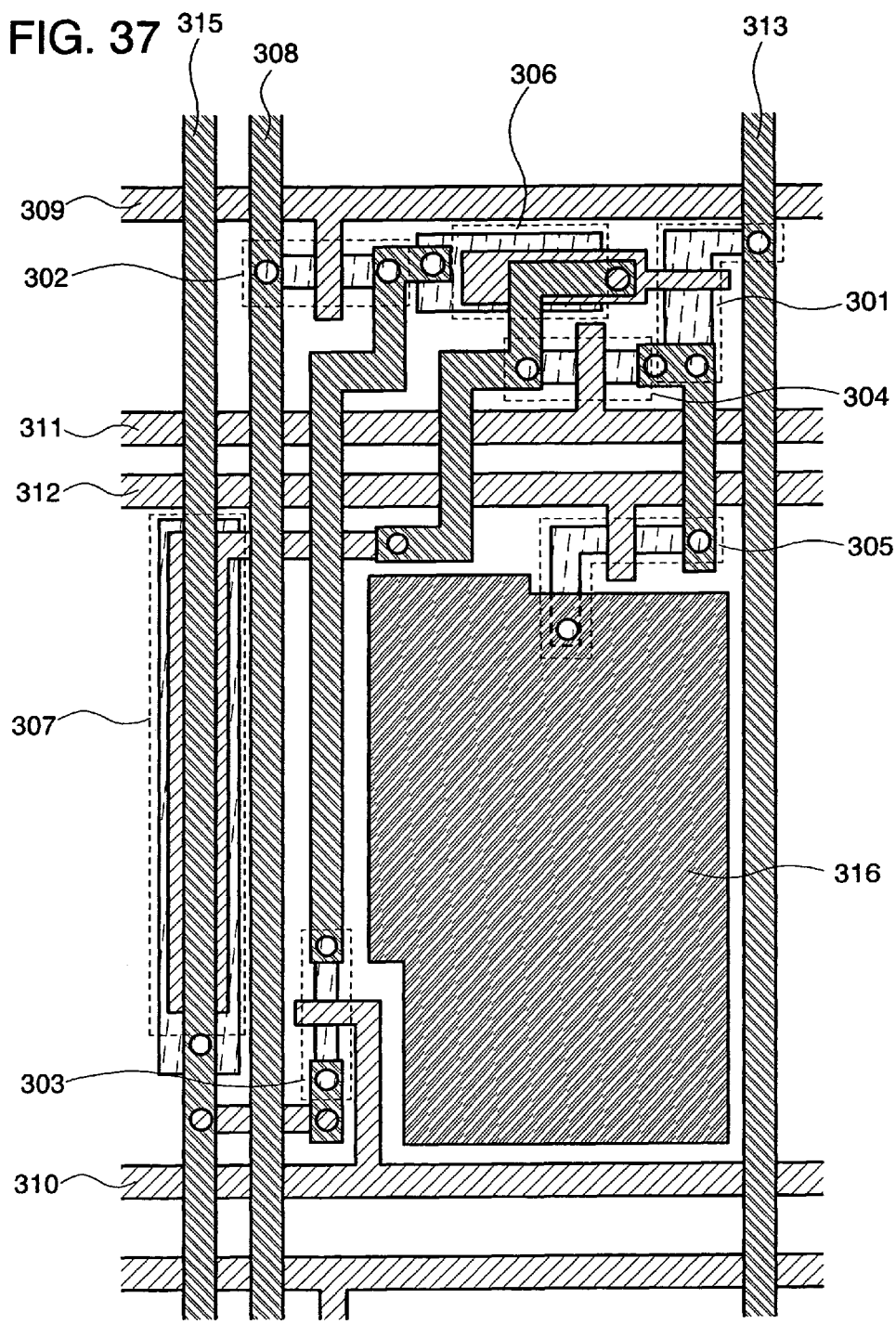
FIG. 37 illustrates an exemplary layout of a pixel configuration of the display device of the invention.

In this embodiment mode, a pixel layout of the display device of the invention will be described. For example, FIG. 37 shows a layout of the pixel circuit shown in FIG. 3. Note that common portions to FIG. 37 and FIG. 3 are denoted by common reference numerals. Note also that the layout is not limited to FIG. 37.

The pixel circuit shown in FIG. 3 includes the first transistor 301 to the fifth transistor 305, the first storage capacitor 306, the second storage capacitor 307, the signal line 308, the first scan line 309 to the fourth scan line 312, the first power supply line 313, the second power supply line 314, the capacitive line 315, and the light-emitting element 316.

The first scan line 319 to the forth scan line 312 are formed from a first wire, while the signal line 308, the first power supply line 313, the second power supply line 314, and the capacitive line 315 are formed from a second wire.

In the case of a top-gate structure, films are stacked in order from a substrate, a semiconductor layer, a gate insulating film, a first wire, an interlayer insulating film, and a second wire. On the other hand, in the case of a bottom-gate structure, films are stacked in order from a substrate, a first wire, a gate insulating film, a semiconductor layer, an interlayer insulating film, and a second wire.

Note that in the pixel configuration of this embodiment mode, when the first transistor 301 is formed to have the largest value of W/L (ratio of the channel width W to the channel length L) among the first transistor 301 to the fifth transistor 305, a current flowing between the drain and the source of the first transistor 301 can be further increased. Accordingly, the operation of acquiring a voltage based on the video signal voltage $V_{data}$ and the threshold voltage $|V_{th}|$ of the first transistor 301 can be performed with a larger current in the third period T3, which leads to a faster operation. Further, the current $I_{OLED}$ which flows into the light-emitting element in the fourth period T4 can be further increased, which leads to higher luminance. In order to obtain the first transistor 301 having the largest value of W/L among all the transistors, the first transistor 301 is formed to have the largest channel width W among the first transistor 301 to the fifth transistor 305 in FIG. 37.

Note also that although this embodiment mode has illustrated the first transistor 301 to the fifth transistor 305 having a single-gate structure, the invention is not limited to this. The structure of the first transistor 301 to the fifth transistor 305 may be various modes. For example, a multi-gate structure having two or more gate electrodes may be employed. When a multi-gate structure is employed, a structure where channel regions are connected in series is provided; therefore, a structure where a plurality of transistors are connected in series is provided. By employing a multi-gate structure, off-current can be reduced as well as the withstand voltage can be increased to improve the reliability of the transistor, and even if a drain-source voltage fluctuates when the transistor operates in the saturation region, flat characteristics can be provided without causing fluctuations of a drain-source current very much. In addition, a structure where gate electrodes are formed above and below a channel may be employed. By using a structure where gate electrodes are formed above and below a channel, the channel region is enlarged to increase the amount of current flowing therethrough, and a depletion layer can be easily formed to improve the S value. When gate electrodes are formed above and below a channel, a structure where a plurality of transistors are connected in parallel is provided.

In addition, any of the following structures may be employed: a structure where a gate electrode is formed above a channel; a structure where a gate electrode is formed below a channel; a staggered structure; an inversely staggered structure; and a structure where a channel region is divided into a plurality of regions, and the divided regions are connected in parallel or in series. In addition, a channel (or a part of it) may overlap with a source electrode or a drain electrode. By forming a structure where a channel (or a part of it) overlaps with a source electrode or a drain electrode, electric charges can be prevented from gathering locally in a part of the channel, which would otherwise cause an unstable operation. In addition, an LDD (Lightly Doped Drain) region may be provided. By providing an LDD region, off-current can be reduced as well as the withstand voltage can be increased to improve the reliability of the transistor, and even if a drain-source voltage fluctuates when the transistor operates in the saturation region, flat characteristics can be provided without causing fluctuations of a drain-source current very much.

Note that wires and electrodes are formed by using one or more elements selected from among aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O); a compound or an alloy containing one or more of such elements (e.g., indium tin oxide (ITO), indium zinc oxide (IZO), indium tin oxide doped with silicon oxide (ITSO), zinc oxide (ZnO), aluminum neodymium (Al—Nd), magnesium silver (Mg—Ag), or the like); a substance obtained by combining such compounds; or the like. Alternatively, a compound of silicon and the aforementioned material (silicide) (e.g., aluminum silicon, molybdenum silicon, nickel silicide, or the like) or a compound of nitride and the aforementioned material (e.g., titanium nitride, tantalum nitride, molybdenum nitride, or the like) can be used.

Note also that silicon (Si) may contain n-type impurities (phosphorus or the like) or p-type impurities (boron or the like) in large quantities. When silicon contains such impurities, conductivity is improved so that the silicon behaves in a similar manner to a normal conductor; therefore, it can be easily utilized as a wire or an electrode. Silicon may have any of a single crystalline state, a polycrystalline state (polysilicon), or an amorphous state (amorphous silicon). By using single crystalline silicon or polycrystalline silicon, resistance can be decreased. On the other hand, by using amorphous silicon, wires or electrodes can be manufactured through a simple process. Note that since aluminum and silver have high conductivity, signal delay can be decreased by using them. Further, since aluminum and silver can be easily etched, they can be easily patterned to enable microfabrication.

Note also that copper has high conductivity; therefore, signal delay can be decreased by using copper. It is also desirable to use molybdenum since it can be manufactured without causing problems such as defects of materials even when it contacts silicon or an oxide semiconductor such as ITO or IZO, while at the same time it can be easily patterned and etched as well as having high heat resistance. It is also desirable to use titanium since it can be manufactured without causing problems such as defects of materials even when it contacts silicon or an oxide semiconductor such as ITO or IZO, while at the same time it can be easily patterned and etched as well as having high heat resistance. It is also desirable to use tungsten or neodymium since both of them have high heat resistance. In particular, when an alloy of neodymium and aluminum is employed, heat resistance is improved so that aluminum hardly has hillocks, which is desirable. Note also that indium tin oxide (ITO), indium zinc oxide (IZO), indium tin oxide doped with silicon oxide (ITSO), zinc oxide (ZnO), and silicon (Si) have light-transmitting properties; therefore, they can be used for a portion to transmit light, which is desirable. For exarnple, such materials can be used as a pixel electrode or a common electrode.

Note also that such materials can be formed either in a single layer or in stacked layers to form a wire or an electrode. When a single-layer structure is employed, a manufacturing process can be simplified to reduce the manufacturing time, thereby cost can be reduced. On the other hand, when a multi-layer structure is employed, advantages of each material can be effectively utilized while disadvantages of each material can be reduced, thereby a wire or an electrode with high performance can be formed. For example, when a multi-layer structure is formed to contain a low resistance material (e.g., aluminum or the like), resistance of a wire can be decreased. In addition, when a multi-layer structure is formed to contain a high heat-resistance material, such as a stacked structure where a low heat-resistance material which has disadvantages is sandwiched between high heat-resistance materials, heat resistance of a wire or an electrode as a whole can be increased.

For example, it is desirable to form a stacked structure where a layer containing aluminum is sandwiched between layers containing molybdenum or titanium. In addition, in the case where a wire or an electrode has a portion having a direct contact with another wire or electrode which is made of another material, or the like, they may adversely affect each other. For example, there is a case where one material is mixed into another material, thereby the properties of the materials are changed, which in turn hinders the original object or causes problems during manufacture so that the normal manufacture cannot be achieved. In such a case, the problems can be solved by sandwiching a layer between other layers or covering a layer with another layer. For example, when indium tin oxide (ITO) and aluminum are made in contact with each other, it is desirable to sandwich titanium or molybdenum between them. In addition, when silicon and aluminum are made in contact with each other, it is desirable to sandwich titanium or molybdenum between them.

In accordance with the pixel in this embodiment mode, given that an n-channel transistor is used for the fourth transistor 304 similarly to the pixel circuit shown in FIG. 3, leak current of the fourth transistor 304 can be decreased than the case of using a p-channel transistor. Therefore, leaks of charges held in the first storage capacitor 306 and the second storage capacitor 307 can be reduced, which leads to smaller fluctuations of a voltage held in the first storage capacitor 306 and the second storage capacitor 307. Accordingly, a constant voltage is continuously applied to the gate terminal of the first transistor 301, in particular, in the light-emitting period. Thus, the light-emitting element can be supplied with a constant current. As a result, the light-emitting element can emit light at a constant luminance, thereby luminance unevenness can be reduced.

Note that this embodiment mode can be freely combined with any of Embodiment Modes 1 to 5.

Embodiment Mode 7

In this embodiment mode, description will be made of a configuration and operation of a signal line driver circuit, a scan line driver circuit, and the like of a display device.

Figure 38:
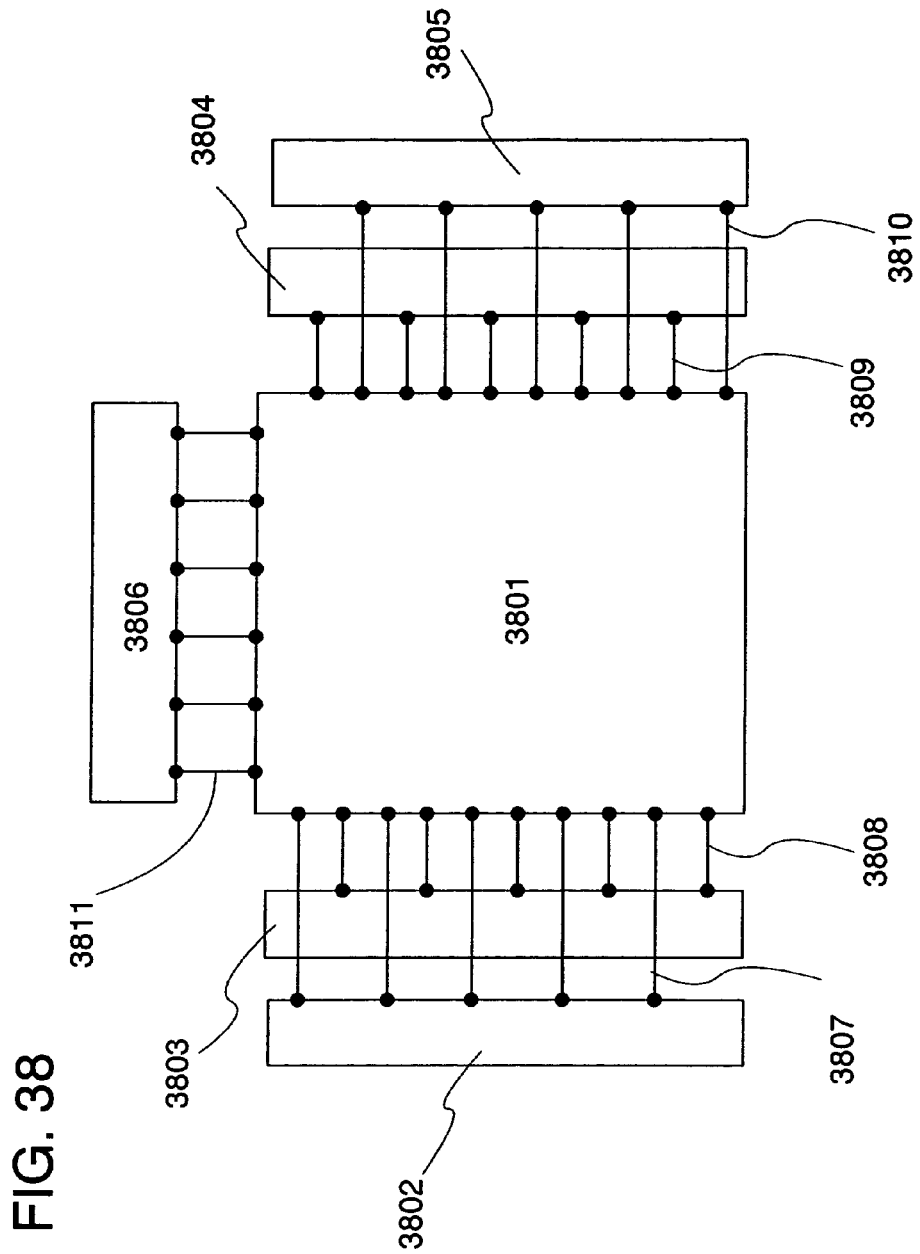
FIG. 38 illustrates an exemplary configuration of the display device of the invention.

For example, a display device having a pixel circuit whose operation is controlled with a signal line and first to fourth scan lines as shown in FIG. 3 and FIG. 9 has a configuration as shown in FIG. 38. The display device shown in FIG. 38 includes a pixel portion 3801, a first scan line driver circuit 3802 to a fourth scan line driver circuit 3805, and a signal line driver circuit 3806.

Here, the first scan line driver circuits 3802 to the fourth scan line driver circuit 3805 are driver circuits for sequentially outputting selection signals to a first scan line 3807 to a fourth scan line 3810 respectively.

First, description will be made of a signal line driver circuit. The signal line driver circuit 3806 sequentially outputs video signals to the pixel portion 3801. In the pixel portion 3801, images are displayed by controlling the light-emitting state of pixels in response to video signals.

Figure 39A:
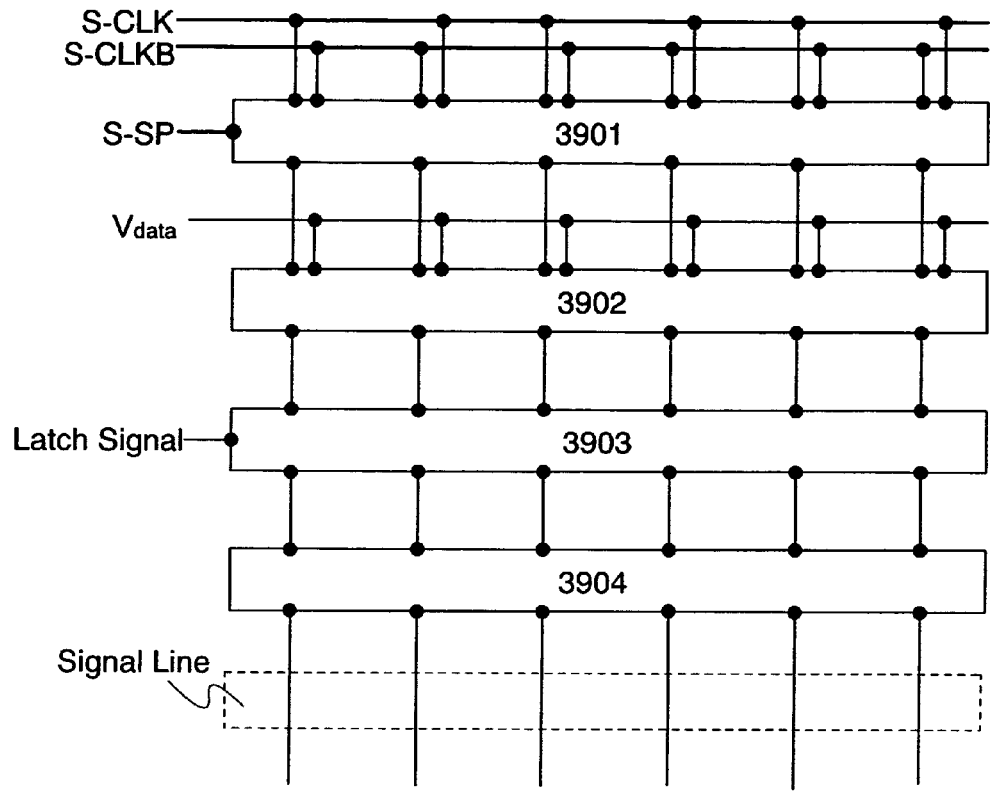
FIGS. 39A and 39B illustrate exemplary configurations of a signal line driver circuit in the display device of the invention.
Figure 39B:
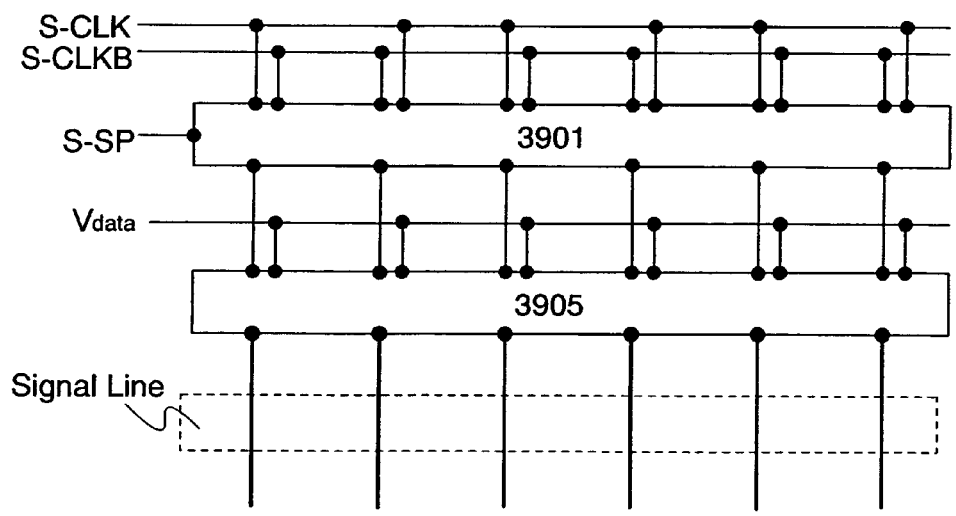

FIGS. 39A and 39B show exemplary configurations of the signal line driver circuit 3806. FIG. 39A shows an example of the signal line driver circuit 3806 in the case where signals are supplied to pixels with a line sequential drive. The signal line driver circuit 3806 in this case includes a shift register 3901, a first latch circuit 3902, a second latch circuit 3903, and an amplifier circuit 3904 as the main components. Note that the amplifier circuit 3904 may have a function of converting digital signals into analog signals or a function of gamma correction.

Here, operation of the signal line driver circuit 3806 shown in FIG. 39A will be briefly described. Clock signals (S-CLK), start pulses (S-SP), and inverted clock signals (S-CLKB) are input into the shift register 3901, and sampling pulses are sequentially output in accordance with the timing of these signals.

The sampling pulse output from the shift register 3901 are input to the first latch circuit 3902. The first latch circuit 3902 receives video signals with a voltage $V_{data}$ from a video signal line, and holds the video signals in respective stages of the first latch circuit 3902 in accordance with the input timing of the sampling pulses.

When holding of video signals in the respective stages of the first latch circuit 3902 is completed, latch signals are input from a latch control line in a horizontal flyback period, so that the video signals which have been held in the first latch circuit 3902 are transferred to the second latch circuit 3903 all at once. After that, one row of the video signals held in the second latch circuit 3903 are concurrently input to the amplifier circuit 3904. Then, the amplitude of the video signal voltage $V_{data}$ is amplified in the amplifier circuit 3904, and the video signals are input to the pixel portion 3801 from respective signal lines.

While the video signals held in the second latch circuit 3903 are being input to the amplifier circuit 3904 and subsequently input to the pixel portion 3801, the shift register 3901 outputs sampling pulses again. That is, two operations are performed at the same time. Accordingly, a line sequential drive can be performed. Hereinafter, such operations are repeated.

Note that there is a case where signals are supplied to pixels with a dot sequential drive. FIG. 39B shows an example of the signal line driver circuit 3806 in that case. The signal line driver circuit 3806 in this case includes a shift register 3901 and a sampling circuit 3905. Sampling pulses are output from the shift register 3901 to the sampling circuit 3905. In addition, the sampling circuit 3905 receives video signals with a voltage $V_{data}$ from a video signal line, and sequentially outputs the video signals to the pixel portion 3801 in response to the sampling pulses. Accordingly, dot sequential drive can be performed.

Figure 40:
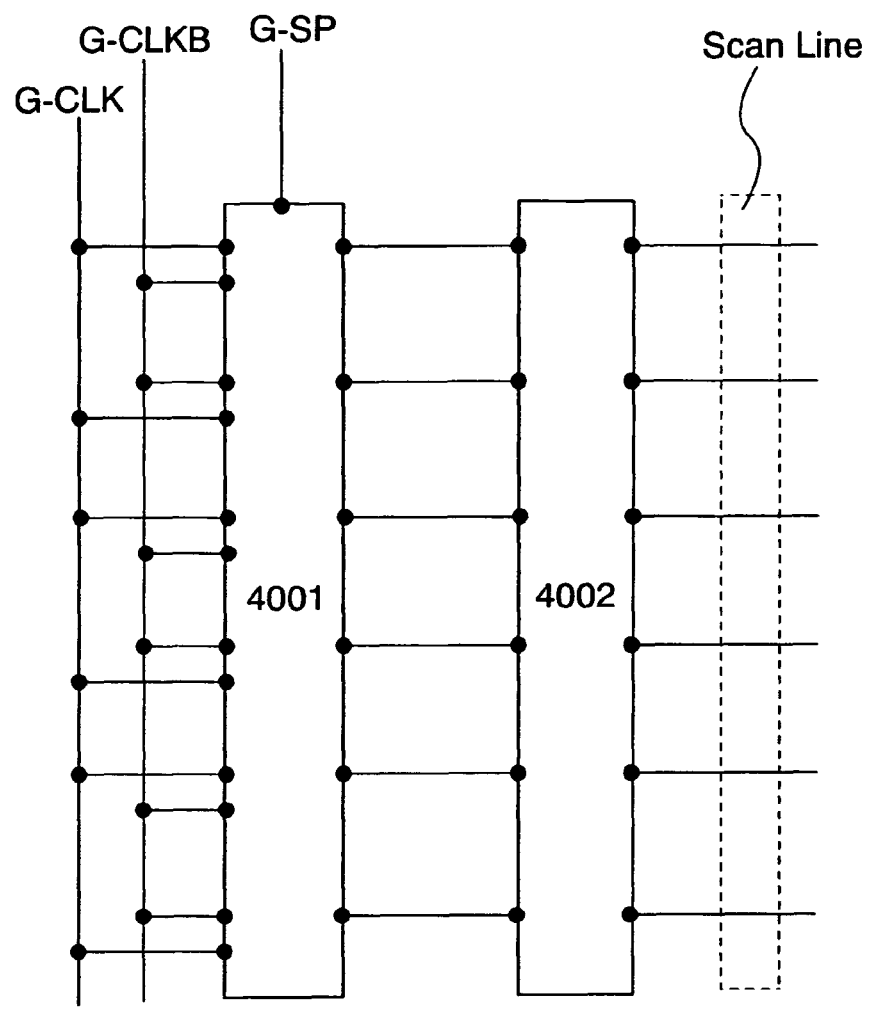
FIG. 40 illustrates an exemplary configuration of a scan line driver circuit in the display device of the invention.

Next, scan line driver circuits will be described. The first scan line driver circuit 3802 to the fourth scan line driver circuit 3805 sequentially output selection signals to the pixel portion 3801. FIG. 40 shows an exemplary configuration of the first scan line driver circuit 3802 to the fourth scan line driver circuit 3805. The scan line driver circuit includes a shift register 4001, an amplifier circuit 4002, and the like as the main components.

Next, operation of the first scan line driver circuit 3802 to the fourth scan line driver circuit 3805 shown in FIG. 40 will be briefly described. Clock signals (G-CLK), start pulses (G-SP), and inverted clock signals (G-CLKB) are input into the shift register 4001, and sampling pulses are sequentially output in accordance with the timing of these signals. The output sampling pulses are amplified in the amplifier circuit 4002 and then input to the pixel portion 3801 through respective scan lines.

Note that the amplifier circuit 4002 may include a buffer circuit or a level shifter circuit. In addition, the scan line driver circuit may include a pulse width control circuit and the like in addition to the shift register 4001 and the amplifier circuit 4002.

By using the signal line driver circuit and the scan line driver circuits as described above, the pixel circuit of the invention can be driven.

Figure 41:
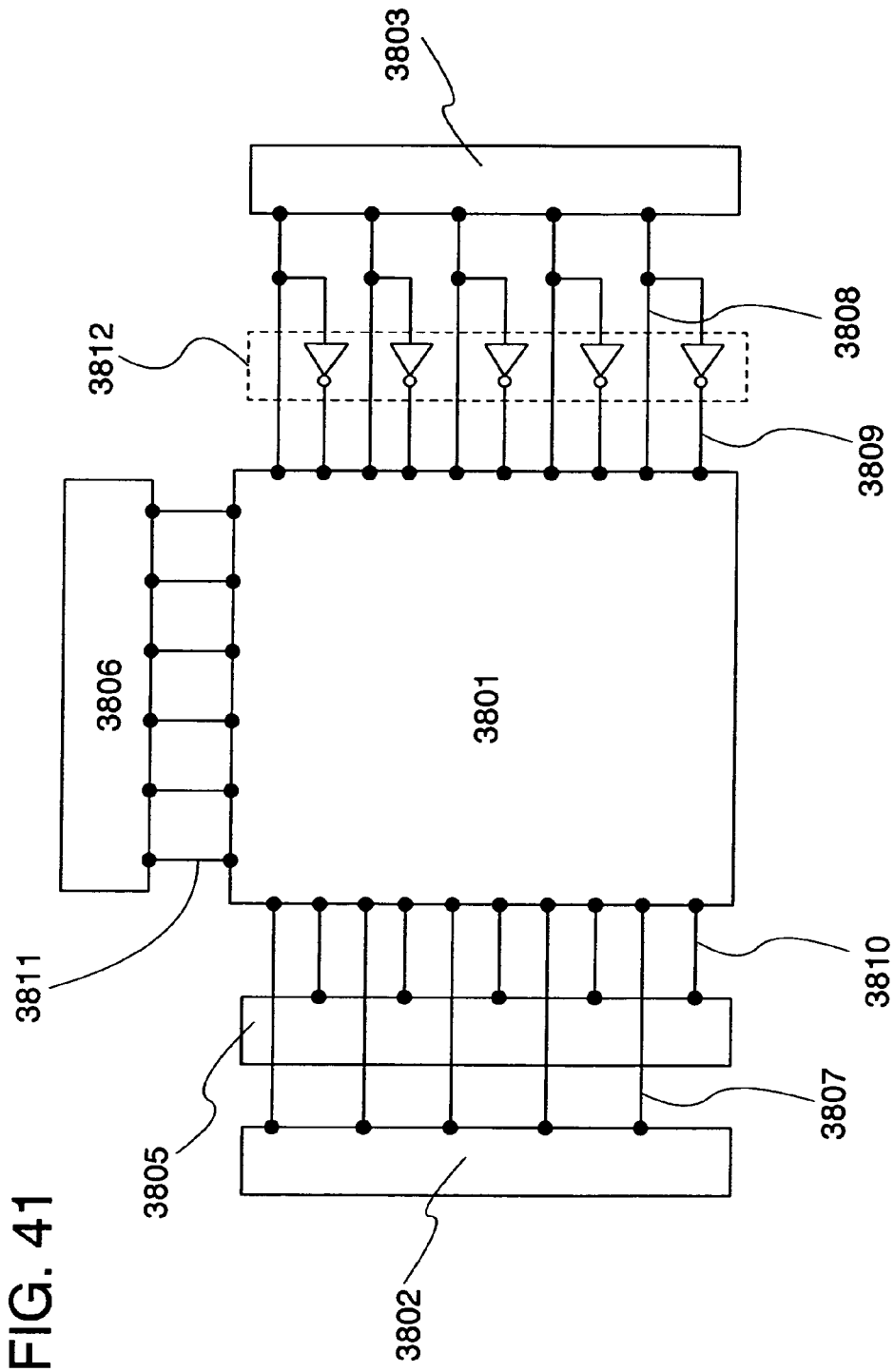
FIG. 41 illustrates an exemplary configuration of the display device of the invention.

Note that in the case where the third transistor and the fourth transistor have different conductivity types as in the pixel circuit shown in FIG. 17, for example, selection signals that are inverted from each other are input to the second and third scan lines. Accordingly, a selection signal input to either one of the second or third scan line may be controlled by using either one of the second scan line driver circuit or the third scan line driver circuit, while the other scan line may be input with an inverted signal thereof. FIG. 41 shows an exemplary configuration of the display device in that case. In FIG. 41, selection signals input to the second scan line 3808 are controlled with the second scan line driver circuit 3803. In addition, signals obtained by inverting the selection signals input to the second scan line 3808 are produced by using an inverter 3812, which is input to the third scan line 3809.

Figure 42:
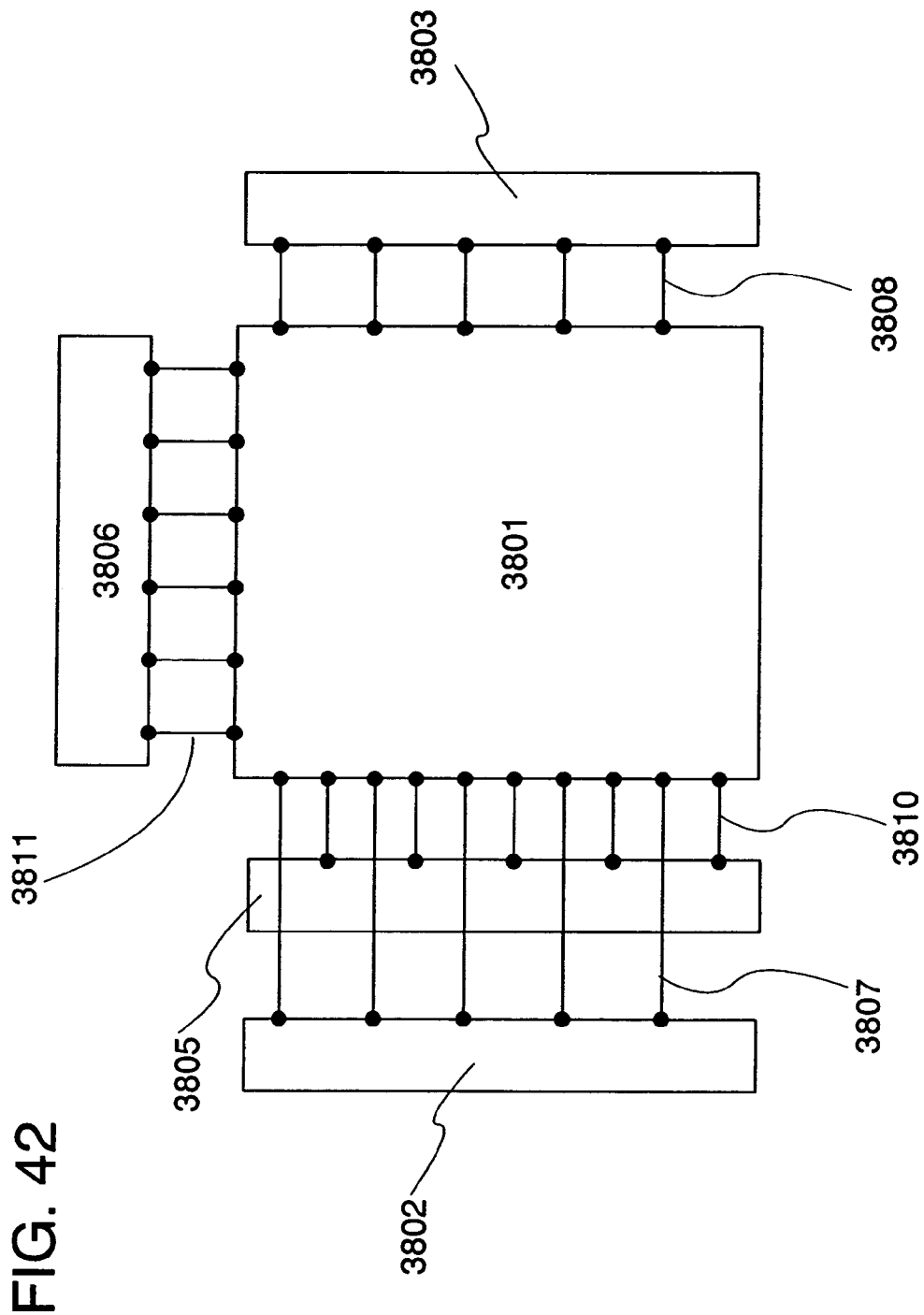
FIG. 42 illustrates an exemplary configuration of the display device of the invention.

In addition, in the case where the third transistor and the fourth transistor have the same conductivity type as in the pixel circuit shown in FIG. 3 and FIG. 9, for example, the same selection signals are input to the second and third scan lines. Accordingly, the third and fourth transistors may be controlled with the same scan line as in the pixel circuits shown in FIG. 15 and FIG. 16. FIG. 42 shows an exemplary configuration of the display device in that case. In FIG. 42, the third transistor and the fourth transistor are controlled with the second scan line 3808, and the second scan line 3808 is controlled with the second scan line driver circuit 3803.

Note that the configurations of the signal line driver circuit, the scan line driver circuits, and the like are not limited to those in FIG. 38 to FIG. 42.

Note also that transistors in the invention may be any type of transistors, and may be formed over any substrate. Accordingly, the whole circuits shown in FIG. 38 to FIG. 42 may be formed over a glass substrate, a plastic substrate, a single crystalline substrate, an SOI substrate, or any other substrates. Alternatively, parts of the circuits shown in FIG. 38 to FIG. 42 may be formed over a substrate, while the other parts of the circuits shown in FIG. 38 to FIG. 42 may be formed over another substrate. That is, not all of the circuits shown in FIG. 38 to FIG. 42 are required to be formed over the same substrate. For example, in FIG. 38 to FIG. 42, the pixel portion and the scan line driver circuits may be formed over a glass substrate, while the signal line driver circuit (or a part of it) may be formed over a single crystalline substrate so that the IC chip is connected to the glass substrate by COG (Chip on Glass) bonding. Alternatively, the IC chip may be connected to the glass substrate by TAB (Tape Automated Bonding) or printed board.

Note that this embodiment mode can be freely combined with any of Embodiment Modes 1 to 6.

Embodiment Mode 8

In this embodiment mode, description will be made of a display panel used for the display device of the invention, with reference to FIG. 67 and the like. Note that FIG. 67A shows top view of a display panel, and FIG. 67B shows a cross section taken along a line A-A' in FIG. 67A. The display panel includes a signal line driver circuit 6701, a pixel portion 6702, a first scan line driver circuit 6703, and a second scan line driver circuit 6706, which are shown by dashed lines. The display panel also includes a sealing substrate 6704 and a sealant 6705, and the inner side of the sealant 6705 is a space 6707.

Note that a wire 6708 is a wire for transmitting signals to be input to the first scan line driver circuit 6703, the second scan line driver circuit 6706, and the signal line driver circuit 6701, and for receiving video signals, clock signals, start signals, and the like from an FPC 6709 (Flexible Printed Circuit) which serves as an external input terminal. IC chips 6719 and 6720 (semiconductor chips incorporating a memory circuit, a buffer circuit, and the like) are mounted on connecting portions between the respective FPCs 6709 and the display panel by COG (Chip On Glass) bonding or the like. Although only an FPC is shown in the drawing, a printed wiring board (PWB) may be attached to the FPC.

Next, a cross-sectional structure is described with reference to FIG. 67B. Although the pixel portion 6702 and its peripheral driver circuits (the first scan line driver circuit 6703, the second scan line driver circuit 6706, and the signal line driver circuit 6701) are actually formed over the substrate 6710, only the signal line driver circuit 6701 and the pixel portion 6702 are shown herein.

Note that the signal line driver circuit 6701 is constructed from a number of transistors such as a transistor 6721 and a transistor 6722. In addition, although this embodiment mode shows a display panel where a pixel portion and peripheral driver circuits are formed over the same substrate, the invention is not necessarily limited to this and a part or all of the peripheral driver circuits may be formed in an IC chip so that it is mounted on the display panel by COG bonding or the like.

The pixel portion 6702 includes a plurality of circuits which constitute pixels each including a switching transistor 6711 and a driving transistor 6712. Note that a source electrode of the driving transistor 6712 is connected to a first electrode 3713. In addition, an insulator 6714 is formed covering the edge of the first electrode 6713. Here, the insulator 6714 is formed by using a positive photosensitive acrylic resin film.

In order to obtain an excellent coverage, a top edge or a bottom edge of the insulator 6714 is formed to have a curved surface with a curvature. For example, in the case of using positive photosensitive acrylic as a material of the insulator 6714, it is preferable to form only the top edge of the insulator 6714 to have a curvature radius (0.2 to 3 μm). Alternatively, the insulator 6714 can be formed by using a negative photoresist which becomes insoluble in etchant by light or a positive photoresist which becomes soluble in etchant by light.

A layer 6716 containing an organic compound and a second electrode 6717 are formed over the first electrode 6713. Here, as a material used for the first electrode 6713 functioning as an anode, a material with a high work function is desirably used. For example, the first electrode 6703 can be formed with a single film such as an ITO (Indium Tin Oxide) film, an indium zinc oxide (IZO) film, a titanium nitride film, a chromium film, a tungsten film, a Zn film, or a Pt film; stacked layers of a titanium nitride film and a film containing aluminum as its main component; a three-layer structure of a titanium nitride film, a film containing aluminum as its main component, and a titanium nitride film; or the like. When the first electrode 6703 is formed to have a stacked structure, low resistance as a wire can be obtained, an excellent ohmic contact can be formed, and further first electrode 6703 can function as an anode.

The layer 6716 containing an organic compound is formed by a vapor deposition method using a vapor-deposition mask or an ink-jet method. A part of the layer 6716 containing an organic compound is formed by using a metal complex of the Group 4 in the periodic table, which may be combined with either a low molecular material or a high molecular material. In general, the material used for a layer containing an organic compound is often an organic compound with a single layer or stacked layers; however, a structure where a film made of an organic compound partially contains an inorganic compound may be used as well. Further, known triplet materials can be used.

As a material used for the second electrode 6717 functioning as a cathode which is formed over the layer 6716 containing an organic compound, a material with a low work function (e.g., Al, Ag, Li, or Ca; an alloy thereof such as MgAg, MgIn, AlLi, $CaF_2$, or calcium nitride) may be used. Note that in the case where light generated in the layer 6716 containing an organic compound is made travel through the second electrode 6717, the second electrode 6717 is preferably formed of stacked layers of a thin metal film and a transparent conductive film (e.g., ITO (an alloy of indium oxide and tin oxide), an alloy of indium oxide and zinc oxide ($In_2O_3$—ZnO), zinc oxide (ZnO), or the like).

Further, by attaching the sealing substrate 6704 to the substrate 6710 with the sealant 6705, a structure where a light-emitting element 6718 is provided in the space 6707 surrounded by the substrate 6710, the sealing substrate 6704, and the sealant 6705 is formed. Note that the space 6707 may be filled with an inert gas (e.g., nitrogen, argon, or the like) or filled with the sealant 6705.

Note also that the sealant 6705 is preferably formed with an epoxy resin. In addition, such a material desirably transmits as little moisture and oxygen as possible. As a material used for the sealing substrate 6704, a plastic substrate made of FRP (Fiberglass-Reinforced Plastics), PVF (PolyVinyl Fluoride), mylar, polyester, acrylic, or the like can be used in addition to a glass substrate or a quartz substrate.

In this manner, a display panel having the pixel configuration of the invention can be obtained.

By forming the signal line driver circuit 6701, the pixel portion 6702, the first scan line driver circuit 6703, and the second scan line driver circuit 6706 over the same substrate as shown in FIGS. 67A and 67B, cost reduction of the display device can be achieved. In addition, in this case, when the signal line driver circuit 6701, the pixel portion 6702, the first scan line driver circuit 6703, and the second scan line driver circuit 6706 are formed by using transistors of the same conductivity type, the manufacturing process can be simplified, which leads to a further cost reduction. Further, by using amorphous silicon for semiconductor layers of the transistors which are used for the signal line driver circuit 6701, the pixel portion 6702, the first scan line driver circuit 6703, and the second scan line driver circuit 6706, further cost reduction can be achieved.

Note that the structure of a display panel is not limited to the structure where the signal line driver circuit 6701, the pixel portion 6702, the first scan line driver circuit 6703, and the second scan line driver circuit 6706 are formed over the same substrate as shown in FIG. 67A, and a structure where the signal line driver circuit 6701 is formed in an IC chip so that it is mounted on the display panel by COG bonding or the like may be used.

That is, only a signal line driver circuit which is required to perform a high-speed operation is formed in an IC chip using a CMOS or the like in order to achieve low power consumption. In addition, by forming an IC chip using a semiconductor chip such as a silicon wafer, a higher-speed operation and lower power consumption can be achieved.

By forming the scan line driver circuits and the pixel portion over the same substrate, cost reduction can be achieved. Note that when the scan line driver circuits and the pixel portion are formed by using transistors of the same conductivity type, further cost reduction can be achieved. As the configuration of pixels included in the pixel portion, the configuration shown in Embodiment Mode 3 can be used. In addition, by using amorphous silicon for semiconductor layers of the transistors, the manufacturing process can be simplified, which leads to a further cost reduction.

In this manner, cost reduction of a high-definition display device can be achieved. In addition, by mounting an IC chip which incorporates a functional circuit (e.g., a memory or a buffer) on a connecting portion between the FPC 6709 and the substrate 6710, the substrate area can be effectively utilized.

Alternatively, after forming the signal line driver circuit 6701, the first scan line driver circuit 6703, and the second scan line driver circuit 6706 in FIG. 67A in IC chips, the IC chips may be mounted on the display panel by COG bonding or the like. In this case, power consumption of the high-definition display device can be further reduced. Therefore, in order to obtain a display device with lower power consumption, polysilicon is desirably used for semiconductor layers of the transistors which are used in the pixel portion.

In addition, by using amorphous silicon for semiconductor layers of the transistors in the pixel portion 6702, further cost reduction can be achieved. Further, a large display panel can be manufactured.

Note that the position of the scan line driver circuits is not limited to the row direction of the pixels as well as the position of the signal line driver circuit is not limited to the column direction of the pixels.

Figure 68:
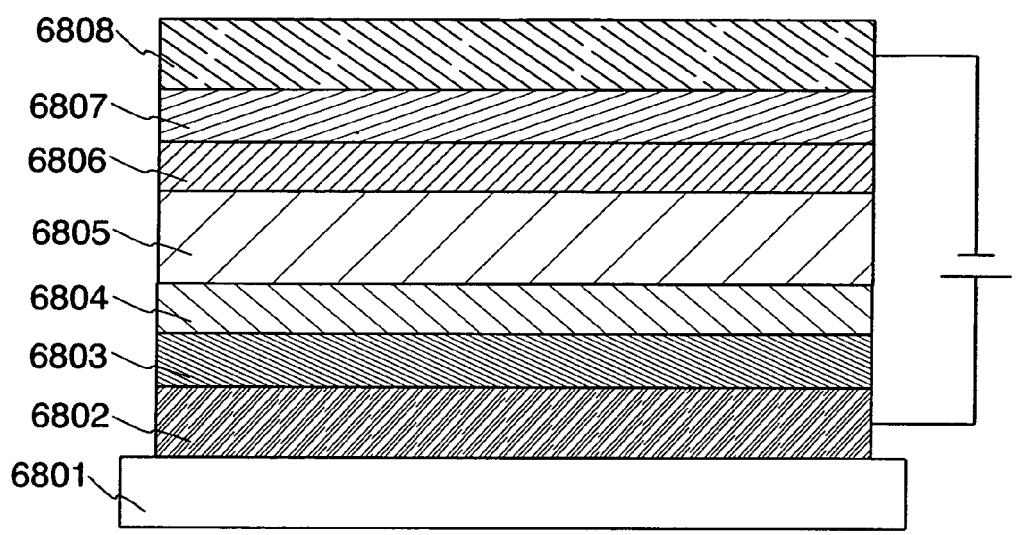
FIG. 68 illustrates an exemplary structure of a light-emitting element used for the display device of the invention.

FIG. 68 shows an example of a light-emitting element which can be applied to the light-emitting element 6718.

A light-emitting element shown in FIG. 68 has an element structure where a substrate 6801, an anode 6802, a hole injection layer 6803 made of a hole injection material, a hole transport layer 6804 made of a hole transporting material, a light-emitting layer 6805, an electron transporting layer 6806 made of an electron transporting material, an electron injection layer 6807 made of an electron injection material, and a cathode 6808 are stacked in this order. Here, the light-emitting layer 6805 is sometimes formed from one kind of a light-emitting material, but it may be formed from two or more kinds of light-emitting materials. In addition, the element structure of the invention is not limited to this.

In addition to the stacked structure shown in FIG. 68 where each functional layer is stacked, a wide variety of element structures can be employed such as an element using a high molecular compound and a high-efficiency element which utilizes as a light-emitting layer a triplet light-emitting material which emits light in returning from a triplet excitation state. The light-emitting element of the invention can also be applied to a white light-emitting element which can be obtained by controlling a recombination region of carries using a hole blocking layer and dividing a light-emitting region into two regions.

Next, the manufacturing method of the element of the invention shown in FIG. 68 will be described. First, a hole injection material, a hole transporting material, and a light-emitting material are sequentially deposited over the substrate 6801 having the anode 6802 (ITO: Indium Tin Oxide). Next, an electron transporting material and an electron injection material are deposited, and finally the cathode 6808 is formed by vapor-deposition.

Next, materials suitable for the hole injection material, the hole transporting material, the electron transporting material, the electron injection material, and the light-emitting material will be described.

As a hole injection material, an organic compound such as a porphyrin-based compound, phthalocyanine (abbreviation: $H_2Pc$), or copper phthalocyanine (abbreviation: CuPc) can be effectively used. In addition, a material having a lower ionization potential than the hole transporting material as well as having a hole transporting function can be used as the hole injection material. There is also a conductive high molecular compound doped with chemicals, such as poly(3,4-ethylenedioxythiophene) (abbreviation: PEDOT) doped with poly (styrenesulfonic acid) (abbreviation: PSS), or polyaniline. In addition, an insulating high molecular compound is also effective in terms of planarization, and polyimide (abbreviation: PI) is often used as such an material. Further, an inorganic compound can also be used, which includes a thin metal film of gold, silver, or the like, an ultrathin film of an aluminum oxide (abbreviation: alumina), and the like.

As a material which is most widely used as the hole transporting material, there is an aromatic amine compound (a material having benzene ring-nitrogen bonds). As a material which is widely used, there are 4,4'-bis(diphenylamino)-biphenyl (abbreviation: TAD), derivatives thereof such as 4,4'-bis[N-(3-methylphenyl)-N-phenyl-amino]-biphenyl (abbreviation: TPD), and 4,4'-bis[N-(1-naphthyl)-N-phenyl-amino]-biphenyl (abbreviation: a-NPD). Besides, a star burst aromatic amine compound can also be given as an example, which includes 4,4',4"-tris(N,N-diphenyl-amino)-triphenylamine (abbreviation: TDATA) or 4,4',4"-tris[N-(3-methylphenyl)-N-phenyl-amino]-triphenylamine (abbreviation: MTDATA).

As an electron transporting material, a metal complex is often used, which includes a metal complex having a quinoline skeleton or a benzoquinoline skeleton such as tris(8-quinolinolato)aluminum (abbreviation: $Alq_3$), BAlq, tris(4-methyl-8-quinolinolato)aluminum (abbreviation: Almq), or bis(10-hydroxybenzo[h]-quinolinato)beryllium (abbreviation: Bebq). Besides, a metal complex having an oxazole-based or thiazole-based ligand such as bis[2-(2-hydroxyphenyl)-benzoxazolato]zinc (abbreviation: $Zn(BOX)_2$) or bis[2-(2-hydroxyphenyl)-benzothiazolato]zinc (abbreviation: $Zn(BTZ)_2$) can also be used. Further, other than the metal complex, the following materials having an electron transporting property can be used: oxadiazole derivatives such as 2-(4-biphenylyl)-5-(4-tert-butylphenyl)-1,3,4-oxadiazole (abbreviation: PBD) or OXD-7; triazole derivatives such as TAZ or 3-(4-tert-butylphenyl)-4-(4-ethylphenyl)-5-(4-biphenylyl)-1,2,4-triazole (abbreviation: p-EtTAZ); and phenanthroline derivatives such as bathophenanthroline (abbreviation: BPhen) or BCP.

As an electron injection material, the aforementioned electron transporting materials can be used. In addition, an ultrathin film of an insulator such as metal halide of calcium fluoride, lithium fluoride, or cesium fluoride, is often used as well as alkali metal oxide such as lithium oxide. Further, an alkali metal complex such as lithium acetyl acetonate (abbreviation: Li(acac)) or 8-quinolinolato-lithium (abbreviation: Liq) is also effective.

As a light-emitting material, various fluorescent pigments can be effectively used in addition to the aforementioned metal complexes such as $Alq_3$, Almq, BeBq, BAlq, $Zn(BOX)_2$, or $Zn(BTZ)_2$. As the fluorescent pigments, there are 4,4'-bis(2,2-diphenyl-vinyl)-biphenyl for blue emission, 4-(dicyanomethylene)-2-methyl-6-(p-dimethylaminostyryl)-4H-pyran for red-orange emission, and the like. In addition, a triplet light-emitting material can be also used, which is mainly a complex having platinum or iridium as a central metal. As a triplet light-emitting material, the following materials are known: tris(2-phenylpyridine)iridium, bis (2-(4'-tolyl)pyridinato-N,C$^{2'}$)acetylacetonato iridium (abbreviation: acacIr(tpy)$_2$), 2,3,7,8,12,13,17,18-octaethyl-21H, 23H-porphyrin-platinum, and the like.

By combining the aforementioned materials having the respective functions, a highly reliable light-emitting element can be manufactured.

In addition, a light-emitting element having layers stacked in reverse order from the order shown in FIG. 68 can be used. That is a element structure where the substrate 6801, the cathode 6808, the electron injection layer 6807 made of an electron injection material, the electron transporting layer 6806 made of an electron transporting material, the light-emitting layer 6805, the hole transporting layer 6804 made of a hole transporting material, the hole injection layer 6803 made of a hole injection material, and the anode 6802 are stacked in this order.

In order to extract light emitted from the light-emitting element, at least one of the anode and the cathode is required to be transparent. A TFT and the light-emitting element are formed over a substrate. As the structure of a light-emitting element, there are a top-emission structure where light is extracted through the opposite side of the substrate, a bottom-emission structure where light is extracted through the substrate side, and a dual-emission structure where light is extracted through both sides of the substrate and the opposite side thereof. The pixel layout of the invention can be applied to a light-emitting element having any of the aforementioned emission structures.

A light-emitting element with a top-emission structure will be described with reference to FIG. 69A.

A driving transistor 6901 is formed over a substrate 6900, and a first electrode 6902 is formed in contact with a source electrode of the driving transistor 6901. A layer 6903 containing an organic compound and a second electrode 6904 are formed thereover.

Note that the first electrode 6902 is an anode of the light-emitting element, while the second electrode 6904 is a cathode of the light-emitting element. That is, the light-emitting element corresponds to a region where the layer 6903 containing an organic compound is sandwiched between the first electrode 6902 and the second electrode 6904.

As a material of the first electrode 6902 functioning as an anode, a material with a high work function is desirably used. For example, the first electrode 6902 can be formed by using a single-layered film such as a titanium nitride film, a chromium film, a tungsten film, a Zn film, or a Pt film; stacked layers of a titanium nitride film and a film containing aluminum as its main component; a three-layer structure of a titanium nitride film, a film containing aluminum as its main component, and a titanium nitride film; or the like. Note that when the first electrode 6902 is formed to have a stacked structure, low resistance as a wire can be obtained, an excellent ohmic contact can be formed, and further the first electrode 6902 can function as an anode. By using a light-reflective metal film, an anode which does not transmit light can be formed.

As a material of the second electrode 6904 functioning as a cathode, it is preferable to use stacked layers of a thin metal film which is made of a material with a low work function (Al, Ag, Li, or Ca, or an alloy thereof such as MgAg, MgIn, AlLi, CaF$_2$, or calcium nitride) and a transparent conductive film (indium tin oxide (ITO), indium zinc oxide (IZO), zinc oxide (ZnO), or the like). By using the thin metal film and the transparent conductive film in this manner, a cathode which can transmit light can be formed.

Figure 69A:
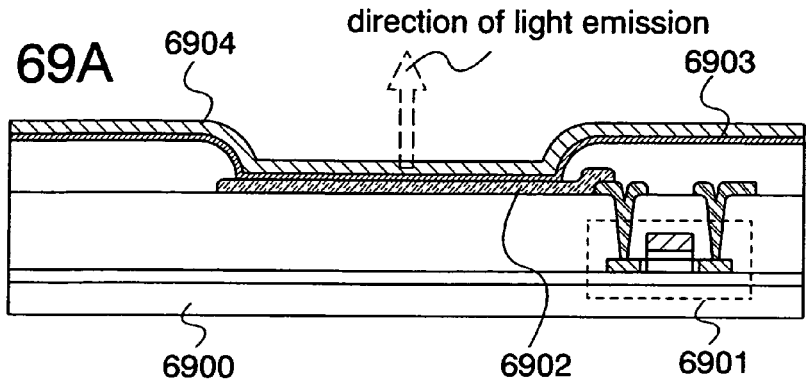
FIGS. 69A to 69C illustrate exemplary structures of the display device of the invention.

Thus, light emitted from the light-emitting element can be extracted through the top surface as shown by the arrow in FIG. 69A. That is, in the case of using such a light-emitting element for the display panel shown in FIGS. 67A and 67B, light is emitted to the side of the sealing substrate 6704. Therefore, when a light-emitting element with a top-emission structure is used for the display device, a light-transmissive substrate is used for the sealing substrate 6704.

In addition, in the case of providing an optical film, the optical film may be provided on the sealing substrate 6704.

Note that the first electrode 6902 may also be formed by using a metal film made of a material with a low work function such as MgAg, MgIn, or AlLi in order to function as a cathode. In this case, the second electrode 6904 may be formed by using a transparent conductive film such as an indium tin oxide (ITO) film or an indium zinc oxide (IZO) film. Accordingly, this structure can increase the transmissivity of light which can be emitted through the top surface.

Next, a light-emitting element with a bottom-emission structure will be described with reference to FIG. 69B. Since the overall structure except the emission structure is the same as that of FIG. 69A, the same reference numerals are used in FIG. 69A and FIG. 69B.

As a material of the first electrode 6902 functioning as an anode, a material with a high work function is desirably used. For example, the first electrode 6902 may be formed by using a transparent conductive film such as an indium tin oxide (ITO) film or an indium zinc oxide (IZO) film. By using a transparent conductive film having light transmissivity, an anode which can transmit light can be formed.

As a material of the second electrode 6904 functioning as a cathode, a metal film made of a material with a low work function (Al, Ag, Li, or Ca, or an alloy thereof such as MgAg, MgIn, AlLi, CaF$_2$, or calcium nitride) can be used. By using a light-reflective metal film in this manner, a cathode which does not transmit light can be formed.

Figure 69B:
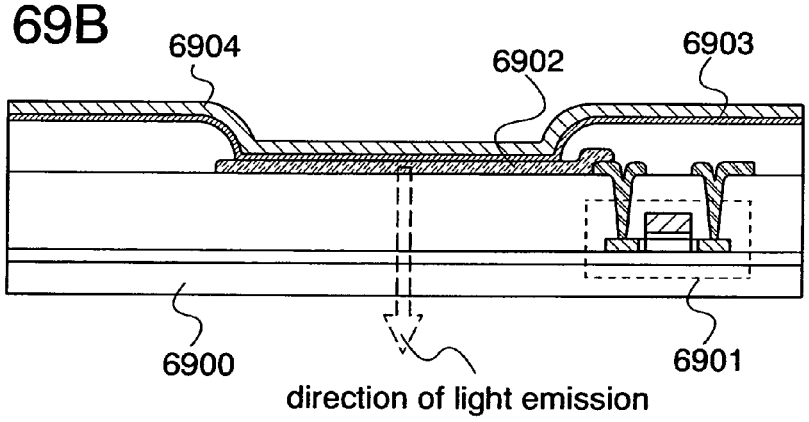

Thus, light emitted from the light-emitting element can be extracted through the bottom surface as shown by the arrow in FIG. 69B. That is, in the case of using such a light-emitting element for the display panel shown in FIGS. 67A and 67B, light is emitted to the side of the substrate 6710. Thus, when a light-emitting element with a bottom-emission structure is used for the display device, a light-transmissive substrate is used as the substrate 6710.

In addition, in the case of providing an optical film, the optical film may be provided on the substrate 6710.

Next, a light-emitting element with a dual-emission structure will be described with reference to FIG. 69C. Since the overall structure except the emission structure is the same as that of FIG. 69A, the same reference numerals are used in FIG. 69A and FIG. 69C.

As a material of the first electrode 6902 functioning as an anode, it is desirable to use a material with a high work function. For example, the first electrode 6902 can be formed by using a transparent conductive film such as an indium ITO (Indium Tin Oxide) film or an indium zinc oxide (IZO) film. By using a light-transmissive conductive film, an anode which can transmit light can be formed.

As a material of the second electrode 6904 functioning as a cathode, it is preferable to use stacked layers of a thin metal film which is made of a material with a low work function (Al, Ag, Li, or Ca, or an alloy thereof such as MgAg, MgIn, AlLi, CaF$_2$, or calcium nitride) and a transparent conductive film (ITO: Indium Tin Oxide), an alloy of indium oxide and zinc oxide (In$_2$O$_3$—ZnO), zinc oxide (ZnO), or the like). By using the thin metal film and the transparent conductive film having light transmissivity in this manner, a cathode which can transmit light can be formed.

Figure 69C:
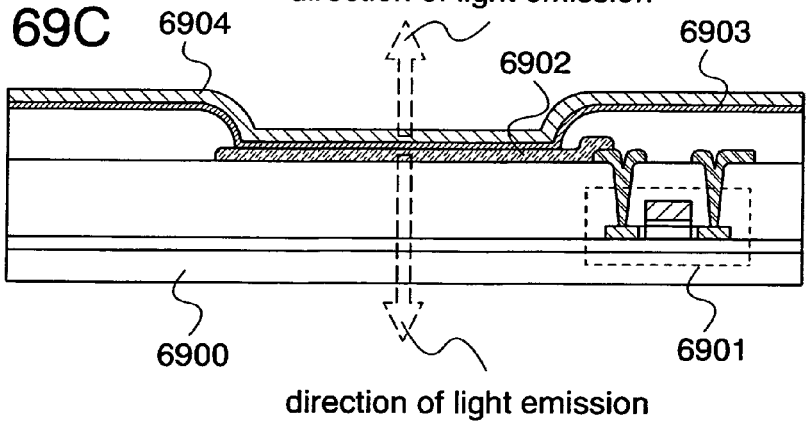

Thus, light emitted from the light-emitting element can be extracted through both surfaces as shown by the arrows in FIG. 69C. That is, in the case of using such a light-emitting element for the display panel shown in FIGS. 67A and 67B, light is emitted to both sides of the substrate 6710 and the sealing substrate 6704. Thus, when a light-emitting element with a dual-emission structure is used for the display device, both of the substrate 6710 and the sealing substrate 6704 are formed by using light-transmissive substrates.

In addition, in the case of providing an optical film, optical films may be provided on the substrate 6710 and the sealing substrate 6704 respectively.

Further, the invention can be applied to a display device which performs full-color display by using white light-emitting elements and color filters.

Figure 70:
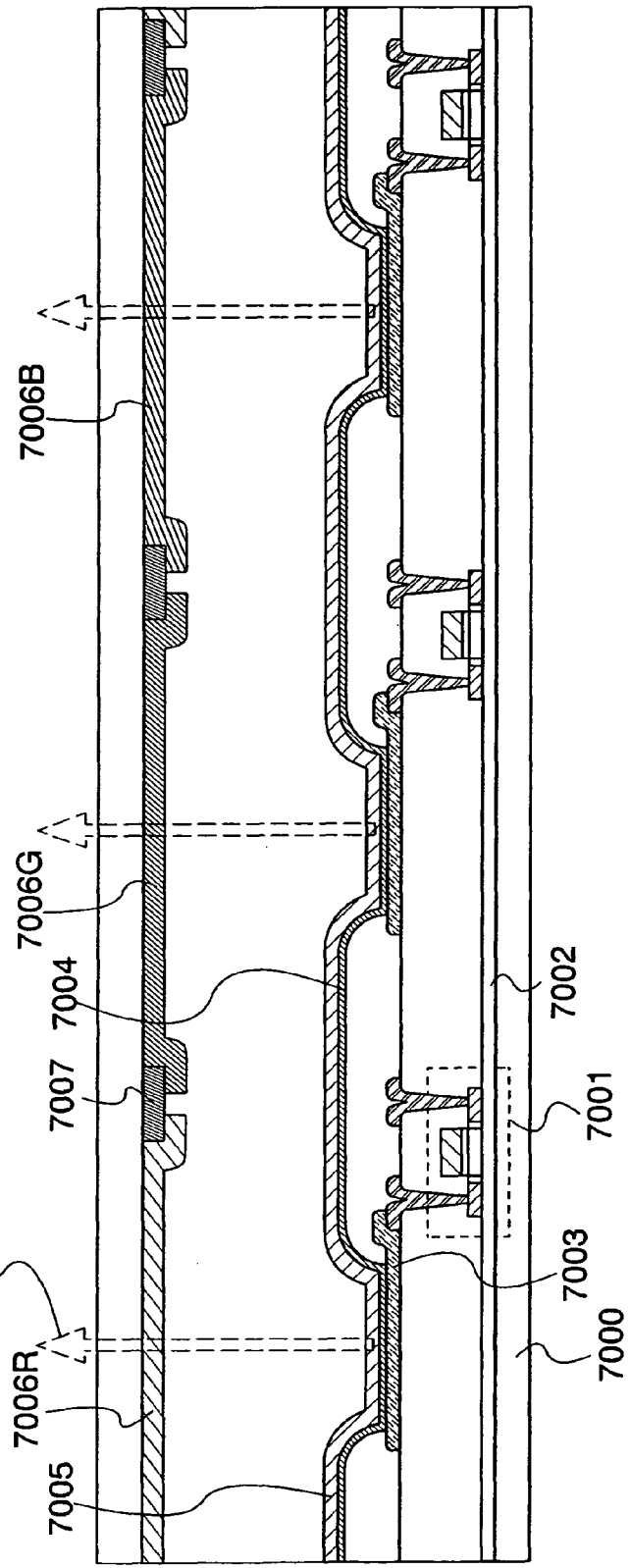
FIG. 70 illustrates an exemplary structure of the display device of the invention.

As shown in FIG. 70, a base film 7002 is formed over a substrate 7000, a driving transistor 7001 is formed over the base film 7002, and a first electrode 7003 is formed in contact with a source electrode of the driving transistor 7001. In addition, a layer 7004 containing an organic compound and a second electrode 7005 are formed thereover.

Note that the first electrode 7003 is an anode of a light-emitting element, while the second electrode 7005 is a cathode of the light-emitting element. That is, the light-emitting element corresponds to a region where the layer 7004 containing an organic compound is sandwiched between the first electrode 7003 and the second electrode 7005. With the structure shown in FIG. 70, white light emission is obtained. A red color filter 7006R, a green color filter 7006G, and a blue color filter 7006B are provided above the light-emitting elements, thereby full-color display can be performed. In addition, a black matrix (also called a "BM") 7007 is provided to separate these color filters.

The aforementioned structures of the light-emitting element can be used in combination and can be appropriately applied to a display device of the invention. Note that the structures of the display panel and the light-emitting element described above are only illustrative, and thus the invention can be applied to a display device having other structures.

Next, a partial cross section of a pixel portion of a display panel will be described.

First, description will be made of a case where a polysilicon (p-Si:H) film is used as a semiconductor layer of a transistor, with reference to FIGS. 71A, 71B, 72A, 72B, 73A, and 73B Here, the semiconductor layer is obtained by, for example forming an amorphous silicon (a-Si) film over a substrate by a known film deposition method. Note that the semiconductor film is not limited to the amorphous silicon film, and any semiconductor film having an amorphous structure (including a microcrystalline semiconductor film) may be used. Further, a compound semiconductor film having an amorphous structure, such as an amorphous silicon germanium film may be used.

Then, the amorphous silicon film is crystallized by laser crystallization, thermal crystallization using RTA or an annealing furnace, thermal crystallization using metal elements which promote crystallization, or the like. Needless to say, such crystallization may be performed in combination.

As a result of the aforementioned crystallization, a crystallized region is formed in a part of the amorphous semiconductor film.

Next, the crystalline semiconductor film having a partially increased crystallinity is patterned into a desired shape, and an island-shaped semiconductor film is formed with the crystallized region. This semiconductor film is used as the semiconductor layer of the transistor.

As shown in FIG. 71A, a base film 7102 is formed over a substrate 7101, and a semiconductor layer is formed thereover. The semiconductor layer includes a channel formation region 7103, an LDD region 7104, and an impurity region 7105 which serves as a source or drain region of a driving transistor 7118. The semiconductor layer also includes a channel formation region 7106, an LDD region 7107, and an impurity region 7108 which jointly serve as a bottom electrode of a capacitor 7119. Note that channel doping may be performed to the channel formation region 7103 and the channel formation region 7106.

As the substrate, a glass substrate, a quartz substrate, a ceramic substrate, or the like can be used. As the base film 7102, either of a single layer of aluminum nitride (AlN), silicon oxide ($SiO_2$), silicon oxynitride ($SiO_xN_y$), or the like, or stacked layers thereof can be used.

A gate electrode 7110 and a top electrode 7111 of the capacitor 7119 are formed over the semiconductor layer with a gate insulating film 7109 sandwiched therebetween.

An interlayer insulating film 7112 is formed to cover the driving transistor 7118 and the capacitor 7119. Then, a wire 7113 is formed over the first interlayer insulating film 7112 so that the wire 7113 contacts the impurity region 7105 through a contact hole. A pixel electrode 7114 is formed in contact with the wire 7113, and an insulator 7115 is formed to cover the edge of the pixel electrode 7114 and the wire 7113. Here, the pixel electrode 7114 is formed with a positive photosensitive acrylic resin film. Then, a layer 7116 containing an organic compound and a counter electrode 7117 are formed over the pixel electrode 7114. Thus, a light-emitting element 7120 is formed in a region where the layer 7116 containing an organic compound is sandwiched between the pixel electrode 7114 and the counter electrode 7117.

In addition, as shown in FIG. 71B, a region 7121 which overlaps with a part of the top electrode 7111 of the capacitor 7119 may be provided by extending the LDD region which forms a part of the bottom electrode of the capacitor 7119 to the inner side. Note that common portions to those in FIG. 71A are denoted by the same reference numerals, and thus their description is omitted.

In addition, as shown in FIG. 72A, a second top electrode 7122 may be provided, which is formed in the same layer as the wire 7113 having a contact with the impurity region 7105 of the driving transistor 7118. Note that common portions to those in FIG. 71A are denoted by the same reference numerals, and thus their description is omitted. In addition, since the second top electrode 7122 has a contact with the impurity region 7108, a first capacitor which has a structure where the gate insulating film 7109 is sandwiched between the top electrode 7111 and the channel formation region 7106, and the second capacitor which has a structure where the interlayer insulating film 7112 is sandwiched between the top electrode 7111 and the second top electrode 7122 are connected in parallel, so that a capacitor 7123 having the first capacitor and the second capacitor is obtained. Since the capacitor 7123 has a total capacity of the first capacitor and the second capacitor, a capacitor having a high capacity can be formed in a small area. That is, the aperture ratio can be further increased by using such a capacitor as the capacitor in the pixel configuration of the invention.

Alternatively, a structure of a capacitor as shown in FIG. 72B may be adopted. A base film 7202 is formed over a substrate 7201, and a semiconductor layer is formed thereover. The semiconductor layer includes a channel formation region 7203, an LDD region 7204, and an impurity region 7205 which serves as a source or drain region of a driving transistor 7218. Note that channel doping may be performed to the channel formation region 7203.

As the substrate, a glass substrate, a quartz substrate, a ceramic substrate, or the like can be used. As the base film 7202, either a single layer of aluminum nitride (AlN), silicon oxide ($SiO_2$), silicon oxynitride ($SiO_xN_y$), or the like or stacked layers thereof can be used.

A gate electrode 7207 and a first electrode 7208 are formed over the semiconductor layer with a gate insulating film 7206 sandwiched therebetween.

A first interlayer insulating film 7209 is formed to cover the driving transistor 7218 and the first electrode 7208. Then, a wire 7210 is formed over the first interlayer insulating film 7209 so that the wire 7210 contacts the impurity region 7205 through a contact hole. In addition, a second electrode 7211 is formed in the same layer and with the same material as the wire 7210.

Further, a second interlayer insulating film 7212 is formed to cover the wire 7210 and the second electrode 7211. Then, a pixel electrode 7213 is formed over the second interlayer insulating film 7212 so that the pixel electrode 7213 contacts the wire 7210 through a contact hole. A third electrode 7214 is formed in the same layer and with the same material as the pixel electrode 7213. Accordingly, a capacitor 7219 is formed with the first electrode 7208, the second electrode 7211, and the third electrode 7214. Note that reference numeral 7215 is a third interlayer insulating film.

A layer 7216 containing an organic compound and a counter electrode 7217 are formed over the pixel electrode 7213. Thus, a light-emitting element 7220 is formed in a region where the layer 7216 containing an organic compound is sandwiched between the pixel electrode 7213 and the counter electrode 7217.

As described above, each of the structures shown in FIGS. 71A, 71B, 72A, and 72B can be given as an exemplary structure of a transistor which uses a crystalline semiconductor film as a semiconductor layer. Note that the transistors having the structures shown in FIGS. 71A, 71B, 72A, and 72B are examples of a transistor with a top-gate structure. That is, the LDD region may be formed either to overlap with the gate electrode or not overlap, and also a part of the LDD region may be formed to overlap with the gate electrode. Further, the gate electrode may have a tapered shape and an LDD region may be provided below the tapered portion of the gate electrode in a self-aligned manner. In addition, the number of gate electrodes is not limited to two, and a multi-gate structure with three or more gate electrodes may be employed, or a single-gate structure may also be employed.

By using a crystalline semiconductor film as a semiconductor layer (e.g., a channel formation region, a source region, a drain region, and the like) of a transistor included in the pixel of the invention, it becomes easier to form a scan driver circuit and a signal line driver circuit over the same substrate as a pixel portion. In addition, a structure where a part of the signal line driver circuit is formed over the same substrate as the pixel portion, while another part of the circuit is formed in an IC chip to be mounted on the substrate by COG bonding or the like, may be employed as shown in the display panel of FIGS. 67A and 67B. With this structure, the manufacturing cost can be reduced.

Figure 73A:
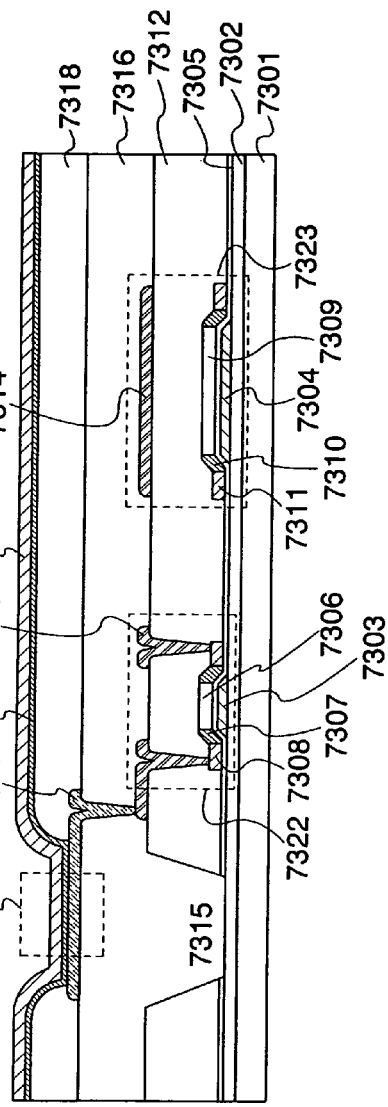
FIGS. 73A and 73B illustrate exemplary structures of the display device of the invention.
Figure 73B:
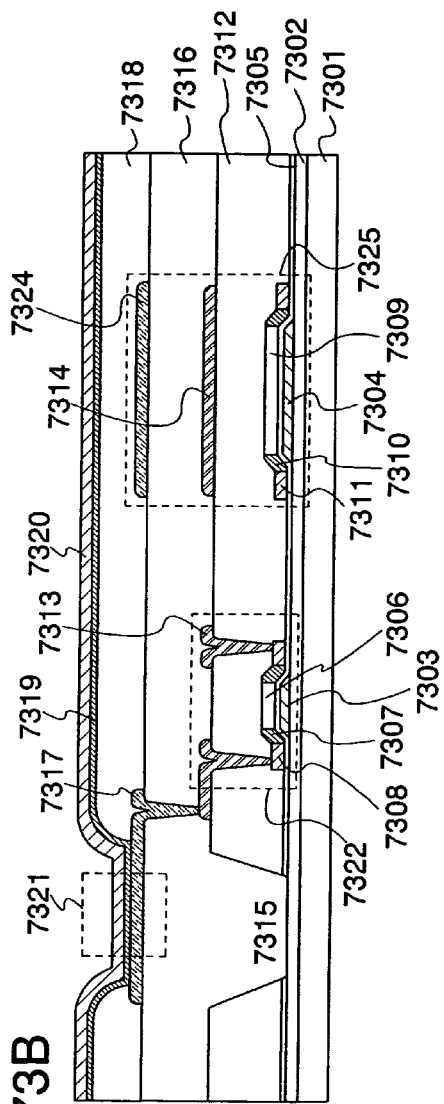

As a structure of a transistor which uses polysilicon (p-Si: H) as a semiconductor layer, a structure where a gate electrode is formed between a substrate and a semiconductor layer, that is a transistor with a bottom-gate structure where a gate electrode is located below a semiconductor layer may be employed as well. FIGS. 73A and 73B show partial cross sections of a pixel portion of a display panel which uses a transistor with a bottom-gate structure.

As shown in FIG. 73A, a base film 7302 is formed over a substrate 7301. Then, a gate electrode 7303 is formed over the base film 7302. A first electrode 7304 is formed in the same layer and with the same material as the gate electrode 7303. As a material of the gate electrode 7303, polycrystalline silicon doped with phosphorus can be used. Not only polycrystalline silicon, but silicide which is a compound of metal and silicon can be used.

A gate insulating film 7305 is formed to cover the gate electrode 7303 and the first electrode 7304. The gate insulating film 7305 is formed by using a silicon oxide film, a silicon nitride film, or the like.

Over the gate insulating film 7305, a semiconductor layer is formed. The semiconductor layer includes a channel formation region 7306, an LDD region 7307, and an impurity region 7308 which serves as a source or drain region of a driving transistor 7322. The semiconductor layer also includes a channel formation region 7309, an LDD region 7310, and an impurity region 7311 which jointly serve as a second electrode of a capacitor 7323. Note that channel doping may be performed to the channel formation region 7306 and the channel formation region 7309.

As the substrate, a glass substrate, a quartz substrate, a ceramic substrate, or the like can be used. As the base film 7302, either a single layer of aluminum nitride (AlN), silicon oxide ($SiO_2$), silicon oxynitride ($SiO_xN_y$), or the like or stacked layers thereof can be used.

A first interlayer insulating film 7312 is formed to cover the semiconductor layer. Then, a wire 7313 is formed over the first interlayer insulating film 7312 so that the wire 7313 contacts the impurity region 7308 through a contact hole. A third electrode 7314 is formed in the same layer and with the same material as the wire 7313. The capacitor 7323 is formed with the first electrode 7304, the second electrode, and the third electrode 7314.

In addition, an opening 7315 is formed in the first interlayer insulating film 7312. A second interlayer insulating film 7316 is formed to cover the driving transistor 7322, the capacitor 7323, and the opening 7315. Then, a pixel electrode 7317 is formed over the second interlayer insulating film 7316 so that the pixel electrode 7317 fills a contact hole. Then, an insulator 7318 is formed to cover the edge of the pixel electrode 7317. For example, a positive photosensitive acrylic resin film can be used as the insulator 7318. Subsequently, a layer 7319 containing an organic compound and a counter electrode 7320 are formed over the pixel electrode 7317. Thus, a light-emitting element 7321 is formed in a region where the layer 7319 containing an organic compound is sandwiched between the pixel electrode 7317 and the counter electrode 7320. The opening 7315 is located below the light-emitting element 7321. That is, in the case where light emitted from the light-emitting element 7321 is extracted from the substrate side, the light transmissivity can be improved due to the provision of the opening 7315.

Further, a fourth electrode 7324 may be formed in the same layer and with the same material as the pixel electrode 7317 in FIG. 73A so as to obtain a structure shown in FIG. 73B. In that case, a capacitor 7325 can be formed with the first electrode 7304, the second electrode, the third electrode 7314, and the fourth electrode 7324.

Next, description will be made of a case where an amorphous silicon (a-Si:H) film is used as a semiconductor layer of a transistor. Description will be made with reference to FIGS. 43A, 43B, 44A, 44B, 45A, and 45B.

FIG. 43A shows a cross section of a top-gate transistor which uses amorphous silicon as a semiconductor layer. As shown in FIG. 43A, a base film 4302 is formed over a substrate 4301. Further, a pixel electrode 4303 is formed over the base film 4302. In addition, a first electrode 4304 is formed in the same layer and with the same material as the pixel electrode 4303.

As the substrate, a glass substrate, a quartz substrate, a ceramic substrate, or the like can be used. As the base film 4302, either a single layer of aluminum nitride (AlN), silicon oxide ($SiO_2$), silicon oxynitride ($SiO_xN_y$), or the like or stacked layers thereof can be used.

A wire 4305 and a wire 4306 are formed over the base film 4302, and the edge of the pixel electrode 4303 is covered with the wire 4305. N-type semiconductor layers 4307 and 4308 having n-type conductivity are formed over the wires 4305 and 4306 respectively. In addition, a semiconductor layer 4309 is formed over the base film 4302, between the wire 4305 and the wire 4306, and a part of the semiconductor layer 4309 is extended to cover the n-type semiconductor layers 4307 and 4308. Note that this semiconductor layer is formed with a non-crystalline semiconductor film such as an amorphous silicon (a-Si:H) film or a microcrystalline semiconductor ($\mu$-Si:H) film. Then, a gate insulating film 4310 is formed over the semiconductor layer 4309, and an insulating film 4311 is formed in the same layer and with the same material as the gate insulating film 4310, over the first electrode 4304. Note that the gate insulating film 4310 is formed using a silicon oxide film, a silicon nitride film, or the like.

Over the gate insulating film 4310, a gate electrode 4312 is formed. In addition, a second electrode 4313 is formed in the same layer and with the same material as the gate electrode 4312, over the first electrode 4304 with the insulating film 4311 sandwiched therebetween. A capacitor 4319 is formed in a region where the insulating film 4311 is sandwiched between the first electrode 4304 and the second electrode 4313. An interlayer insulating film 4314 is formed to cover the edge of the pixel electrode 4303, the driving transistor 4318, and the capacitor 4319.

Over the interlayer insulating film 4314 and the pixel electrode 4303 located in an opening of the interlayer insulating film 4314, a layer 4315 containing an organic compound and a counter electrode 4316 are formed. Thus, a light-emitting element 4317 is formed in a region where the layer 4315 containing an organic compound is sandwiched between the pixel electrode 4303 and the counter electrode 4316.

The first electrode 4304 shown in FIG. 43A may be formed like a first electrode 4320 as shown in FIG. 43B. The first electrode 4320 is formed in the same layer and with the same material as the wires 4305 and 4306.

FIGS. 44A and 44B show partial cross sections of a panel of a display device having a bottom-gate transistor which uses amorphous silicon as a semiconductor layer.

A gate electrode 4403 is formed over a substrate 4401. In addition, a first electrode 4404 is formed in the same layer and with the same material as the gate electrode 4403. As a material of the gate electrode 4403, polycrystalline silicon doped with phosphorus can be used. Not only polycrystalline silicon, but silicide which is a compound of metal and silicon can be used. As the substrate 4401, a glass substrate, a quartz substrate, a ceramic substrate, or the like can be used.

Then, a gate insulating film 4405 is formed to cover the gate electrode 4403 and the first electrode 4404. The gate insulating film 4405 is formed by using a silicon oxide film, a silicon nitride film, or the like.

A semiconductor layer 4406 is formed over the gate insulating film 4405. In addition, a semiconductor layer 4407 is formed in the same layer and with the same material as the semiconductor layer 4406.

N-type semiconductor layers 4408 and 4409 having n-type conductivity are formed over the semiconductor layer 4406, and an n-type semiconductor layer 4410 is formed over the semiconductor layer 4407.

Wires 4411 and 4412 are formed over the n-type semiconductor layers 4408 and 4409 respectively, and a conductive layer 4413 is formed in the same layer and with the same material as the wires 4411 and 4412, over the n-type semiconductor layer 4410.

Thus, a second electrode is formed with the semiconductor layer 4407, the n-type semiconductor layer 4410, and the conductive layer 4413. Note that a capacitor 4420 is formed to have a structure where the gate insulating film 4405 is sandwiched between the second electrode and the first electrode 4404.

One of the edges of the wire 4411 is extended, and a pixel electrode 4414 is formed to be in contact with the extended portion of the wire 4411.

In addition, an insulator 4415 is formed to cover the edge of the pixel electrode 4414, a driving transistor 4419, and the capacitor 4420.

Then, a layer 4416 containing an organic compound and a counter electrode 4417 are formed over the pixel electrode 4414 and the insulator 4415. Thus, a light-emitting element 4418 is formed in a region where the layer 4416 containing an organic compound is sandwiched between the pixel electrode 4414 and the counter electrode 4417.

The semiconductor layer 4407 and the n-type semiconductor layer 4410 which serve as a part of the second electrode of the capacitor are not necessarily required. That is, the second electrode may formed with only the conductive layer 4413, so that the capacitor has a structure where the gate insulating film is sandwiched between the first electrode 4404 and the conductive layer 4413.

Note that the pixel electrode 4414 may be formed before forming the wire 4411 in FIG. 44A, so that a capacitor 4422 as shown in FIG. 44B can be obtained, which has a structure where the gate insulating film 4405 is sandwiched between a second electrode 4421 formed of the pixel electrode 4414 and the first electrode 4404.

Although FIGS. 44A and 44B show inversely staggered channel-etched transistors, a channel-protected transistor may be used as well. Description will be made below of channel-protected transistors with reference to 45A and 45B.

A channel-protected transistor shown in FIG. 45A differs from the channel-etched driving transistor 4419 shown in FIG. 44A in that an insulator 4501 serving as an etching mask is provided over the channel formation region in the semiconductor layer 4406. Common portions except that point are denoted by the same reference numerals.

Similarly, a channel-protected transistor shown in FIG. 45B differs from the channel-etched driving transistor 4419 shown in FIG. 44B in that the insulator 4501 serving as an etching mask is provided over the channel formation region in the semiconductor layer 4406. Common portions except that point are denoted by the same reference numerals.

By using an amorphous semiconductor film as a semiconductor layer (e.g., a channel formation region, a source region, a drain region, and the like) of a transistor included in the pixel of the invention, the manufacturing cost can be reduced.

Note that structures of a transistor and a capacitor which can be applied to the pixel configuration of the invention are not limited to the aforementioned structures of the transistors and capacitors, and various structures of transistors and capacitors can be used.

Note also that this embodiment mode can be freely combined with any of Embodiment Modes 1 to 7. That is, in the display device in accordance with this embodiment mode, a current flowing into a light-emitting element is determined independently of the threshold voltage of a transistor; therefore, variations in the threshold voltage of the transistor can be compensated. Accordingly, variations in luminance of the light-emitting element can be reduced, which in turn can improve the image quality.

Embodiment Mode 9

In this embodiment mode, description will be made of a method for manufacturing a display device using plasma treatment, as a method for manufacturing a display device including transistors, for example.

Figure 46A:
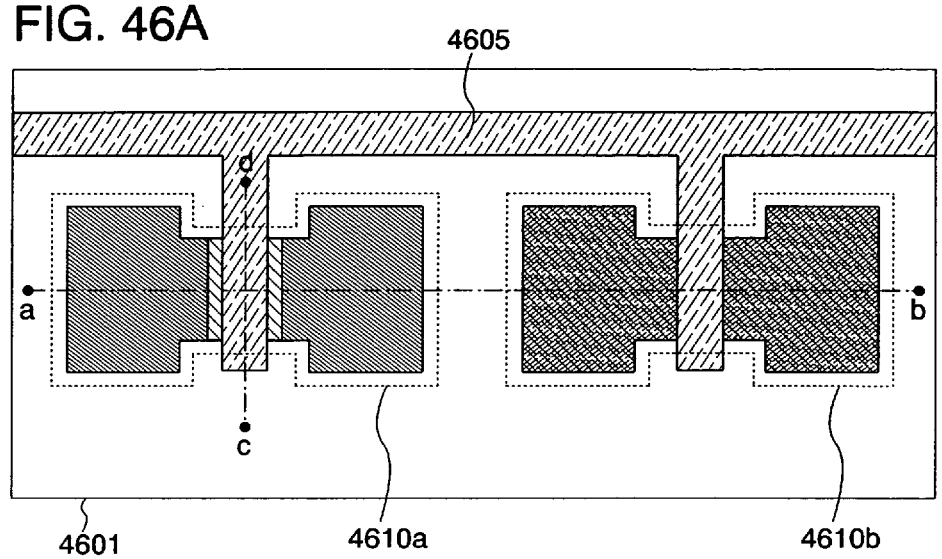
FIGS. 46A to 46C illustrate structures of a transistor used in the display device of the invention.
Figure 46B:
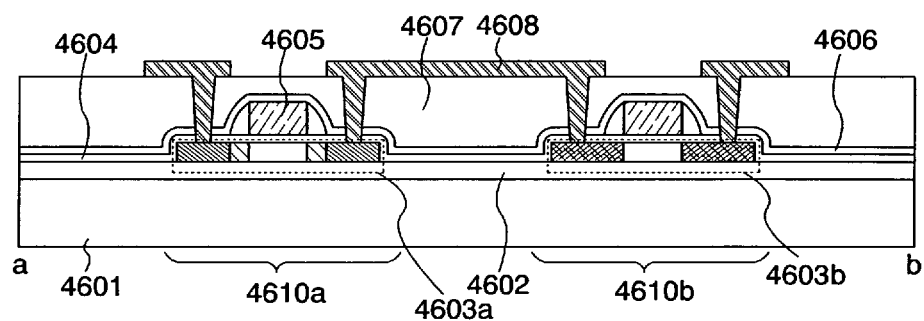
Figure 46C:
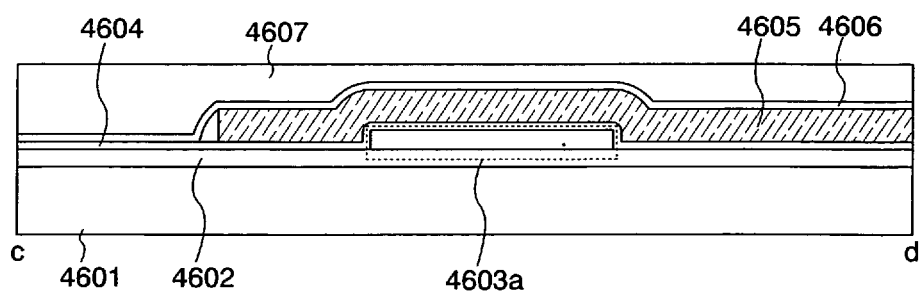

FIGS. 46A to 46C show exemplary structures of a display device including transistors. Note that FIG. 46B corresponds to a cross section taken along a line a-b in FIG. 46A, and FIG. 46C corresponds to a cross section taken along a line c-d in FIG. 46A.

The display shown in FIGS. 46A to 46C includes semiconductor films 4603a and 4603b provided over a substrate 4601 with an insulating film 4602 sandwiched therebetween, gate electrodes 4605 provided over the semiconductor films 4603a and 4603b respectively with a gate insulating layer 4604 sandwiched therebetween, insulating films 4606 and 4607 provided to cover the gate electrodes 4605, and a conductive film 4608 provided over the insulating film 4607 to be electrically connected to a source region or a drain region of the semiconductor films 4603a and 4603b. Although FIGS. 46A to 46C show the case of providing an n-channel transistor 4610a which uses a part of the semiconductor film 4603a as a channel region, and a p-channel transistor 4610b which uses a part of the semiconductor film 4603b as a channel region, the invention is not limited to such a structure. For example, although the n-channel transistor 4610a is provided with LDD (Lightly Doped Drain) regions, while the p-channel transistor 4610b is not provided with LDD regions in FIGS. 46A to 46C, a structure where both of the transistors are provided with LDD regions or a structure where neither of the transistors is provided with LDD regions may be employed.

In this embodiment mode, the display device shown in FIGS. 46A to 46C is manufactured by oxidizing or nitriding a semiconductor film or an insulating film, that is, by performing plasma oxidation or nitridation treatment to at least one layer among the substrate 4601, the insulating film 4602, the semiconductor films 4603a and 4603b, the gate insulating film 4604, the insulating film 4606, and the insulating film 4607. In this manner, by oxidizing or nitriding a semiconductor film or an insulating film by plasma treatment, the surface of the semiconductor film or the insulating film can be modified, thereby a denser insulating film can be obtained, compared with an insulating film formed by CVD or sputtering. Therefore, defects such as pin holes can be suppressed, and thus the characteristics and the like of the display device can be improved.

In this embodiment mode, description will be made of a method of manufacturing a display device by oxidizing or nitriding the semiconductor films 4603a and 4603b or the gate insulating film 4604 shown in FIGS. 46A to 46C by plasma treatment, with reference to the drawings.

First, a case where an island-shaped semiconductor film provided over a substrate is formed to have an edge with about 90 degrees is shown.

First, the semiconductor films 4603a and 4603b with island shapes are formed over the substrate 4601 (FIG. 47A). The island-shaped semiconductor films 4603a and 4603b can be obtained by forming an amorphous semiconductor film by a known method (e.g., sputtering, LPCVD, plasma CVD, or the like) using a material containing silicon (Si) as a main component (e.g., $Si_xGe_{1-x}$ or the like) over the insulating film 4602 which is formed in advance over the substrate 4601, and then crystallizing the amorphous semiconductor film, and further etching the semiconductor film selectively. Note that the crystallization of the amorphous semiconductor film can be performed by a known crystallization method such as laser crystallization, thermal crystallization using RTA or an annealing furnace, or thermal crystallization using metal elements which promote crystallization, or a method combining them. Note that in FIG. 47, the island-shaped semiconductor films 4603a and 4603b are each formed to have an edge with about 90 degrees ($\theta$=85 to 100 degrees).

Next, the semiconductor films 4603a and 4603b are oxidized or nitrided by plasma treatment to form insulating films (oxide films or nitride films) 4621a and 4621b on the surfaces of the semiconductor films 4603a and 4603b respectively (FIG. 47B). For example, when Si is used for the semiconductor films 4603a and 4603b, silicon oxide ($SiO_x$) or silicon nitride ($SiN_x$) is formed as the insulating films 4621a and 4621b. Further, after being oxidized by plasma treatment, the semiconductor films 4603a and 4603b may be subjected to plasma treatment again to be nitrided. In that case, silicon oxide ($SiO_x$) is formed on the semiconductor films 4603a and 4603b first, and then silicon nitride oxide ($SiN_xO_y$) (x>y) is formed on the surface of the silicon oxide. Note that in the case of oxidizing the semiconductor film by plasma treatment, the plasma treatment is performed under an oxygen atmosphere (e.g., an atmosphere containing oxygen ($O_2$) and a rare gas (at least one of He, Ne, Ar, Kr, and Xe), an atmosphere containing oxygen, hydrogen ($H_2$), and a rare gas, or an atmosphere containing nitrous oxide and a rare gas). Meanwhile, in the case of nitriding the semiconductor film by plasma treatment, the plasma treatment is performed under a nitrogen atmosphere (e.g., an atmosphere containing nitrogen ($N_2$) and a rare gas (at least one of He, Ne, Ar, Kr, and Xe), an atmosphere containing nitrogen, hydrogen, and a rare gas, or an atmosphere containing $NH_3$ and a rare gas). As the rare gas, Ar can be used, for example. Alternatively, a mixed gas of Ar and Kr may be used. Therefore, the insulating films 4621a and 4621b contain the rare gas (at least one of He, Ne, Ar, Kr, and Xe) used in the plasma treatment, and in the case where Ar is used, the insulating films 4621a and 4621b contain Ar.

The plasma treatment is performed in the atmosphere containing the aforementioned gas, with the conditions of a plasma electron density in the range of $1\times10^{11}$ to $1\times10^{13}$ cm$^{-3}$, and a plasma electron temperature in the range of 0.5 to 1.5 eV. Since the plasma electron density is high and the electron temperature in the vicinity of the treatment subject (here, the semiconductor films 4603a and 4603b) formed over the substrate 4601 is low, plasma damage to the treatment subject can be prevented. In addition, since the plasma electron density is as high as $1\times10^{11}$ cm$^{-3}$ or more, an oxide or nitride film which is formed by oxidizing or nitriding the treatment subject by plasma treatment is advantageous in its uniform thickness or the like as well as being dense, compared with a film formed by CVD, sputtering, or the like. Further, since the plasma electron temperature is as low as 1 eV, oxidation or nitridation treatment can be performed at a lower temperature, compared with the conventional plasma treatment or thermal oxidation. For example, oxidation or nitridation treatment can be performed sufficiently even when plasma treatment is performed at a temperature lower than the strain point of a glass substrate by 100 degrees or more. Note that as a frequency for generating plasma, high frequencies such as microwaves (2.45 GHz) can be used. Note also that the plasma treatment is to be performed with the aforementioned conditions unless otherwise specified.

Next, the gate insulating film 4604 is formed so as to cover the insulating films 4621a and 4621b (FIG. 47C). The gate insulating film 4604 can be formed by a known method (e.g., sputtering, LPCVD, plasma CVD, or the like) to have either a single-layer structure or a stacked-layer structure of an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y). For example, when Si is used for the semiconductor films 4603a and 4603b, and the Si is oxidized by plasma treatment to form silicon oxide as the insulating films 4621a and 4621b on the surfaces of the semiconductor films 4603a and 4603b, silicon oxide ($SiO_x$) is formed as a gate insulating film on the insulating films 4621a and 4621b. In addition, referring to FIG. 47B, if the insulating films 4621a and 4621b formed by oxidizing or nitriding the semiconductor films 4603a and 4603b by plasma treatment are sufficiently thick, the insulating films 4621a and 4621b can be used as the gate insulating film.

Next, by forming the gate electrodes 4605 or the like over the gate insulating film 4604, a semiconductor device having the n-channel transistor 4610a and the p-channel transistor 4610b which use the island-shaped semiconductor films 4603a and 4603b respectively as channel regions can be manufactured (FIG. 47D).

In this manner, by oxidizing or nitriding the surfaces of the semiconductor films 4603a and 4603b by plasma treatment before providing the gate insulating film 4604 over the semiconductor films 4603a and 4603b, short circuits or the like between the gate electrodes and the semiconductor films can be prevented, which would otherwise be caused by coverage defects of the channel regions with the gate insulating film 4604 at edges 4651a and 4651b. That is, if each of the island-shaped semiconductor films has an edge with an angle of about 90 degrees (θ=85 to 100 degrees), there is a concern that at the time when a gate insulating film is formed so as to cover the semiconductor films by CVD, sputtering, or the like, a coverage defect might be caused, resulting from breaking of the gate insulating film at the edges of the semiconductor films, or the like. However, such a coverage defect or the like can be prevented by oxidizing or nitriding the surfaces of the semiconductor films by plasma treatment in advance.

Alternatively, referring to FIG. 47C, the gate insulating film 4604 may be oxidized or nitrided by performing plasma treatment after forming the gate insulating film 4604. In that case, an insulating film (an oxide or nitride film) 4623 is formed on the surface of the gate insulating film 4604 (FIG. 48A) by oxidizing or nitriding the gate insulating film 4604 which is formed to cover the semiconductor films 4603a and 4603b by plasma treatment (FIG. 48B). The plasma treatment can be performed with similar conditions to those in FIG. 47B. In addition, the insulating film 4623 contains a rare gas which is used in the plasma treatment, and for example, it contains Ar if Ar is used for the plasma treatment.

Alternatively, referring to FIG. 48B, after oxidizing the gate insulating film 4604 by performing plasma treatment under an oxygen atmosphere, the gate insulating film 4604 may be subjected to plasma treatment again under a nitrogen atmosphere, so as to be nitrided. In that case, silicon oxide ($SiO_x$) or silicon oxynitride ($SiO_xN_y$) (x>y) is formed on the semiconductor films 4603a and 4603b first, and then silicon nitride oxide ($SiN_xO_y$) (x>y) is formed to be in contact with the gate electrodes 4605. After that, by forming the gate electrodes 4605 or the like over the insulating film 4623, a semiconductor device having the n-channel transistor 4610a and the p-channel transistor 4610b which use the island-shaped semiconductor films 4603a and 4603b respectively has channel regions can be manufactured (FIG. 48C). In this manner, by oxidizing or nitriding the surface of the gate insulating film by plasma treatment, the surface of the gate insulating film can be modified to form a dense film. The insulating film obtained by plasma treatment is dense and has few defects such as pin holes, compared with an insulating film formed by CVD or sputtering. Therefore, the characteristics of the transistors can be improved.

Although FIG. 48A shows the case where the surfaces of the semiconductor films 4603a and 4603b are oxidized or nitrided by performing plasma treatment to the semiconductor films 4603a and 4603b in advance, another method may be employed such that plasma treatment is not performed to the semiconductor films 4603a and 4603b, but plasma treatment is performed after forming the gate insulating film 4604. In this manner, by performing plasma treatment before forming a gate electrode, a semiconductor film can be oxidized or nitrided even if the semiconductor film is exposed due to a coverage defect such as breaking of a gate insulating film at edges of the semiconductor film; therefore, short circuits or the like between the gate electrode and the semiconductor film can be prevented, which would otherwise be caused by a coverage defect of the semiconductor film with the gate insulating film at the edges.

In this manner, by oxidizing or nitriding the semiconductor films or the gate insulating film by plasma treatment, short circuits or the like between the gate electrodes and the semiconductor films can be prevented, which would otherwise be caused by a coverage defect of the semiconductor films with the gate insulating film at the edges, even if the island-shaped semiconductor films are formed to have edges with an angle of about 90 degrees.

Next, a case is shown where the island-shaped semiconductor films formed over the substrate are provided with tapered edges (θ=30 to 85 degrees).

Figure 49A:
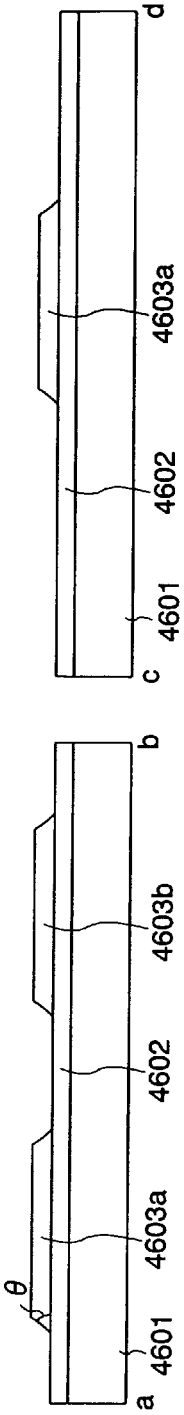
FIGS. 49A to 49D illustrate a manufacturing method of a transistor used in the display device of the invention.

First, the island-shaped semiconductor films 4603a and 4603b are formed over the substrate 4601 (FIG. 49A). The island-shaped semiconductor films 4603a and 4603b can be obtained by forming an amorphous semiconductor film over the insulating film 4602 which is formed over the substrate 4601 in advance, by sputtering, LPCVD, plasma CVD, or the like using a material containing silicon (Si) as a main component, and then crystallizing the amorphous semiconductor film by a known crystallization method such as laser crystallization, thermal crystallization using RTA or an annealing furnace, or thermal crystallization using metal elements which promote crystallization, and further etching the semiconductor film selectively. Note that in FIG. 49A, the island-shaped semiconductor films are formed to have tapered edges (θ=30 to 85 degrees).

Figure 49B:
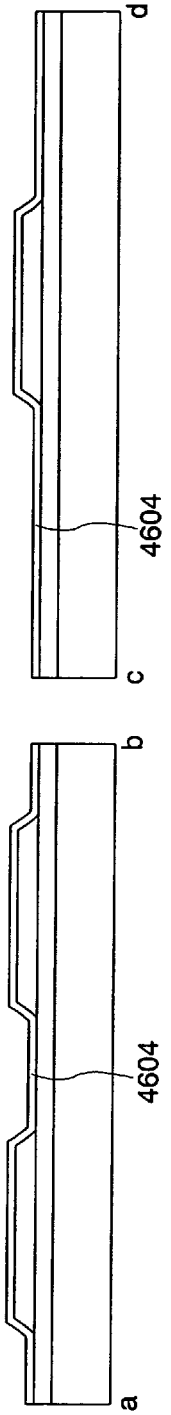

Next, the gate insulating film 4604 is formed so as to cover the semiconductor films 4603a and 4603b (FIG. 49B). The gate insulating film 4604 can be formed to have either a single-layer structure or a stacked-layer structure of an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y) by a known method such as sputtering, LPCVD, or plasma CVD.

Figure 49C:
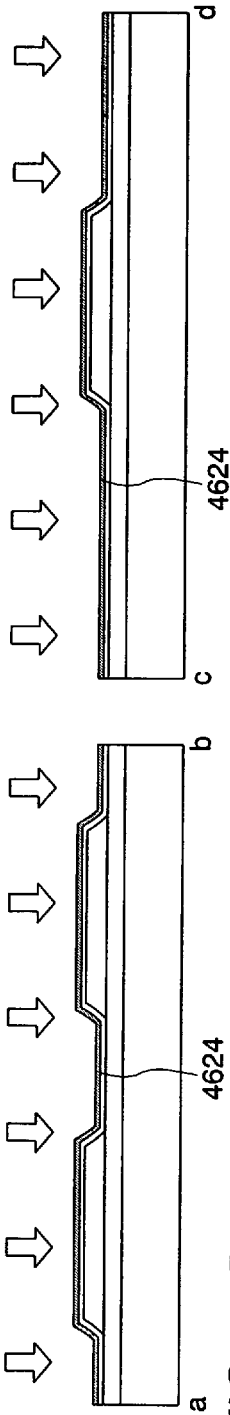

Next, an insulating film (an oxide or nitride film) 4624 is formed on the surface of the gate insulating film 4604 by oxidizing or nitriding the gate insulating film 4604 by plasma treatment (FIG. 49C). The plasma treatment can be performed with the aforementioned conditions. For example, if silicon oxide ($SiO_x$) or silicon oxynitride ($SiO_xN_y$) (x>y) is used as the gate insulating film 4604, the gate insulating film 4604 is oxidized by performing plasma treatment under an oxygen atmosphere, thereby a dense film with few defects such as pin holes can be formed on the surface of the gate insulating film, compared with a gate insulating film formed by CVD, sputtering, or the like. On the other hand, if the gate insulating film 4604 is nitrided by plasma treatment under a nitrogen atmosphere, a silicon nitride oxide film ($SiN_xO_y$) (x>y) can be provided as the insulating film 4624 on the surface of the gate insulating film 4604. Alternatively, after oxidizing the gate insulating film 4604 by performing plasma treatment under an oxygen atmosphere, the gate insulating film 4604 may be subjected to plasma treatment again under a nitrogen atmosphere, so as to be nitrided. In addition, the insulating film 4624 contains a rare gas which is used in the plasma treatment, and for example, it contains Ar if Ar is used in the plasma treatment.

Figure 49D:
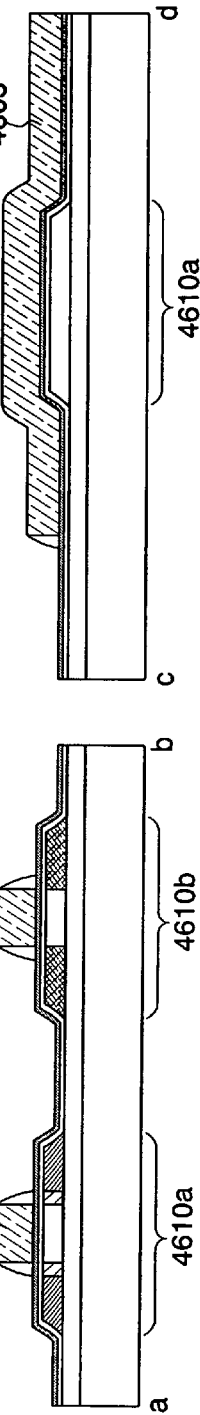

Next, by forming the gate electrodes 4605 or the like over the gate insulating film 4604, a semiconductor device having the n-channel transistor 4610a and the p-channel transistor 4610b which use the island-shaped semiconductor films 4603a and 4603b respectively as channel regions can be manufactured (FIG. 49D).

In this manner, by performing plasma treatment to the gate insulating film, an insulating film made of an oxide or nitride film can be provided on the surface of the gate insulating film, and thus the surface of the gate insulating film can be modified. Since the insulating film obtained by oxidation or nitridation with plasma treatment is dense and has few defects such as pin holes, compared with a gate insulating film formed by CVD or sputtering, the characteristics of the transistors can be improved. In addition, whereas short circuits or the like between the gate electrodes and the semiconductor films can be prevented by forming the semiconductor films to have tapered edges, which would otherwise be caused by a coverage defect of the semiconductor films with the gate insulating film at the edges, short circuits or the like between the gate electrodes and the semiconductor films can be prevented even more effectively by performing plasma treatment after forming the gate insulating film.

Next, description will be made of a manufacturing method of a semiconductor device which differs from that in FIGS. 49A to 49D, with reference to the drawings. Specifically, a case is shown where plasma treatment is selectively performed to tapered edges of semiconductor films.

First, the island-shaped semiconductor films 4603a and 4603b are formed over the substrate 4601 (FIG. 50A). The island-shaped semiconductor films 4603a and 4603b can be obtained by forming an amorphous semiconductor film over the insulating film 4602 which is formed over the substrate 4601 in advance, by a known method (e.g., sputtering, LPCVD, plasma CVD, or the like) using a material containing silicon (Si) as a main component (e.g., $Si_xGe_{1-x}$ or the like), and crystallizing the amorphous semiconductor film, and further etching the semiconductor film selectively by using resists 4625a and 4625b as masks. Note that the crystallization of the amorphous semiconductor film can be performed by a known crystallization method such as laser crystallization, thermal crystallization using RTA or an annealing furnace, or thermal crystallization using metal elements which promote crystallization, or a method combining them.

Next, the edges of the island-shaped semiconductor films 4603a and 4603b are selectively oxidized or nitrided by plasma treatment before removing the resists 4625a and 4625b which are used for etching the semiconductor films, thereby an insulating film (an oxide or nitride film) 4626 is formed on each edge of the semiconductor films 4603a and 4603b (FIG. 50B). The plasma treatment is performed with the aforementioned conditions. In addition, the insulating film 4626 contains a rare gas which is used in the plasma treatment.

Next, the gate insulating film 4604 is formed to cover the semiconductor films 4603a and 4603b (FIG. 50C). The gate insulating film 4604 can be formed in a similar manner to the aforementioned one.

Next, by forming the gate electrodes 4605 or the like over the gate insulating film 4604, a semiconductor device having the n-channel transistor 4610a and the p-channel transistor 4610b which use the island-shaped semiconductor films 4603a and 4603b respectively as channel regions can be manufactured (FIG. 50D).

If the semiconductor films 4603a and 4603b are provided with tapered edges, edges 4652a and 4652b of the channel regions which are formed in parts of the semiconductor films 4603a and 4603b are also tapered, thereby the thickness of the semiconductor films and the gate insulating film in that portion differs from that in the central portion, which may adversely affect the characteristics of the transistors. Thus, the adverse effects on the transistors due to the edges of the channel regions can be reduced by forming insulating films on the edges of the semiconductor films, namely, the edges of the channel regions, by selectively oxidizing or nitriding the edges of the channel regions by plasma treatment here.

Although FIGS. 50A to 50D show an example where only the edges of the semiconductor films 4603a and 4603b are oxidized or nitrided by plasma treatment, the gate insulating film 4604 can also be oxidized or nitrided by plasma treatment as shown in FIG. 49C (FIG. 52A).

Next, description will be made of a manufacturing method of a semiconductor device which differs from the aforementioned manufacturing method, with reference to the drawings. Specifically, a case of performing plasma treatment to semiconductor films with tapered shapes is shown.

First, the island-shaped semiconductor films 4603a and 4603b are formed over the substrate 4601 in a similar manner to the aforementioned one (FIG. 51A).

Next, the semiconductor films 4603a and 4603b are oxidized or nitrided by plasma treatment, thereby forming insulating films (oxide or nitride films) 4627a and 4627b on the surfaces of the semiconductor films 4603a and 4603b (FIG. 50B). The plasma treatment can be performed with the aforementioned conditions. For example, when Si is used for the semiconductor films 4603a and 4603b, silicon oxide ($SiO_x$) or silicon nitride ($SiN_x$) is formed as the insulating films 4627a and 4627b. In addition, after oxidizing the semiconductor films 4603a and 4603b by plasma treatment, the semiconductor films 4603a and 4603b may be subjected to plasma treatment again to be nitrided. In that case, silicon oxide ($SiO_x$) or silicon oxynitride ($SiO_xN_y$) (x>y) is formed on the semiconductor films 4603a and 4603b first, and then silicon nitride oxide ($SiN_xO_y$) (x>y) is formed on the silicon oxide or the silicon oxynitride. Therefore, the insulating films 4627a and 4627b contain a rare gas which is used in the plasma treatment. Note that the edges of the semiconductor films 4603a and 4603b are concurrently oxidized or nitrided by performing plasma treatment.

Next, the gate insulating film 4604 is formed to cover the insulating films 4627a and 4627b (FIG. 51C). The gate insulating film 4604 can be formed to have either a single-layer structure or a stacked-layer structure of an insulating film containing oxygen or nitrogen, such as silicon oxide ($SiO_x$), silicon nitride ($SiN_x$), silicon oxynitride ($SiO_xN_y$) (x>y), or silicon nitride oxide ($SiN_xO_y$) (x>y) by a known method (e.g., sputtering, LPCVD, plasma CVD, or the like). For example, when Si is used for the semiconductor films 4603a and 4603b, and the surfaces of the semiconductor films 4603a and 4603b are oxidized by plasma treatment to form silicon oxide as the insulating films 4627 and 4627b, silicon oxide ($SiO_x$) is formed as a gate insulating film over the insulating films 4627a and 4627b.

Next, by forming the gate electrodes 4605 or the like over the gate insulating film 4604, a semiconductor device having the n-channel transistor 4610a and the p-channel transistor 4610b which use the island-shaped semiconductor films 4603a and 4603b respectively as channel regions can be manufactured (FIG. 51D).

If the semiconductor films are provided with tapered edges, edges 4653a and 4653b of the channel regions which are formed in parts of the semiconductor films are also tapered, which may adversely affect the characteristics of the semiconductor elements. Thus, the adverse effects on the semiconductor elements can be reduced by oxidizing or nitriding the semiconductor films by plasma treatment, since the edges of the channel regions can be also oxidized or nitrided accordingly.

Although FIGS. 51A to 51D show an example where only the semiconductor films 4603a and 4603b are oxidized or nitrided by plasma treatment, the gate insulating film 4604 may also be oxidized or nitrided by plasma treatment as shown in FIG. 49C (FIG. 52B). In that case, after oxidizing the gate insulating film 4604 by plasma treatment under an oxygen atmosphere, the gate insulating film 4604 may be subjected to plasma treatment again to be nitrided. In such a case, silicon oxide ($SiO_x$) or silicon oxynitride ($SiO_xN_y$) (x>y) is formed on the semiconductor films 4603a and 4603b first, and then silicon nitride oxide ($SiN_xO_y$) (x>y) is formed in contact with the gate electrodes 4605.

In this manner, by modifying the surface of a semiconductor film or an insulating film by oxidation or nitridation using plasma treatment, a dense and high-quality insulating film can be formed. Accordingly, defects such as pin holes can be prevented even when the insulating film is formed to be thin, thereby microfabrication and high performance of semiconductor elements such as transistors can be realized.

Although this embodiment mode has illustrated an example where plasma treatment is performed to the semiconductor films 4603a and 4603b or the gate insulating film 4604 in FIG. 46B so as to oxidize or nitride the semiconductor films 4603a and 4603b or the gate insulating film 4604, a layer to be subjected to the plasma treatment is not limited to these. For example, plasma treatment may be performed to the substrate 4601, the insulating film 4602, the insulating film 4606, or the insulating film 4607.

Note that this embodiment mode can be freely combined with any of Embodiment Modes 1 to 8. That is, in the display device manufactured by the process in accordance with this embodiment mode, a transistor can be driven with a low voltage, and thus variations in the threshold voltage can be reduced. Further, since a current flowing into a light-emitting element can be determined independently of the threshold voltage of a transistor, variations in luminance of the light-emitting element can be reduced, which in turn can improve the image quality.

Embodiment Mode 10

In this embodiment, description will be made of a halftone process as a method for manufacturing a display device including transistors.

Figure 53:
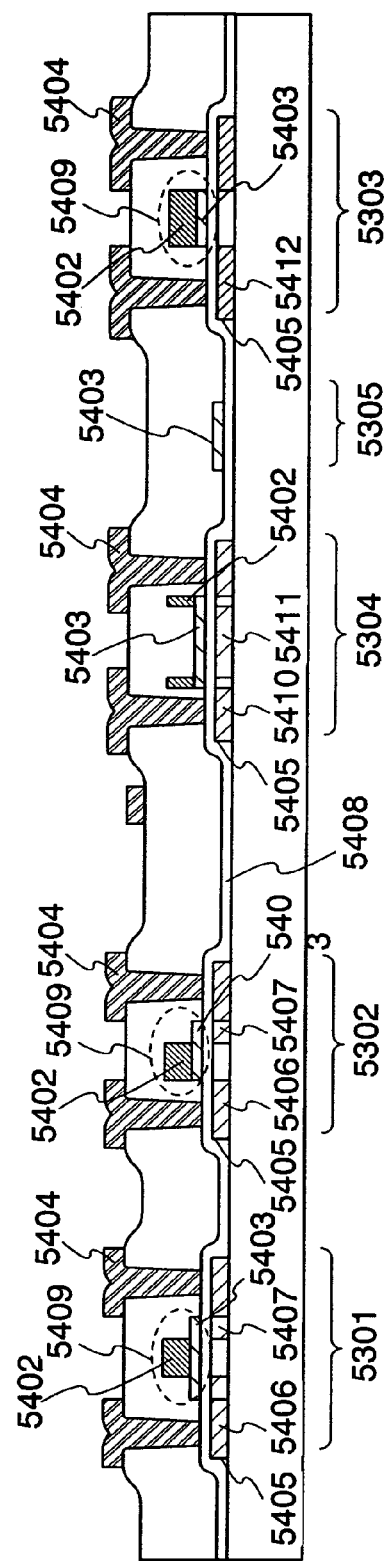
FIG. 53 illustrates a cross-sectional structure of a transistor used in the display device of the invention.

FIG. 53 shows a cross-sectional structure of a display device including transistors, a capacitor, and a resistor. FIG. 53 shows n-channel transistors 5301 and 5302, a capacitor 5304, a resistor 5305, and a p-channel transistor 5303. Each transistor has a semiconductor layer 5405, an insulating layer 5408, and a gate electrode 5409. The gate electrode 5409 is formed to have a stacked structure of a first conductive layer 5403 and a second conductive layer 5402. In addition, FIGS. 54A to 54E are top views of the transistors, the capacitor, and the resistor shown in FIG. 53, which can be referred to in conjunction with FIG. 53.

Referring to FIG. 53, the n-channel transistor 5301 has impurity regions 5407 (also called lightly doped drain: LDD regions) on opposite sides of a channel region in the semiconductor layer 5405, which are doped with impurities at a lower concentration than impurity regions 5406 which form source and drain regions for making contact with wires 5404. In forming the n-channel transistor 5301, the impurity regions 5406 and 5407 are doped with phosphorus as impurities which impart n-type conductivity. The LDD regions are formed in order to suppress hot-electron degradation and a short-channel effect.

Figure 54A:
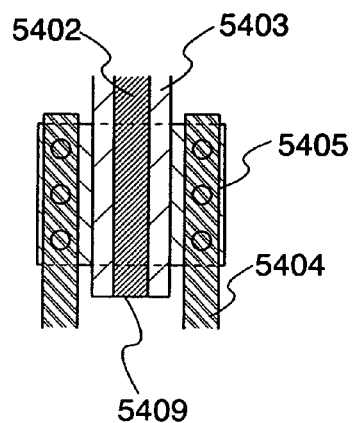
FIGS. 54A to 54E are top views of a transistor used in the display device of the invention.

As shown in FIG. 54A, the first conductive layer 5403 is formed to be wider than the second conductive layer 5402 in the gate electrode 5409 of the n-channel transistor 5301. In this case, the first conductive layer 5403 is formed to be thinner than the second conductive layer 5402. The first conductive layer 5403 is formed to have a thickness enough for ion species which are accelerated with an electric field of 10 to 100 kV to travel through. The impurity regions 5407 are formed to overlap with the first conductive layer 5403 of the gate electrode 5409. That is, LDD regions which overlap with the gate electrode 5409 are formed. In this structure, the impurity regions 5407 are formed in a self-aligned manner by doping the semiconductor layer 5405 with impurities having one conductivity type through the first conductive layer 5403 of the gate electrode 5409, using the second conductive layer 5402 as a mask. That is, the LDD regions which overlap with the gate electrode are formed in a self-aligned manner.

Figure 54B:
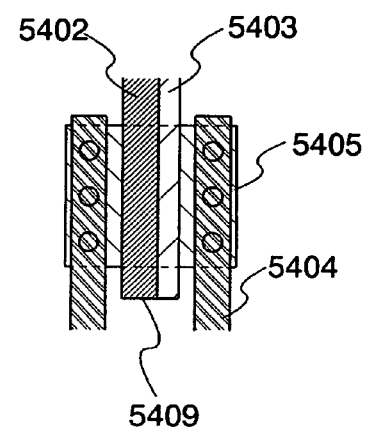

Referring again to FIG. 53, the n-channel transistor 5302 has the impurity region 5407 only on one side of a channel region in the semiconductor layer 5405, which is doped with impurities at a lower concentration than the impurity regions 5406. As shown in FIG. 54B, the first conductive layer 5403 is formed to be wider than one side of the second conductive layer 5402 in the gate electrode 5409 of the n-channel transistor 5302. In this case also, an LDD region can be formed in a self-aligned manner by doping the semiconductor layer 5405 with impurities having one conductivity type through the first conductive layer 5403 using the second conductive layer 5402 as a mask.

A transistor having an LDD region on one side of a channel region may be used as a transistor where only a positive voltage or a negative voltage is applied between source and drain electrodes. Specifically, such a transistor may be applied to a transistor for constructing a logic gate such as an inverter circuit, a NAND circuit, a NOR circuit, or a latch circuit, or a transistor for constructing an analog circuit such as a sense amplifier, a constant voltage generation circuit, or a VCO.

Figure 54C:
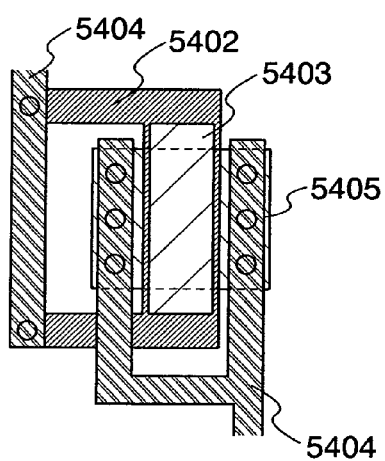

Referring again to FIG. 53, the capacitor 5304 is formed by sandwiching the insulating layer 5408 by the first conductive layer 5403 and the semiconductor layer 5405. The semiconductor layer 5405 for forming the capacitor 5304 includes impurity regions 5410 and 5411. The impurity region 5411 is formed in the semiconductor layer 5405 in a position overlapping with the first conductive layer 5403. The impurity region 5410 forms a contact with the wire 5404. The impurity region 5411 can be formed by doping the semiconductor layer 5405 with impurities having one conductivity type through the first conductive layer 5403; therefore, the concentration of impurities having one conductivity type which are contained in the impurity regions 5410 and 5411 can be controlled to be either the same or different. In either case, since the semiconductor layer 5405 in the capacitor 5304 functions as an electrode, the resistance of the semiconductor layer 5405 is preferably lowered by adding impurities with one conductivity type thereto. Further, the first conductive layer 5403 can fully function as an electrode by utilizing the second conductive layer 5402 as an auxiliary electrode as shown in FIG. 54C. In this manner, by forming a composite electrode structure where the first conductive layer 5403 and the second conductive layer 5402 are combined, the capacitor 5304 can be formed in a self-aligned manner.

Referring again to FIG. 53, the resistor 5305 is formed of the first conductive layer 5403. The first conductive layer 5403 is formed to have a thickness of 30 to 150 nm; therefore, the resistor can be formed by appropriately setting the width or length of the first conductive layer 5403.

Figure 54D:
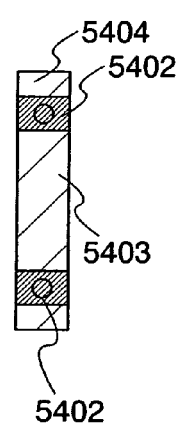

The resistor may be formed with a semiconductor layer containing impurity elements at a high concentration or a thin metal layer. A metal layer is preferable since the resistance value thereof is determined by the thickness and quality of the film itself, and thus has small variations, while the resistance value of a semiconductor layer is determined by the thickness and quality of the film, the concentration and activation rate of impurities, and the like. FIG. 54D shows a top view of the resistor 5405.

Figure 54E:
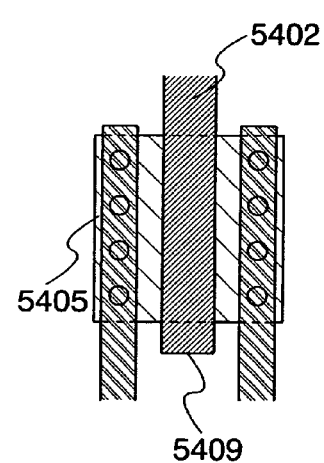

Referring again to FIG. 53, the semiconductor layer 5305 in the p-channel transistor 5303 has the impurity region 5412. This impurity region 5412 forms a source or drain region for making contact with the wire 5404. The gate electrode 5409 has a structure where the first conductive layer 5403 and the second conductive layer 5402 overlap with each other. The p-channel transistor 5303 is a transistor with a single-drain structure where no LDD region is provided. In forming the p-channel transistor 5303, the impurity region 5412 is doped with boron or the like as impurities which impart p-type conductivity. On the other hand, an n-channel transistor with a single-drain structure can also be formed if the impurity region 5412 is doped with phosphorus. FIG. 54E shows a top view of the p-channel transistor 5303.

One or both of the semiconductor layer 5405 and the gate insulating layer 5408 may be oxidized or nitrided by high-density plasma treatment with the conditions of microwave excitation, an electron temperature of less than or equal to 2 eV, an ion energy of less than or equal to 5 eV, and an electron density in the range of $1 \times 10^{11}$ to $1 \times 10^{13}$ cm$^{-3}$. At this time, by treating the layer in an oxygen atmosphere (e.g., $O_2$, $N_2O$, or the like) or a nitrogen atmosphere (e.g., $N_2$, $NH_3$, or the like) with the substrate temperature being set at 300 to 450° C., a defect level of an interface between the semiconductor layer 5405 and the gate insulating layer 5408 can be lowered. By performing such treatment to the gate insulating layer 5408, the gate insulating layer 5408 can be densified. That is, generation of defective charges can be suppressed, and thus fluctuations of the threshold voltage of the transistor can be suppressed. In addition, in the case of driving the transistor with a voltage of less than or equal to 3 V, an insulating layer oxidized or nitrided by the aforementioned plasma treatment can be used as the gate insulating layer 5408. Meanwhile, in the case of driving the transistor with a voltage of greater than or equal to 3 V, the gate insulating layer 5408 can be formed by combining an insulating layer formed on the surface of the semiconductor layer 5405 by the aforementioned plasma treatment with an insulating layer deposited by CVD (plasma CVD or thermal CVD). Similarly, such an insulating layer can be utilized as a dielectric layer of the capacitor 5304 as well. In this case, the insulating layer formed by the plasma treatment is a dense film with a thickness of 1 to 10 nm; therefore, a capacitor with a high capacity can be formed.

As has been described with reference to FIGS. 53 and 54A to 54E, elements with various structures can be formed by combining conductive layers with various thickness. A region where only the first conductive layer is formed and a region where both the first conductive layer and the second conductive layer are formed can be formed by using a photomask or a reticle having an auxiliary pattern which is formed of a diffraction grating pattern or a semi-transmissive film and has a function of reducing the light intensity. That is, the thickness of the resist mask to be developed is varied by controlling the quantity of light that the photomask can transmit, at the time of exposing the photoresist to light in the photolithography process. In this case, a resist with the aforementioned complex shape may be formed by providing the photomask or the reticle with slits with a resolution limit or narrower than that. Further, the mask pattern formed of the photoresist material may be transformed by baking at 200° C. after development.

By using a photomask or a reticle having an auxiliary pattern which is formed of a diffraction grating pattern or a semi-transmissive film and has a function of reducing the light intensity, the region where only the first conductive layer is formed and the region where the first conductive layer and the second conductive layer are stacked can be continuously formed. As shown in FIG. 54A, the region where only the first conductive layer is formed can be selectively formed over the semiconductor layer. Whereas such a region is effective over the semiconductor layer, it is not required in other regions (wire regions which are connected to a gate electrode). With such a photomask or reticle, the region where only the first conductive layer is not formed in the wire portion; therefore, the density of the wire can be substantially increased.

In FIGS. 53 and 54A to 54E, the first conductive layer is formed with a thickness of 30 to 50 nm, using high-melting-point metals such as tungsten (W), chromium (Cr), tantalum (Ta), tantalum nitride (TaN), or molybdenum (Mo), or alloys or compounds containing such metals as a main component, while the second conductive layer is formed with a thickness of 300 to 600 nm, using high-melting-point metals such as tungsten (W), chromium (Cr), tantalum (Ta), tantalum nitride (TaN), or molybdenum (Mo), or alloys or compounds containing such metals as a main component. For example, the first conductive layer and the second conductive layer are formed with different conductive materials, so that the etching rate of each conductive layer can be varied in the etching process to be performed later. For example, TaN can be used for the first conductive layer, while a tungsten film can be used for the second conductive layer.

This embodiment mode shows that transistors, a capacitor, and a resistor each having a different electrode structure can be formed concurrently through the same patterning process, using a photomask or a reticle having an auxiliary pattern which is formed of a diffraction grating pattern or a semi-transmissive film and has a function of reducing the light intensity. Accordingly, elements with different modes can be formed and integrated in accordance with the characteristics required of a circuit, without increasing the number of manufacturing steps.

Note that this embodiment mode can be freely combined with any of Embodiment Modes 1 to 9. That is, in the display device in accordance with this embodiment mode, elements with different modes can be formed in accordance with the characteristics required of a circuit without increasing the number of manufacturing steps. Further, since a current flowing into a light-emitting element can be determined independently of the threshold voltage of a transistor, variations in luminance of the light-emitting element can be reduced, which in turn can improve the image quality.

Embodiment Mode 11

In this embodiment, description will be made of an exemplary mask pattern for manufacturing a display device including transistors, with reference to FIGS. 55A to 57B.

Figure 55A:
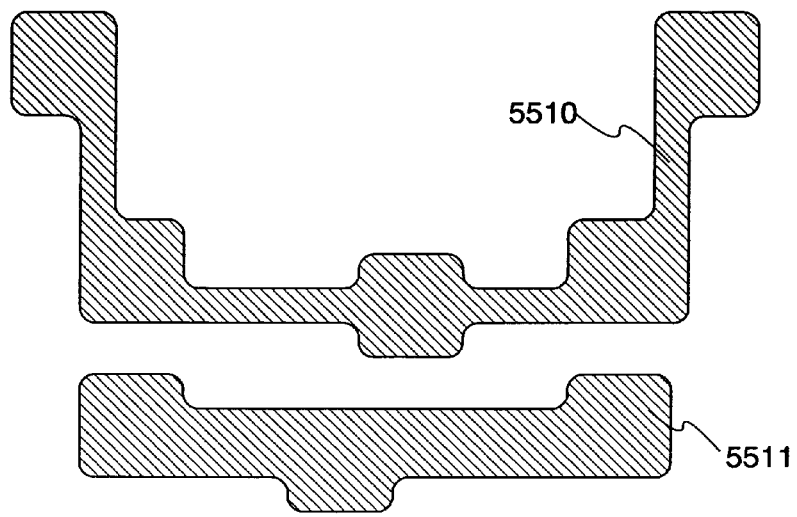
FIGS. 55A and 55B illustrate exemplary mask patterns of a transistor used in the display device of the invention.

Semiconductor layers 5510 and 5511 shown in FIG. 55A are preferably formed with silicon or a crystalline semiconductor containing silicon as a main component. For example, single crystalline silicon, polycrystalline silicon obtained by crystallizing a silicon film by laser annealing, or the like can be employed. Alternatively, a metal oxide semiconductor, amorphous silicon, or an organic semiconductor which exhibits semiconductor characteristics can be employed.

In any case, a semiconductor layer to be formed first is provided over the entire surface of a substrate having an insulating surface, or a part thereof (a region having a larger area than the area which is defined as a semiconductor region of a transistor). Then, a mask pattern is formed over the semiconductor layer by a photolithography technique. By etching the semiconductor layer using the mask pattern, the semiconductor layers 5510 and 5511 each having a specific island shape are formed, which include source and drain regions and a channel formation region of a transistor. The semiconductor layers 5510 and 5511 are determined in accordance with the layout design.

Figure 55B:
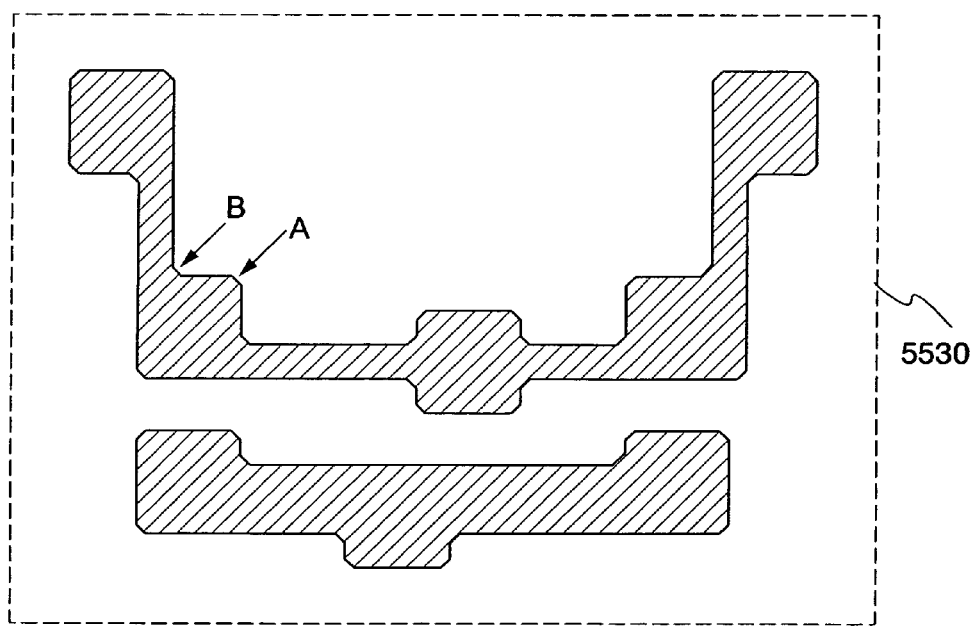

The photomask for forming the semiconductor layers 5510 and 5511 which are shown in FIG. 55A has a mask pattern 5530 shown in FIG. 55B. The shape of this mask pattern 5530 differs depending on whether the resist used for the photolithography process is a positive type or a negative type. In the case of using a positive resist, the mask pattern 5530 shown in FIG. 55B is formed as a light-blocking portion. The mask pattern 5530 has a shape that a vertex A of a polygon is removed. In addition, a corner B has such a shape that a plurality of gradations are provided so as not to form a right-angled corner.

The semiconductor layers 5510 and 5511 shown in FIG. 55A reflect the shape of the mask pattern 5530 shown in FIG. 55B. In the photolithography process, the mask pattern 5530 may be transferred such that a pattern similar to the original mask pattern is formed, or a transferred pattern has more roundish corners than the original mask pattern. That is, the semiconductor layers 5510 and 5511 can be formed to have corner portions with an even rounder and smoother shape, than those of the mask pattern 5530.

Figure 56A:
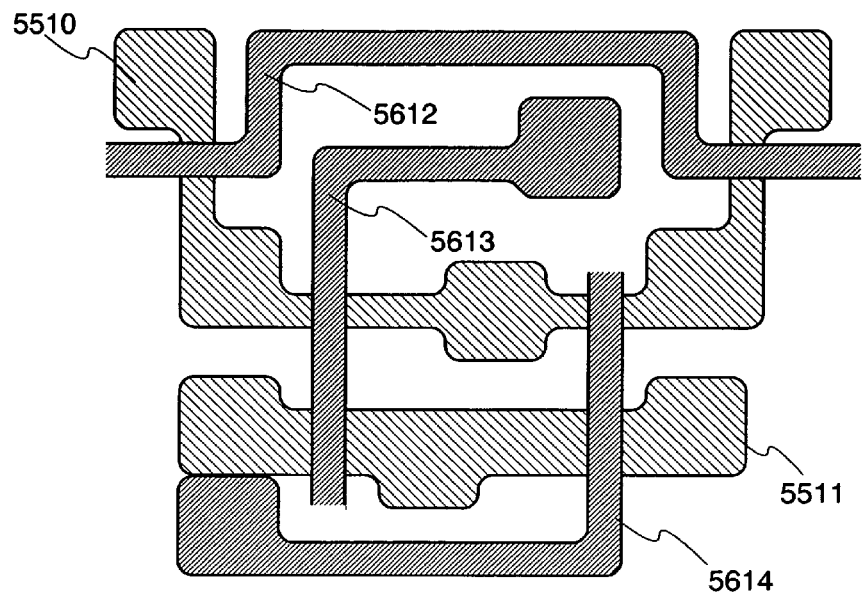
FIGS. 56A and 56B illustrate exemplary mask patterns of a transistor used in the display device of the invention.

An insulating layer which at least partially contains silicon oxide or silicon nitride is formed over the semiconductor layers 5510 and 5511. One of the purposes of forming this insulating layer is to form a gate insulating layer. Then, gate wires 5612, 5613, and 5614 are formed so as to partially overlap with the semiconductor layers as shown in FIG. 56A. The gate wire 5612 is formed corresponding to the semiconductor layer 5510. The gate wire 5613 is formed corresponding to the semiconductor layers 5510 and 5511. The gate wire 5614 is formed corresponding to the semiconductor layers 5510 and 5511. The gate wires are formed by depositing a metal layer or a highly conductive semiconductor layer over the insulating layer and then printing a pattern onto the layer by a photolithography technique.

Figure 56B:
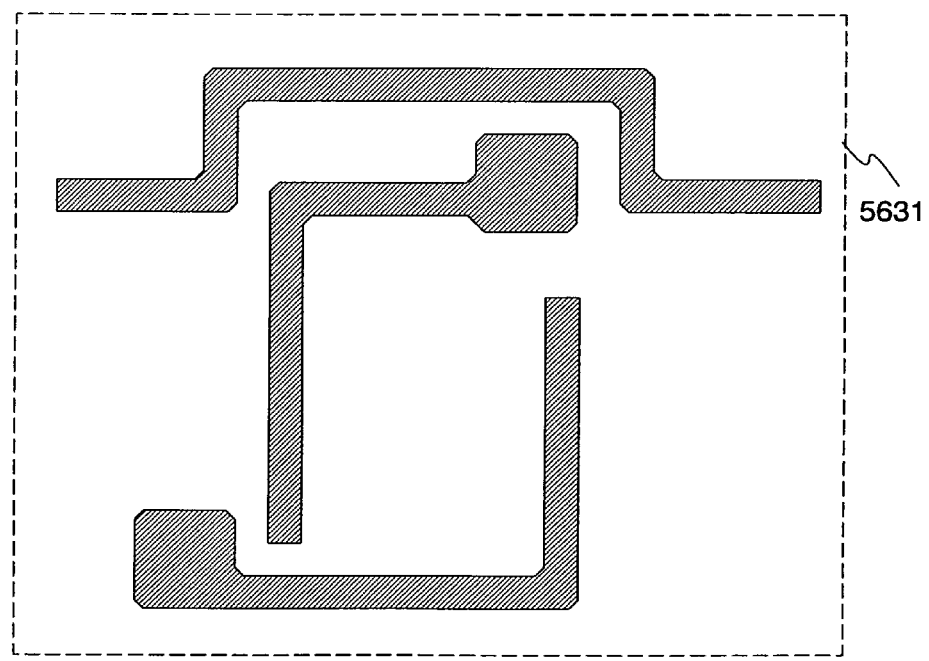

The photomask for forming such gate wires has a mask pattern 5631 shown in FIG. 56B. This mask pattern 5631 is removed its corners in such a manner that each removed corner (right-angled triangle) has one side of less than or equal to 10 μm, or has one side as long as $1/5$ to $1/2$ of the wire width. The gate wires 5612, 5613, and 5614 shown in FIG. 56A reflect the shape of the mask pattern 5631 shown in FIG. 56B. Although the mask pattern 5631 may be transferred such that a pattern similar to the original one is formed, the transferred pattern may be controlled to have more roundish corners than those of the original one. That is, corner portions which have a more roundish and smoother shape than those of the mask pattern 5631 can be formed. Specifically, each of the gate wires 5612, 5613, and 5614 is formed to have roundish corners by being removed edges such that each removed corner (right-angled triangle) has one side of less than or equal to 10 μm, or has one side as long as $1/5$ to $1/2$ of the wire width. By forming a projecting portion to have a roundish corner, generation of particles due to overdischarge can be suppressed in dry etching with plasma. In addition, by forming a depressed portion to have a roundish corner, such an effect can be obtained that, even when particles are generated in washing, they can be washed away without gathering in the corner. Thus, yields can be significantly improved.

An interlayer insulating layer is a layer to be formed after forming the gate wires 5612, 5613, and 5614. The interlayer insulating layer is formed with an inorganic insulating material such as silicon oxide or an organic insulating material such as polyimide or an acrylic resin. Another insulating layer such as silicon nitride or silicon nitride oxide may be provided between the interlayer insulating layer and the gate wires 5612, 5613, and 5614. Further, an insulating layer such as silicon nitride or silicon nitride oxide may be provided over the interlayer insulating layer as well. Such an insulating layer can prevent contamination of the semiconductor layer and the gate insulating layer with impurities such as extrinsic metal ions or moisture, which would otherwise adversely affect the transistor.

Figure 57A:
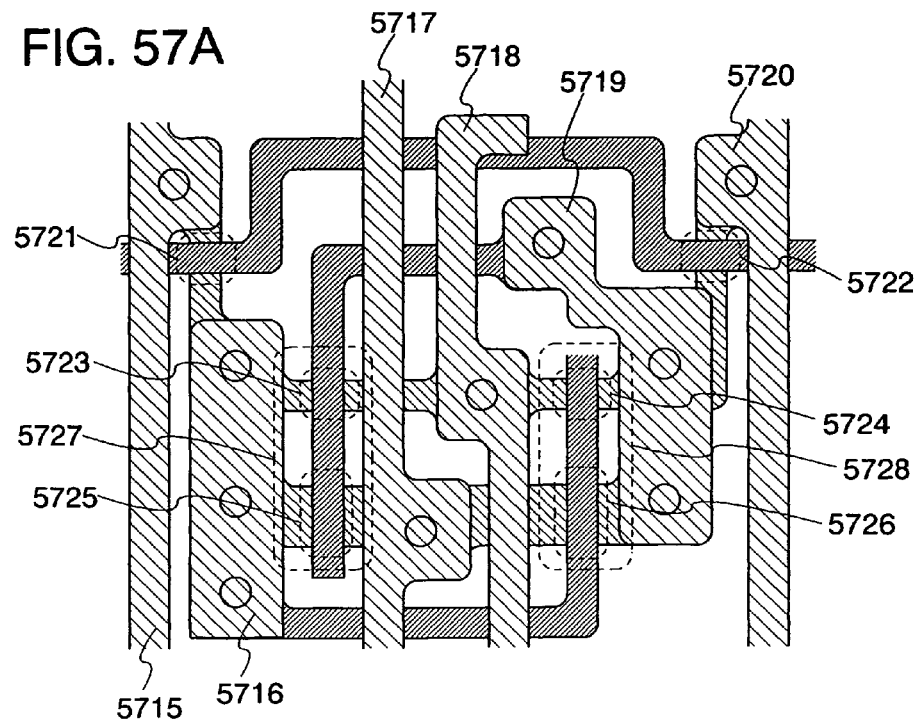
FIGS. 57A and 57B illustrate exemplary mask patterns of a transistor used in the display device of the invention.

Openings are formed in predetermined positions of the interlayer insulating layer. For example, the openings are provided in corresponding positions to the gate wires and the semiconductor layers located below the interlayer insulating layer. A wire layer which has a single layer or a plurality of layers of metals or metal compounds is formed by photolithography with the use of a mask pattern, and then etching into a desired pattern. Then, as shown in FIG. 57A, the wires 5715 to 5720 are formed to partially overlap with the semiconductor layers. A wire connects specific elements to each other, which means a wire connects specific elements not linearly but nonlinearly (so as to include corners) due to the restriction of a layout. In addition, the width of the wire varies in between a contact portion and other portions. As for the contact portion, if the width of a contact hole is wider than or equal to the wire width, the wire in the contact portion is formed to be wider than the width of the wire in other portions.

Figure 57B:
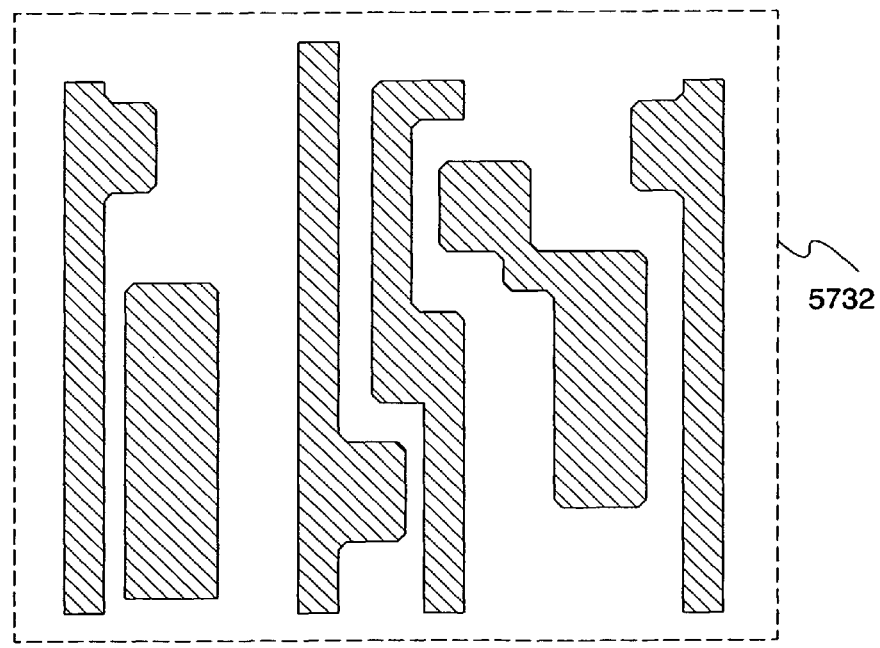

A photomask for forming the wires 5715 and 5720 has a mask pattern 5732 shown in FIG. 57B. In this case also, each wire is formed to have roundish corners by being removed edges such that each removed corner (right-angled triangle) has one side of less than or equal to 10 μm, or has one side as long as /1;5 to /1;2 of the wire width. By forming a projecting portion of such a wire to have a roundish corner, generation of particles due to overdischarge can be suppressed in dry etching with plasma. In addition, by forming a depressed portion to have a roundish corner, such an effect can be obtained that, even when particles are generated in washing, they can be washed away without gathering in the corner. Thus, yields can be significantly improved. Further, by forming wires to have roundish corners, an electric field can be prevented from concentrating on the corner, thereby the wire can be less easily broken. Further, when a plurality of wires are formed in parallel, dust can be easily washed away.

In FIG. 57A, n-channel transistors 5721 to 5724 and p-channel transistors 5725 and 5726 are formed. A pair of the n-channel transistor 5723 and the p-channel transistor 5725, and a pair of the n-channel transistor 5724 and the p-channel transistor 5726 constitute inverters 5727 and 5728 respectively. Note that a circuit including the six transistors constitutes an SRAM. An insulating layer such as silicon nitride or silicon oxide may be formed over these transistors.

Note also that this embodiment mode can be freely combined with any of Embodiment Modes 1 to 10. That is, in the display device in accordance with this embodiment mode, dust which is produced during the formation of wires can be effectively removed, thereby defects of light-emitting elements which result from the residual foreign material such as duct can be reduced. Further, since a current flowing into a light-emitting element can be determined independently of the threshold voltage of a transistor, variations in luminance of the light-emitting element can be reduced, which in turn can improve the image quality.

Embodiment Mode 12

In this embodiment mode, description will be made of hardware for controlling the driving methods described in Embodiment Modes 1 to 7.

Figure 58:
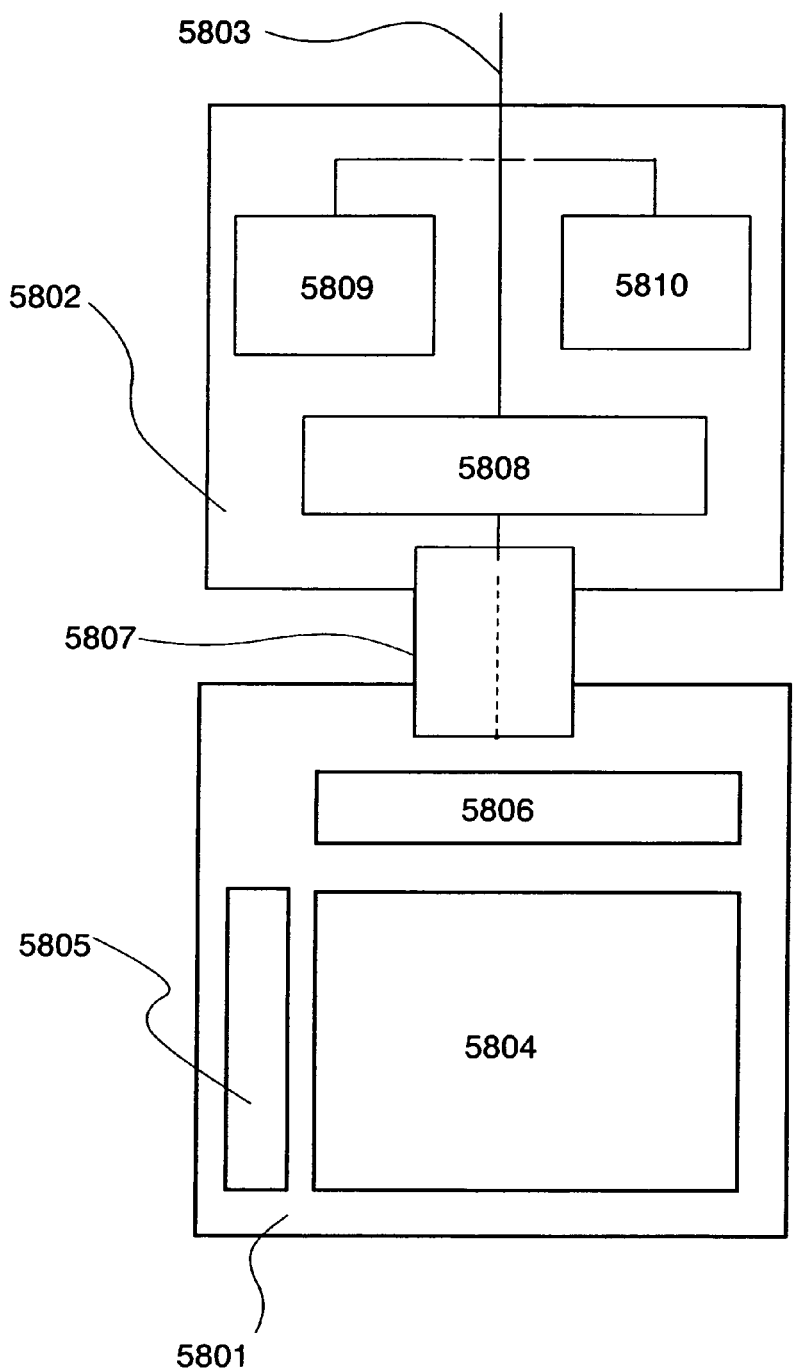
FIG. 58 illustrates exemplary hardware for controlling the driving method of the invention.

FIG. 58 shows a schematic diagram of a display device and hardware. A pixel portion 5804 is disposed over a substrate 5801. In addition, a signal line driver circuit 5806 and a scan line driver circuit 5805 are often disposed over the same substrate. Besides, a power supply circuit, a precharge circuit, a timing generating circuit, and the like may be disposed. There is also a case where the signal line driver circuit 5806 or the scan line driver circuit 5805 is not disposed. In that case, a circuit which is not provided over the substrate 5801 is often formed in an IC. Such an IC is often mounted on the substrate 5801 by COG (Chip On Glass) bonding. Alternatively, the IC may be mounted on a connecting substrate 5807 for connecting a peripheral circuit substrate 5802 to the substrate 5801.

A signal 5803 is inputted to the peripheral circuit substrate 5802, and a controller 5808 controls the signal to be stored in a memory 5809, a memory 5810, or the like. In the case where the signal 5803 is an analog signal, it is often converted into a digital signal before being stored in the memory 5809, the memory 5810, or the like. The controller 5808 outputs a signal to the substrate 5801 by using the signal stored in the memory 5809, the memory 5810, or the like.

In order to implement the driving methods described in Embodiment Modes 1 to 7, the controller 5808 controls the arranging order of subframes or the like, and outputs signals to the substrate 5801.

Note that this embodiment mode can be freely combined with any of Embodiment Modes 1 to 11.

Embodiment Mode 13

In this embodiment, description will be made of an exemplary configuration of an EL module and an EL television receiver using the display device of the invention.

Figure 59:
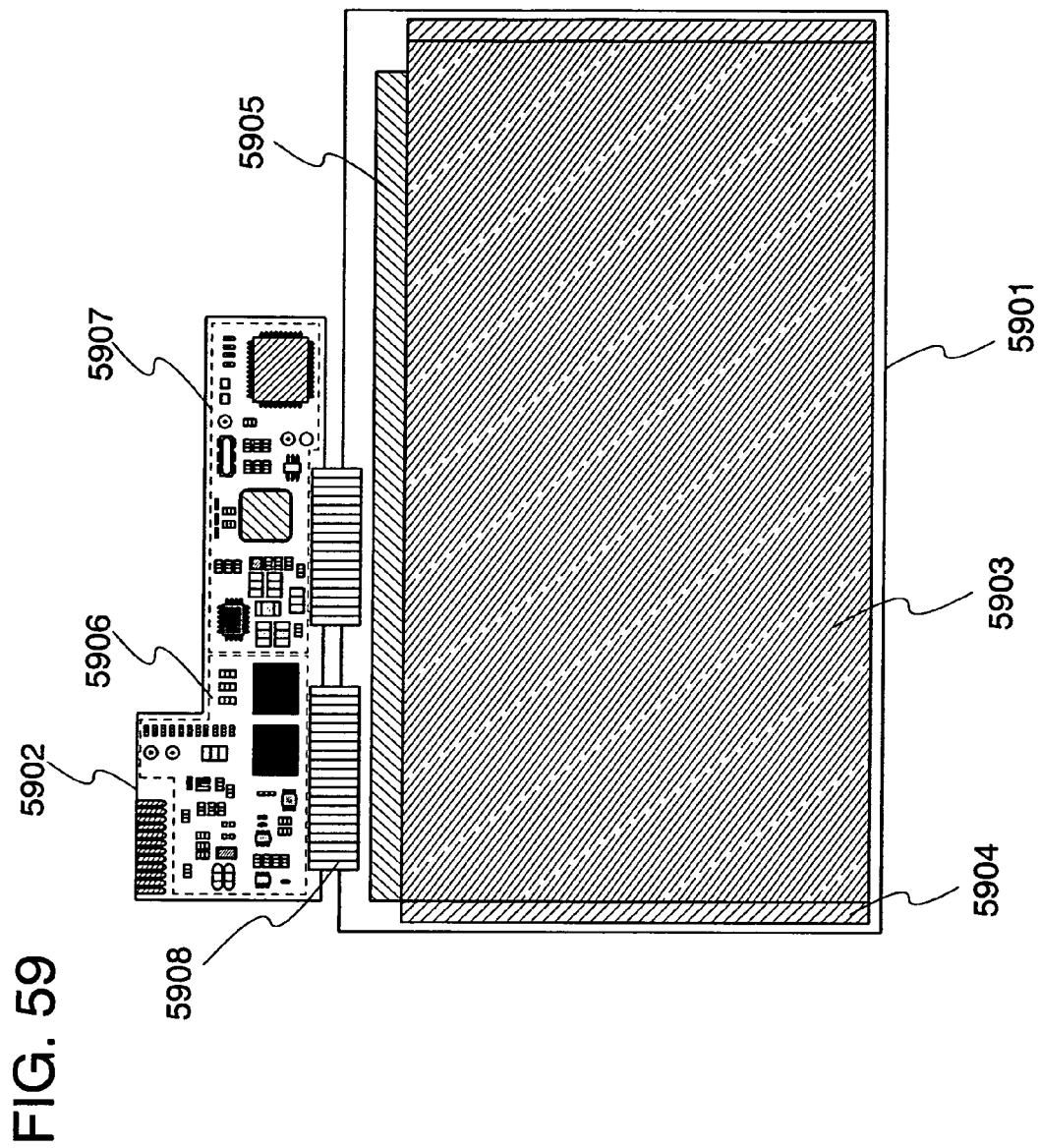
FIG. 59 illustrates an exemplary EL module using the driving method of the invention.

FIG. 59 shows an EL module combining a display panel 5901 and a circuit board 5902. The display panel 5901 includes a pixel portion 5903, a scan line driver circuit 5904, and a signal line driver circuit 5905. A control circuit 5906, a signal dividing circuit 5907, and the like are formed over the circuit board 5902, for example. The display panel 5901 and the circuit board 5911 are connected with a connecting wire 5908. The connecting wire 5908 can be an FPC or the like.

The control circuit 5906 corresponds to the controller 5808 and the memories 5809 and 5810 in Embodiment Mode 12. The control circuit 5906 mainly controls the arranging order of subframes or the like.

The display panel 5901 may be constructed such that a part of peripheral driver circuits (e.g., a driver circuit having a low operating frequency among a plurality of driver circuits) is formed over the same substrate as a pixel portion by using TFTs, while another part of the peripheral driver circuits (a driver circuit having a high operating frequency among the plurality of driver circuits) is formed in an IC chip, so that the IC chip is mounted on the display panel 5901 by COG (Chip On Glass) or the like. Alternatively, the IC chip may be mounted on the display panel 5901 by TAB (Tape Automated Bonding) or a printed wiring board.

In addition, when signals set on scan lines and signals lines are impedance-converted with a buffer, the signal writing period into pixels in each row can be shortened. Accordingly, a higher-definition display device can be provided.

Further, in order to reduce power consumption, a pixel portion may be formed over a glass substrate with TFTs, while all of the peripheral driver circuits may be formed in IC chips to be mounted on the display panel by COG (Chip On Glass) bonding or the like.

Figure 60:
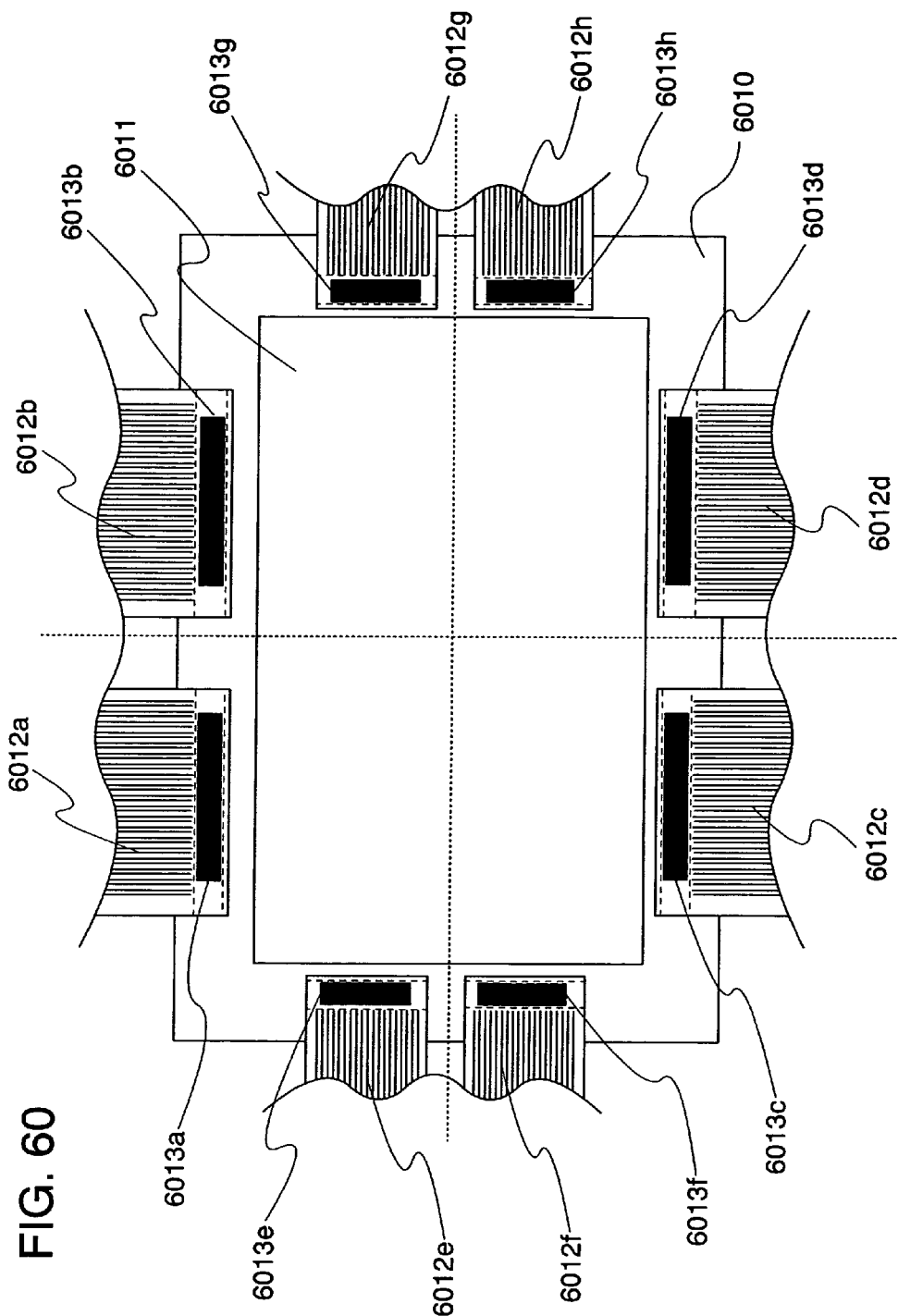
FIG. 60 illustrates an exemplary configuration of a display panel using the driving method of the invention.

For example, the whole display panel may be divided into several regions and IC chips incorporating a part or all of the peripheral driver circuits (the signal line driver circuit, the scan line driver circuit, and the like) may be mounted on the respective regions of the display panel by COG (Chip On Glass) bonding. FIG. 60 shows a configuration of a display panel in that case.

FIG. 60 shows an example where the whole screen is divided into four regions and driven with eight IC chips. The display panel includes a substrate 6010, a pixel portion 6011, FPCs 6012*a* to 6012*h*, and IC chips 6013*a* to 6013*h*. Among the eight IC chips, the IC chips 6013*a* to 6013*d* are formed with signal line driver circuits, and the IC chips 6013*e* to 6013*h* are formed with scan line driver circuits. Then, by driving an arbitrary IC chip, only an arbitrary display region can be driven among the four display regions. For example, when only the IC chips 6013*a* and 6013*e* are driven, only an upper left region can be driven. Accordingly, power consumption can be reduced.

Figure 61:
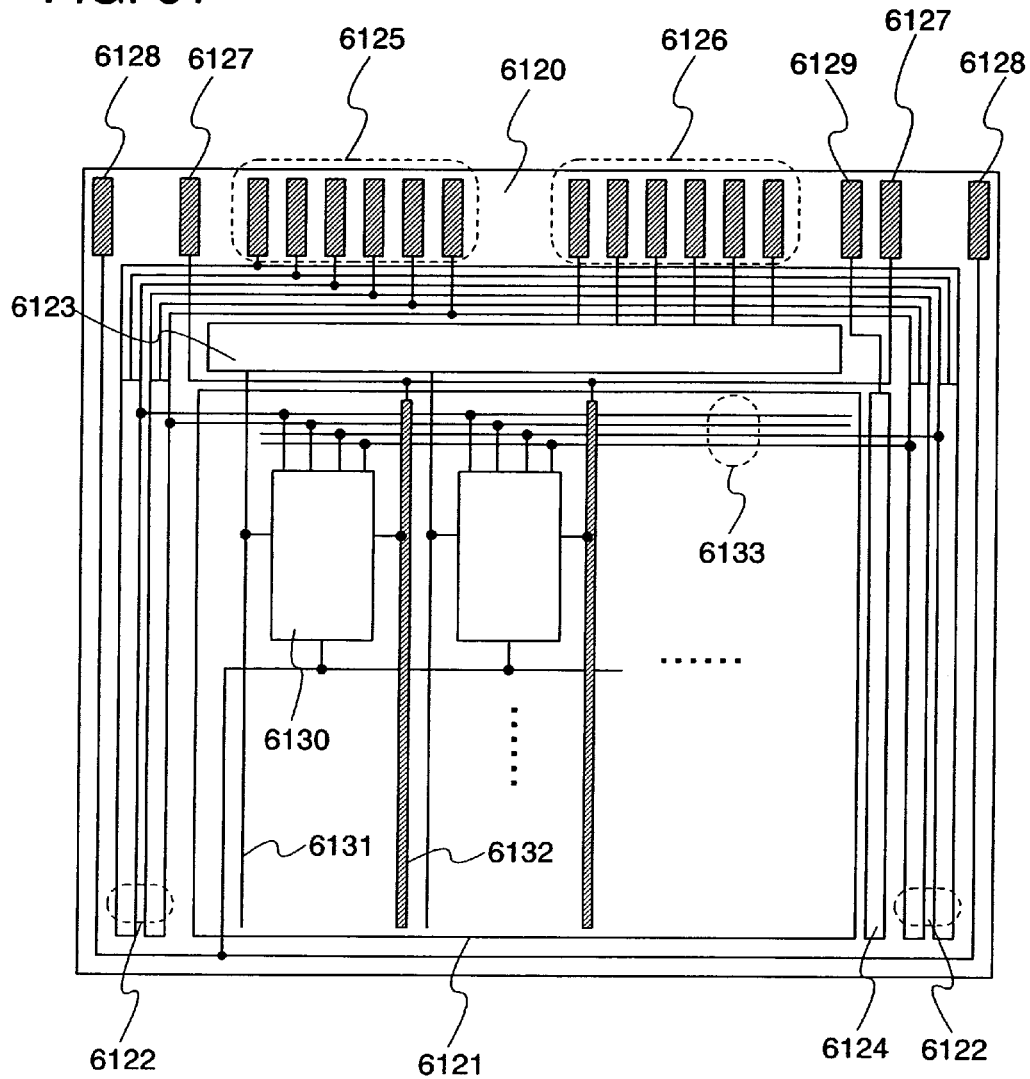
FIG. 61 illustrates an exemplary configuration of a display panel using the driving method of the invention.

FIG. 61 sows an exemplary display panel having another configuration. In the display panel in FIG. 61, a pixel portion 6121 where a plurality of columns of pixels 6130 are arranged, a scan line driver circuit 6122 for controlling signals of scan lines 6133, and a signal line driver circuit 6123 for controlling signals of signal lines 6131 are provided over a substrate 6120. In addition, a monitoring circuit 6124 may be provided in order to compensate variations in luminance of light-emitting elements in the pixels 6130. The light-emitting elements in the pixels 6130 have the same structure as the light-emitting elements in the monitoring circuit 6124. Each light-emitting element has a structure where a material which exhibits electroluminescence is sandwiched between a pair of electrodes.

On the outer edge of the substrate 6120, input terminals 6125 for inputting signals to the scan line driver circuit 6122 from an external circuit, input terminals 6126 for inputting signals to the signal line driver circuit 6123 from an external circuit, and an input terminal 6129 for inputting signals to the monitoring circuit 6124 are provided.

In order to make the light-emitting elements provided in the pixels 6130 emit light, it is necessary to supply power from an external circuit. A power supply line 6132 provided in the pixel portion 6121 is connected at an input terminal 6127 to the external circuit. Since there arises a resistance loss in the power supply line 6132 depending on the length thereof, it is preferable to provide a plurality of input terminals 6127 at the periphery of the substrate 6120. The input terminals 6127 are provided at both ends of the substrate 6120 so that luminance unevenness in the pixel portion 6121 becomes unnoticeable. That is, the phenomenon that only one side of a display screen is bright while the other side is dark can be prevented. In addition, one of a pair of electrodes of each light-emitting element, which is not connected to the power supply line 6132, is formed as a common electrode to be shared by the plurality of pixels 6130, and this electrode also has a plurality of terminals 6128 in order to reduce a resistance loss.

Power supply lines of such a display panel are formed from a low-resistance material such as Cu, which is effective particularly in the case of increasing the size of the display screen. For example, while a display screen with a size of 13 inches has a diagonal line of 340 mm, a display screen with a size of 60 inches has a diagonal line of greater than or equal to 1500 mm. In such a case, the wire resistance necessarily has to be taken into consideration. Therefore, it is preferable to use a low-resistance material such as Cu as a wire. In addition, considering a wire delay, signal lines and scan lines can be formed in a similar manner.

Figure 62:
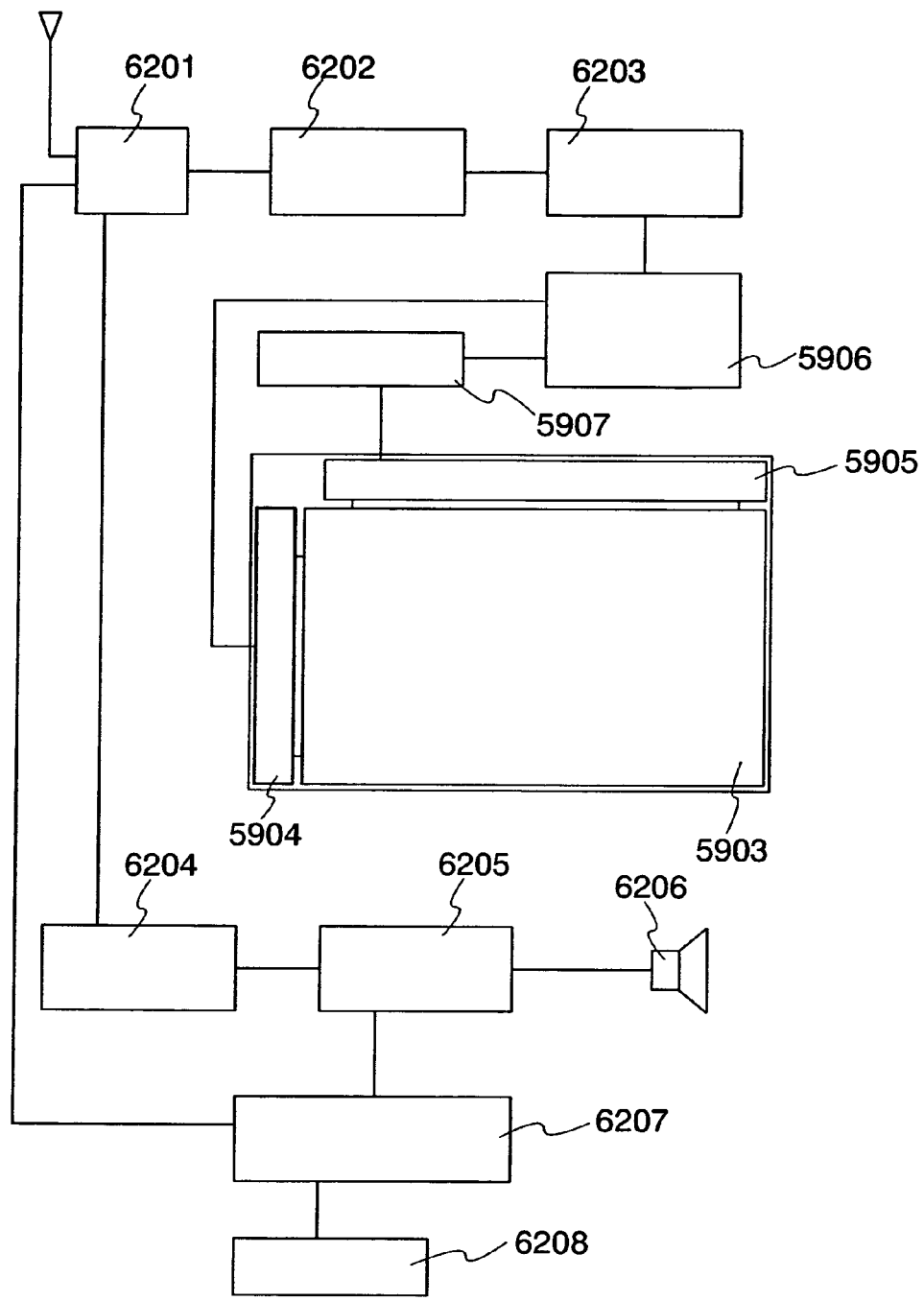
FIG. 62 illustrates an exemplary EL television receiver using the driving method of the invention.

With an EL module having the aforementioned panel configuration, an EL television receiver can be completed. FIG. 62 is a block diagram showing the main configuration of an EL television receiver A tuner 6201 receives video signals and audio signals. The video signals are processed by a video signal amplifier circuit 6202, a video signal processing circuit 6203 for converting a signal output from the video signal amplifier circuit 6202 into a color signal corresponding to each color of red, green, and blue, and a control circuit 5906 for converting the video signal to be input into a driver circuit. The control circuit 5906 outputs signals to each of the scan line side and the signal line side. In the case of performing digital drive, a signal dividing circuit 5907 may be provided on the input side of the signal line driver circuit 5905, so as to divide an input digital signal into m signals before being supplied to a pixel portion.

Among the signals received at the tuner 6201, audio signals are transmitted to an audio signal amplifier circuit 6204, and an output thereof is supplied to a speaker 6206 through an audio signal processing circuit 6205. A control circuit 6207 receives control data on a receiving station (reception frequency) or sound volume from an input portion 6208 and transmits the signals to the tuner 6201 as well as the audio signal processing circuit 6205.

By incorporating the EL module into a housing, a TV receiver can be completed. A display portion of the TV receiver is formed with such an EL module. In addition, a speaker, a video input terminal, and the like are provided as appropriate.

Needless to say, the invention is not limited to the TV receiver, and can be applied as a display medium to various objects such as a monitor of a personal computer, an information display board at the train station, airport, or the like, or an advertisement display board on the street.

In this manner, by using the display device and the driving method thereof in accordance with the invention, a current which flows into a light-emitting element is determined independently of the threshold voltage of a transistor. Accordingly, variations in the threshold voltage of transistors can be compensated, and thus variations in luminance of light-emitting elements can be reduced, which in turn can improve the image quality.

Note that this embodiment mode can be freely combined with any of Embodiment Modes 1 to 12.

Embodiment Mode 14

An electronic device using the display device of the invention includes a camera (e.g., a video camera, a digital camera, and the like), a goggle display (head mounted display), a navigation system, an audio reproducing device (e.g., a car audio, an audio component set, and the like), a personal computer, a game machine, a portable information terminal (e.g., a mobile computer, a mobile phone, a portable game machine, an electronic book, and the like), an image reproducing device provided with a storage medium (specifically, a device for reproducing a storage medium such as a digital versatile disc (DVD) and having a display for displaying the reproduced image). Specific examples of such electronic devices are shown in FIGS. 63A to 63H.

Figure 63A:
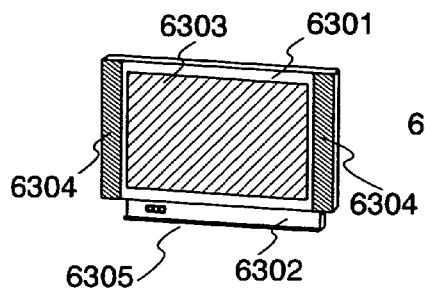
FIGS. 63A to 63H illustrate exemplary electronic devices to which the driving method of the invention is applied.

FIG. 63A shows a light-emitting device which includes a housing 6301, a supporting base 6302, a display portion 6303, speaker portions 6304, a video input terminal 6304, and the like. The invention can be applied to a display device which forms the display portion 6303. In accordance with the invention, clear images with reduced luminance variations can be provided. Since a light-emitting device is a self-luminous type, no backlight is required and a display portion which is thinner than a liquid crystal display can be provided. Note that a light-emitting device includes all display devices for information display such as a personal computer, a TV broadcast reception, and advertisement display.

Figure 63B:
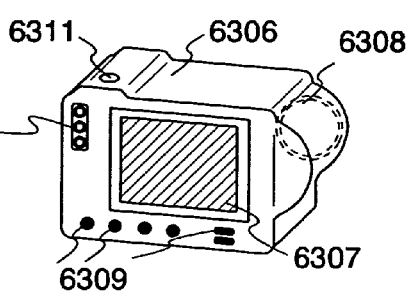

FIG. 63B shows a digital still camera which includes a main body 6306, a display portion 6307, an image receiving portion 6308, operating keys 6309, an external connecting port 6310, a shutter 6311, and the like. The invention can be applied to a display device which forms the display portion 6307. In accordance with the invention, clear images with reduced luminance variations can be provided.

Figure 63C:
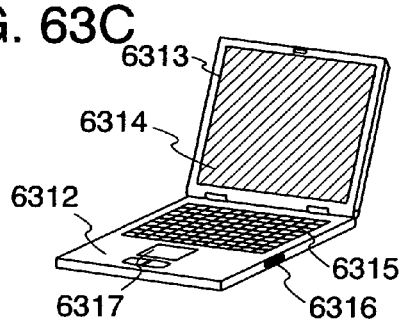

FIG. 63C shows a laptop personal computer which includes a main body 6312, a housing 6316, a display portion 6314, a keyboard 6315, an external connecting port 6316, a pointing device 6317, and the like. The invention can be applied to a display device which forms the display portion 6314. In accordance with the invention, clear images with reduced luminance variations can be provided.

Figure 63D:
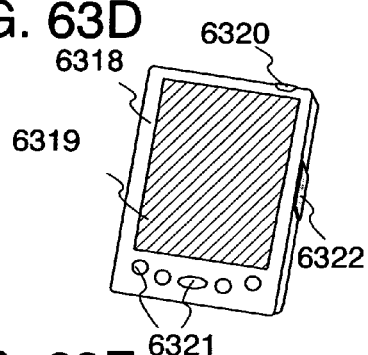

FIG. 63D shows a mobile computer which includes a main body 6318, a display portion 6319, a switch 6320, operating keys 6321, an infrared port 6322, and the like. The invention can be applied to a display device which forms the display portion 6319. In accordance with the invention, clear images with reduced luminance variations can be provided.

Figure 63E:
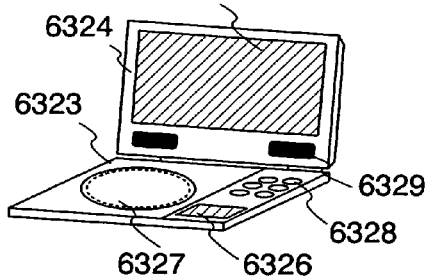

FIG. 63E shows a portable image reproducing device having a storage medium (specifically, a DVD player), which includes a main body 6326, a housing 6324, a display portion A6325, a display portion B6326, a storage medium (e.g., DVD or the like) reading portion 6327, operating keys 6328, a speaker portion 6329, and the like. The display portion A6325 mainly displays image data, while the display portion B6326 displays text data. The invention can be applied to display devices which form the display portions A6325 and B6326. In accordance with the invention, clear images with reduced luminance variations can be provided. Note that the image reproducing device having a storage medium includes a home-use game machine and the like.

Figure 63F:
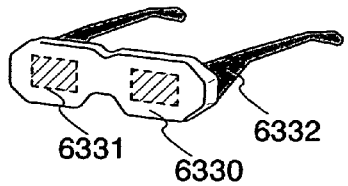

FIG. 63F shows a goggle display (head mounted display) which includes a main body 6330, a display portion 6331, an arm portion 6332, and the like. The invention can be applied to a display device which forms the display portion 6331. In accordance with the invention, clear images with reduced luminance variations can be provided.

Figure 63G:
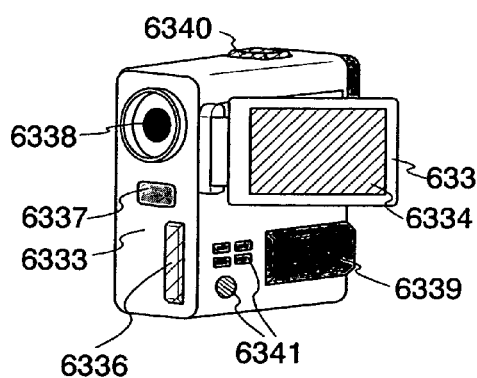

FIG. 63G is a video camera which includes a main body 6333, a display portion 6334, a housing 6335, an external connecting port 6336, a remote controlling portion 6337, an image receiving portion 6338, a battery 6339, an audio input portion 6340, operating keys 6341, and the like. The invention can be applied to a display device which forms the display portion 6334. In accordance with the invention, clear images with reduced luminance variations can be provided.

Figure 63H:
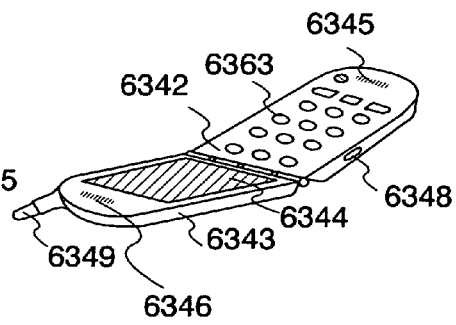
Figure 64:
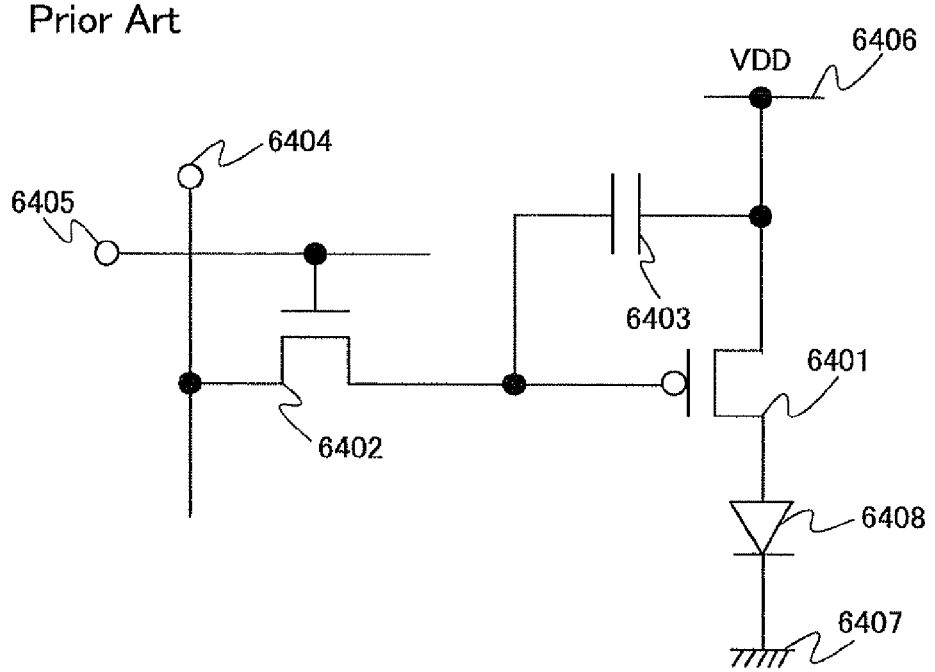
FIG. 64 illustrates a conventional pixel configuration.

FIG. 63H shows a portable phone which includes a main body 6342, a housing 6343, a display portion 6334, an audio input portion 6345, an audio output portion 6346, operating keys 6347, an external connecting port 6348, an antenna 6349, and the like. The invention can be applied to a display device which forms the display portion 6344. Note that power consumption of the portable phone can be suppressed by displaying white text on a black background of the display portion 6334. In accordance with the invention, clear images with reduced luminance variations can be provided.

Note that when a light-emitting material with high luminance is used, the display device can be applied to a front projector or a rear projector by magnifying and projecting the light containing output image data with a lens or the like.

Nowadays, the aforementioned electronic devices are more often used for displaying data which has been distributed through telecommunications paths such as the Internet or CATV (cable television), and in particular for displaying data on moving images. Since the response speed of a light-emitting material is quite high, it is preferable to use a light-emitting device for displaying moving images.

In addition, since a light-emitting device consumes power in its light-emitting portion, it is desirable to display data by utilizing a light-emitting portion having as small an area as possible. Thus, when a light-emitting device is used for a display portion of a portable information terminal, which mainly displays text data, such as a portable phone and an audio reproducing device, it is desirable to drive the device so that text data is formed by using a light-emitting portion with a non-light-emitting portion on the background.

As described above, the applicable range of the invention is so wide that the invention can be applied to electronic devices in various fields. In addition, an electronic device of this embodiment mode can employ a display device with any of the configurations shown in Embodiment Modes 1 to 13.

The present application is based on Japanese Priority application No. 2005-303656 filed on Oct. 18, 2005 with the Japanese Patent Office, the entire contents of which are hereby incorporated by reference.

What is claimed is:

1. A display device comprising:
a light-emitting element;
a first transistor connected to the light-emitting element;
a second transistor;
a third transistor;
a fourth transistor;
a first storage capacitor;
a second storage capacitor;
a first line capable of supplying a first potential to be input to one of source and drain of the first transistor, wherein the first potential is a power supply potential;
a second line capable of supplying a video signal; and
a third line capable of supplying a second potential that is different from the first potential,
wherein a gate terminal of the first transistor is connected to a first electrode of the first storage capacitor,
wherein the one of source and drain of the first transistor is connected to the first line,
wherein one of source and drain of the second transistor is directly connected to the other one of source and drain of the first transistor and is directly connected to a first electrode of the light-emitting element,
wherein the other one of source and drain of the second transistor is directly connected to the gate terminal of the first transistor,
wherein one of source and drain of the third transistor is connected to the second line,
wherein the other one of source and drain of the third transistor is connected to a second electrode of the first storage capacitor,
wherein one of source and drain of the fourth transistor is connected to the third line,
wherein the other one of source and drain of the fourth transistor is connected to the second electrode of the first storage capacitor,
wherein a first electrode of the second storage capacitor is connected to the other one of source and drain of the second transistor, and
wherein a second electrode of the second storage capacitor is connected to the third line.

2. The display device according to claim 1, wherein the first transistor, the second transistor, the third transistor and the fourth transistor have the same conductivity type.

3. A display device comprising:
a light-emitting element;
a first transistor connected to the light-emitting element;
a second transistor;
a third transistor;
a fourth transistor;
a first storage capacitor;
a second storage capacitor;
a first line which is a power supply line;
a second line which is a signal line; and
a third line which is a capacitive line capable of supplying a potential different from the power supply line,
wherein a gate terminal of the first transistor is connected to a first electrode of the first storage capacitor,
wherein one of source and drain of the first transistor is connected to the first line,
wherein one of source and drain of the second transistor is directly connected to the other one of source and drain of the first transistor and is directly connected to a first electrode of the light-emitting element,
wherein the other one of source and drain of the second transistor is directly connected to the gate terminal of the first transistor,
wherein one of source and drain of the third transistor is connected to the second line,
wherein the other one of source and drain of the third transistor is connected to a second electrode of the first storage capacitor,
wherein one of source and drain of the fourth transistor is connected to the third line, wherein the other one of source and drain of the fourth transistor is connected to the second electrode of the first storage capacitor, wherein a first electrode of the second storage capacitor is connected to the other one of source and drain of the second transistor, and wherein a second electrode of the second storage capacitor is connected to the third line.

4. A semiconductor device comprising:

a pixel electrode;

a first transistor connected to the pixel electrode;

a second transistor;

a third transistor;

a fourth transistor;

a first storage capacitor;

a second storage capacitor;

a first line capable of supplying a first potential to be input to one of source and drain of the first transistor, wherein the first potential is a power supply potential;

a second line capable of supplying a video signal; and a third line capable of supplying a second potential that is different from the first potential, wherein a gate terminal of the first transistor is connected to a first electrode of the first storage capacitor, wherein the one of source and drain of the first transistor is connected to the first line, wherein one of source and drain of the second transistor is directly connected to the other one of source and drain of the first transistor and is directly connected to a first electrode of the pixel electrode, wherein the other one of source and drain of the second transistor is directly connected to the gate terminal of the first transistor, wherein one of source and drain of the third transistor is connected to the second line, wherein the other one of source and drain of the third transistor is connected to a second electrode of the first storage capacitor, wherein one of source and drain of the fourth transistor is connected to the third line, wherein the other one of source and drain of the fourth transistor is connected to the second electrode of the first storage capacitor, wherein a first electrode of the second storage capacitor is connected to the other one of source and drain of the second transistor, and wherein a second electrode of the second storage capacitor is connected to the third line.

5. The semiconductor device according to claim 4, further comprising a fourth line connected to the pixel electrode, wherein a voltage applied to the fourth line changes over time.

6. The semiconductor device according to claim 4, wherein the fourth transistor is an n-channel transistor.

7. A semiconductor device comprising:

a pixel electrode;

a first transistor connected to the pixel electrode;

a second transistor;

a third transistor;

a fourth transistor;

a first storage capacitor;

a second storage capacitor;

a first line which is a power supply line;

a second line which is a signal line; and a third line which is a capacitive line capable of supplying a potential different from the power supply line, wherein a gate terminal of the first transistor is connected to a first electrode of the first storage capacitor, wherein one of source and drain of the first transistor is connected to the first line, wherein one of source and drain of the second transistor is directly connected to the other one of source and drain of the first transistor and is directly connected to a first electrode of the pixel electrode, wherein the other one of source and drain of the second transistor is directly connected to the gate terminal of the first transistor, wherein one of source and drain of the third transistor is connected to the second line, wherein the other one of source and drain of the third transistor is connected to a second electrode of the first storage capacitor, wherein one of source and drain of the fourth transistor is connected to the third line, wherein the other one of source and drain of the fourth transistor is connected to the second electrode of the first storage capacitor, wherein a first electrode of the second storage capacitor is connected to the other one of source and drain of the second transistor, and wherein a second electrode of the second storage capacitor is connected to the third line.

8. The semiconductor device according to claim 7, further comprising a fourth line connected to the pixel electrode, wherein a voltage applied to the fourth line changes over time.

9. The semiconductor device according to claim 7, wherein the fourth transistor and the second transistor have the same conductivity type.

10. The semiconductor device according to claim 7, wherein the fourth transistor is an n-channel transistor.

11. The semiconductor device according to claim 4, wherein the fourth transistor and the second transistor have the same conductivity type.

* * * * *